US009081286B2

(12) United States Patent
Odani et al.

(10) Patent No.: US 9,081,286 B2
(45) Date of Patent: Jul. 14, 2015

(54) PATTERN FORMING METHOD, METHOD FOR PRODUCING ELECTRONIC DEVICE USING THE SAME, AND ELECTRONIC DEVICE

(75) Inventors: Tadahiro Odani, Haibara-gun (JP); Ryosuke Ueba, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/528,118

(22) Filed: Jun. 20, 2012

(65) Prior Publication Data
US 2013/0004739 A1 Jan. 3, 2013

(30) Foreign Application Priority Data

Jun. 29, 2011 (JP) ................................. 2011-145019
Apr. 9, 2012 (JP) ................................. 2012-088485

(51) Int. Cl.
G03F 7/20 (2006.01)
G03F 7/40 (2006.01)
G03F 7/32 (2006.01)
(Continued)

(52) U.S. Cl.
CPC ................ G03F 7/203 (2013.01); G03F 7/325 (2013.01); G03F 7/38 (2013.01); G03F 7/40 (2013.01); G03F 7/22 (2013.01); Y10T 428/24802 (2015.01)

(58) Field of Classification Search
CPC ............. G03F 7/40; G03F 7/325; G03F 7/22; G03F 7/203
USPC .......................................... 430/311, 322, 325
See application file for complete search history.

(56) References Cited

U.S. PATENT DOCUMENTS

| 8,088,550 | B2 | 1/2012 | Tarutani et al. |
| 8,236,483 | B2 | 8/2012 | Ando et al. |
| 2007/0003878 | A1* | 1/2007 | Paxton et al. ................. 430/311 |

(Continued)

FOREIGN PATENT DOCUMENTS

| JP | 11329939 A | 11/1999 |
| JP | 2008311474 A | 12/2008 |

(Continued)

OTHER PUBLICATIONS

V. Truffert, et al., "Ultimate contact hole resolution using immersion lithography with line/space imaging", Optical Microlithography XXII, 2009, Proc. of SPIE vol. 7274, pp. 72740N-1 to 72740N-12.

(Continued)

*Primary Examiner* — Brittany Raymond
(74) *Attorney, Agent, or Firm* — Sughrue Mion, PLLC

(57) ABSTRACT

Provided is a pattern forming method including, in the following order: (1) forming a resist film on a substrate; (2) exposing the resist film, and thereby forming a first line-and-space latent image; (3) subjecting the resist film in which the first line-and-space latent image has been formed, to a first heating treatment; (4) exposing the resist film that has been subjected to the first heating treatment, and thereby forming a second line-and-space latent image, so that the line direction in the second line-and-space latent image intersects the line direction in the first line-and-space latent image; (5) subjecting the resist film in which the second line-and-space latent image has been formed, to a second heating treatment; and (6) developing the resist film that has been subjected to the second heating treatment, using a developer containing an organic solvent.

24 Claims, 9 Drawing Sheets

(51) Int. Cl.
 *G03F 7/38* (2006.01)
 *G03F 7/22* (2006.01)

(56) References Cited

U.S. PATENT DOCUMENTS

| | | | |
|---|---|---|---|
| 2009/0011362 | A1 | 1/2009 | Tarutani et al. |
| 2009/0017400 | A1 | 1/2009 | Tarutani et al. |
| 2009/0035708 | A1* | 2/2009 | Furukawa et al. ............ 430/327 |
| 2010/0143844 | A1 | 6/2010 | Takeshita et al. |
| 2010/0331440 | A1* | 12/2010 | Maruyama et al. ............ 522/108 |
| 2011/0236826 | A1* | 9/2011 | Hatakeyama et al. ..... 430/270.1 |
| 2011/0294069 | A1* | 12/2011 | Bae et al. .................... 430/283.1 |
| 2012/0315449 | A1 | 12/2012 | Tsubaki et al. |

FOREIGN PATENT DOCUMENTS

| | | |
|---|---|---|
| JP | 2009053688 A | 3/2009 |
| JP | 2010040849 A | 2/2010 |
| JP | 2010139996 A | 6/2010 |
| JP | 4554665 B2 | 9/2010 |
| JP | 2011227463 A | 11/2011 |
| KR | 20090004602 A | 1/2009 |
| KR | 20100039231 A | 4/2010 |

OTHER PUBLICATIONS

Jörg Zimmermann, et al., "Generation of arbitrary freeform source shapes using advanced illumination systems in high-NA immersion scanners", Optical Microlithography XXIII, 2010, Proc. of SPIE vol. 7640, pp. 764005-1 to 764005-15.

Joost Bekaert, et al., "Experimental verification of source-mask optimization and freeform illumination for 22-nm node static random access memory cells", J. Micro/Nanolith. MEMS MOEMS, Jan.-Mar. 2011, vol. 10, No. 1, pp. 013008-1 to 013008-10.

Thomas Huang, et al., "Improvement of lithography process by using a FlexRay illuminator for memory applications", Optical Microlithography XXIV, 2011, Proc. of SPIE, vol. 7973, pp. 79731X-1-79731X-11.

L. Van Look, et al., "Printing the Metal and Contact Layers for the 32 and 22 nm Node: Comparing positive and negative Tone Development Process", Optical Microlithography XXIII, 2010, Proc. of SPIE, vol. 7640, pp. 764011-1 to 764011-12.

Notice of Submission of Argument, mailed Dec. 6, 2013, issued in corresponding KR Application No. 2012-60891, 12 pages in English and Korean.

* cited by examiner

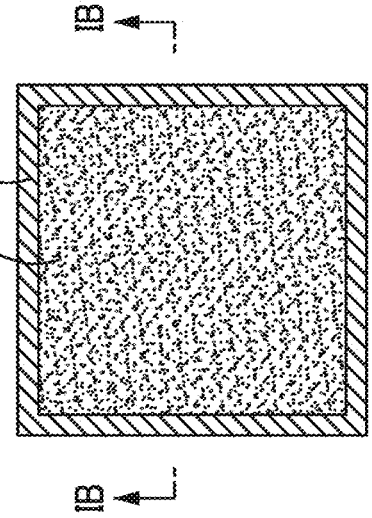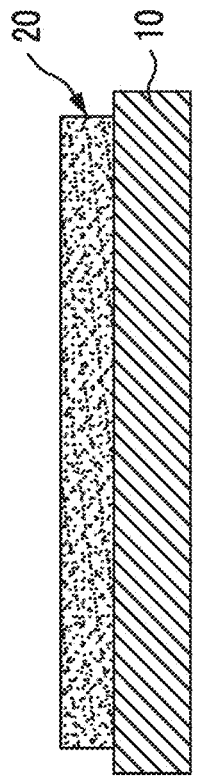

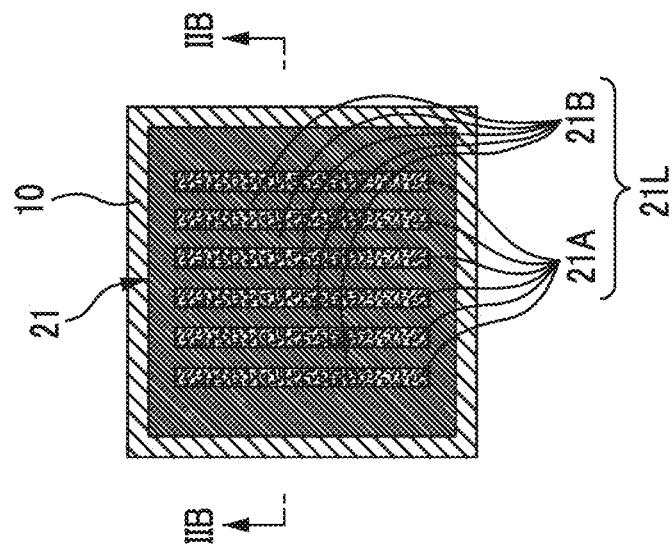

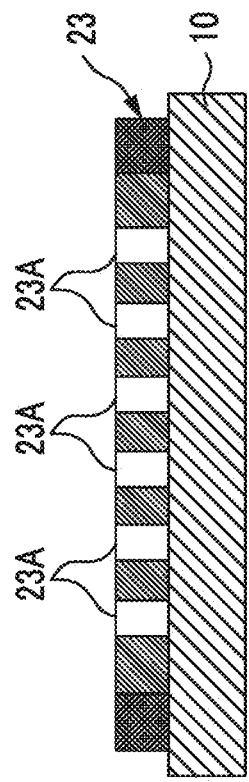
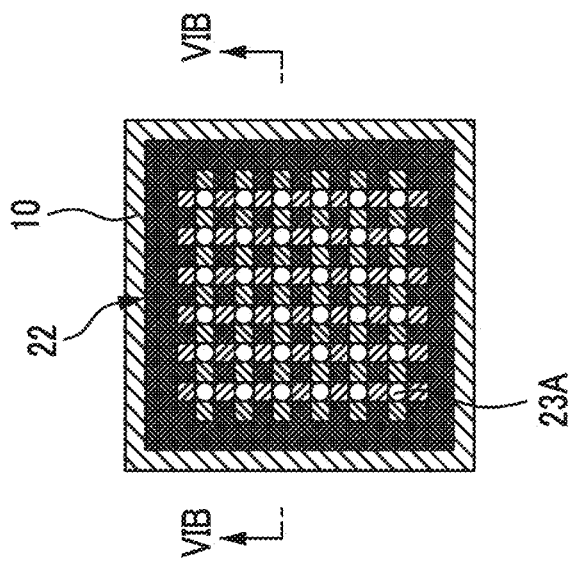

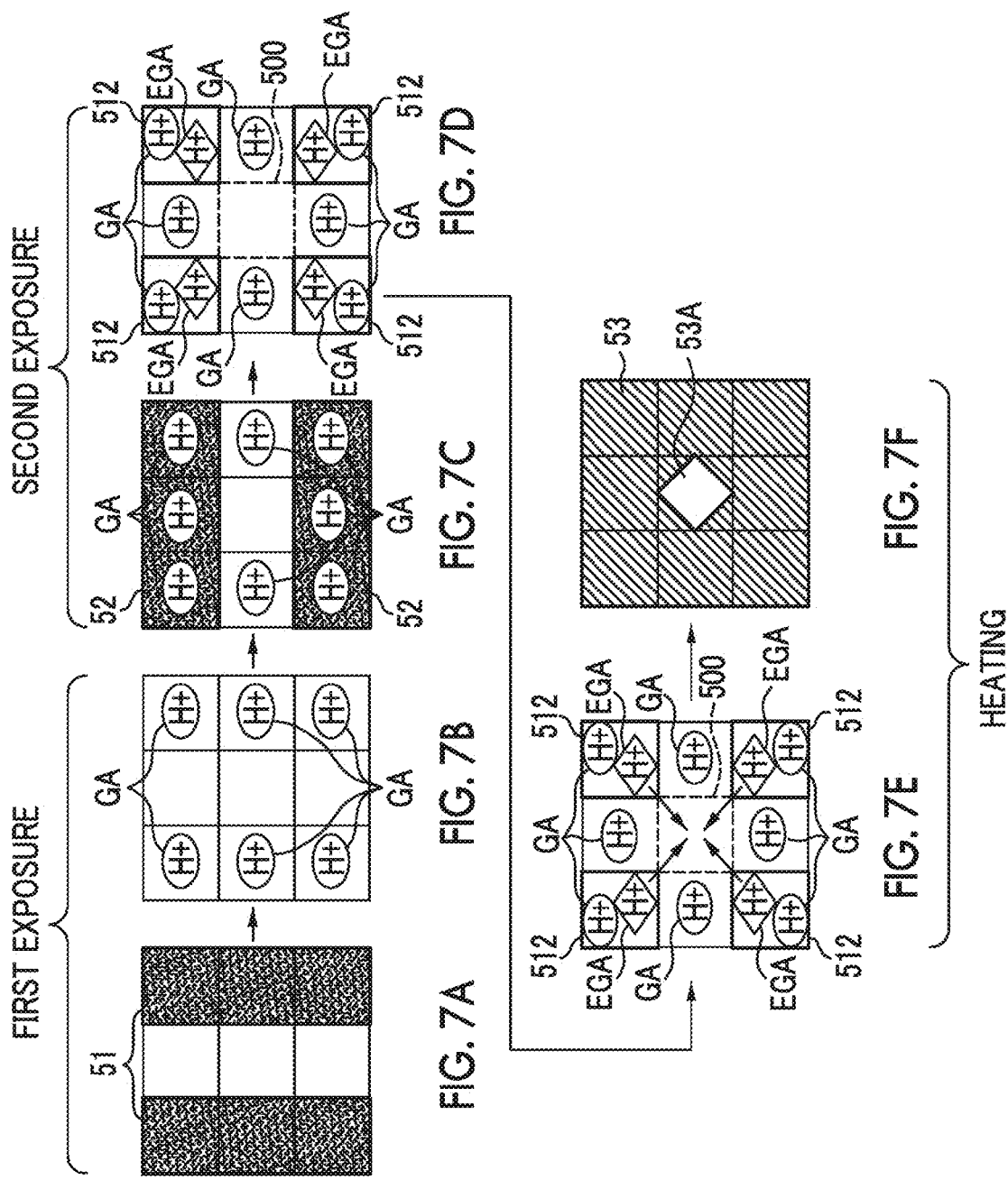

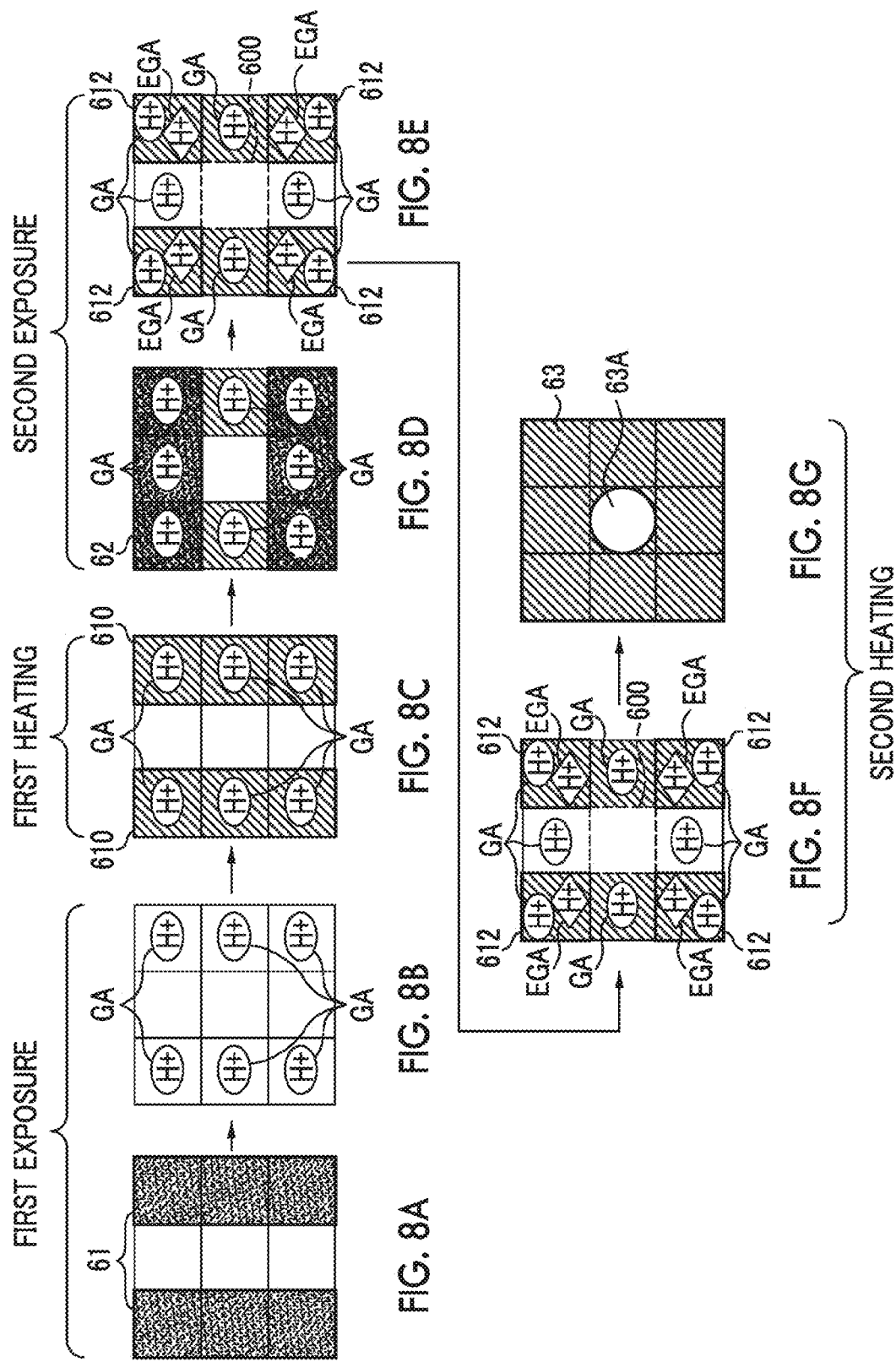

PATTERN FORMING METHOD, METHOD FOR PRODUCING ELECTRONIC DEVICE USING THE SAME, AND ELECTRONIC DEVICE

BACKGROUND OF THE INVENTION

1. Field of the Invention

The present invention relates to a pattern forming method, a method for producing an electronic device using the same, and an electronic device. More particularly, the present invention relates to a pattern forming method which is suitable for semiconductor production processes for integrated circuits (ICs) and the like, production of circuit boards such as liquid crystals and thermal heads, and lithographic printing processes for photopublication applications, a method for producing an electronic device using the pattern forming method, and an electronic device. In particular, the present invention relates to a pattern forming method which is suitable for the exposure by means of an ArF exposure apparatus that uses far-ultraviolet light having wavelength of 300 nm or less as a light source, an ArF liquid immersion type projection exposure apparatus, and an extreme ultraviolet (EUV) exposure apparatus, a method for producing an electronic device using the pattern forming method, and an electronic device.

2. Description of the Related Art

Along with the miniaturization of semiconductor elements, shortening of the wavelength of exposure light sources and an enhancement of the numerical aperture (high NA) of projection lenses are in progress. Furthermore, a so-called liquid immersion method is known which is intended to increase the resolving power by shortening the wavelength, and involves filling of the space between the projection lens and a sample with a liquid having a high refractive index (hereinafter, also called "immersion liquid"). The liquid immersion method is effective for all types of pattern shapes, and the miniaturization of patterns and an enhancement of resolving power have been achieved by combining the liquid immersion method with super-resolution technologies such as a phase shift method, a modified illumination method, double patterning, and Reflow.

Furthermore, since the development of resists for a KrF excimer laser (248 nm), an image forming method called chemical amplification has been used as a resist image forming method, in order to compensate for a decrease in the sensitivity caused by light absorption. To explain the mechanism by taking an example of the image forming method based on positive type chemical amplification, it is an image forming method in which an acid generator at an exposed area is decomposed by exposure to produce an acid, an alkali-insoluble group is converted to an alkali-soluble group through a process of post exposure bake (PEB) by using the generated acid as a reaction catalyst, and the exposed area is removed by alkali development. The positive type image forming method utilizing this mechanism of chemical amplification is currently considered as mainstream.

However, in recent years, there has been a demand for further advanced miniaturization of patterns. Recently, a technology has been disclosed, in which resist films that are obtained by using not only the positive type chemical amplification resist compositions of the current mainstream but also negative type chemical amplification resist compositions, are developed using organic developers (see, for example, JP4554665B).

In the positive type image forming method, isolated line or dot patterns can be satisfactorily formed; however, when isolated spaces or fine contact holes are formed, the shape of the pattern is markedly deteriorated, and it is difficult to apply the pattern to a device even if a super-resolution technology is employed. Instead, as a method for satisfactorily forming isolated spaces or fine contact holes, negative type chemical amplification pattern forming methods making use of organic developers such as described above are employed.

In more recent years, as one of the measures for the sharp increase in the demand for the miniaturization of contact holes, an attempt to form contact holes that are finer than the conventional contact holes by combining a negative type image forming method using an organic developer with a double exposure technology, is underway at a rapid pace. More specifically, there is known a method of exposing a resist film twice by using a mask having lines and spaces alternately arranged, in which method the mask is disposed such that the line direction of the mask at the time of the first exposure and the line direction of the mask at the second exposure are perpendicular to each other, and a contact hole pattern is formed by developing the resist film after exposure, using an organic developer (see Proceedings of the International Society for Optics and Photonics, Vol. 7274, 72740N (2009) (hereinafter, cited as "Proceedings 7274"); and Proceedings of the International Society for Optical Engineering, Vol. 7640, 764011 (2010) (hereinafter, cited as "Proceedings 7640")).

SUMMARY OF THE INVENTION

However, in the methods described in Proceedings 7274 and Proceedings 7640, the shape of the cross-section in the plane direction of resist films having contact holes is, strictly speaking, still distorted (for example, diamond-shaped), and along with a further enhancement of the performance of electronic devices, there is also a demand for the shape of the cross-section in the plane direction of resist films having contact holes to be a more regularly ordered shape.

The present invention has been made in view of the problems described above, and an object of the present invention is to provide a pattern forming method which is capable of forming contact holes having satisfactory shapeability (low degree of deformation) in connection with the shape of the cross-section in the plane direction of a resist film, a method for producing an electronic device using the pattern forming method, and an electronic device.

The present invention has the following constitution, and thereby, the object of the invention as described above is addressed.

[1] A pattern forming method including, in the following order:

(1) forming, on a substrate, a resist film using a chemical amplification resist composition including (A) a resin in which the polarity increases under the action of an acid and thereby the solubility in a developer containing an organic solvent decreases, and (B) a compound which generates an acid when irradiated with an actinic ray or a radiation;

(2) exposing the resist film, and thereby forming a first line-and-space latent image in which a first group of lines and a first group of spaces are alternately arranged;

(3) subjecting the resist film in which the first line-and-space latent image has been formed, to a first heating treatment;

(4) exposing the resist film that has been subjected to the first heating treatment, and thereby forming a second line-and-space latent image in which a second group of lines and a second group of spaces are alternately arranged, so that the line direction in the second lineand-space latent image is intersects the line direction in the first line-and-space latent image;

(5) subjecting the resist film in which the second line-and-space latent image has been formed, to a second heating treatment; and (6) developing the resist film that has been subjected to the second heating treatment, using a developer containing an organic solvent.

[2] The pattern forming method as described in the above item [1], wherein the content of the organic solvent in the developer containing the organic solvent is from 90% by mass to 100% by mass with respect to the total amount of the developer.

[3] The pattern forming method as described in the above item [1] or [2], wherein the chemical amplification resist composition contains (C) a basic compound or ammonium salt compound, each of which has decreasing basicity when irradiated with an actinic ray or a radiation.

[4] The pattern forming method as described in any one of the above items [1] to [3], wherein the resin (A) contains a repeating unit represented by the following formula (AI):

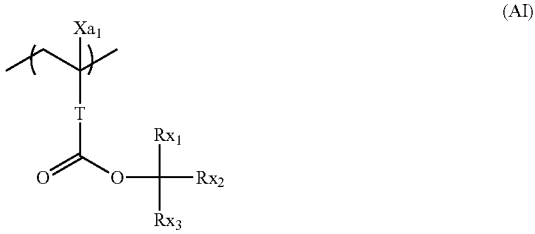

(AI)

wherein in the formula (AI), $Xa_1$ represents a hydrogen atom, a methyl group which may be substituted, or a group represented by the formula —$CH_2$—$R_9$; $R_9$ represents a hydroxyl group or a monovalent organic group;

T represents a single bond or a divalent linking group;

$Rx_1$ to $Rx_3$ each independently represent an alkyl group or a cycloalkyl group; and two of $Rx_1$ to $Rx_3$ may be joined to form a cycloalkyl group.

[5] The pattern forming method as described in any one of the above items [1] to [4], wherein the resin (A) contains a repeating unit represented by the following formula (I), and the repeating unit represented by the following formula (I) is decomposed by an acid and produces a carboxyl group:

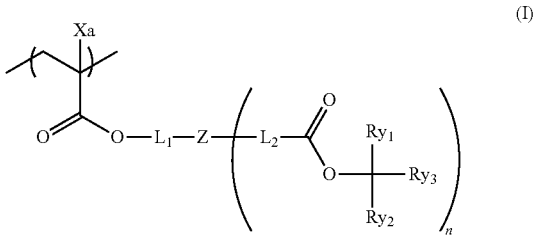

(I)

wherein Xa represents a hydrogen atom, an alkyl group, a cyano group, or a halogen atom;

$Ry_1$ to $Ry_3$ each independently represent an alkyl group or a cycloalkyl group; two of $Ry_1$ to $Ry_3$ may be joined to form a ring;

Z represents a linking group having a valence of (n+1) and having a polycyclic hydrocarbon structure which may have heteroatoms as ring members;

$L_1$ and $L_2$ each independently represent a single bond or a divalent linking group;

n represents an integer of 1 to 3; and when n is 2 or 3, plural $L_2$'s, plural $Ry_1$'s, plural $Ry_1$'s, and plural $Ry_1$'s may be each identical with or different from each other.

[6] The pattern forming method as described in any one of the above items [1] to [5], wherein the forming of the first line-and-space latent image and the forming of the second line-and-space latent image respectively involve exposing the resist film using an ArF excimer laser.

[7] The pattern forming method as described in the above item [6], wherein the forming of the first line-and-space latent image and the forming of the second line-and-space latent image respectively involve exposing the resist film through an immersion liquid using an ArF excimer laser.

[8] The pattern forming method as described in any one of the above items [1] to [7], wherein the heating temperature in the step of performing the first heating treatment and the heating temperature in the step of performing the second heating treatment are respectively independently from 70° C. to 150° C., and the heating time in the step of performing the first heating treatment and the heating time in the step of performing the second heating treatment are each independently from 10 seconds to 90 seconds.

[9] The pattern forming method as described in the above item [1], wherein the amount of exposure in the forming of the second line-and-space latent image is greater by a range of 0 mJ/cm$^2$ to 15 mJ/cm$^2$ as compared with the amount of exposure in the forming of the first line-and-space latent image.

[10] The pattern forming method as described in the above item [1], wherein the amount of exposure in the forming of the second line-and-space latent image is greater by a range of 2 mJ/cm$^2$ to 15 mJ/cm$^2$ as compared with the amount of exposure in the forming of the first line-and-space latent image.

[11] A method for producing an electronic device, the method including the pattern forming method as described in any one of the above items [1] to [10].

[12] An electronic device produced by the method for producing the electronic device according to the above item [11].

It is more preferable that the present invention have the following constitution.

[13] The pattern forming method as described in any one of the above item [1] to [10], wherein in the formula (AI), T represents a single bond; and $Rx_1$ to $Rx_3$ each independently represent a linear or branched alkyl group (provided that two of $Rx_1$ to $Rx_3$ do not join together to form a cycloalkyl group).

[14] The pattern forming method as described in any one of the above items [1] to [10] and [13], wherein the widths of the plural spaces constituting the first group of spaces are identical to each other, and the widths of the plural spaces constituting the second group of spaces are identical to each other.

[15] The pattern forming method as described in the above item [14], wherein in the forming of the second line-and-space latent image, the second line-and-space latent image is formed such that the line direction in the second line-and-space latent image is perpendicular to the line direction in the first line-and-space latent image.

[16] The pattern forming method as described in the above item [14] or [15], wherein the widths of the spaces in the first group of spaces are identical to the widths of the spaces in the second group of spaces.

[17] The pattern forming method as described in the above item [14], wherein in the forming of the second line-and-space latent image, the second line-and-space latent image is formed such that the line direction in the second line-and-space latent image obliquely intersects the line direction in the first line-and-space latent image.

[18] The pattern forming method as described in any one of the above items [1] to [10] and [13] to [17], wherein the exposure processes employed in the forming of the first line-and-space latent image and the forming of the second line-and-space latent image are exposure processes respectively using a double pole illumination.

[19] The pattern forming method as described in any one of the above items [1] to [10] and [13] to [18], wherein the exposure processes employed in the forming of the first line-and-space latent image and the forming of the second line-and-space latent image are exposure processes respectively using a photomask selected from a binary mask and a phase shift mask.

According to the present invention, a pattern forming method capable of forming contact holes with satisfactory shapeability (low degree of deformation) in connection with the cross-sectional shape in the plane direction of a resist film, a method for producing an electronic device using the pattern forming method, and an electronic device can be provided.

BRIEF DESCRIPTION OF THE DRAWINGS

FIG. 1A is a schematic top view illustrating the process for forming a resist film, and FIG. 1B is a cross-sectional view of the schematic top view of FIG. 1A cut along the line IB-IB.

FIG. 2A is a schematic top view illustrating the process for performing the first exposure on a resist film, and FIG. 2B is a cross-sectional view of the schematic top view of FIG. 2A cut along the line IIB-IIB.

FIG. 6A is a schematic cross-sectional view illustrating the state of the resist film after development, and FIG. 6B is a cross-sectional view of the schematic cross-sectional view of FIG. 6A cut along the line VIB-VIB.

FIG. 7A to FIG. 7F are schematic top views illustrating a comparative pattern forming method.

FIG. 8A to FIG. 8G are schematic top views illustrating the pattern forming method according to the present invention.

DESCRIPTION OF THE PREFERRED EMBODIMENTS

Figure 3:
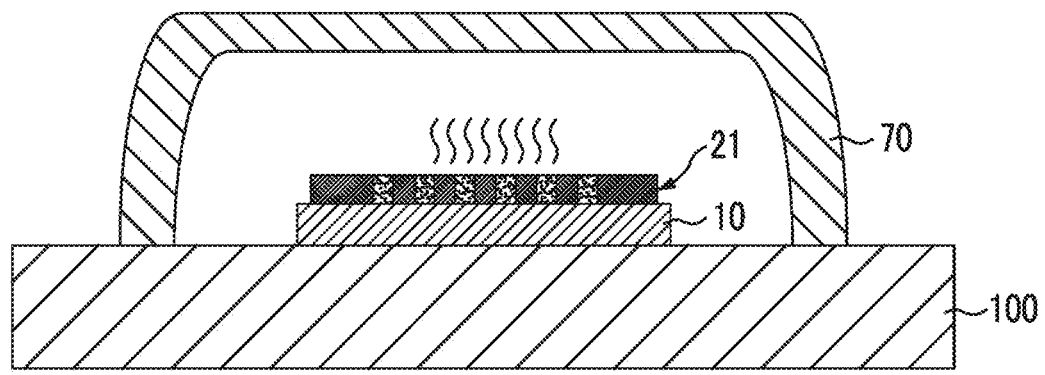
FIG. 3 is a schematic cross-sectional view illustrating the process for performing the first heating treatment.

Hereinafter, embodiments of the present invention will be described in detail.

In regard to the indication of a group (atomic group) in the present specification, an indication without any description on the state of being substituted or non-substituted is intended to include groups that do not have any substituent as well as groups that have substituents. For example, the term "alkyl group" includes alkyl groups that do not have any substituent (unsubstituted alkyl groups), as well as alkyl groups that have substituents (substituted alkyl groups).

The term "actinic ray" or "radiation" as used in the present specification means, for example, far-ultraviolet radiation represented by the bright line spectrum of a mercury lamp or excimer laser light, extreme ultraviolet radiation (EUV light), X-radiation, or an electron beam (EB). Furthermore, light according to the present invention means an actinic ray or a radiation.

The term "exposure" as used in the present specification includes, unless particularly stated otherwise, exposure to far-ultraviolet radiation represented by a mercury lamp light or excimer laser light, extreme ultraviolet radiation, X-radiation, EUV light or the like, as well as image drawing by means of a particle beam such as an electron beam or an ion beam.

Furthermore, the term "perpendicular" as used in the present specification includes intersection exactly at the right angle, as well as intersection at a substantial (in view of the accuracy of the instrument) right angle. In the present specification, the expression "A to B," or "from A to B," which indicates a numeric value range, has the same meaning as "not less than A and not more than B."

In the pattern forming method according to an exemplary embodiment of the present invention, first, a resist film is formed.

FIG. 1A is a schematic top view illustrating the process for forming a resist film, and FIG. 1B is a cross-sectional view of FIG. 1A cut along the line IB-IB.

More specifically, as shown in FIG. 1A and FIG. 1B, a resist film 20 is formed on a substrate 10 using a chemical amplification resist composition (more specifically, a negative type resist composition).

The substrate 10 is selected in accordance with the use, and is not particularly limited. However, inorganic substrates of silicon, SiN, SiO$_2$, SiN and the like; coated inorganic substrates such as spin-on-glasses (SOG); and substrates that are generally used in the production processes for semiconductors such as integrated circuits (IC), liquid crystals, and circuit boards such as thermal heads, and lithographic processes for other photopublication applications, can be used.

A substrate provided in advance with an antireflection film may also be used. As the antireflection film, inorganic film types formed from titanium, titanium dioxide, titanium nitride, chromium oxide, carbon, amorphous silicon and the like, and organic film types formed from light absorbents and polymeric materials can all be used. Furthermore, as an organic antireflection film, commercially available organic antireflection films such as DUV 30 series and DUV 40 series manufactured by Brewer Science, Inc.; AR-2, AR-3, and AR-5 manufactured by Shipley Company LLC; and ARC series such as ARC29A manufactured by Nissan Chemical Industries, Ltd. can also be used.

The formation of the resist film 20 using a resist composition may be achieved by using any method as long as the resist composition can be applied on the substrate 10, and a spin coating method, a spray method, a roller coating method, a flow coating method, a doctor coating method, an immersion method and the like, which are conventionally known, can be used. It is preferable to form a coating film by applying the resist composition by a spin coating method.

The thickness of this coating film is preferably 10 nm to 200 nm, and more preferably 20 nm to 150 nm.

After the resist composition is applied, the substrate may be heated (preheating; PB (PreBake)) as necessary. Thereby, a film from which insoluble residual solvent has been removed can be uniformly formed. The temperature of the prebake process is not particularly limited, but is preferably 50° C. to 160° C., and more preferably 60° C. to 140° C.

The heating time is preferably 30 seconds to 300 seconds, more preferably 30 seconds to 180 seconds, and even more preferably 30 seconds to 90 seconds.

The preheating can be carried out by a means provided in a conventional exposure machine, and may also be carried out by using a hot plate or the like.

As the resist composition, a chemical amplification resist composition containing (A) a resin in which the polarity increases under the action of an acid and thereby the solubility in a developer containing an organic solvent increases, and (B) a compound which generates an acid when irradiated with an actinic ray or a radiation, is used.

This chemical amplification resist composition will be explained in detail.

Next, a first exposure (exposure in the step of forming a first line-and-space latent image) is carried out.

FIG. 2A is a schematic top view illustrating the process for performing the first exposure on a resist film, and FIG. 2B is a cross-sectional view of FIG. 2A cut along the line IIB-IIB.

More specifically, the first exposure is carried out by mediation of a mask (not depicted) on the surface of the resist film 20 shown in FIG. 1A and FIG. 1B. Here, the mask is composed of plural light-shielding mask lines and plural translucent spaces alternately arranged.

As illustrated in FIG. 2A and FIG. 2B, the resist film 20 shown in FIG. 1A and FIG. 1B is modified by the first exposure to a resist film 21 on which a first line-and-space latent image 21L is formed. Here, in the first line-and-space latent image 21L, a first group of spaces 21A formed as a result of light being shielded by the plural light-shielding mask lines, and a first group of lines 21B formed as a result of light being transmitted through plural translucent spaces are alternately arranged.

The widths of the plural first spaces constituting the first group of spaces 21A are identical to each other, and for example, the widths are in a range of 25 nm to 100 nm.

Furthermore, the distances between adjacent first spaces (pitch of spaces) are respectively independently set to a range of 76 nm to 200 nm, and the distances may be identical.

Next, the resist film 21 on which the first line-and-space latent image 21L is formed is subjected to a first heating treatment.

FIG. 3 is a schematic cross-sectional view illustrating the process for performing the first heating treatment.

More specifically, the first heating treatment is carried out, as shown in FIG. 3, while the substrate 10 provided with the resist film 21 is mounted on a hot plate 100, and the resist film 21 is covered with a cover 70.

The heating temperature for the first heating treatment is preferably from 70° C. to 150° C., and more preferably from 90° C. to 110° C.

The heating time for the first heating treatment is preferably from 10 seconds to 90 seconds, and more preferably from 30 seconds to 60 seconds.

Next, a second exposure process (exposure in the step of forming a second line-and-space latent image) is carried out.

Figure 4A:
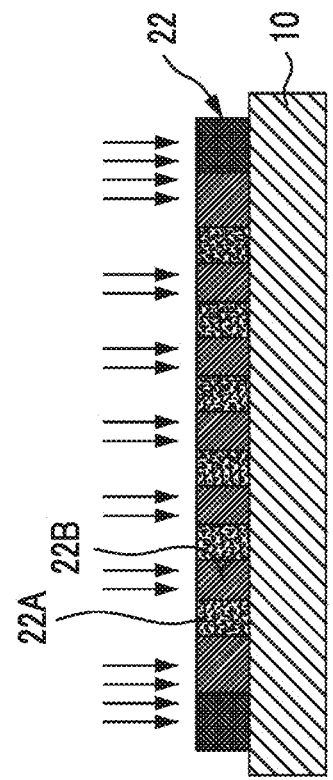
FIG. 4A is a schematic top view illustrating the process for performing the second exposure on the resist film.
Figure 4B:
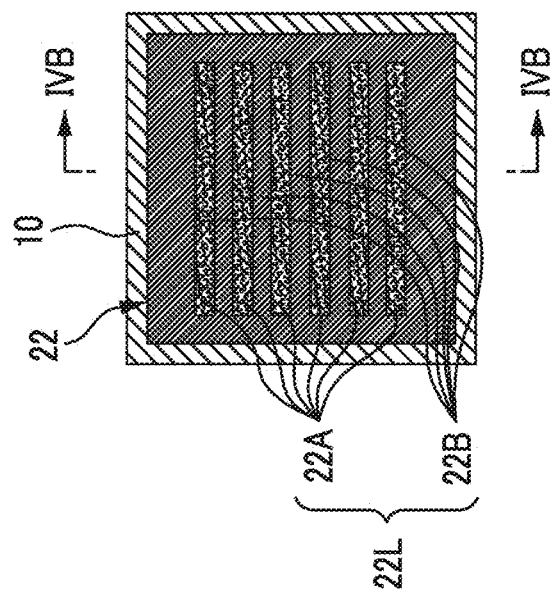
FIG. 4B is a cross-sectional view of the schematic top view of FIG. 4A cut along the line IVB-IVB.

FIG. 4A is a schematic top view illustrating the process for performing the second exposure on the resist film, and FIG. 4B is a cross-sectional view of FIG. 4A cut along the line IVB-IVB.

More specifically, the second exposure process is carried out by mediation of a mask (not depicted) on the surface of the resist film 21 that has been subjected to the first heating treatment. Here, the mask for the second exposure is used in a state in which the mask for the first exposure has been rotated by 90° (the state in which the light-shielding mask lines of the mask for the second exposure are perpendicular to the light-shielding mask lines of the mask for the first exposure).

As illustrated in FIG. 4A and FIG. 4B, the resist film 21 shown in FIG. 3 is modified by the second exposure to a resist film 22 on which a second line-and-space latent image 22L has been formed in addition to the first line-and-space latent image 21L described above. Here, in the second line-and-space latent image 22L, a second group of spaces 22A formed as a result of light being shielded by plural light-shielding mask lines, and a second group of lines 22B formed as a result of light being transmitted through plural translucent spaces are alternately arranged. The second line-and-space latent image 22L is provided such that the line direction in the second line-and-space latent image 22L (also being the longitudinal direction of the spaces) is perpendicular to the line direction in the first line-and-space latent image 21L (also being the longitudinal direction of the spaces).

The respective widths of the plural second spaces constituting the second group of spaces 22A are identical to each other, and are identical to the respective widths of the plural first spaces constituting the first group of spaces 21A described above.

Furthermore, the distances of adjacent second spaces (pitch of spaces) are also identical to each other, and are identical to the distances of adjacent first spaces described above.

As a result of the first exposure and second exposure explained above, in the resist film 22, plural unexposed areas (not depicted) that have been exposed by neither the first exposure nor the second exposure are formed in the form of square lattices at an interval of the distance between adjacent first or second spaces (that is, for example, 76 nm to 200 nm). Here, the cross-section of the unexposed areas in the plane direction of the resist film 22 is a square shape having the width of the first or second space (that is, for example, 25 nm to 100 nm) as one side.

Next, the resist film 22 in which the second line-and-space latent image 22L has been formed in addition to the first line-and-space latent image 21L is subjected to a second heating treatment.

Figure 5:
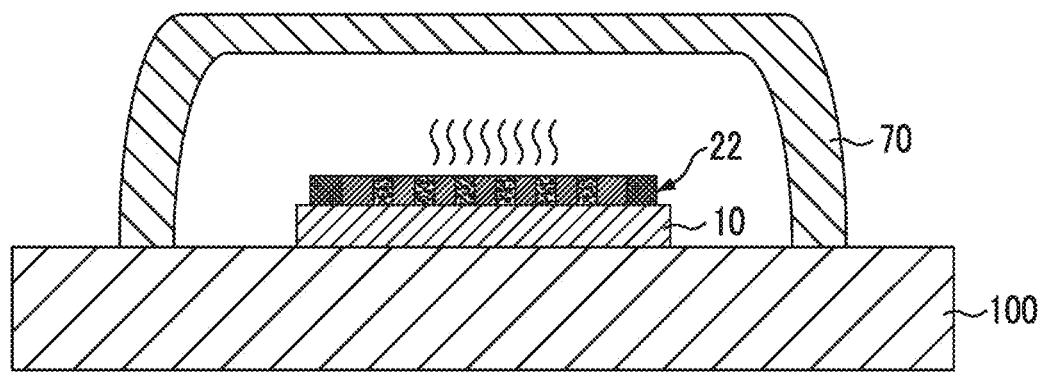
FIG. 5 is a schematic cross-sectional view illustrating the process for performing the second heating treatment.

FIG. 5 is a schematic cross-sectional view illustrating the process for performing the second heating treatment.

More specifically, the second heating treatment is carried out by the same method as the first heating treatment. That is, as illustrated in FIG. 5, the second heating treatment is carried out while the substrate 10 provided with the resist film 22 is mounted on a hot plate 100, and the resist film 22 is covered with a cover 70.

The heating temperature for the second heating treatment is preferably from 70° C. to 150° C., and more preferably from 90° C. to 110° C.

The heating time for the second heating treatment is preferably from 10 seconds to 90 seconds, and more preferably from 30 seconds to 60 seconds.

The heating temperature for the second heating treatment may be identical with or different from the heating temperature for the first heating treatment.

The heating time for the second heating treatment may be identical with or different from the heating time for the first heating treatment.

For the first exposure and the second exposure, there are no limitations on the light source used in the exposure apparatus, but infrared light, visible light, ultraviolet light, far-ultraviolet light, extreme ultraviolet light, X-radiation, an electron beam and the like may be used. A preferred example is far-ultraviolet light having a wavelength of 250 nm or less, more preferably 220 nm or less, and particularly preferably 1 nm to 200 nm, and specific examples include KrF excimer laser light (248 nm), ArF excimer laser light (193 nm), $F_2$ excimer laser light (157 nm), X-radiation, EUV (13 nm), and an electron beam. Preferred examples include KrF excimer laser light, ArF excimer laser light, EUV and an electron beam, and a more preferred example is ArF excimer laser light.

According to the present invention, the amounts of exposure at the time of the first exposure and the second exposure are respectively not particularly limited, but are preferably 10 mJ/cm$^2$ to 40 mJ/cm$^2$. Furthermore, in the present invention, the amounts of exposure at the first exposure and the second exposure may be identical with or different from each other. However, it is preferable that the amount of exposure at the second exposure be larger than the amount of exposure at the time of the first exposure by an amount in a range of 0 mJ/cm$^2$ to 15 mJ/cm$^2$ (more preferably, 2 mJ/cm$^2$ to 15 mJ/cm$^2$).

For the first exposure and the second exposure, it is preferable to use an immersion exposure method.

The immersion exposure method is a technology for increasing the resolution power, and is a technology of exposing by filling a liquid having a high refractive index (hereinafter, also called an "immersion liquid") between a projection lens and a sample.

The resolution limit is represented by the formula $k_1 \cdot (\lambda/NA)$ (wherein $\lambda$ represents the wavelength of the exposure light source in air; NA represents the numerical aperture of the projection lens; and $k_1$ represents a coefficient related to the process); however, when n is designated as the refractive index of the immersion liquid in air, $\theta$ as the convergence half angle, and $NA_0 = \sin \theta$, the resolution limit can be represented by the following formula:

$$(\text{Resolution limit}) = k_1 \cdot [\lambda/(n \cdot NA_0)] = k_1 \cdot (\lambda/n)/NA_0$$

That is, the effect of immersion is equivalent to an effect of increasing the numerical aperture of the projection lens to n times (in other words, in the case of a projection optical system of the same NA, the effect of immersion is equivalent to an effect of using an exposure wavelength of 1/n).

In the case of carrying out immersion exposure, a process of washing the surface of the film with a water-based reagent liquid in at least one case of (1) after the film has been formed on the substrate, and before the first exposure; (2) after the first exposure is carried out, and before the first heating treatment is carried out; (3) after the first heating treatment is carried out, and before the second exposure is carried out; and (4) after the second exposure is carried out, and before the second heating treatment that will be described later is carried out.

The immersion liquid is preferably a liquid having a temperature coefficient of the refractive index which is as small as possible so that the liquid is transparent to the exposure wavelength, and the distortion of the optical image projected on the film may be minimized. However, particularly when the exposure light source is an ArF excimer laser (wavelength: 193 nm), it is preferable to use water from the viewpoints of ease of availability and ease of handling, in addition to the viewpoint described above.

In the case of using water, an additive (liquid) which increases the surface active force while decreasing the surface tension of water, may be added at a small proportion. This additive is preferably a compound which does not dissolve the resist layer on the wafer and for which the effect on the optical coating on the lower surface of a lens element can be neglected.

As such an additive, for example, an aliphatic alcohol having a refractive index that is approximately equal to that of water is preferred, and specific examples include methyl alcohol, ethyl alcohol, and isopropyl alcohol. When an alcohol having a refractive index that is approximately equal to that of water is added, it is advantageous in that even if the alcohol component in water is evaporated and its concentration changes, the overall change in the refractive index of the liquid can be minimized.

On the other hand, when a substance that is opaque to light having a wavelength of 193 nm, or an impurity having a refractive index that is largely different from that of water has been incorporated, such a substance causes distortion in the optical image projected on the resist. Therefore, distilled water is preferred as the water used. Furthermore, pure water which has been filtered through an ion exchange filter or the like may also be used.

The electrical resistance of the water used as the immersion liquid is desirably 18.3 MΩcm or higher, the total organic carbon (TOC; concentration of organic substances) is desirably 20 ppb or less, and it is desirable that the water have been degassed.

Furthermore, the lithographic performance can be enhanced by increasing the refractive index of the immersion liquid. From this point of view, an additive for increasing the refractive index may be added to water, or deuterated water ($D_2O$) may be used instead of water.

When the film formed by using the composition of the present invention is exposed through an immersion medium, a hydrophobic resin (E) that will be described later may be further added as necessary. When the hydrophobic resin (E) is added, the receding contact angle of the surface is increased. The receding contact angle of the film is preferably 60° to 90°, and more preferably 70° or higher.

In the immersion exposure step, the immersion liquid needs to move over the wafer in accordance with the movement of the exposure head of scanning over the wafer at a high speed and forming an exposure pattern. Therefore, the contact angle of the immersion liquid against the resist film in a dynamic state becomes important, and accordingly, the resist is required to have a performance of conforming to the high-speed scan of the exposure head without having liquid droplets remaining thereon.

Between the film formed by using the composition of the present invention and the immersion liquid, a film that is poorly soluble in the immersion liquid (hereinafter, also called "overcoat") may be provided so as to prevent the film from being brought into direct contact with the immersion liquid. Functions required of the overcoat include coating suitability to the resist upper layer, transparency to radiation, particularly a radiation having a wavelength of 193 nm, and poor solubility in the immersion liquid. The overcoat is preferably a film which does not mix with the resist and can be uniformly applied on the upper layer of the resist.

The overcoat is preferably a polymer which does not contain an aromatic group, from the viewpoint of transparency at 193 nm.

Specific examples include hydrocarbon polymers, acrylic acid ester polymers, polymethacrylic acid, polyacrylic acid, polyvinyl ether, silicon-containing polymers, and fluorine-containing polymers. The hydrophobic resin (E) that will be described later is also suitable as the overcoat. When impurities are eluted from the overcoat to the immersion liquid, the optical lens becomes contaminated. Therefore, it is preferable that the polymer contained in the overcoat have a lower amount of residual monomer components.

When the overcoat is detached, a developer may be used, or a separate release agent may also be used. As the release agent, a solvent which penetrates less into the film is preferred. From the viewpoint that the detachment step and the film development step can be simultaneously carried out, it is preferable that the overcoat can be detached by using an alkali developer. From the viewpoint of detaching with an alkali developer, it is preferable that the overcoat be acidic, but from the viewpoint of non-intermiscibility with the film, the overcoat may also be neutral or alkaline.

It is preferable that there be no difference, or only a small difference, in the refractive index between the overcoat and the immersion liquid. In this case, the resolution power can be increased. When the exposure light source is an ArF excimer laser (wavelength: 193 nm), it is preferable to use water as the immersion liquid. Therefore, it is preferable that the refractive index of the overcoat for ArF immersion exposure be closer to the refractive index of water (1.44). Furthermore, from the viewpoints of transparency and refractive index, the overcoat is preferably a thin film.

It is preferable that the overcoat be not miscible with the film and not miscible with the immersion liquid. From this point of view, when the immersion liquid is water, the solvent used in the overcoat is preferably a medium which is sparingly soluble in the solvent used in the composition of the present invention, and non-water-soluble. Furthermore, when the immersion liquid is an organic solvent, the overcoat may be water-soluble or may be non-water-soluble.

Next, the resist film that has been subjected to the second heating treatment is developed.

The development is carried out by using a developer containing an organic solvent (hereinafter, also called an organic developer).

As discussed above, the resist film is formed from a chemical amplification resist composition containing (A) a resin in which the polarity increases under the action of an acid and thereby the solubility in a developer containing an organic solvent increases, and (B) a compound which generates an acid when irradiated with an actinic ray or a radiation.

Therefore, in the exposed areas of the resist film, when the acid generated from the compound (B) reacts with the resin (A), and as the polarity of the resin (A) is increased, the solubility in a developer containing an organic solvent is decreased. Thereby, the exposed areas of the resist film can be made insoluble or sparingly soluble in the developer containing an organic solvent. On the other hand, in the unexposed areas of the resist film, since the increase of polarity in the resin (A) that is exhibited at the exposed areas does not occur, the solubility in the developer containing an organic solvent does not change. Thereby, the unexposed areas of the resist film can be made soluble in the developer containing an organic solvent.

As such, a negative type pattern is formed by the development.

FIG. 6A is a schematic cross-sectional view illustrating the state of the resist film after development, and FIG. 6B is a cross-sectional view of FIG. 6A cut along the line VIB-VIB.

More specifically, as illustrated in FIG. 6A and FIG. 6B, the resist film 22 shown in FIG. 5 is modified by the development to a resist film 23 in which plural resist hole patterns 23A are formed. Here, the plural resist hole patterns 23A are each a through-hole formed when an unexposed area (not depicted) that has not been exposed by any of the first exposure and the second exposure described above is dissolved by the developer and removed.

Furthermore, the dimensions of the resist hole pattern 23A is equivalent to the dimensions of the unexposed area, and the resist hole pattern 23A has a cylindrical shape in which the diameter of the circular cross-section in the plane direction of the resist film 23 is, for example, 25 nm to 100 nm.

Suitable examples of the organic developer include polar solvents such as ketone-based solvents, ester-based solvents, alcohol-based solvents, amide-based solvents, and ether-based solvents, and hydrocarbon-based solvents.

Examples of the ketone-based solvents include 1-octanone, 2-octanone, 1-nonanone, 2-nonanone, acetone, 2-heptanone(methyl amyl ketone), 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetyl carbinol, acetophenone, methyl naphthyl ketone, isophorone, and propylene carbonate.

Examples of the ester-based solvents include methyl acetate, butyl acetate, ethyl acetate, isopropyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl 3-ethoxypropionate, 3-methoxybutyl acetate, 3-methyl-3-methoxybutyl acetate, methyl formate, ethyl formate, butyl formate, propyl formate, ethyl lactate, butyl lactate, and propyl lactate.

Examples of the alcohol-based solvents include alcohols such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, and n-decanol; glycol-based solvents such as ethylene glycol, diethylene glycol, and triethylene glycol; and glycol ether-based solvents such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, and methoxymethylbutanol.

Examples of the ether-based solvents include dioxane, and tetrahydrofuran, in addition to the glycol ether-based solvents.

Examples of the amide-based solvents include N-methyl-2-pyrrolidone, N,N-dimethylacetamide, N,N-dimethylformamide, hexamethylphosphoric triamide and 1,3-dimethyl-2-imidazolidinone.

Examples of the hydrocarbon-based solvents include aromatic hydrocarbon-based solvents such as toluene and xylene; and aliphatic hydrocarbon-based solvents such as pentane, hexane, octane, and decane.

The solvents described above may be used as mixtures of plural solvents, or may be used as mixtures with other solvents or water. However, in order to provide a more than sufficient effect of the present invention, the overall water content of the developer is preferably less than 10 mass %, and it is more preferable that the developer substantially do not contain any water.

That is, the use amount of the organic solvent with respect to the organic developer is preferably from 90 mass % to 100 mass %, and more preferably from 95 mass % to 100 mass %, with respect to the total amount of the developer.

Particularly, the organic developer is preferably a developer containing at least one kind of organic solvent selected from the group consisting of ketone-based solvents, ester-based solvents, alcohol-based solvents, amide-based solvents, and ether-based solvents.

The vapor pressure of the organic developer is preferably 5 kPa or less at 20° C., more preferably 3 kPa or less, and particularly preferably 2 kPa or less. When the vapor pressure of the organic developer is adjusted to 5 kPa or less, evaporation of the developer on the substrate or in the developing cup is suppressed, the temperature uniformity in the wafer plane is enhanced, and as a result, the dimensional uniformity in the wafer plane is ameliorated.

Specific examples of compounds having a vapor pressure of 5 kPa or less include ketone-based solvents such as 1-octanone, 2-octanone, 1-nonanone, 2-nonanone, 2-heptanone (methyl amyl ketone), 4-heptanone, 2-hexanone, diisobutyl ketone, cyclohexanone, methylcyclohexanone, phenylacetone, and methyl isobutyl ketone; ester-based solvents such as butyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl 3-ethoxypropionate, 3-methoxybutyl acetate, 3-methyl-3-methoxybutyl acetate, butyl formate, propyl formate, ethyl lactate, butyl lactate, and propyl lactate; n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, and n-decanol; glycol-based solvents such as ethylene glycol, diethylene glycol, and triethylene glycol; glycol ether-based solvents such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, and methoxymethylbutanol; ether-based solvents such as tetrahydrofuran; amide-based solvents such as N-methyl-2-pyrrolidone, N,N-dimethylacetamide, and N,N-dimethylformamide; aromatic hydrocarbon-based solvents such as toluene and xylene; and aliphatic hydrocarbon-based solvents such as octane and decane.

Specific examples of compounds having a vapor pressure of 2 kPa or less, which is a particularly preferred range, include ketone-based solvents such as 1-octanone, 2-octanone, 1-nonanone, 2-nonanone, 4-heptanone, 2-hexanone, diisobutyl ketone, cyclohexanone, methylcyclohexanone, and phenylacetone; ester-based solvents such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl 3-ethoxypropionate, 3-methoxybutyl acetate, 3-methyl-3-methoxybutyl acetate, ethyl lactate, butyl lactate, and propyl lactate; alcohol-based solvents such as n-butyl alcohol, sec-butyl alcohol, tert-butyl alcohol, isobutyl alcohol, n-hexyl alcohol, n-heptyl alcohol, n-octyl alcohol, and n-decanol; glycol-based solvents such as ethylene glycol, diethylene glycol, and triethylene glycol; glycol ether-based solvents such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, and methoxymethylbutanol; amide-based solvents such as N-methyl-2-pyrrolidone, N,N-dimethylacetamide, N,N-dimethylformamide; aromatic hydrocarbon-based solvents such as xylene; and aliphatic hydrocarbon-based solvents such as octane and decane.

In the organic developer, an appropriate amount of a surfactant can be added as necessary.

The surfactant is not particularly limited, but for example, ionic or nonionic, fluorine-based and/or silicone-based surfactants can be used. Examples of these fluorine-based and/or silicone-based surfactants include the surfactants described in JP 1987-36663A (JP-S62-36663A), JP 1986-226746A (JP-S61-226746 A), JP 1986-226745A (JP-S61-226745A), JP1987-170950A (JP-S62-170950A), JP1988-34540A (JP-S63-34540A), JP 1995-230165A (JP-H07-230165A), JP 1996-62834A (JP-H08-62834A), JP 1997-54432A (JP-H09-54432A), JP1997-5988A (JP-H09-5988A), U.S. Pat. No. 5,405,720A, U.S. Pat. No. 5,360,692A, U.S. Pat. No. 5,529,881 A, U.S. Pat. No. 5,296,330A, U.S. Pat. No. 5,436,098A, U.S. Pat. No. 5,576,143A, U.S. Pat. No. 5,294,511A, and U.S. Pat. No. 5,824,451A. Preferred examples include nonionic surfactants. The nonionic surfactants are not particularly limited, but it is more preferable to use a fluorine-based surfactant or a silicone-based surfactant.

The use amount of the surfactant is usually 0.001 mass % to 5 mass %, preferably 0.005 mass % to 2 mass %, and even more preferably 0.01 mass % to 0.5 mass %, with respect to the total amount of the developer.

As the developing method, for example, a method of immersing a substrate in a tank filled with a developer for a certain time (dipping method), a method of heaping up a developer on the surface of a substrate by means of surface tension and resting the developer for a certain time to perform development (paddle method), a method of spraying a developer on the surface of a substrate (spraying method), or a method of continuously ejecting a developer on a substrate that is rotating at a certain speed, while scanning the developer ejection nozzle at a certain rate (dynamic dispensing method) can be applied.

When the various developing methods described above respectively include a step of ejecting a developer toward a resist film through the developing nozzles of a developing apparatus, the ejection pressure (flow rate of the developer to be ejected per unit area) of the developer to be ejected is preferably 2 mL/sec/mm$^2$ or less, more preferably 1.5 mL/sec/mm$^2$ or less, and even more preferably 1 mL/sec/mm$^2$ or less. There are no particular limitations on the flow rate, but when the throughput is taken into consideration, an ejection pressure of 0.2 mL/sec/mm$^2$ or greater is preferred.

When the ejection pressure of the developer that is ejected is adjusted to the range described above, the defects of a pattern originating from resist residues after development can be markedly reduced.

Although the details of the mechanism of this occurrence are not clearly known, it can be speculated that it is because when the ejection pressure is adjusted to the range described above, the pressure exerted by the developer toward the resist film is decreased, and careless planning or collapse of the resist film or resist pattern can be suppressed.

Meanwhile, the ejection pressure (mL/sec/mm$^2$) of the developer is a value at the developing nozzle outlet in a developing apparatus.

Examples of the method for adjusting the ejection pressure of the developer include a method of adjusting the ejection pressure using a pump or the like, and a method of changing the pressure by adjusting the pressure through the supply from a pressurized tank.

Furthermore, after the step of performing development by using a developer containing an organic solvent, a step of stopping development while replacing the solvent to a different solvent may also be carried out.

After the development using an organic developer, it is preferable to carry out a step of washing the resist pattern using a rinsing liquid (rinsing step).

The rinsing liquid used in the rinsing step is not particularly limited as long as the rinsing liquid does not dissolve the resist pattern, and any solution containing a general organic solvent can be used. As the rinsing liquid, it is preferable to use a rinsing liquid containing at least one kind of organic solvent selected from the group consisting of hydrocarbon-based solvents, ketone-based solvents, ester-based solvents, alcohol-based solvents, amide-based solvents, and ether-based solvents.

Specific examples of the hydrocarbon-based solvents, ketone-based solvents, ester-based solvents, alcohol-based solvents, amide-based solvents and ether-based solvents include the same solvents described in connection with the developer containing an organic solvent.

After the development using an organic developer, more preferably, a step of washing the substrate using a rinsing liquid containing at least one kind of organic solvent selected from the group consisting of ketone-based solvents, ester-based solvents, alcohol-based solvents, and amide-based solvents is carried out. Even more preferably, a step of washing the substrate using a rinsing liquid containing an alcohol-based solvent or an ester-based solvent is carried out, and particularly preferably, a step of washing the substrate using a rinsing liquid containing a monohydric alcohol is carried out. Most preferably, a step of washing the substrate using a rinsing liquid containing a monohydric alcohol having 5 or more carbon atoms is carried out.

Here, examples of the monohydric alcohol used in the rinsing step include linear, branched and cyclic monohydric alcohols, and specific examples that can be used include 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol, and 4-octanol. Particularly preferred examples of the monohydric alcohol having 5 or more carbon atoms that can be used include 1-hexanol, 2-hexanol, 4-methyl-2-pentanol, 1-pentanol, and 3-methyl-1-butanol.

The respective components may be used as mixtures of plural compounds, or may also be used as mixtures with organic solvents other than those described above.

The water content in the rinsing liquid is preferably 10% by mass or less, more preferably 5% by mass or less, and particularly preferably 3% by mass or less. When the water content is adjusted to 10% by mass or less, satisfactory development characteristics can be obtained.

The vapor pressure of the rinsing liquid used after the step of performing development using a developer containing an organic solvent, is preferably from 0.05 kPa to 5 kPa at 20° C., more preferably from 0.1 kPa to 5 kPa, and most preferably from 0.12 kPa to 3 kPa. When the vapor pressure of the rinsing liquid is adjusted to from 0.05 kPa to 5 kPa, the temperature uniformity in the wafer plane is enhanced, swelling caused by penetration of the rinsing liquid is suppressed, and the dimensional uniformity in the wafer plane is ameliorated.

In the rinsing liquid, an appropriate amount of a surfactant may be added and used.

In the rinsing step, the wafer that has been developed using the developer containing an organic solvent is subjected to a washing treatment using the rinsing liquid containing an organic solvent as described above. There are no particular limitations on the method for washing treatment, but for example, a method of continuously ejecting a rinsing liquid on a substrate that is rotating at a constant speed (rotary coating method), a method of immersing a substrate in a bath filled with a rinsing liquid for a certain time (dipping method), or a method of spraying a rinsing liquid on the surface of a substrate (spraying method) can be applied. Among these, it is preferable to perform the washing treatment by the rotary coating method, and to remove the rinsing liquid from the substrate by rotating the substrate after washing at a speed of rotation of 2000 rpm to 4000 rpm. Furthermore, it is also preferable to include a heating step (postbake) after the rinsing step. As a result of baking, any developer and rinsing liquid remaining between the patterns and inside the patterns are removed. The heating process after the rinsing step is usually carried out at 40° C. to 160° C., and preferably 70° C. to 95° C., usually for 10 seconds to 3 minutes, and preferably for 30 seconds to 90 seconds.

According to the pattern forming method related to the exemplary embodiment of the present invention described above, the cross-sectional shape of the contact holes thus obtainable in the plane direction of the resist film has excellent shapeability. More specifically, the circular cross-section of the contact holes thus obtainable in the plane direction of the resist film has high circularity.

Hereinafter, the speculated operating mechanism of the pattern forming method according to the present invention will be explained with reference to the attached drawings.

FIG. 7A to FIG. 7F are schematic top views illustrating a pattern forming method for comparison, and FIG. 8A to FIG. 8G are schematic top views illustrating the pattern forming method according to the present invention.

The pattern forming method for comparison is a method which does not carry out the first heating treatment in the pattern forming method according to the exemplary embodiment of the present invention as described above.

More specifically, first, a resist film is subjected to a first exposure through a mask (not depicted) in which plural light-shielding mask lines and plural translucent spaces are alternately arranged.

The resist film is formed from a chemical amplification resist composition containing (A) a resin in which the polarity increases under the action of an acid and thereby the solubility in a developer containing an organic solvent increases, and (B) a compound which generates an acid when irradiated with an actinic ray or a radiation.

When the first exposure is carried out, first line-shaped exposed areas 51 are formed on the resist film, as shown in FIG. 7A. As a result, as shown in FIG. 7B, an acid GA is generated from the compound (B) at the first line-shaped exposed areas 51.

Subsequently, the resist film is subjected to a second exposure through the same mask as the mask used for the first exposure. However, the mask in the second exposure is used in a state in which the mask for the first exposure has been rotated by 90° (a state in which the light-shielding mask lines of the mask for the second exposure are perpendicular to the light-shielding mask lines of the mask for the first exposure).

By performing the second exposure, second line-shaped exposed areas 52 that perpendicularly intersect with the first line-shaped exposed areas 51 are formed on the resist film, as shown in FIG. 7C. As a result, as shown in FIG. 7D, an acid GA is generated from the compound (B) at the second line-shaped exposed areas 52.

Here, in the regions 512 at the four corners, which belong to the region of the first line-shaped exposed areas 51 and also belong to the region of the second line-shaped exposed areas 52, the amount of exposure is large, and excess acid EGA is generated from the compound (B) as compared with other exposed areas.

On the other hand, in the center region 500 which does not belong to any of the first line-shaped exposed areas 51 and the second line-shaped exposed areas 52, exposure is not achieved, and the acid GA is not generated from the compound (B).

Subsequently, the first lined-shaped exposed areas 51 and the second line-shaped exposed areas 52 are subjected to a heating treatment so that the reaction between the acid generated from the compound (B), and the (A) resin in which the polarity increases under the action of an acid and thereby the solubility in a developer containing an organic solvent increases, can be accelerated.

However, in the pattern forming method for comparison, as shown in FIG. 7E, the excess acid EGA in the regions 512 at the four corners is likely to diffuse to the inner region 500 as a result of the heating treatment. As a result, as illustrated in FIG. 7F, the hole region 53A where an image has been formed by the polarity switch regions 53 in which the reaction between the acid generated from the compound (B), and the (A) resin which has an increasing polarity and a decreasing solubility in a developer containing an organic solvent, has been accelerated under the action of an acid, has a deformed cross-sectional shape (lower circularity) in the plane direction of the resist film, since the acid is excessively diffused from the regions 512 at the four corners toward the inner region 500.

On the other hand, the pattern forming method according to the present invention performs a heating treatment between the first exposure and the second exposure, as explained in the exemplary embodiment described above.

More specifically, first, a resist film is subjected to a first exposure through a mask (not depicted) in which plural light-shielding mask lines and plural translucent spaces are alternately arranged.

As described in the above exemplary embodiment, and also in the same manner as the pattern forming method for comparison, the resist film is formed from a chemical amplification resist composition containing (A) a resin in which the polarity increases under the action of an acid and thereby the solubility in a developer containing an organic solvent increases, and (B) a compound which generates an acid when irradiated with an actinic ray or a radiation.

By performing the first exposure, first line-shaped exposed areas 61 are formed on the resist film, as shown in FIG. 8A. As a result, as shown in FIG. 8B, an acid GA is generated from the compound (B) at the first line-shaped exposed areas 61.

Subsequently, a first heating treatment is carried out. As a result, as illustrated in FIG. 8C, polarity switch regions 610 in which the reaction between the acid generated from the compound (B), and the (A) resin in which the polarity increases under the action of an acid and thereby the solubility in a developer containing an organic solvent increases, has been accelerated, are formed at the same positions as the first line-shaped exposed areas 61.

Subsequently, the resist film is subjected to a second exposure through the same mask as the mask used for the first exposure. However, the mask for the second exposure is used in a state in which the mask for the first exposure has been rotated by 90° (a state in which the light-shielding mask lines of the mask for the second exposure are perpendicular to the light-shielding mask lines of the mask for the first exposure).

By performing the second exposure, second line-shaped exposed areas 62 that perpendicularly intersect with the first line-shaped exposed areas 61 are formed on the resist film, as shown in FIG. 8D. As a result, as shown in FIG. 8E, an acid GA is generated from the compound (B) at the second line-shaped exposed areas 62.

Similarly to the pattern forming method for comparison, also in the pattern forming method of the present invention, the amount of exposure is large in the regions 612 at the four corners, which belong to the region of the first line-shaped exposed areas 61 and also belong to the region of the second line-shaped exposed areas 62, and excess acid EGA is generated from the compound (B) as compared with other exposed areas.

On the other hand, in the center region 600 which does not belong to any of the first line-shaped exposed areas 61 and the second line-shaped exposed areas 62, exposure is not achieved, and the acid GA is not generated from the compound (B).

Subsequently, the first lined-shaped exposed areas 61 and the second line-shaped exposed areas 62 are subjected to a second heating treatment so that the reaction between the acid generated from the compound (B), and the (A) resin in which the polarity increases under the action of an acid and thereby the solubility in a developer containing an organic solvent increases, can be accelerated.

However, in the pattern forming method according to the present invention, as illustrated in FIG. 8F, the regions 612 at the four corners where excess acid EGA is generated are included in the polarity switch regions 610 in which the reaction between the acid generated from the compound (B), and the (A) resin in which the polarity increases under the action of an acid and thereby the solubility in a developer containing an organic solvent increases, has been accelerated by the first heating treatment. Further, in these polarity switch regions 610, the glass transition temperature of the resin has increased as a result of the acceleration of the reaction described above by the first heating treatment. As a result, it is difficult for the acid included in the polarity switch regions 610, and furthermore, the acid included in the regions 612, to diffuse to other regions even after the second heating treatment.

Therefore, as illustrated in FIG. 8G, the hole region 63A where an image has been formed by the polarity switch regions 63 in which the reaction between the acid generated from the compound (B), and the (A) resin which has an increasing polarity and a decreasing solubility in a developer containing an organic solvent, has been accelerated, is not likely to be affected by the excess acid generated in the regions 612 at the four corners. Accordingly, a satisfactory cross-sectional shape in the plane direction of the resist film is obtained (increased circularity).

In the pattern forming method related to the exemplary embodiment of the present invention, the widths of the plural spaces constituting the first group of spaces in the first line-and-space latent image are identical to each other, and the widths of the plural spaces constituting the second group of spaces in the second line-and-space latent image are identical to each other.

Furthermore, in the pattern forming method related to the exemplary embodiment of the present invention, the second line-and-space latent image is formed such that the line direction in the second line-and-space latent image is perpendicular to the line direction in the first line-and-space latent image.

In addition, in the pattern forming method related to the exemplary embodiment of the present invention, the widths of the spaces in the first group of spaces are identical to the widths of the spaces in the second group of spaces.

As a result, the plural hole patterns formed on the resist film are identical in size to each other, and also, the cross-sectional shape of the hole patterns in the plane direction of the substrate is circular in shape.

However, the present invention is not intended to be limited to the embodiment described above, and for example, an embodiment in which the widths of the spaces in the first group of spaces constituting the first line-and-space latent image are different from the widths of the spaces in the second group of spaces constituting the second line-and-space latent image, or an embodiment in which the second line-and-space latent image is formed such that the line direction in the second line-and-space latent image obliquely intersects the line direction in the first line-and-space latent image, may also be employed. In these embodiments, the cross-sectional shape of the hole patterns formed in the substrate in the plane direction of the substrate is elliptical in shape.

Furthermore, an embodiment in which at least any one group of spaces between the first group of spaces constituting the first line-and-space latent image and the second group of spaces constituting the second line-and-space latent image includes plural kinds of spaces having different widths of spaces, may also be employed.

As such, even in an embodiment different from the exemplary embodiment of the present invention described above, when the pattern forming method of the present invention is employed, contact holes can be formed such that the cross-sectional shape in the plane direction of the resist film is a desired shape, more specifically, has satisfactory shapeability (low degree of deformation).

In regard to the pattern forming method according to the exemplary embodiment of the present invention described above, the type of the mask is not particularly limited, but the mask is preferably a photomask selected from a binary mask (a mask having a transmittance of the translucent area of 0%) and a phase shift mask, and a binary mask is more preferred.

Furthermore, in regard to the exposure in the step of forming the first line-and-space latent image and the step of forming the second line-and-space latent image, an exposure process of using a double pole illumination may be employed. The exposure by a double pole illumination is usually an exposure process in which the optical image is optimized in the line direction of the first group of lines and the line direction of the second group of lines.

Furthermore, the exposure in the step of forming the first line-and-space latent image and the step of forming the second line-and-space latent image may also be an exposure process using the Source Mask Optimization (SMO: the illumination system of the exposure machine and the mask pattern are optimized with each other) technology, or using a programmable illumination system utilizing micromirrors, by which the illumination shape in a modified illumination such as the double pole illumination described above can be formed in the exposure apparatus without any loss in the illumination energy (see J. Micro/Nanolith. MEMS MOEMS 10(1), 013008 (January-March 2011); Proc. of SPIE Vol. 7973 79731X-1; Proc. of SPIE Vol. 7640 764005-1; and the like).

In the photomask used for the first exposure and the second exposure in the pattern forming process, the ratio of the width of the light-shielding mask line to the width of the translucent space is appropriately modified by the shape and size of the hole pattern to be formed, the pitch of the hole patterns, and the like. However, the ratio is preferably 1:10 to 10:1, more preferably 1:5 to 5:1, and even more preferably 1:5 to 1:1.

Furthermore, the mask used for the first exposure and the mask used for the second exposure may be different masks, not only in the case where the mask shape does not coincide with the mask shape obtainable after rotating the mask, but also in the case where the mask shapes coincide with each other.

Also, a single mask in which the region of the mask used for the first exposure and the region of the mask used for the second exposure are disposed in separate regions may also be used.

Furthermore, in the first heating treatment and the second heating treatment of the pattern forming method related to the exemplary embodiment of the present invention described above, the cover 70 is used, but such a cover is used as appropriate, and may not be used.

The present invention also relates to a method for producing an electronic device including the pattern forming method of the present invention described above, and an electronic device produced by this production method.

The electronic device of the present invention is a device which is suitably mounted in electric/electronic equipment (electrical appliances, OA/media-related equipment, optical equipment, communication equipment, and the like).

Next, the details of the chemical amplification resist composition (more specifically, a negative resist composition) containing (A) a resin in which the polarity increases under the action of an acid and thereby the solubility in a developer containing an organic solvent increases, and (B) a compound which generates an acid when irradiated with an actinic ray or a radiation, used in the pattern forming method of the present invention will be described.

Meanwhile, an exposed area formed from a crosslinked product tends to be such that desired holes are not easily formed by swelling even if the developer is an organic developer. Therefore, it is preferable that the chemical amplification resist composition according to the present invention substantially do not contain a crosslinking agent selected from "a crosslinking agent which crosslinks the resin (A) under the action of an acid and thereby forms a crosslinked product," "a crosslinking agent which crosslinks with another crosslinking agent under the action of an acid and thereby forms a crosslinked product," and the like (specifically, the content of the crosslinking agent relative to the total solids content of the chemical amplification resist composition is preferably 1 mol % or less, more preferably 0.5 mol % or less, and ideally, 0 mol %, that is, the chemical amplification resist composition does not contain any crosslinking agent).

[1] (A) Resin in which the polarity increases under the action of an acid and thereby the solubility in a developer containing an organic solvent increases An example of the resin in which the polarity increases under the action of an acid and thereby the solubility in a developer containing an organic solvent increases, as used in the resist composition of the present invention, may be a resin having a group which is degraded under the action of an acid and produces a polar group (hereinafter, also referred to as "acid-degradable group") in the main chain or a side chain of the resin, or in both the main chain and a side chain (hereinafter, also referred to as "acid-degradable resin" or "resin (A)").

The acid-degradable group preferably has a structure that is protected by a group which degrades a polar group under the action of an acid and detaches the polar group.

The polar group is not particularly limited as long as it is a group which makes the resin sparingly soluble or insoluble in a developer containing an inorganic solvent, but examples include acidic groups (groups which dissociate in a 2.38 mass % aqueous solution of tetramethylammonium hydroxide that is used as a conventional developer for resists) such as a phenolic hydroxyl group, a carboxyl group, a fluorinated alcohol group (preferably, a hexafluoroisopropanol group), a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group; and alcoholic hydroxyl groups.

Meanwhile, an alcoholic hydroxyl group means a hydroxyl group bonded to a hydrocarbon group, and is a hydroxyl group other than the hydroxyl group directly bonded to an aromatic ring (phenolic hydroxyl group), but as a hydroxyl group, an aliphatic alcohol in which the α-position has been substituted with an electron-withdrawing group such as a fluorine atom (for example, a fluorinated alcohol group (a hexafluoroisopropanol group or the like)) is excluded. The alcoholic hydroxyl group is preferably a hydroxyl group having a pKa of from 12 to 20.

Preferred examples of the polar group include a carboxyl group, a fluorinated alcohol group (preferably a hexafluoroisopropanol group), and a sulfonic acid group.

A group preferable as an acid-degradable group is a group in which a hydrogen atom of such a group has been substituted by a group which is detached by an acid.

Examples of the group which is detached by an acid include —C($R_{36}$)($R_{37}$)($R_{38}$), —C($R_{36}$)($R_{37}$)(O$R_{39}$), and —C($R_{01}$)($R_{02}$)(O$R_{39}$).

In the formulae, $R_{36}$ to $R_{39}$ each independently represent an alkyl group, a cycloalkyl group, an aryl group, an aralkyl group, or an alkenyl group. $R_{36}$ and $R_{37}$ may be joined together to form a ring.

$R_{01}$ and $R_{02}$ each independently represent a hydrogen atom, an alkyl group, a cycloalkyl group, an aryl group, an aralkyl group, or an alkenyl group.

The alkyl group of $R_{36}$ to $R_{39}$, $R_{01}$ and $R_{02}$ is preferably an alkyl group having 1 to 8 carbon atoms, and examples thereof include a methyl group, an ethyl group, a propyl group, an n-butyl group, a sec-butyl group, a hexyl group, and an octyl group.

The cycloalkyl group of $R_{36}$ to $R_{39}$, $R_{01}$ and $R_{02}$ may be of a monocyclic type or a polycyclic type. The monocyclic type is preferably a cycloalkyl group having 3 to 8 carbon atoms, and examples include a cyclopropyl group, a cyclobutyl group, a cyclopentyl group, a cyclohexyl group, and a cyclooctyl group. The polycyclic type is preferably a cycloalkyl group having 6 to 20 carbon atoms, and examples thereof include an adamantyl group, a norbornyl group, an isobornyl group, a camphanyl group, a dicyclopentyl group, an α-pinel group, a tricyclodecanyl group, a tetracyclododecyl group, and an androstanyl group. Meanwhile, at least one carbon atom in the cycloalkyl group may be substituted by a heteroatom such as an oxygen atom.

The aryl group of $R_{36}$ to $R_{39}$, $R_{01}$ and $R_{02}$ is preferably an aryl group having 6 to 10 carbon atoms, and examples thereof include a phenyl group, a naphthyl group, and an anthryl group.

The aralkyl group of $R_{36}$ to $R_{39}$, $R_{01}$ and $R_{02}$ is preferably an aralkyl group having 7 to 12 carbon atoms, and examples thereof include a benzyl group, a phenethyl group, and a naphthylmethyl group.

The alkenyl group of $R_{36}$ to $R_{39}$, $R_{01}$ and $R_{02}$ is preferably an alkenyl group having 2 to 8 carbon atoms, and examples thereof include a vinyl group, an allyl group, a butenyl group, and a cyclohexenyl group.

The ring formed by $R_{36}$ and $R_{37}$ that are bonded together is preferably a cycloalkyl group (monocyclic or polycyclic). The cycloalkyl group is preferably a monocyclic cycloalkyl group such as a cyclopentyl group or a cyclohexyl group; or a polycyclic cycloalkyl group such as a norbornyl group, a tetracyclodecanyl group, a tetracyclododecanyl group, or an adamantyl group. A monocyclic cycloalkyl group having 5 or 6 carbon atoms is more preferred, and a monocyclic cycloalkyl group having 5 carbon atoms is particularly preferred.

The acid-degradable group is preferably a cumyl ester group, an enol ester group, an acetal ester group, or a tertiary alkyl ester group. More preferably, the acid-degradable group is a tertiary alkyl ester group.

The resin (A) preferably includes a repeating unit having an acid-degradable group, and as the repeating unit having an acid-degradable group, a repeating unit represented by the following formula (AI) is preferred.

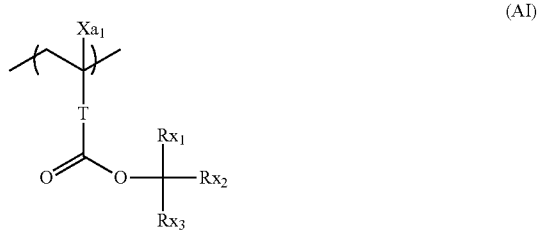

In the formula (AI), $Xa_1$ represents a hydrogen atom, a methyl group which may be substituted, or a group represented by —$CH_2$—$R_9$. $R_9$ represents a hydroxyl group or a monovalent organic group, and examples of the monovalent organic group include an alkyl group having 5 or fewer carbon atoms, and an acyl group having 5 or fewer carbon atoms. The monovalent organic group is preferably an alkyl group having 3 or fewer carbon atoms, and more preferably a methyl group. $Xa_1$ preferably represents a hydrogen atom, a methyl group, a trifluoromethyl group, or a hydroxymethyl group.

T represents a single bond or a divalent linking group.

$Rx_1$ to $Rx_3$ each independently represent an alkyl group (linear or branched), or a cycloalkyl group (monocyclic or polycyclic).

Two of $Rx_1$ to $Rx_3$ may be joined and form a cycloalkyl group (monocyclic or polycyclic).

Examples of the divalent linking group of T include an alkylene group, a —COO-Rt- group, and —O-Rt- group. In the formula, Rt represents an alkylene group or a cycloalkylene group.

T is preferably a single bond, or a —COO-Rt- group, and more preferably a single bond. Rt is preferably an alkylene group having 1 to 5 carbon atoms, and more preferably a —$CH_2$-group, a —$(CH_2)_2$— group, or a —$(CH_2)_3$— group.

The alkyl group of $Rx_1$ to $Rx_3$ is preferably an alkyl group having 1 to 4 carbon atoms, such as a methyl group, an ethyl group, an n-propyl group, an isopropyl group, an n-butyl group, an isobutyl group, or a t-butyl group.

The cycloalkyl group of $Rx_1$ to $Rx_3$ is preferably a monocyclic cycloalkyl group such as a cyclopentyl group or a cyclohexyl group; or a polycyclic cycloalkyl group such as a norbornyl group, a tetracyclodecanyl group, a tetracyclododecanyl group, or an adamantyl group.

The cycloalkyl group formed by two of $Rx_1$ to $Rx_3$ that are bonded together is preferably a monocyclic cycloalkyl group such as a cyclopentyl group or a cyclohexyl group; or a polycyclic cycloalkyl group such as a norbornyl group, a tetracyclodecanyl group, a tetracyclododecanyl group, or an adamantyl group. The monocyclic cycloalkyl group having 5 or 6 carbon atoms is particularly preferred.

An embodiment in which $Rx_1$ is a methyl group or an ethyl group, and $Rx_2$ and $Rx_3$ are bonded together to form the cycloalkyl group described above, is also preferable.

Among them, $Rx_1$ to $Rx_3$ are each independently preferably a linear or branched alkyl group, and preferably a linear or branched alkyl group having 1 to 4 carbon atoms. Examples thereof include a methyl group, an ethyl group, an n-propyl group, an isopropyl group, an n-butyl group, an isobutyl group, and a tert-butyl group.

When $Rx_1$ to $Rx_3$ are each independently a linear or branched alkyl group, $Rx_1$ is preferably a methyl group, an ethyl group, an n-propyl group, or an n-butyl group; more preferably a methyl group or an ethyl group; and particularly preferably a methyl group. $Rx_2$ is preferably a methyl group, an ethyl group, an n-propyl group, an isopropyl group, or an n-butyl group; more preferably a methyl group or an ethyl group; and particularly preferably a methyl group. $Rx_3$ is preferably a methyl group, an ethyl group, an n-propyl group, an isopropyl group, an n-butyl group, an isobutyl group, or a tert-butyl group; more preferably a methyl group, an ethyl group, an isopropyl group, or an isobutyl group; and particularly preferably a methyl group, an ethyl group, or an isopropyl group.

When T is a single bond, and at the same time, $Rx_1$ to $Rx_3$ are each independently a linear or branched alkyl group (in this case, two of $Rx_1$ to $Rx_3$ are not bonded to form a cycloalkyl group), a pattern forming method which is excellent in the roughness performance, local uniformity of the pattern dimensions, and the exposure latitude, and can further suppress a decrease in the thickness of the pattern part formed by exposure, that is, so-called film slip, can be obtained.

Each of the groups described above may have a substituent, and examples of the substituent include an alkyl group (having 1 to 4 carbons), a halogen atom, a hydroxyl group, an alkoxy group (having 1 to 4 carbon atoms), a carboxyl group, and an alkoxycarbonyl group (having 2 to 6 carbon atoms). A substituent having 8 or fewer carbon atoms is preferred. Among them, from the viewpoint of further enhancing the dissolution contrast against a developer containing an organic solvent before and after the acid degradation, a substituent which does not have any heteroatom such as an oxygen atom, a nitrogen atom, or a sulfur atom is more preferred (for example, it is more preferable that there be no alkyl group substituted with a hydroxyl group), a group composed only of hydrogen atoms and carbon atoms is even more preferred, and a linear or branched alkyl group or cycloalkyl group is particularly preferred.

Specific preferred examples of the repeating unit having an acid-degradable group will be listed below, but the present invention is not intended to be limited to these.

Among the specific examples, Rx and $Xa_1$ each represent a hydrogen atom, $CH_3$, $CF_3$, or $CH_2OH$. Rxa and Rxb each represent an alkyl group having 1 to 4 carbon atoms. Z represents a substituent, and if plural Z's are present, the plural Z's may be identical with or different from each other. p represents 0 or a positive integer. Specific examples and preferred examples of Z are the same as the specific examples and preferred examples of the substituent that may be carried by the various groups such as $Rx_1$ to $Rx_3$.

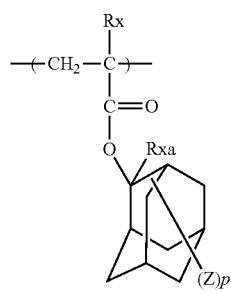

1

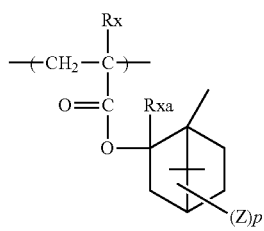

2

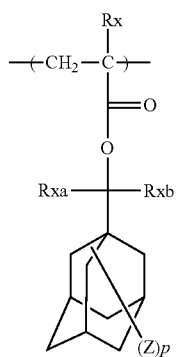

3

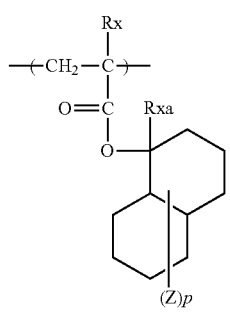

4

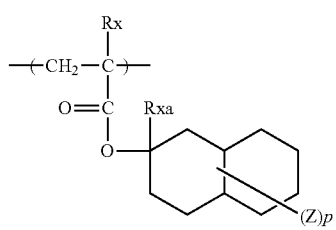

5

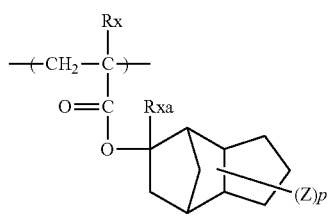

6

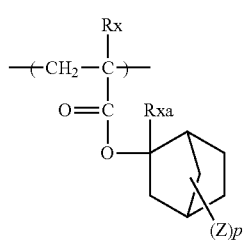

7

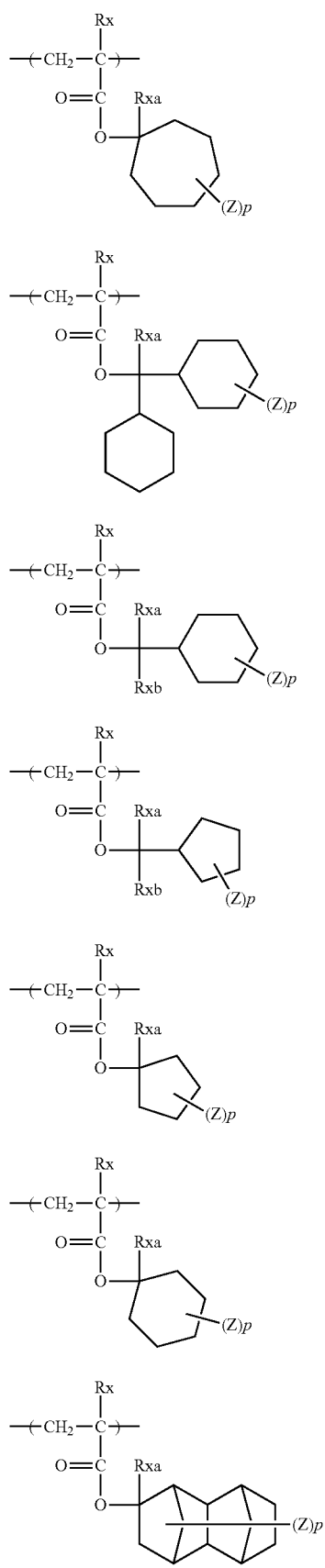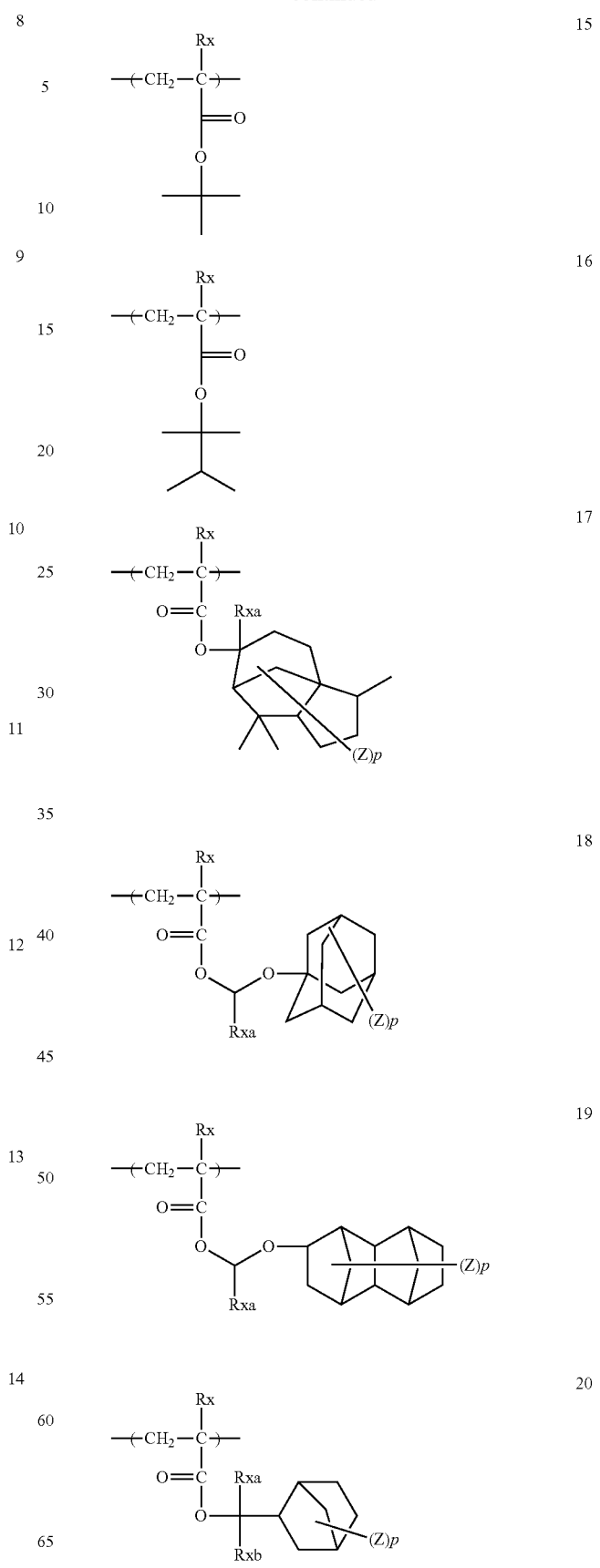

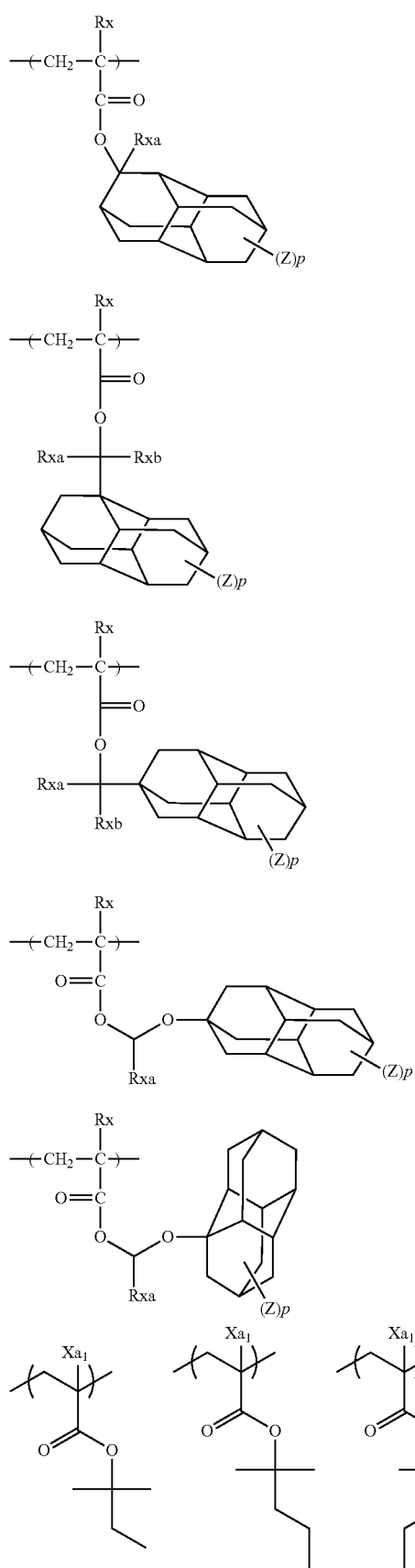
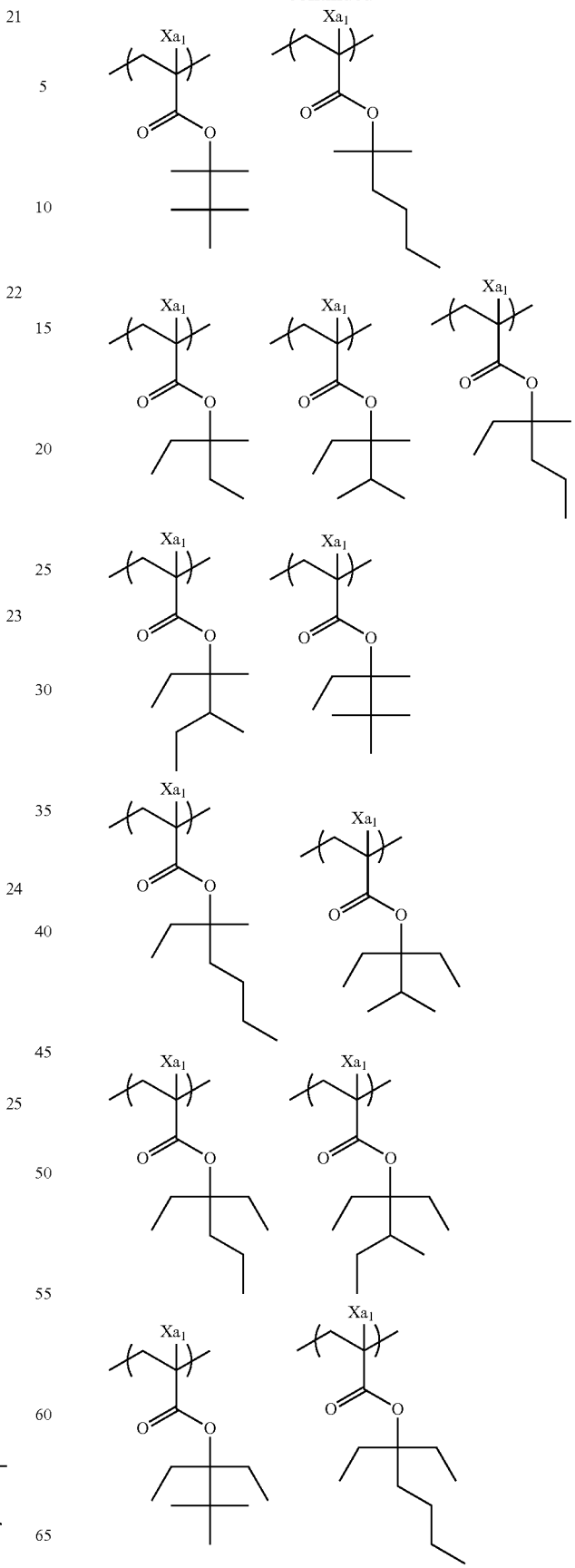

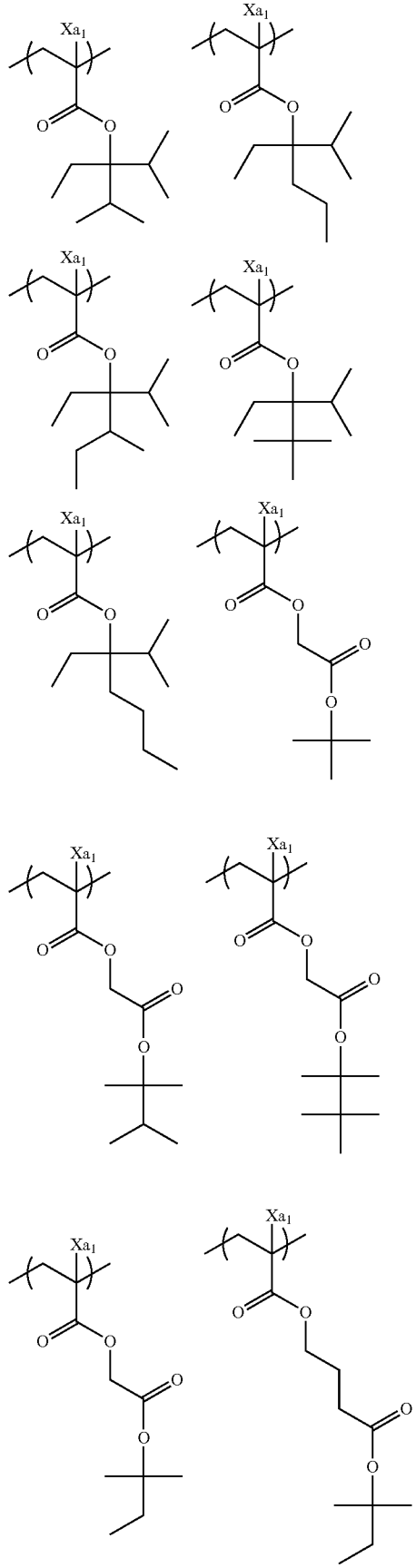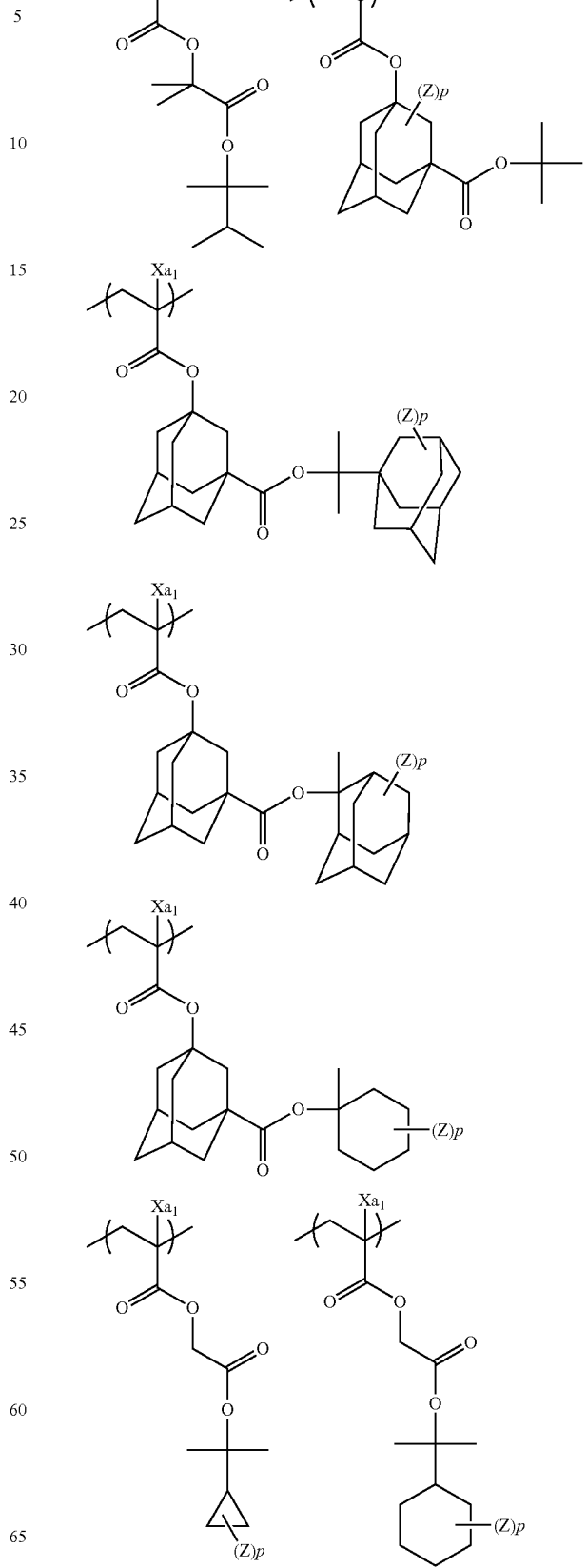

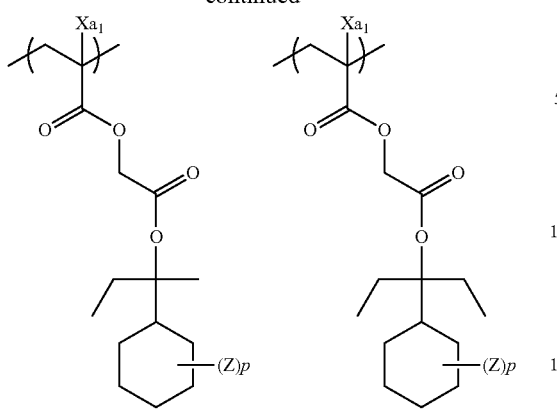
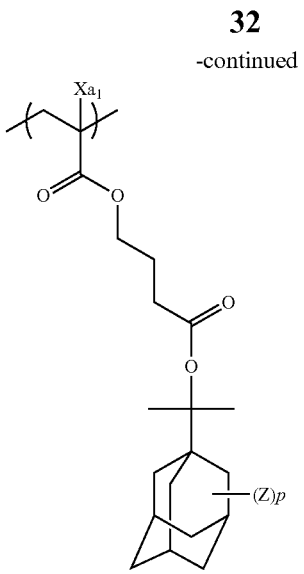
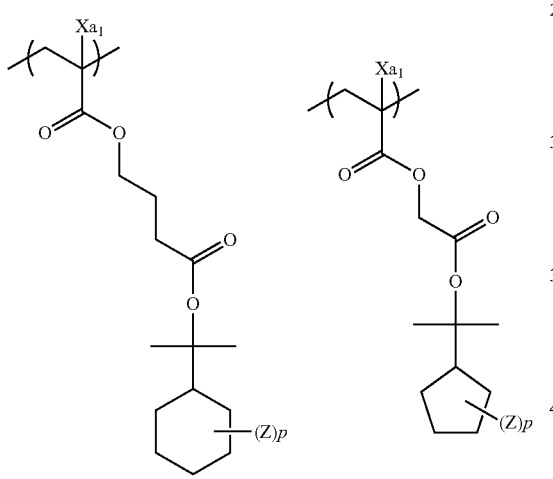
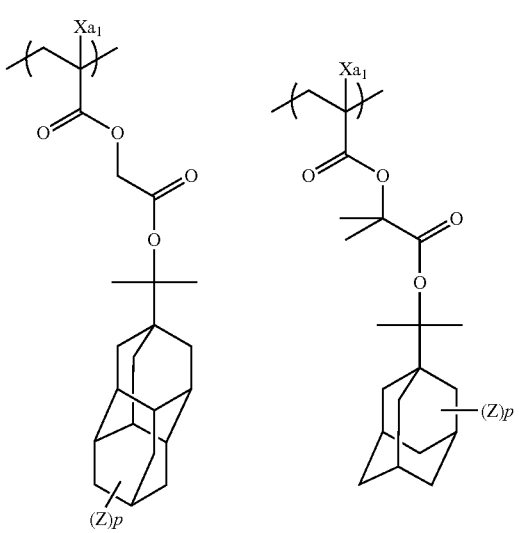
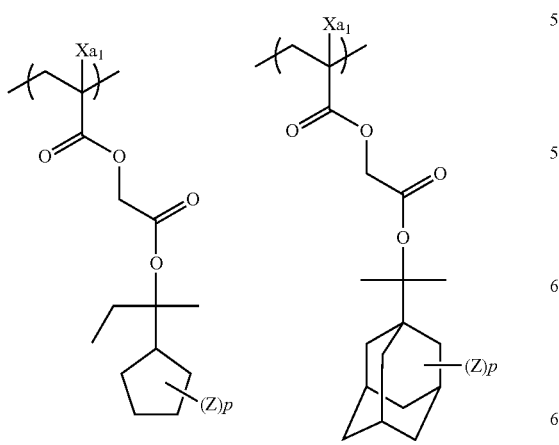
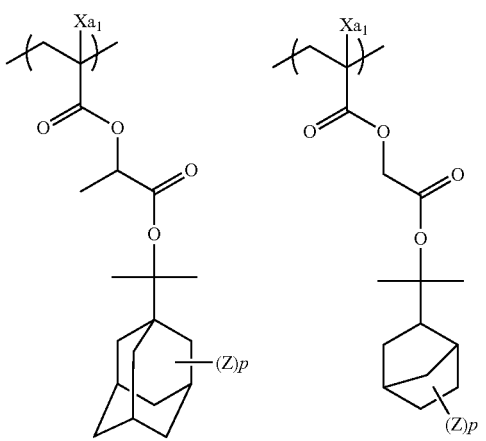

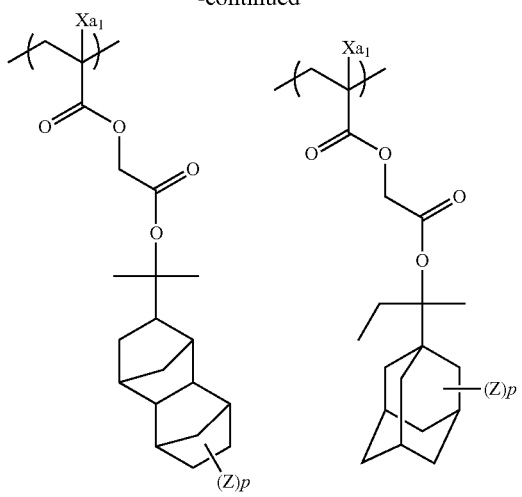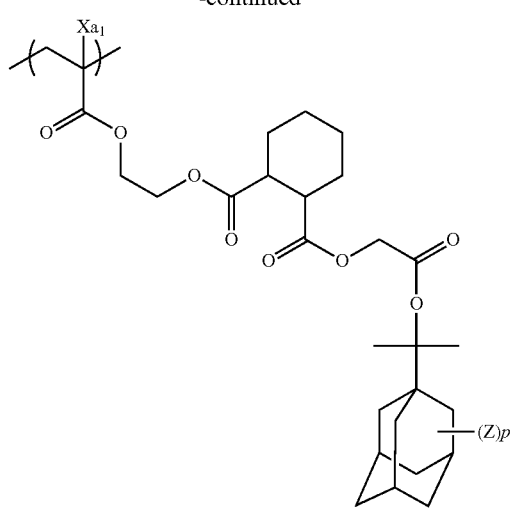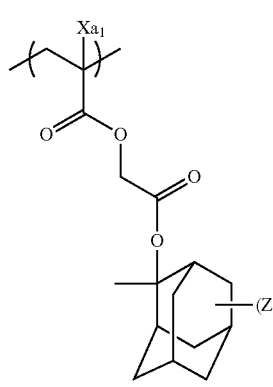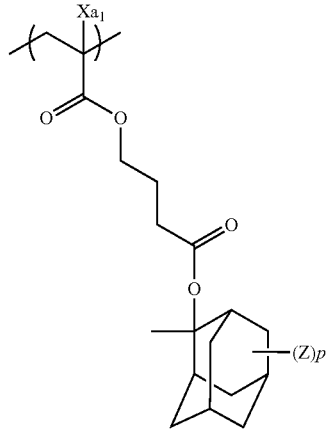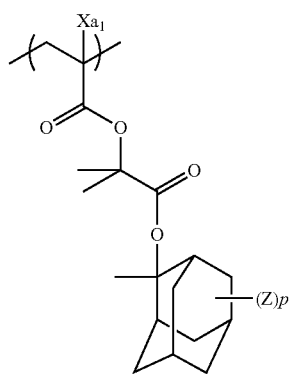

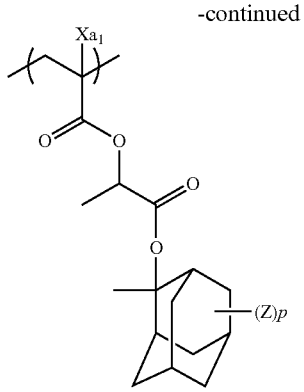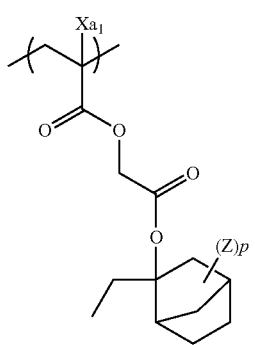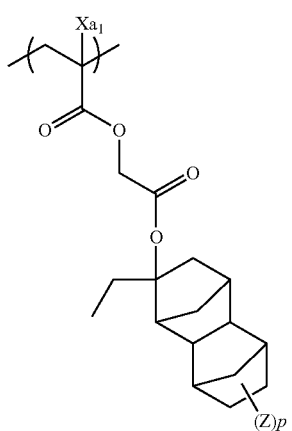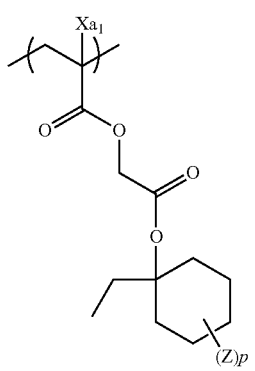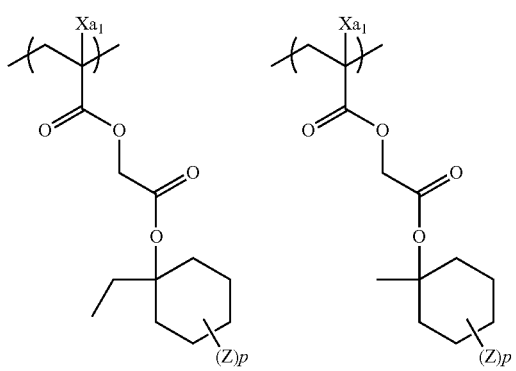

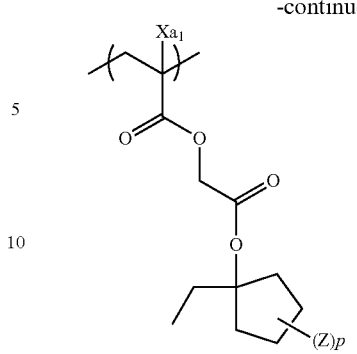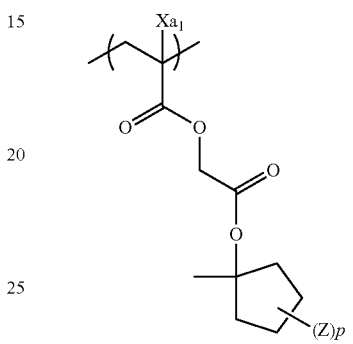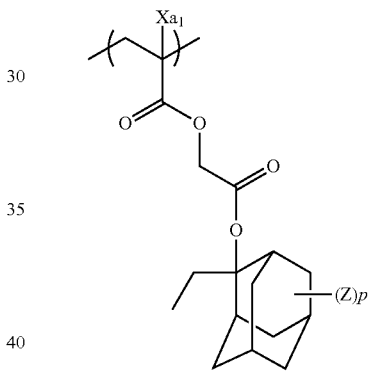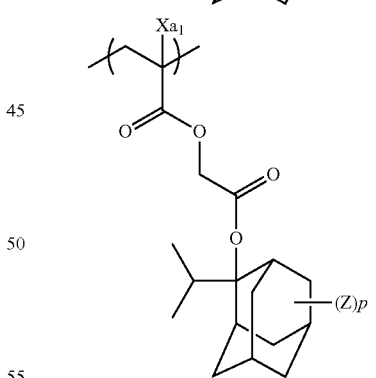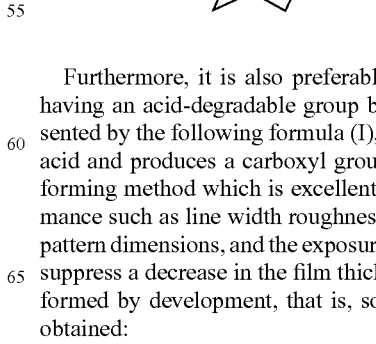

Furthermore, it is also preferable that the repeating unit having an acid-degradable group be a repeating unit represented by the following formula (I), which is degraded by an acid and produces a carboxyl group, and thereby, a pattern forming method which is excellent in the roughness performance such as line width roughness, local uniformity of the pattern dimensions, and the exposure latitude, and can further suppress a decrease in the film thickness of the pattern areas formed by development, that is, so-called film slip, can be obtained:

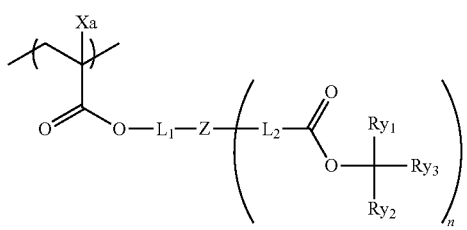

(I)

wherein Xa represents a hydrogen atom, an alkyl group, a cyano group, or a halogen atom;

$Ry_1$ to $Ry_3$ each independently represent an alkyl group or a cycloalkyl group; any two of $Ry_1$ to $Ry_3$ may be joined together to form a ring;

Z represents a linking group having a valence of (n+1) and having a polycyclic hydrocarbon structure which may have a heteroatom as a ring member;

$L_1$ and $L_2$ each independently represent a single bond or a divalent linking group;

n represents an integer of 1 to 3; and when n is 2 or 3, plural $L_2$'s, plural $Ry_1$'s, plural $Ry_1$'s, and plural $Ry_1$'s may be identical with or different from each other.

The alkyl group of Xa may have a substituent, and examples of the substituent include a hydroxyl group and a halogen atom (preferably, a fluorine atom).

The alkyl group of Xa preferably has 1 to 4 carbon atoms, and examples include a methyl group, an ethyl group, a propyl group, a hydroxymethyl group, and a trifluoromethyl group. However, the alkyl group is preferably a methyl group.

Xa is preferably a hydrogen atom or a methyl group.

The alkyl group of $Ry_1$ to $Ry_3$ may be linear or branched, and an alkyl group having 1 to 4 carbon atoms, such as a methyl group, an ethyl group, an n-propyl group, an isopropyl group, an n-butyl group, an isobutyl group, or a t-butyl group, is preferred.

The cycloalkyl group of $Ry_1$ to $Ry_3$ is preferably a monocyclic cycloalkyl group such as a cyclopentyl group or a cyclohexyl group; or a polycyclic cycloalkyl group such as a norbornyl group, a tetracyclodecanyl group, a tetracyclododecanyl group, or an adamantyl group.

The ring that is formed by two of $Ry_1$ to $Ry_3$ that are bonded together is preferably a monocyclic hydrocarbon ring such as a cyclopentane ring or a cyclohexane ring; or a polycyclic hydrocarbon ring such as a norbornane ring, a tetracyclodecane ring, a tetracyclododecane ring, or an adamantane ring. A monocyclic hydrocarbon ring having 5 or 6 carbon atoms is particularly preferred.

$Ry_1$ to $Ry_3$ are each independently preferably an alkyl group, and more preferably a linear or branched alkyl group having 1 to 4 carbon atoms. Furthermore, the total number of carbon atoms of the linear or branched alkyl group as $Ry_1$ to $Ry_3$ is preferably 5 or less.

$Ry_1$ to $Ry_3$ may further have substituents, and examples of the substituents include an alkyl group (having 1 to 4 carbon atoms), a cycloalkyl group (having 3 to 8 carbon atoms), a halogen atom, an alkoxy group (having 1 to 4 carbon atoms), a carboxyl group, and an alkoxycarbonyl group (having 2 to 6 carbon atoms). A substituent having 8 or fewer carbon atoms is preferred. Among them, from the viewpoint of further enhancing the dissolution contrast against a developer containing an organic solvent before and after the acid degradation, a substituent which does not have any heteroatom such as an oxygen atom, a nitrogen atom, or a sulfur atom is more preferred (for example, it is more preferable that there be no alkyl group substituted with a hydroxyl group), a group composed only of hydrogen atoms and carbon atoms is even more preferred, and a linear or branched alkyl group or cycloalkyl group is particularly preferred.

The linking group having a polycyclic hydrocarbon structure as Z may be a fused ring type hydrocarbon ring group or a bridged ring type hydrocarbon ring group, and examples include a group obtained by removing any (n+1) hydrogen atoms from a fused ring type hydrocarbon ring, and a group obtained by removing any (n+1) hydrogen atoms from a bridged ring type hydrocarbon ring.

Examples of the fused ring hydrocarbon ring group include a bicyclohexane ring group and a perhydronaphthalene ring group. Examples of the bridged ring type hydrocarbon ring group include bicyclic hydrocarbon ring groups such as a pinane ring group, a bornane ring group, a norpinane ring group, a norbornane ring group, and a bicyclooctane ring group, (a bicyclo[2.2.2]octane ring group, a bicyclo[3.2.1] octane ring group, or the like); tricyclic hydrocarbon ring groups such as a homobrendane ring group, an adamantane ring group, a tricyclo[5.2.1.0$^{2,6}$]decane ring group, and a tricyclo[4.3.1.1$^{2,5}$]undecane ring group; and tetracyclic hydrocarbon ring groups such as a tetracyclo[4.4.0.1$^{2,5}$.1$^{7,10}$] dodecane ring group, and a perhydro-1,4-methano-5,8-methanonaphthalene ring group. Furthermore, as the bridged ring type hydrocarbon ring group, condensed ring type hydrocarbon ring groups, for example, condensed ring groups formed by plural 5- to 8-membered cycloalkane ring groups, such as a perhydronaphthalene (decalin) ring group, a perhydroanthracene ring group, a perhydrophenanthrene ring group, a perhydroacenaphthene ring group, a perhydrofluorene ring group, a perhydroindene ring group, and a perhydrophenalene ring group, are also included.

Preferred examples of the bridged ring type hydrocarbon ring group include a norbornane ring group, an adamantane ring group, a bicyclooctane ring group, and a tricyclo [5.2.1.0$^{2,6}$]decane ring group. More preferred examples of the bridged ring type hydrocarbon ring group include a norbornane ring group and an adamantane ring group.

The linking group represented by Z having a polycyclic hydrocarbon structure may have a substituent. Examples of the substituent that can be carried by Z include substituents such as an alkyl group, a hydroxyl group, a cyano group, a keto (=O) group, an acyloxy group, —COR, —COOR, —CON(R)$_2$, —SO$_2$R, —SO$_3$R, and —SO$_2$N(R)$_2$. Here, R represents a hydrogen atom, an alkyl group, a cycloalkyl group or an aryl group.

The alkyl group, alkylcarbonyl group, acyloxy group, —COR, —COOR, —CON(R)$_2$, —SO$_2$R, —SO$_3$R, and —SO$_2$N(R)$_2$ as the substituents which may be carried by Z may further have substituents, and examples of such substituents include a halogen atom (preferably, a fluorine atom).

In the linking group having a polycyclic hydrocarbon structure represented by Z, the carbon atoms constituting the polycyclic ring (carbon atoms contributing to ring formation) may be carbonyl carbon atoms. The polycyclic ring may also have a heteroatom such as an oxygen atom or a sulfur atom as the ring member.

Examples of the linking group represented by $L_1$ and $L_2$ include —COO—, —COO—, —CONH—, —NHCO—, —CO—, —O—, —S—, —SO—, —SO$_2$—, an alkylene group (preferably, having 1 to 6 carbon atoms), a cycloalkylene group (preferably, having 3 to 10 carbon atoms), an alkenylene group (preferably having 2 to 6 carbon atoms), or a linking group combining plural groups of these, while a linking group having 12 or fewer carbon atoms in total is preferred.

$L_1$ is preferably a single bond, an alkylene group, —COO—, —COO—, —CONH—, —NHCO—, an -alkylene group-COO—, an -alkylene group-OCO—, an -alkylene group-CONH—, an -alkylene group-NHCO—, —CO—, —O—, —SO$_2$—, or an -alkylene group-O—; and more preferably a single bond, an alkylene group, an alkylene group-COO—, or an alkylene group-O—.

$L_2$ is preferably a single bond, an alkylene group, —COO—, —COO—, —CONH—, —NHCO—, a —COO-alkylene group, a —OCO-alkylene group, a —CONH-alkylene group, a —NHCO-alkylene group, —CO—, —O—, —SO$_2$—, a —O-alkylene group, or a —O-cycloalkylene group; and more preferably a single bond, an alkylene group, a —COO-alkylene group, a —O-alkylene group, or a —O-cycloalkylene group.

In the method described above, the single bond "—" at the left end means that in the case of $L_1$, the linking group is connected to the ester bond on the main chain side, while in the case of $L_2$, the linking group is connected to Z. The single bond "—" at the right end means that in the case of $L_1$, the linking group is connected to Z, while in the case of $L_2$, the linking group is bonded to the ester bond that is connected to a group represented by $(Ry_1)(Ry_2)(Ry_3)C$—.

Meanwhile $L_1$ and $L_2$ may be bonded to the same atom constituting the polycyclic ring for Z.

n is preferably 1 or 2, and more preferably 1.

Specific examples of the repeating unit represented by the formula (I) will be listed below, but the present invention is not limited to these. In the following specific examples, Xa represents a hydrogen atom, an alkyl group, a cyano group or a halogen atom.

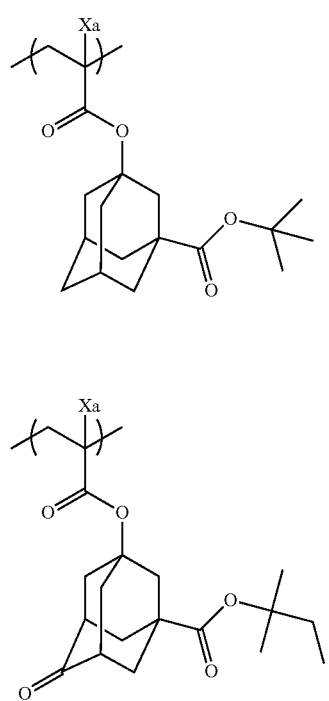

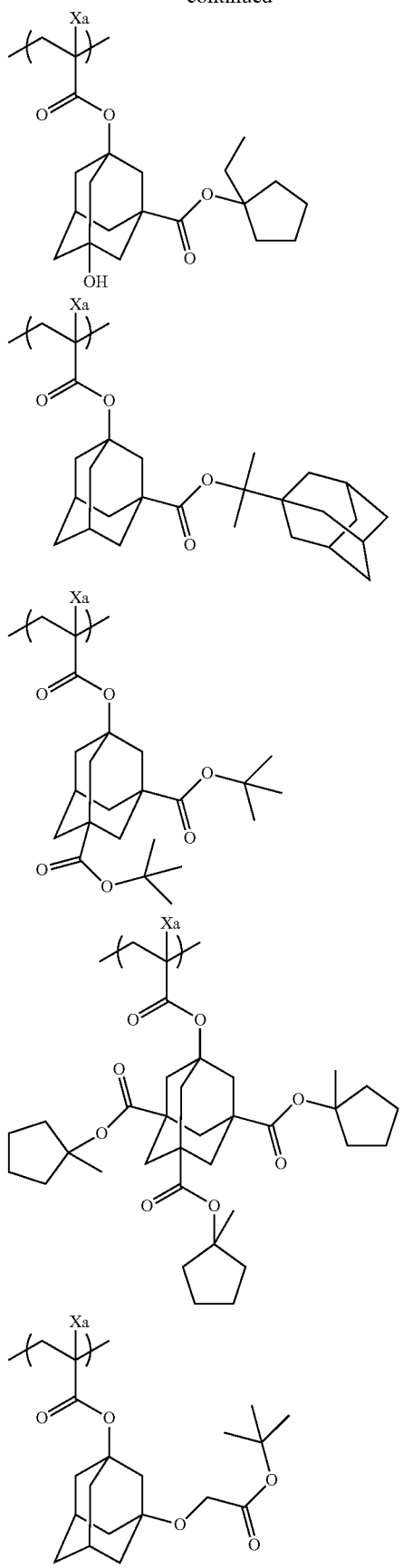

41
-continued
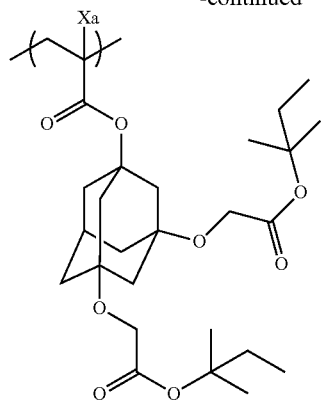
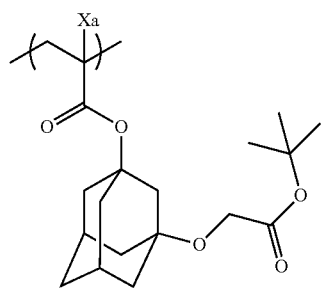
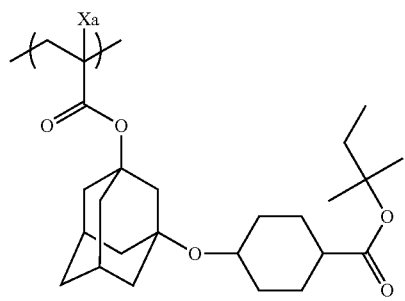
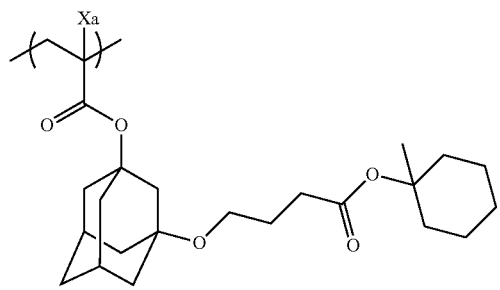
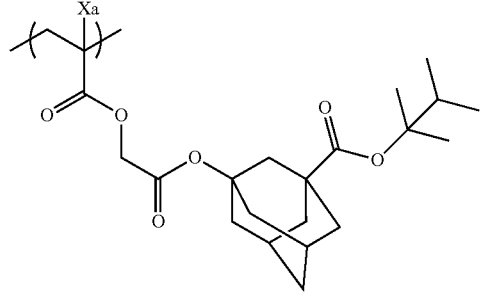
42
-continued
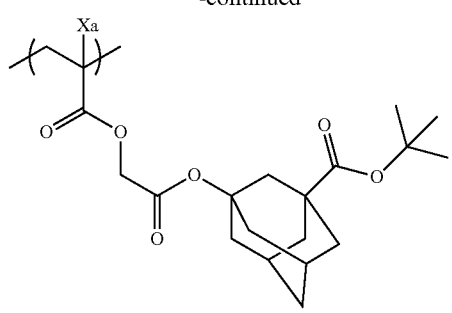
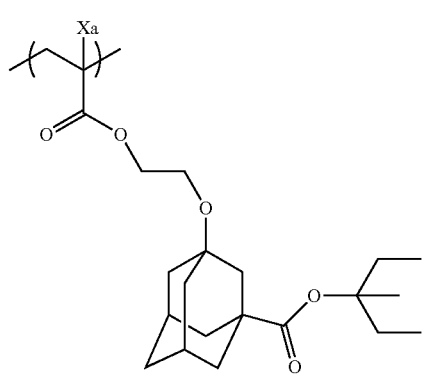
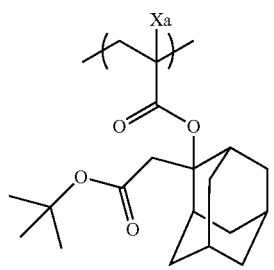
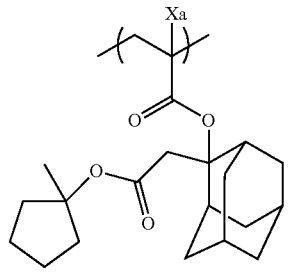
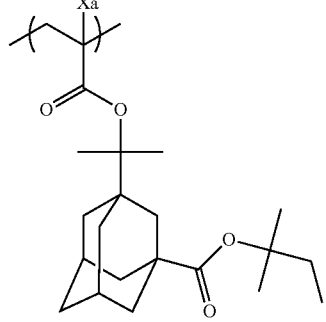

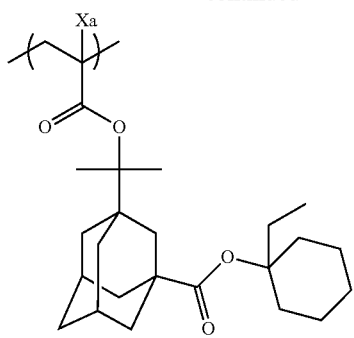
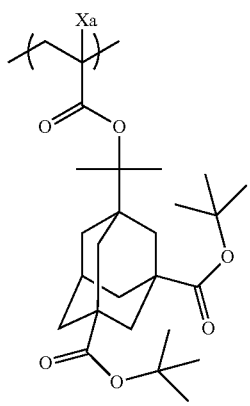
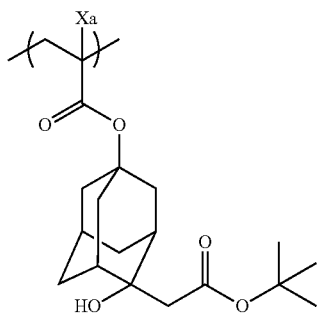
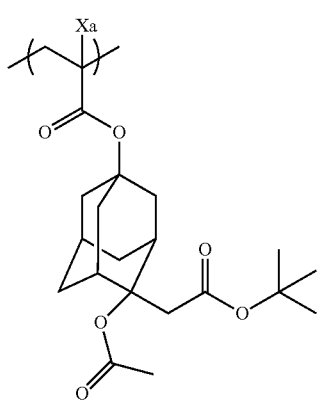
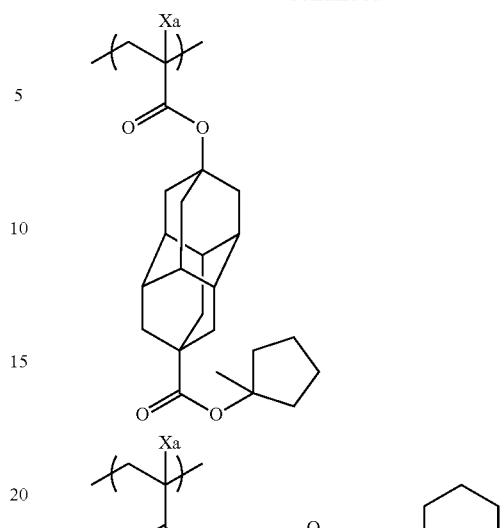

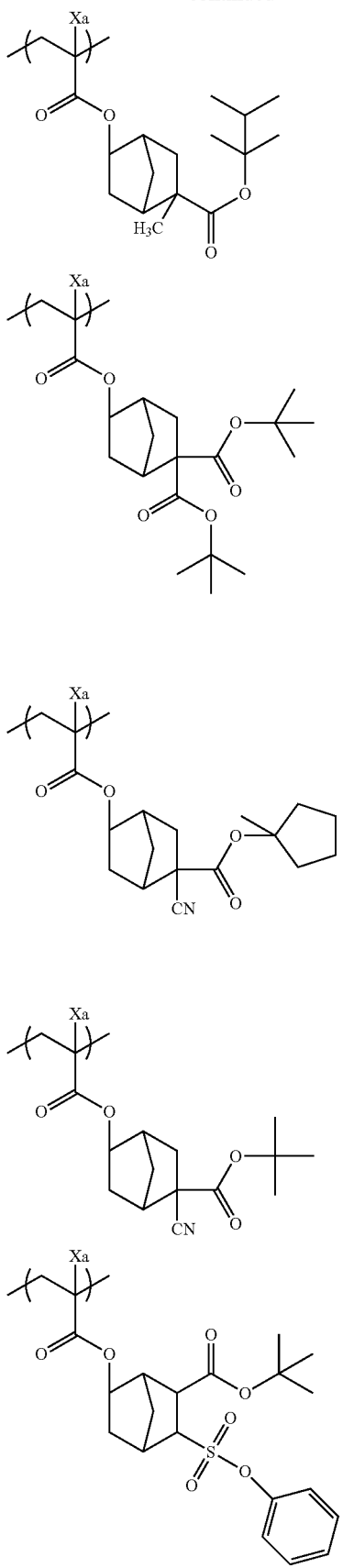
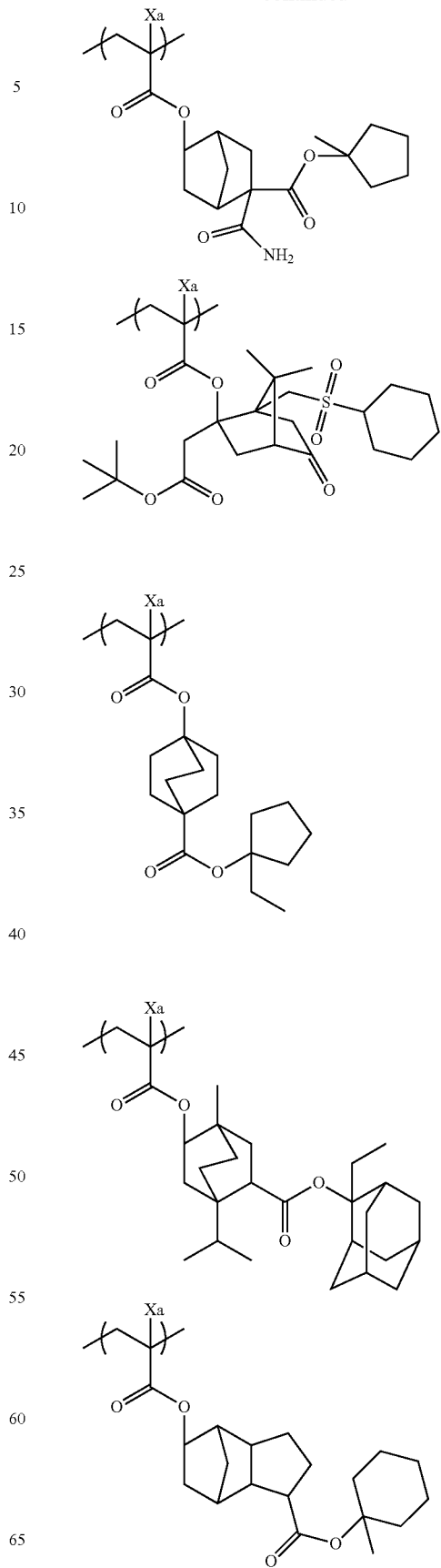

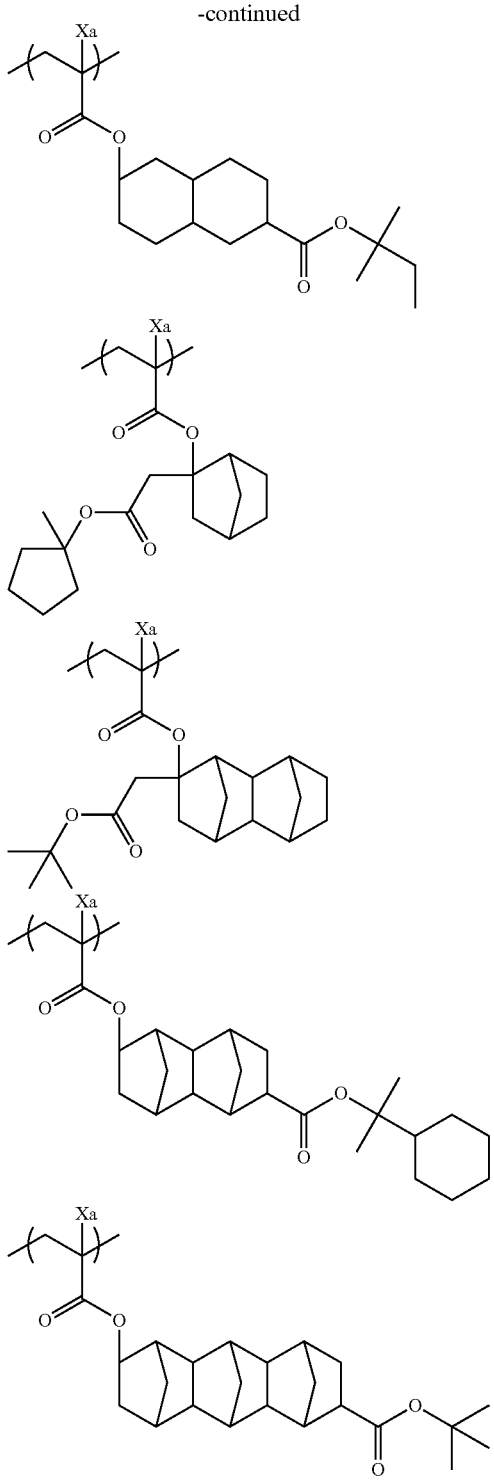

The repeating unit having an acid-degradable group of the resin (A) may be of one kind, or two or more kinds may be used in combination.

According to the present invention, it is preferable that the resin (A) have the repeating unit having an acid-degradable group described above (if the resin has plural kinds of repeating units, the sum) in which the molecular weight of the detachment product that is produced as the group which degrades under the action of an acid and produces a polar group (acid-degradable group) is degraded (when plural kinds of detachment product are produced, the weighted average value of the molecular weights based on the molar fractions), is 140 or less, in an amount of 50 mol % or more based on all of the repeating units in the resin. Thereby, in the case of forming a negative type image, since the exposed areas remain as the pattern, a decrease in the film thickness of the pattern areas can be prevented by decreasing the molecular weight of the detachment product.

According to the present invention, the "detachment product produced as the acid-degradable group is degraded" means a product that has been degraded and detached under the action of an acid, which corresponds to the group that is degraded and detached under the action of an acid. For example, in the case of a repeating unit (α) that will be described below (the first repeating unit from the left in the examples described below), the detachment product refers to the alkene ($H_2C=C(CH_3)_2$) that is produced as the t-butyl moiety is degraded.

According to the present invention, the molecular weight of the detachment product produced as the acid-degradable group is degraded (when plural kinds of detachment products are produced, the molar average value) is more preferably 100 or less, from the viewpoint of preventing a decrease in the thickness of the pattern areas.

Furthermore, there are no particular limitations on the lower limit of the molecular weight of the detachment product (when plural kinds of detachment products are produced, the average value) produced as the acid-degradable group is degraded, but from the viewpoint of allowing the acid-degradable group to exhibit its function, the lower limit of the molecular weight is preferably 45 or greater, and more preferably 55 or greater.

According to the present invention, from the viewpoint of more reliably maintaining the thickness of the pattern areas as the exposed areas, it is more preferable that the resin (A) have the repeating unit (in the case of containing plural kinds of repeating units, the sum) having an acid-degradable group in which the molecular weight of the detachment product produced as the acid-degradable group is degraded is 140 or less, in an amount 60 mol % or greater, even more preferably 65 mol % or greater, and still more preferably 70 mol % or greater, based on the total content of the repeating units in the resin. Furthermore, there are no particular limitations on the upper limit, but the upper limit of the content is preferably 90 mol % or less, and more preferably 85 mol % or less.

Specific examples of the repeating unit having an acid-degradable group in which the molecular weight of the detachment product produced as the acid-degradable group is degraded is equal to or less than 140 will be listed below, but the present invention is not limited to these.

Among the following specific examples, $Xa_1$ represents a hydrogen atom, $CH_3$, $CF_3$ or $CH_2OH$.

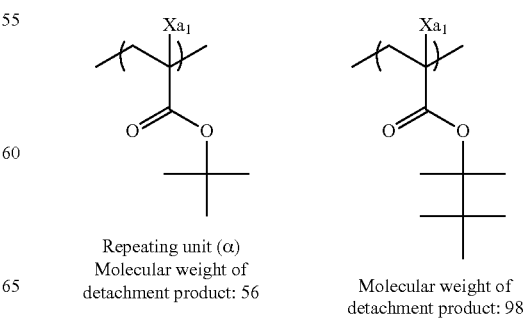

Repeating unit (α)
Molecular weight of detachment product: 56

Molecular weight of detachment product: 98

-continued

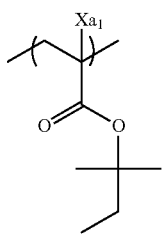
Molecular weight of detachment product: 70

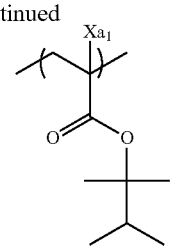
Molecular weight of detachment product: 84

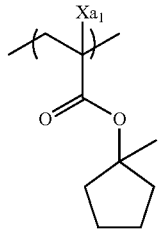
Molecular weight of detachment product: 82

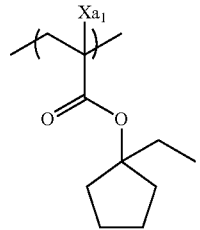
Molecular weight of detachment product: 96

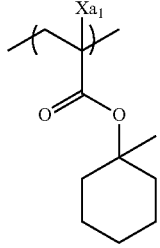
Molecular weight of detachment product: 96

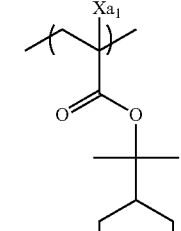
Molecular weight of detachment product: 124

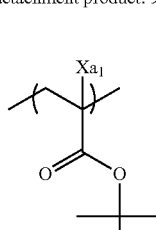
Molecular weight of detachment product: 138

The content in total of the repeating units having an acid-degradable group is preferably 20 mol % or greater, more preferably 30 mol % or greater, even more preferably 45 mol % or greater, and particularly preferably 50 mol % or greater, based on the total content of the repeating units in the resin (A).

Furthermore, the content in total of the repeating units having an acid-degradable group is preferably 90 mol % or less, and more preferably 85 mol % or less, based on the total content of the repeating units in the resin (A).

When the repeating unit having an acid-degradable group is the repeating unit represented by the formula (AI), and at the same time, $Rx_1$ to $Rx_3$ in particular are each independently a linear or branched alkyl group, the content of the repeating unit represented by the formula (AI) is preferably 45 mol % or greater, more preferably 50 mol % or greater, and particularly preferably 55 mol % or greater, based on the total content of the repeating units of the resin (A). Furthermore, from the viewpoint of forming a satisfactory pattern, the upper limit is preferably 90 mol % or less, and more preferably 85 mol % or less. Thereby, a pattern forming method which is excellent in the roughness performance, local uniformity of the pattern dimensions, and the exposure latitude, and can further suppress a decrease in the thickness of the pattern areas formed by the exposure, that is, so-called film slip, can be obtained.

The resin (A) may further include a repeating unit having a lactone structure.

As the lactone structure, any compound can be used as long as it has a lactone structure, but the lactone structure is preferably a 5- to 7-membered cyclic lactone structure, and more preferably a structure in which another cyclic structure is fused with a 5- to 7-membered cyclic lactone structure in the form of forming a bicyclo structure or a spiro structure. A repeating unit having a lactone structure represented by any one of the following formulae (LC1-1) to (LC1-17) is more preferred. Furthermore, the lactone structure may be directly bonded to the main chain. Preferred lactone structures include (LC1-1), (LC1-4), (LC1-5), (LC1-6), (LC1-13), (LC1-14), and (LC1-17), and a particularly preferred lactone structure is (LC1-4). When these specific lactone structures are used, the line width roughness (LWR) and the development defects are ameliorated.

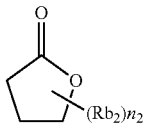
LC1-1

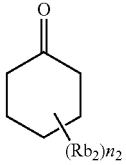
LC1-2

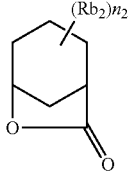
LC1-3

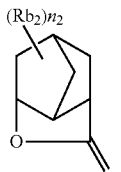
LC1-4

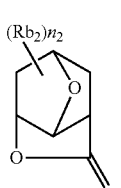
LC1-5

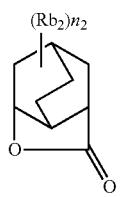
LC1-6

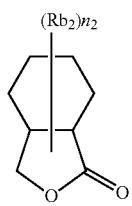
LC1-7

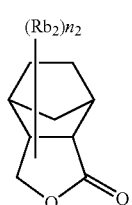
LC1-8

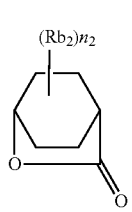
LC1-9

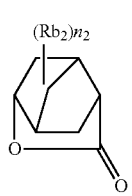
LC1-10

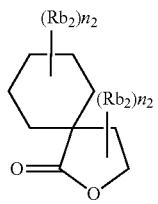
LC1-11

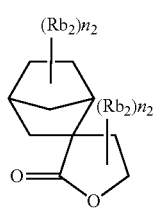
LC1-12

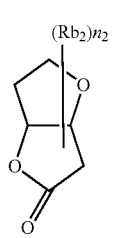
LC1-13

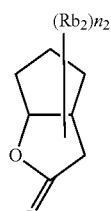
LC1-14

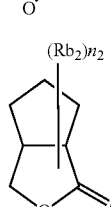
LC1-15

LC1-16

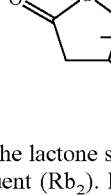
LC1-17

The lactone structure moiety may or may not have a substituent ($Rb_2$). Preferred examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, a cyano group, and an acid-degradable group. More preferred examples include an alkyl group having 1 to 4 carbon atoms, a cyano group, and an acid-degradable group. $n_2$ represents an integer of 0 to 4. When $n_2$ is 2 or greater, the plural substituents ($Rb_2$) may be identical with or different from each other. Also, plural substituents ($Rb_2$) may be joined together to form a ring.

The repeating unit having a lactone group usually has optical isomers, but it is acceptable to use any of the optical isomers. Furthermore, one kind of optical isomer may be used alone, or plural optical isomers may be used as a mixture. When one kind of optical isomer is mainly used, an optical isomer having an enantiomeric excess (ee) of 90% or higher is preferred, and an optical isomer having an ee of 95% or higher is more preferred.

The repeating unit having a lactone structure is preferably a repeating unit represented by the following formula (AII).

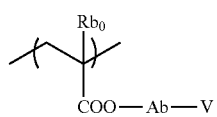
(AII)

In the formula (AII),
$Rb_0$ represents a hydrogen atom, a halogen atom, or an alkyl group (preferably having 1 to 4 carbon atoms) which may have a substituent.

Preferred examples of the substituent which may be carried by the alkyl group of $Rb_0$ include a hydroxyl group and a halogen atom. Examples of the halogen atom of $Rb_0$ include a fluorine atom, a chlorine atom, a bromine atom, and an iodine atom. $Rb_0$ is preferably a hydrogen atom, a methyl group, a hydroxymethyl group, or a trifluoromethyl group, and particularly preferably a hydrogen atom or a methyl group.

Ab represents a single bond, an alkylene group, a divalent linking group having a monocyclic or polycyclic cycloalkyl structure, an ether bond, an ester bond, a carbonyl group, or a divalent linking group combining these. Ab is preferably a single bond, or a divalent linking group represented by -$Ab_1$-$CO_2$—.

$Ab_1$ represents a linear or branched alkylene group, or a monocyclic or polycyclic cycloalkylene group, and is preferably a methylene group, an ethylene group, a cyclohexylene group, an adamantylene group, or a norbornylene group.

V represents a group having a lactone structure. Specifically, for example, V represents a group having a structure represented by any one of the formulae (LC1-1) to (LC1-17) described above.

When the resin (A) includes a repeating unit having a lactone structure, the content of the repeating unit having a lactone structure is preferably in the range of 0.5 mol % to 80 mol %, more preferably in the range of 1 mol % to 65 mol %, even more preferably in the range of 5 mol % to 60 mol %, particularly preferably in the range of 3 mol % to 50 mol %, and most preferably 10 mol % to 50 mol %, based on the total content of the repeating units of the resin (A).

One kind of the repeating unit having a lactone structure may be used, or two or more kinds may be used in combination.

Specific examples of the repeating unit having a lactone structure will be listed below, but the present invention is not limited to these. In the formulae, Rx represents H, $CH_3$, $CH_7OH$, or $CF_3$.

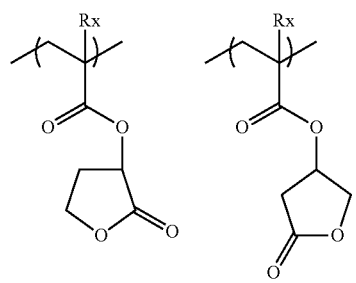

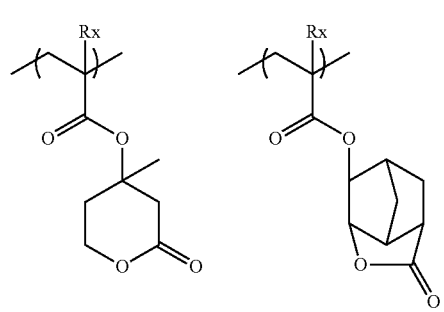

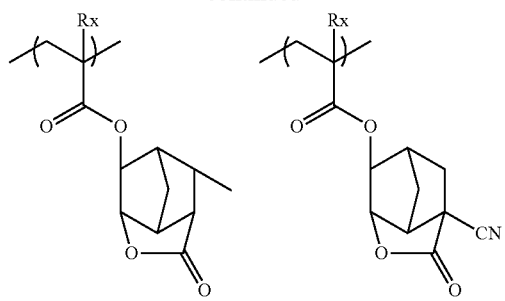

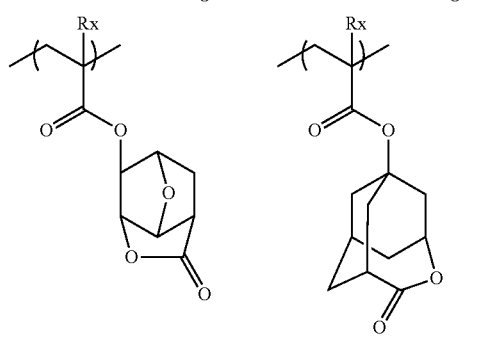

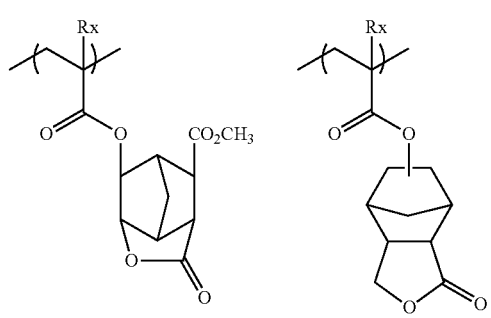

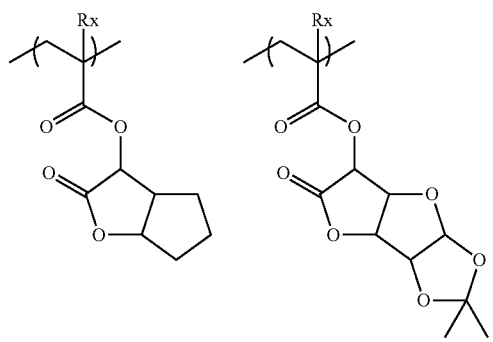

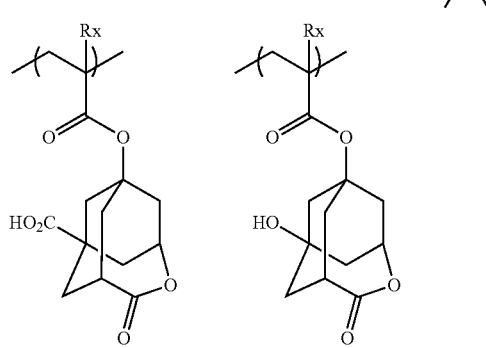

55
-continued
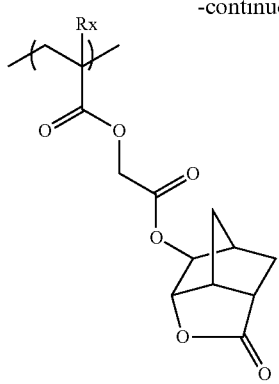
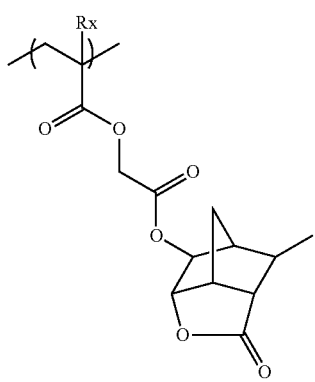
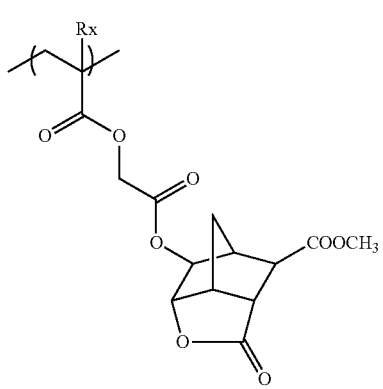
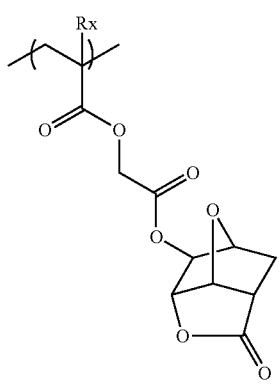
56
-continued
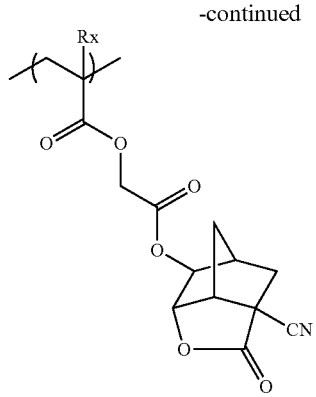
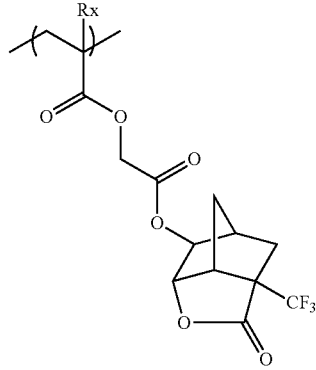
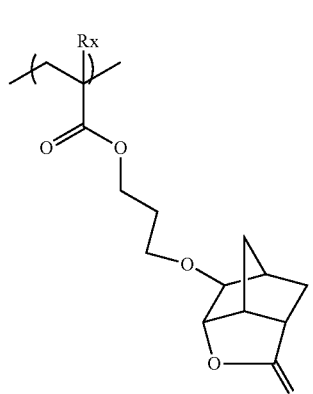
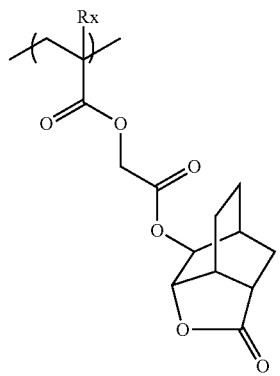

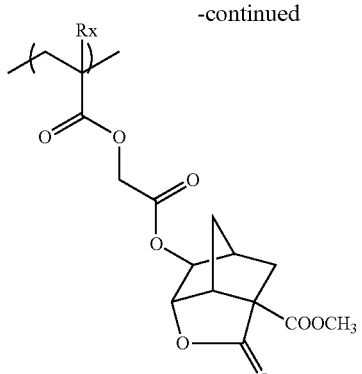

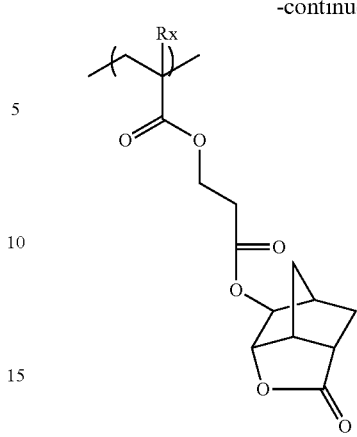

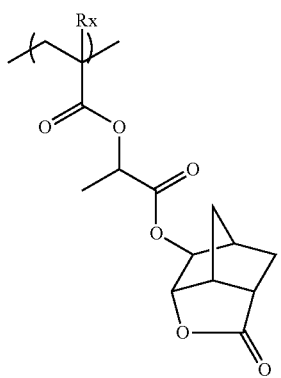

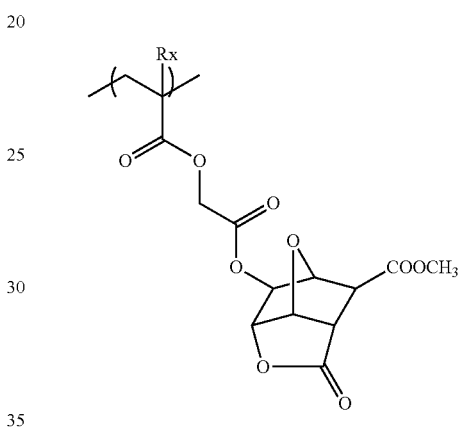

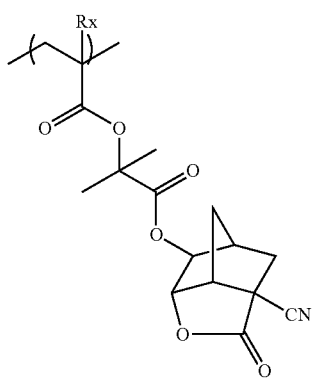

The resin (A) preferably has a repeating unit having a hydroxyl group or a cyano group. Thereby, the substrate adhesiveness and the affinity to developers are enhanced. The repeating unit having a hydroxyl group or a cyano group is preferably a repeating unit having an alicyclic hydrocarbon structure substituted with a hydroxyl group or a cyano group, and preferably does not have an acid-degradable group.

Furthermore, the repeating unit having an alicyclic hydrocarbon structure substituted with a hydroxyl group or a cyano group is preferably different from the repeating unit represented by the above formula (AII).

In the alicyclic hydrocarbon structure substituted with a hydroxyl group or a cyano group, the alicyclic hydrocarbon structure is preferably an adamantyl group, a diadamantyl group, or a norbornane group. Preferred examples of the alicyclic hydrocarbon structure substituted with a hydroxyl group or a cyano group include the partial structures represented by the following formulae (VIIa) to (VIId).

(VIIa)

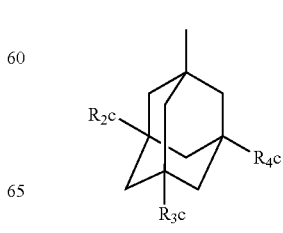

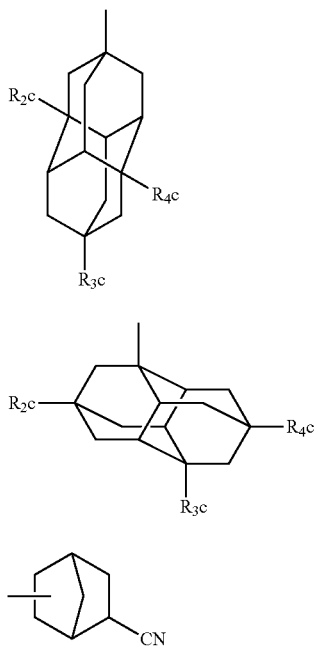

(VIIb)

(VIIc)

(VIId)

In the formulae (VIIa) to (VIIc),

R$_2$c to R$_4$c each independently represent a hydrogen atom, a hydroxyl group, or a cyano group. However, at least one of R$_2$c to R$_4$c represents a hydroxyl group or a cyano group. Preferably, one or two of R$_2$c to R$_4$c are hydroxyl groups, while the other is a hydrogen atom. In the formula (VIIa), more preferably, two of R$_2$c to R$_4$c are hydroxyl groups, while the other is a hydrogen atom.

Examples of the repeating unit having a partial structure represented by any one of the formulae (VIIa) to (VIId) include repeating units represented by the following formulae (AIIa) to (AIId).

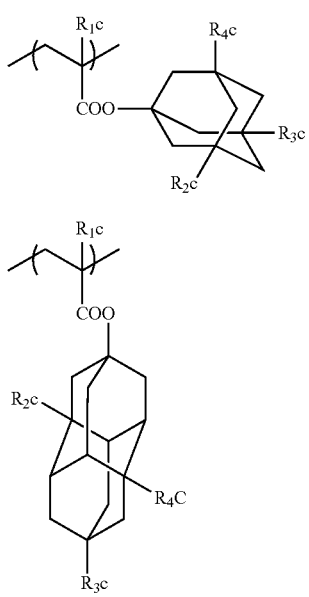

(AIIa)

(AIIb)

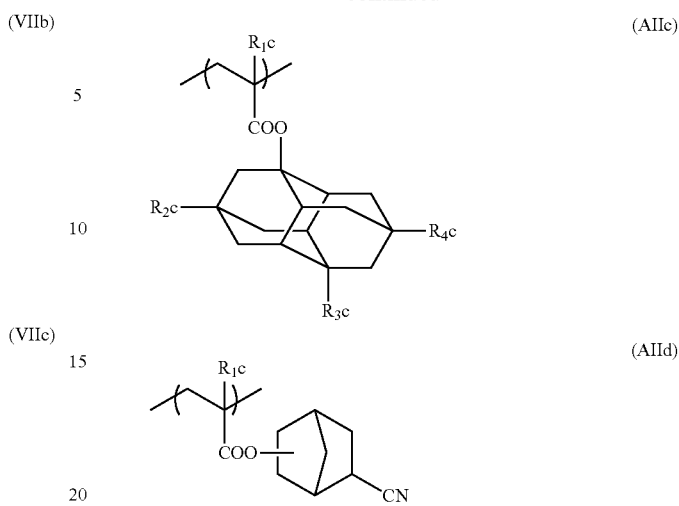

(AIIc)

(AIId)

In the formulae (AIIa) to (AIId),

R$_1$c represents a hydrogen atom, a methyl group, a trifluoromethyl group, or a hydroxymethyl group.

R$_2$c to R$_4$c have the same meanings as R$_2$c to R$_4$c defined in the formulae (VIIa) to (VIIc).

The resin (A) may or may not include a repeating unit having a hydroxyl group or a cyano group, but when the resin (A) includes a repeating unit having a hydroxyl group or a cyano group, the content of the repeating unit having a hydroxyl group or a cyano group is preferably 1 mol % to 50 mol %, more preferably 1 mol % to 45 mol %, and even more preferably 3 mol % to 45 mol %, based on the total content of the repeating units in the resin (A).

Specific examples of the repeating unit having a hydroxyl group or a cyano group will be listed below, but the present invention is not limited to these.

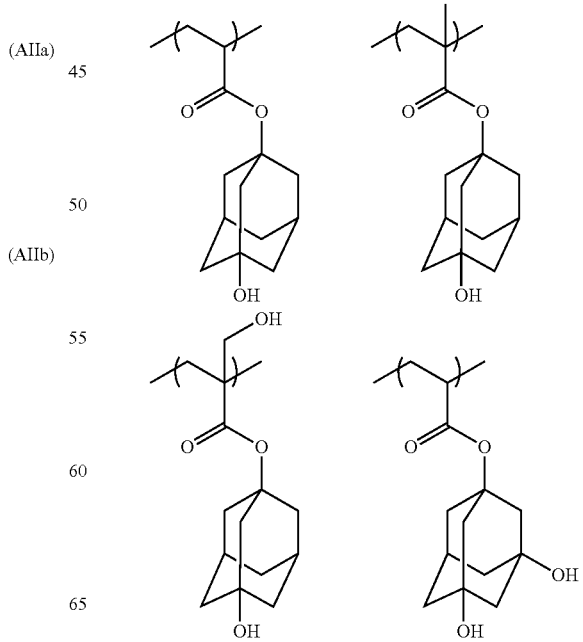

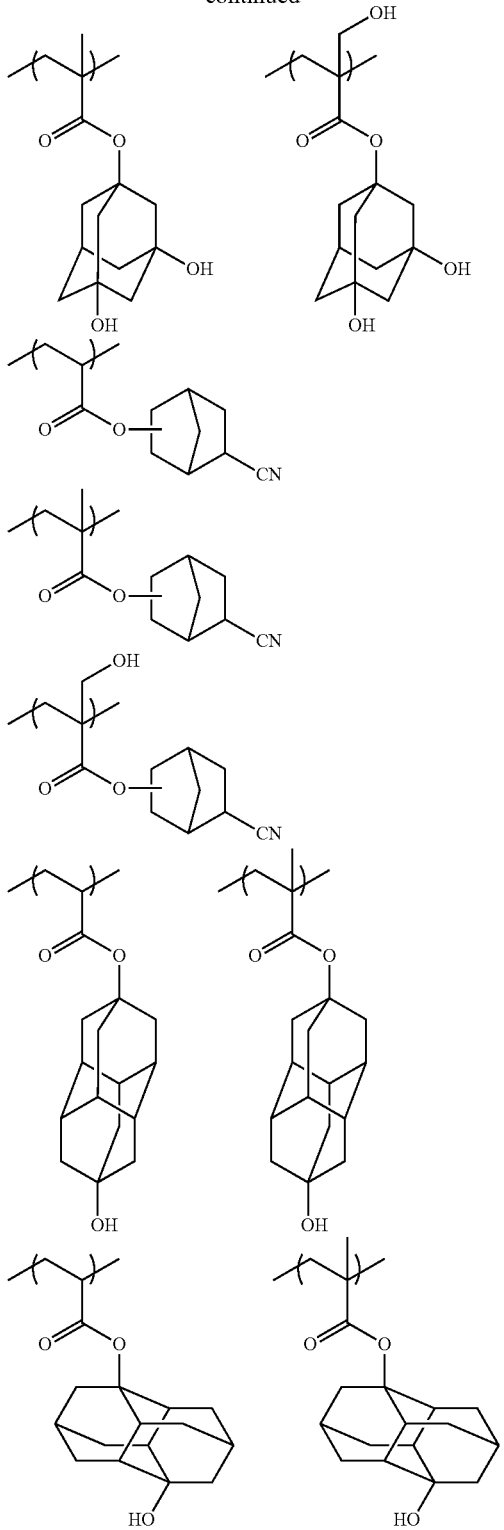

The resin (A) may have a repeating unit having an acid group. Examples of the acid group include a carboxyl group, a sulfonamide group, a sulfonylimide group, a bissulfonylimide group, and an aliphatic alcohol substituted with an electron-withdrawing group at the α-position (for example, a hexafluoroisopropanol group), and it is more preferable that the resin (A) have a repeating unit having a carboxyl group.

When the resin (A) includes a repeating unit having an acid group, the resolution for the use in contact hole applications increases. The repeating unit having an acid group is preferably any of a repeating unit in which an acid group is directly bonded to the main chain of the resin, such as a repeating unit based on acrylic acid or methacrylic acid; a repeating unit in which an acid group is bonded to the main chain of the resin through a linking group; and a repeating unit in which an acid group is introduced into the ends of the polymer chain using a polymerization initiator or chain transfer agent having an acid group at the time of polymerization. The linking group may have a monocyclic or polycyclic hydrocarbon structure. A particularly preferred repeating unit is a repeating unit based on acrylic acid or methacrylic acid.

The resin (A) may or may not include a repeating unit having an acid group, but when the resin includes the repeating unit, the content of the repeating unit having an acid group is preferably 10 mol % or less, and more preferably 5 mol % or less, based on the total content of the repeating units in the resin (A). When the resin (A) includes a repeating unit having an acid group, the content of the repeating unit having an acid group in the resin (A) is usually 1 mol % or greater.

Specific examples of the repeating unit having an acid group will be listed below, but the present invention is not limited to these.

In the specific examples, Rx represents H, CH$_3$, CH$_2$OH, or CF$_3$.

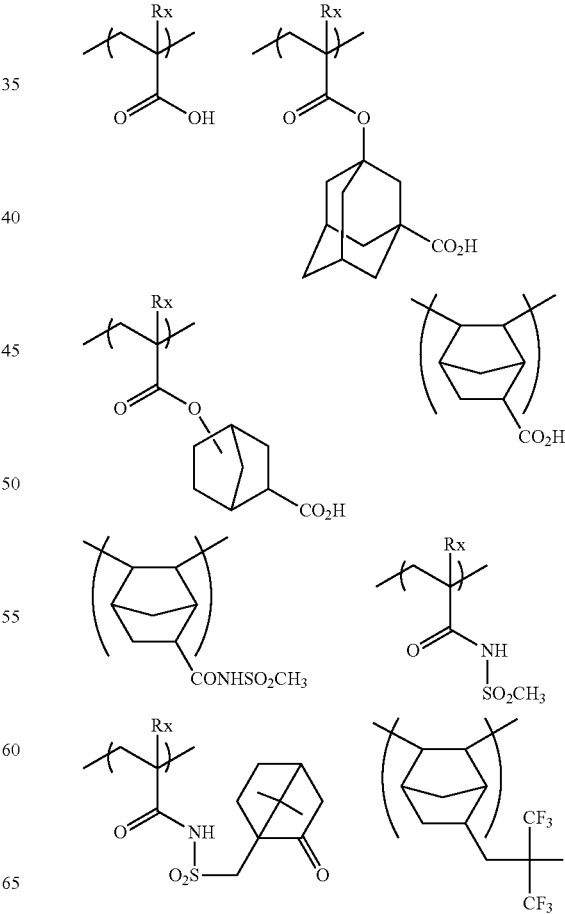

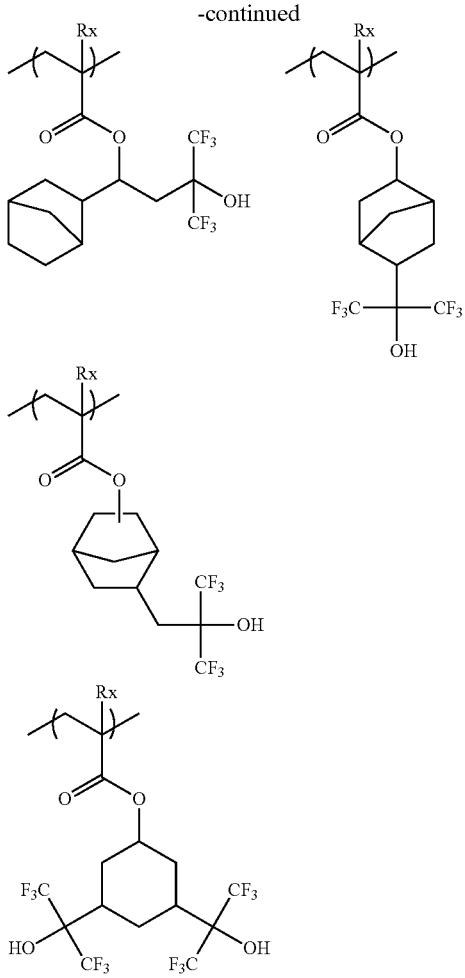

The resin (A) of the present invention can further have a repeating unit which has an alicyclic hydrocarbon structure that does not have a polar group (for example, the acid group, hydroxyl group or cyano group described above), and which does not exhibit acid degradability. Thereby, at the time of immersion exposure, the elution of low molecular weight components from the resist film to the immersion liquid can be reduced, and also, solubility of the resin at the time of development using a developer containing an organic solvent can be appropriately adjusted. Such a repeating unit may be a repeating unit represented by formula (IV):

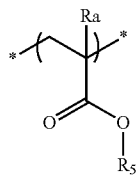

(IV)

In the formula (IV), $R_5$ represents a hydrocarbon group which has at least one cyclic structure and does not have a polar group.

Ra represents a hydrogen atom, an alkyl group, or a —$CH_2$—O—$Ra_2$ group. In the formula, $Ra_2$ represents a hydrogen atom, an alkyl group, or an acyl group. Ra is preferably a hydrogen atom, a methyl group, a hydroxymethyl group, or a trifluoromethyl group, and particularly preferably a hydrogen atom or a methyl group.

The cyclic structure carried by $R_5$ includes a monocyclic hydrocarbon group and a polycyclic hydrocarbon group. Examples of the monocyclic hydrocarbon group include cycloalkyl groups having 3 to 12 carbon atoms, such as a cyclopentyl group, a cyclohexyl group, a cycloheptyl group, and a cyclooctyl group; and cycloalkenyl groups having 3 to 12 carbon atoms, such as a cyclohexenyl group. The monocyclic hydrocarbon group is preferably a monocyclic hydrocarbon group having 3 to 7 carbon atoms, and more preferably a cyclopentyl group or a cyclohexyl group.

The polycyclic hydrocarbon group includes a fused ring type hydrocarbon group and a bridged ring type hydrocarbon group. Examples of the fused ring type hydrocarbon group include a bicyclohexyl group, and a perhydronaphthalenyl group. Examples of the bridged ring type hydrocarbon ring include bicyclic hydrocarbon rings such as pinane, bornane, norpinane, and bicyclooctane rings (a bicyclo[2.2.2]octane ring, a bicyclo[3.2.1]octane ring, and the like); tricyclic hydrocarbon rings such as homobrendane, adamantane, tricyclo[5.2.1.0$^{2,6}$]decane, and a tricyclo[4.3.1.1$^{2,5}$]undecane ring; and tetracyclic hydrocarbons such as tetracyclo [4.4.0.1$^{2,5}$.1$^{7,10}$]dodecane, and a perhydro-1,4-methano-5,8-methanonaphthalene ring. Furthermore, as the bridged ring type hydrocarbon ring group, fused ring type hydrocarbon ring groups, for example, condensed ring groups formed by plural 5- to 8-membered cycloalkane ring groups, such as a perhydronaphthalene (decalin) ring group, a perhydroanthracene ring group, a perhydrophenanthrene ring group, a perhydroacenaphthene ring group, a perhydrofluorene ring group, a perhydroindene ring group, and a perhydrophenalene ring group, are also included.

Preferred examples of the bridged ring type hydrocarbon ring include a norbornyl group, an adamantyl group, a bicyclooctanyl group, and a tricyclo[5.2.1.0$^{2,6}$]decanyl group. More preferred examples of the bridged ring type hydrocarbon ring include a norbornyl group and an adamantyl group.

These alicyclic hydrocarbon groups may have substituents, and preferred substituents include a halogen atom, an alkyl group, a hydroxyl group having its hydrogen atom substituted, and an amino group having its hydrogen atoms substituted. Preferred examples of the halogen atom include bromine, chlorine and fluorine atoms, and preferred examples of the alkyl group include methyl, ethyl, butyl, and t-butyl groups. The alkyl group may further have a substituent, and examples of the substituent that may be further carried include a halogen atom, an alkyl group, a hydroxyl group having its hydrogen atom substituted, and an amino group having its hydrogen atoms substituted.

Examples of the substituent for hydrogen atoms include an alkyl group, a cycloalkyl group, an aralkyl group, a substituted methyl group, a substituted ethyl group, an alkoxycarbonyl group, and an aralkyloxycarbonyl group. Preferred examples of the alkyl group include an alkyl group having 1 to 4 carbon atoms, and preferred examples of the substituted methyl group include methoxymethyl, methoxythiomethyl, benzyloxymethyl, t-butoxymethyl, and 2-methoxyethoxymethyl groups. Preferred examples of the substituted ethyl group include 1-ethoxyethyl and 1-methyl-1-methoxyethyl groups. Preferred examples of the acyl group include aliphatic acyl groups having 1 to 6 carbon atoms, such as formyl, acetyl, propionyl, butyryl, isobutyryl, valeryl, and pivaloyl groups, and examples of the alkoxycarbonyl group include alkoxycarbonyl groups having 1 to 4 carbon atoms.

The resin (A) may or may not include a repeating unit which has an alicyclic hydrocarbon structure that does not have a polar group, and which does not exhibit acid degradability, but when the resin includes the repeating unit, the content of this repeating unit is preferably 1 mol % to 40 mol %, and more preferably 1 mol % to 20 mol %, based on the total content of the repeating units in the resin (A).

Specific examples of the repeating unit which has an alicyclic hydrocarbon structure that does not have a polar group, and which does not exhibit acid degradability will be listed below, but the present invention is not limited to these. In the formulae, Ra represents H, $CH_3$, $CH_2OH$, or $CF_3$.

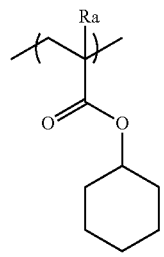 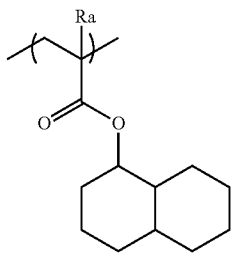

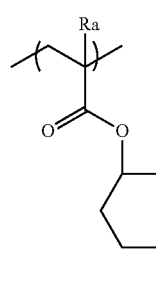 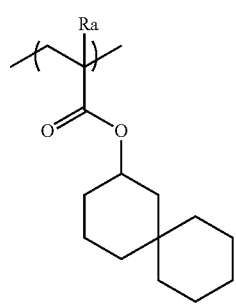

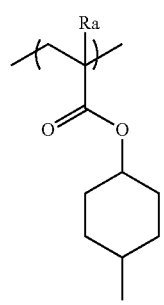 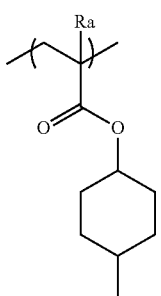 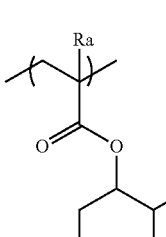

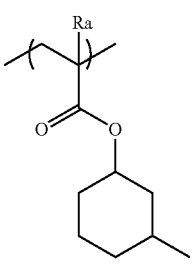 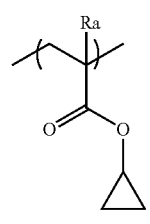 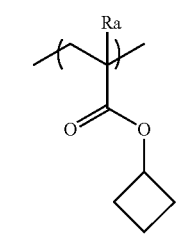

-continued

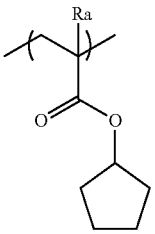 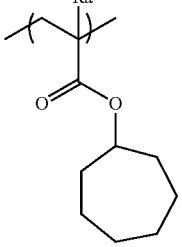 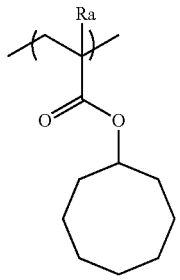

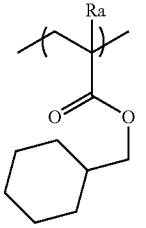 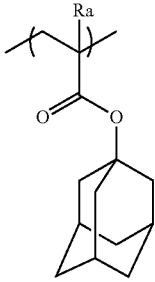 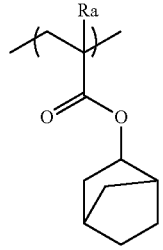

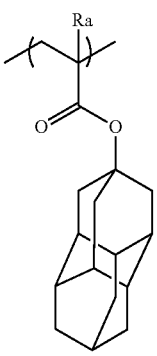 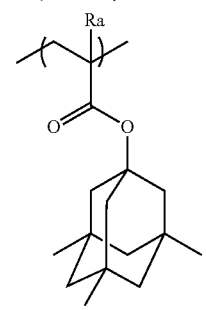

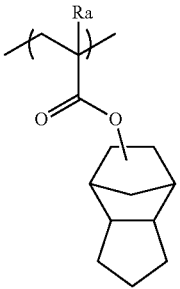 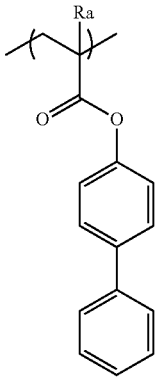

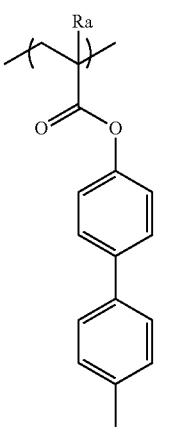 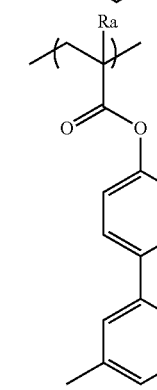

-continued

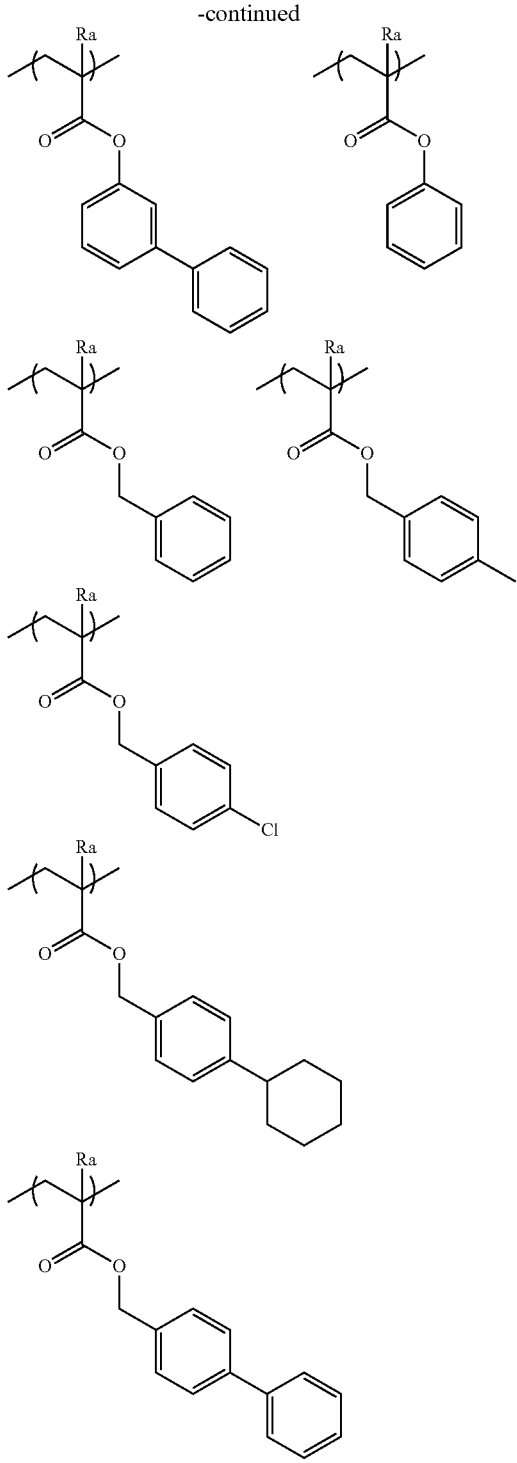

The resin (A) used in the composition of the present invention can have various repeating structural units, in addition to the repeating structural units described above, for the purpose of controlling dry etching resistance, suitability to standard developers, adhesiveness to substrates, resist profile, and other general characteristics required by a resist, such as resolution, heat resistance, and sensitivity.

Examples of such a repeating structural unit include repeating structural units corresponding to the following monomers, but the examples are not limited to these.

Thereby, fine adjustment of the performances required of the resin used in the composition of the present invention, particularly the following performances, is enabled:
(1) solubility in a coating solvent,
(2) film-forming properties (glass transition point),
(3) alkali developability,
(4) film (selection of hydrophilicity or hydrophobicity, or alkali-solubility),
(5) adhesiveness to the substrate at unexposed areas, and
(6) dry etching resistance.

Examples of such a monomer include compounds having one addition polymerizable unsaturated bond selected from acrylic acid esters, methacrylic acid esters, acrylamides, methacrylamides, aryl compounds, vinyl ethers, vinyl esters and the like.

In addition to that, any addition polymerizable unsaturated compound which is capable of copolymerizing with monomers corresponding to the various repeating structural units, may also be copolymerized.

In the resin (A) used in the composition of the present invention, the molar content ratio of the various repeating structural units is appropriately set so as to control the dry etching resistance, suitability to standard developers, and adhesiveness to substrates of the resist, the resist profile, and general performances required by resists such as resolution, heat resistance, and sensitivity.

The form of the resin (A) according to the present invention may be any of random type, block type, comb type and star type. The resin (A) can be synthesized by, for example, radical, cation, or anion polymerization of unsaturated monomers corresponding to the various structures. Furthermore, a desired resin can also be obtained by performing a polymeric reaction after polymerization is carried out using unsaturated monomers corresponding to the precursors of the various structures.

When the composition of the present invention is intended for exposure to ArF, from the viewpoint of transparency to ArF light, it is preferable that the resin (A) used in the composition of the present invention substantially do not have an aromatic ring (specifically, the proportion of a repeating unit having an aromatic group in the resin is preferably 5 mol % or less, more preferably 3 mol % or less, and ideally 0 mol %, that is, the resin has no aromatic group), and it is preferable that the resin (A) have a monocyclic or polycyclic alicyclic hydrocarbon structure.

Furthermore, when the composition of the present invention includes a resin (E) that will be described below, the resin (A) preferably does not contain fluorine atoms and silicon atoms, from the viewpoint of compatibility with the resin (E).

A preferred example of the resin (A) used in the composition of the present invention is a resin in which the repeating units entirely consist of (meth)acrylate-based repeating units. In this case, any of a resin in which all the repeating units are methacrylate-based repeating units, a resin in which all the repeating units are acrylate-based repeating units, and a resin in which all the repeating units are composed of methacrylate-based repeating units and acrylate-based repeating units, can be used. However, a resin in which the content of acrylate-based repeating units is 50 mol % or less based on the total content of repeating units, is preferred. Furthermore, a copolymerized polymer including 20 mol % to 50 mol % of a (meth)acrylate-based repeating unit having an acid-degradable group, 20 mol % to 50 mol % of a (meth)acrylate-based repeating unit having a lactone group, 5 mol % to 30 mol % of a (meth)acrylate-based repeating unit having an alicyclic hydrocarbon structure substituted with a hydroxyl group or a cyano group, and 0 mol % to 20 mol % of another(meth) acrylate-based repeating unit, is also preferred.

When the composition of the present invention is irradiated with KrF excimer laser light, an electron beam, X-rays, a high energy light (extreme ultraviolet (EUV), or the like) having a wavelength of 50 nm or less, and the like, it is preferable that the resin (A) further have a hydroxystyrene-based repeating unit. More preferably, a resin having a hydroxystyrene-based repeating unit, a hydroxystyrene-based repeating unit protected with an acid-degradable group, or an acid-degradable repeating unit such as (meth)acrylic acid tertiary alkyl esters, is preferred.

Examples of the hydroxystyrene-based repeating unit having a preferred acid-degradable group include repeating units based on t-butoxycarbonyloxystyrene, 1-alkoxyethoxystyrene, and (meth)acrylic acid tertiary alkyl esters, and more preferred examples include repeating units based on 2-alkyl-2-adamantyl(meth)acrylate and dialkyl(1-adamantyl)methyl (meth)acrylate.

The resin (A) of the present invention can be synthesized (for example, by radical polymerization) according to a routine method. For example, as a general synthesis method, a bulk polymerization method of performing polymerization by dissolving monomer species and an initiator in a solvent and heating the solution; a dropping polymerization method of adding dropwise a solution of monomer species and an initiator into a heated solvent over 1 to 10 hours; and the like may be used, and the dropping polymerization method is preferred. Examples of the reaction solvent include ethers such as tetrahydrofuran, 1,4-dioxane, and diisopropyl ether; ketones such as methyl ethyl ketone, and methyl isobutyl ketone; ester solvents such as ethyl acetate; amides such as dimethylformamide and dimethylacetamide; and solvents that dissolve the composition of the present invention, such as propylene glycol monomethyl ether acetate, propylene glycol monomethyl ether, and cyclohexanone. More preferably, it is preferable to perform polymerization using the same solvent as the solvent used in the photosensitive composition of the present invention. Thereby, generation of particles during storage can be suppressed.

It is preferable that the polymerization reaction be carried out in an inert gas atmosphere such as nitrogen or argon. As the polymerization initiator, the polymerization is initiated by using a commercially available radical initiator (an azo-based initiator, a peroxide or the like). The radical initiator is preferably an azo-based initiator, and an azo-based initiator having an ester group, a cyano group, or a carboxyl group is preferred. Preferred examples of the initiator include azobisisobutyronitrile, azobisdimethylvaleronitrile, and dimethyl-2,2'-azobis(2-methyl propionate). An initiator is added, or added in divided parts, as desired. After completion of the reaction, the reaction system is poured into a solvent, and the desired polymer is collected by methods such as collection in the form of powder or solids. The concentration of the reaction is 5 mass % to 50 mass %, and preferably 10 mass % to 30 mass %. The reaction temperature is usually 10° C. to 150° C., preferably 30° C. to 120° C., and even more preferably 60° C. to 100° C.

After completion of the reaction, the reaction system is left to cool naturally, and is purified. Purification can be achieved by applying a conventional method such as a liquid-liquid extraction method of removing residual monomers or oligomer components by washing with water or combining an appropriate solvent; a purification method in a solution state, such as ultrafiltration by which only compounds having a specific molecular weight or less are extracted and removed; a reprecipitation method of adding a resin solution dropwise to a poor solvent to coagulate a resin in the poor solvent, and thereby remove residual monomers and the like; or a purification method in the solid state performed by washing a separated resin slurry with a poor solvent. For example, a resin is precipitated as a solid by bringing the resin into contact with a solvent in which the resin is sparing soluble or insoluble (poor solvent) in a volume of 10 times or less, and preferably 10 to 5 times, the volume of the reaction solution.

As the solvent used at the time of a precipitation or reprecipitation operation from a polymer solution (precipitation or reprecipitation solvent), a poor solvent for the polymer may be used, and depending on the type of the polymer, one can be appropriately selected for use among hydrocarbons, halogenated hydrocarbons, nitro compounds, ethers, ketones, esters, carbonates, alcohols, carboxylic acids, water, and solvent mixtures including these solvents. Among these, a solvent containing at least an alcohol (particularly, methanol or the like) or water is preferred as the precipitation or reprecipitation solvent.

The amount of the precipitation or reprecipitation solvent used can be appropriately selected in consideration of efficiency or yield, but generally, the amount used is 100 parts to 10,000 parts by mass, preferably 200 to 2,000 parts by mass, and more preferably 300 parts to 1,000 parts by mass, relative to 100 parts by mass of the polymer solution.

The temperature at the time of precipitation or reprecipitation can be appropriately selected in consideration of efficiency or operability, but usually, the temperature is about 0° C. to 50° C., and preferably near room temperature (for example, about 20° C. to 35° C.). The precipitation or reprecipitation operation can be carried out by a known method such as a batch method or a continuous method, using a conventionally used mixing container such as a stirring tank.

The polymer that has been precipitated or reprecipitated is usually subjected to conventional solid-liquid separation such as filtration or centrifugation, subsequently dried, and is supplied for use. Filtration is preferably carried out under pressure using a solvent resistant filter material. Drying is carried out at normal pressure or under reduced pressure (preferably under reduced pressure) at a temperature of about 30° C. to 100° C., and preferably about 30° C. to 50° C.

Meanwhile, after the resin is precipitated once and separated, the resin may be dissolved in a solvent, and then be brought into contact with a solvent in which the resin is sparingly soluble or insoluble. That is, a method in which after completion of the radical polymerization reaction, the polymer is brought into a solvent in which the polymer is sparingly soluble or insoluble to precipitate the resin (step a); the resin is separated from the solution (step b); the resin is dissolved again in a solvent to prepare a resin solution A (step c); subsequently, the resin solution A is brought into contact with a solvent in which the resin is sparingly soluble or insoluble in a volume of less than 10 times the volume of the resin solution A (preferably, a volume of 5 times or less) to precipitate a solid resin (step d); and the precipitated resin is separated (step e), may also be used.

The weight average molecular weight of the resin (A) of the present invention as a value calculated relative to polystyrene standards according to gel permeation chromatography (GPC) is preferably 1,000 to 200,000, more preferably 1,500 to 30,000, even more preferably 2,000 to 20,000, still more preferably 3,000 to 15,000, and particularly preferably 3,000 to 10,000. When the weight average molecular weight is adjusted to 1,000 to 200,000, deterioration of heat resistance or dry etching resistance can be prevented. Also, deterioration of developability, or deterioration of film-forming properties as a result of an increase in the viscosity can be prevented.

A resin having a dispersity (molecular weight distribution, Mw/Mn) of usually in the range of 1.0 to 3.0, preferably 1.0 to 2.6, more preferably 1.0 to 2.0, and particularly preferably 1.4 to 2.0, is used. As the molecular weight distribution is smaller, the resolution and the resist shape are excellent. Also, the side walls of the resist pattern are smooth, and roughness is excellent. According to the present specification, the weight average molecular weight (Mw) and number average molecular weight (Mn) of the resin (A) can be determined by, for example, using an HLC-8120 (manufactured by Tosoh Corp.), and using a TSK GEL MULTIPORE HXL-M column (manufactured by Tosoh Corp., 7.8 mm ID×30.0 cm) and tetrahydrofuran (THF) as an eluent.

In the resist composition of the present invention, the mixing ratio of the resin (A) in the entire composition is preferably 30% to 99% by mass, and more preferably 60% to 95% by mass, of the total solids content.

Furthermore, the resin (A) may be used individually, or plural resins may be used in combination.

[2] Compound (B) which generates an acid when irradiated with actinic ray or radiation The composition according to the present invention contains a compound (B) which generates an acid when irradiated with an actinic ray or a radiation (hereinafter, also referred to as "acid generator"). The compound (B) which generates an acid when irradiated with an actinic ray or a radiation is preferably a compound which generates an organic acid when irradiated with an actinic ray or a radiation.

As the acid generator, a photoinitiator for photocationic polymerization, a photoinitiator for photoradical polymerization, a photo-decoloring agent for colorings, photo-discoloring agent, or a known compound which generates an acid when irradiated with an actinic ray or a radiation, or a mixture of such compounds, which is used in microresists or the like can be appropriately selected and used.

Examples include diazonium salts, phosphonium salts, sulfonium salts, iodonium salts, imide sulfonates, oxime sulfonates, diazodisulfone, disulfone, and o-nitrobenzyl sulfonate.

Preferred examples of the acid generator include compounds represented by the following formulae (ZI), (ZII) and (ZIII).

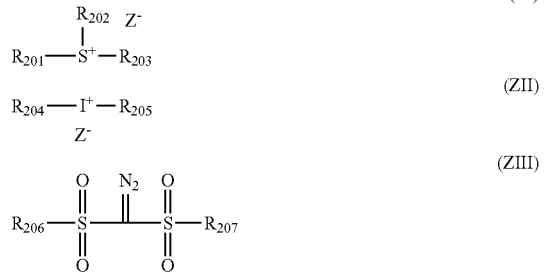

In the formula (ZI), $R_{201}$, $R_{202}$ and $R_{203}$ each independently represent an organic group.

The carbon number of the organic group as $R_{201}$, $R_{202}$ and $R_{203}$ is generally 1 to 30, and preferably 1 to 20.

Furthermore, any two of $R_{201}$ to $R_{203}$ may be joined together to form a cyclic structure, and an oxygen atom, a sulfur atom, an ester bond, an amide bond, or a carbonyl group may be included in the ring. The group formed by any two of $R_{201}$ to $R_{203}$ that are joined together may be an alkylene group (for example, a butylene group or a pentylene group).

$Z^-$ represents a non-nucleophilic anion.

Examples of the non-nucleophilic anion as $Z^-$ include sulfonate anion, carboxylate anion, sulfonylimide anion, bis(alkylsulfonyl)imide anion, and tris(alkylsulfonyl)methyl anion.

A non-nucleophilic anion is an anion having a markedly low ability to cause a nucleophilic reaction, and is an anion which is capable of suppressing the degradation over time caused by an intramolecular nucleophilic reaction. Thereby, the stability over time of the resist composition is enhanced.

Examples of the sulfonate anion include an aliphatic sulfonate anion, an aromatic sulfonate anion, and a camphor sulfonate anion.

Examples of the carboxylate anion include an aliphatic carboxylate anion, an aromatic carboxylate anion, and an aralkylcarboxylate anion.

The aliphatic moiety in the aliphatic sulfonate anion and the aliphatic carboxylate anion may be an alkyl group or a cycloalkyl group, and the aliphatic moiety is preferably an alkyl group having 1 to 30 carbon atoms or a cycloalkyl group having 3 to 30 carbon atoms. Examples thereof include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group, and a bornyl group.

The aromatic group in the aromatic sulfonate anion and the aromatic carboxylate anion is preferably an aryl group having 6 to 14 carbon atoms, and examples include a phenyl group, a tolyl group, and a naphthyl group.

The alkyl group, cycloalkyl group and aryl group in the aliphatic sulfonate anion and the aromatic sulfonate anion may each have a substituent. Examples of the substituent of the alkyl group, cycloalkyl group and aryl group in the aliphatic sulfonate anion and the aromatic sulfonate anion include a nitro group, a halogen atom (a fluorine atom, a chlorine atom, a bromine atom, or an iodine atom), a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 1 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), and a cycloalkylalkyloxyalkyloxy group (preferably having 8 to 20 carbon atoms). For the aryl group and cyclic structure carried in the various groups, examples of the substituent include an alkyl group (preferably having 1 to 15 carbon atoms) and a cycloalkyl group (preferably having 3 to 15 carbon atoms).

The aralkyl group in the aralkylcarboxylate anion is preferably an aralkyl group having 7 to 12 carbon atoms, and examples thereof include a benzyl group, a phenethyl group, a naphthylmethyl group, a naphthylethyl group, and a naphthylbutyl group.

The alkyl group, cycloalkyl group, aryl group and aralkyl group in the aliphatic carboxylate anion, the aromatic carboxylate anion and the aralkylcarboxylate anion may each have a substituent. Examples of this substituent include the same halogen atom, alkyl group, cycloalkyl group, alkoxy group and alkylthio group as those for the aromatic sulfonate anions.

Examples of the sulfonylimide anion include a saccharin anion.

The alkyl group in the bis(alkylsulfonyl)imide anion and the tris(alkylsulfonyl)methide anion is preferably an alkyl group having 1 to 5 carbon atoms, and examples include a methyl group, an ethyl group, a propyl group, an isopropyl group, an n-butyl group, an isobutyl group, a sec-butyl group, a pentyl group and a neopentyl group. Substituents of such an alkyl group include a halogen atom, an alkyl group substituted with a halogen atom, an alkoxy group, an alkylthio group, an alkyloxysulfonyl group, an aryloxysulfonyl group, and a cycloalkylaryloxysulfonyl group. An alkyl group substituted with a fluorine atom is preferred.

Examples of other non-nucleophilic anions include fluorophosphate (for example, $PF_6^-$), fluoroborate (for example, $BF_4^-$ and fluoroantimonate (for example, $SbF_6^-$).

The non-nucleophilic anion of $Z^-$ is preferably an aliphatic sulfonate anion in which at least the α-position of sulfonic acid has been substituted by a fluorine atom, an aromatic sulfonate anion substituted with a fluorine atom or a group having a fluorine atom, bis(alkylsulfonyl)imide anion having an alkyl group substituted with a fluorine atom, or tris(alkylsulfonyl)methide anion having an alkyl group substituted with a fluorine atom. The non-nucleophilic anion is more preferably an aliphatic perfluorosulfonate anion having 4 to 8 carbon atoms, or a benzenesulfonate anion having a fluorine atom; and even more preferably a nonafluorobutanesulfonate anion, a perfluorooctanesulfonate anion, a pentafluorobenzenesulfonate anion, or a 3,5-bis(trifluoromethyl)benzenesulfonate anion.

The acid generator is preferably a compound which generates an acid represented by the following formula (III) or (IV), when irradiated with an actinic ray or a radiation. Since a compound which generates an acid represented by the following formula (III) or (IV) has a cyclic organic group, resolution and roughness performance can be further improved.

As the non-nucleophilic anion, an anion producing an organic acid represented by the following formula (III) or (IV) can be used.

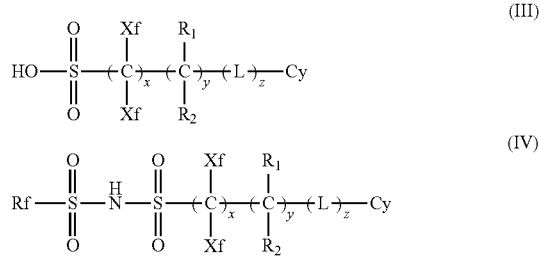

In the formulae above,

Xfs each independently represent a fluorine atom, or an alkyl group substituted with at least one fluorine atom.

$R_1$ and $R_2$ each independently represent a hydrogen atom, a fluorine atom, or an alkyl group.

L's each independently represent a divalent linking group.

Cy represents a cyclic organic group.

Rf represents a group containing a fluorine atom.

x represents an integer from 1 to 20.

y represents an integer from 0 to 10.

z represents an integer from 0 to 10.

Xf represents a fluorine atom, or an alkyl group substituted with at least one fluorine atom. The carbon number of this alkyl group is preferably 1 to 10, and more preferably 1 to 4. Furthermore, the alkyl group substituted with at least one fluorine atom is preferably a perfluoroalkyl group.

Xf is preferably a fluorine atom, or a perfluoroalkyl group having 1 to 4 carbon atoms. More specifically, Xf is preferably a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, or $CH_2CH_2C_4F_9$, and more preferably a fluorine atom or $CF_3$. Particularly, it is preferable that both Xfs be fluorine atoms.

$R_1$ and $R_2$ each independently represent a hydrogen atom, a fluorine atom, or an alkyl group. This alkyl group may have a substituent (preferably, a fluorine atom), and is preferably an alkyl group having 1 to 4 carbon atoms. The alkyl group is more preferably a perfluoroalkyl group having 1 to 4 carbon atoms. Specific examples of the alkyl group having a substituent of $R_1$ and $R_2$ include, for example, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$, and among these, $CF_3$ is preferred.

L represents a divalent linking group. Examples of this divalent linking group include —COO—, —COO—, —CONH—, —NHCO—, —CO—, —O—, —S—, —SO—, —SO$_2$—, an alkylene group (preferably having 1 to 6 carbon atoms), a cycloalkylene group (preferably having 3 to 10 carbon atoms), an alkenylene group (preferably having 2 to 6 carbon atoms), or a divalent linking group combining plural groups of these. Among these, —COO—, —COO—, —CONH—, —NHCO—, —CO—, —O—, —SO$_2$—, a —COO-alkylene group-, a —OCO-alkylene group-, a —CONH-alkylene group- and a —NHCO-alkylene group- are preferred, and —COO—, —COO—, —CONH—, —SO$_2$—, a —COO-alkylene group- and a —OCO-alkylene group- are more preferred.

Cy represents a cyclic organic group. Examples of the cyclic organic group include an alicyclic group, an aryl group, and a heterocyclic group.

The alicyclic group may be monocyclic or may be polycyclic. Examples of a monocyclic alicyclic group include monocyclic cycloalkyl groups such as a cyclopentyl group, a cyclohexyl group, and a cyclooctyl group. Examples of a polycyclic alicyclic group include polycyclic cycloalkyl groups such as a norbornyl group, a tricyclodecanyl group, a tetracyclodecanyl group, a tetracyclododecanyl group, and an adamantyl group. Among them, alicyclic groups having a bulky structure having 7 or more carbon atoms, such as a norbornyl group, a tricyclodecanyl group, a tetracyclodecanyl group, a tetracyclododecanyl group and an adamantyl group are preferred from the viewpoint of suppressing in-film diffusivity in the post-exposure bake (PEB) step and enhancing the mask error enhancement factor (MEEF).

The aryl group may be monocyclic or may be polycyclic. Examples of the aryl group include a phenyl group, a naphthyl group, a phenanthryl group, and an anthryl group. Among them, a naphthyl group having a relatively low light absorbance at 193 nm is preferred.

The heterocyclic group may be monocyclic or may be polycyclic, but a polycyclic heterocyclic group is more capable of suppressing the diffusion of acid. Furthermore, the heterocyclic group may have aromaticity, or may not have aromaticity. Examples of heterocyclic group having aromaticity include a furan ring, a thiophene ring, a benzofuran ring, a benzothiophene ring, a dibenzofuran ring, a dibenzothiophene ring, and a pyridine ring. Examples of the heterocyclic ring which does not have aromaticity include a tetrahydropyran ring, a lactone ring, and a decahydroisoquinoline ring. The heterocyclic ring for the heterocyclic group is particularly preferably a furan ring, a thiophene ring, a pyridine ring, or a decahydroisoquinoline ring. Furthermore, examples of the lactone ring may be the lactone structure illustrated for the resin (A).

The cyclic organic group may have a substituent. Examples of this substituent include an alkyl group (may be linear or branched, and preferably having 1 to 12 carbon atoms), a cycloalkyl group (may be monocyclic, polycyclic or spirocyclic, and preferably having 3 to 20 carbon atoms), an aryl group (preferably having 6 to 14 carbon atoms), a hydroxyl group, an alkoxy group, an ester group, an amide group, a urethane group, an ureido group, a thioether group, a sulfonamide group, and a sulfonic acid ester group. The carbon constituting the cyclic organic group (carbon contributing to ring formation) may be a carbonyl carbon.

x is preferably 1 to 8, and among others, x is preferably 1 to 4, and particularly preferably 1. y is preferably 0 to 4, and more preferably 0. z is preferably 0 to 8, and among others, z is preferably 0 to 4.

Examples of the group containing a fluorine atom represented by Rf include an alkyl group having at least one fluorine atom, a cycloalkyl group having at least one fluorine atom, and an aryl group having at least one fluorine atom.

These alkyl group, cycloalkyl group and aryl group may be each substituted with a fluorine atom, or may be substituted with another substituent containing a fluorine atom. When Rf is a cycloalkyl group having at least one fluorine atom or an aryl group having at least one fluorine atom, examples of the other substituent containing a fluorine atom include an alkyl group substituted with at least one fluorine atom.

Furthermore, these alkyl group, cycloalkyl group and aryl group may be further substituted with a substituent which does not contain a fluorine atom. Examples of this substituent include, among those described previously for Cy, substituents which do not contain fluorine atoms.

Examples of the alkyl group having at least one fluorine atom represented by Rf include the same alkyl groups described previously as the alkyl group substituted with at least one fluorine atom represented by Xf. Examples of the cycloalkyl group having at least one fluorine atom represented by Rf include a perfluorocyclopentyl group and a perfluorocyclohexyl group. Examples of the aryl group having at least one fluorine atom represented by Rf include a perfluorophenyl group.

Examples of the organic group represented by $R_{201}$, $R_{202}$ and $R_{203}$ include groups corresponding to the compounds (ZI-1), (ZI-2), (ZI-3) and (ZI-4) that will be described below.

Meanwhile, the organic group may be a compound having plural structures represented by the formula (ZI). For example, the organic group may be a compound having a structure in which at least one of $R_{201}$ to $R_{203}$ of the compound represented by the formula (ZI) is linked to at least one of $R_{201}$ to $R_{203}$ of another compound represented by the formula (ZI) through a single bond or a linking group.

More preferred examples of the (ZI) component include compounds (ZI-1), (ZI-2), (ZI-3) and (ZI-4) that will be described below.

The compound (ZI-1) is an arylsulfonium compound in which at least one of $R_{201}$ to $R_{203}$ of the formula (ZI) is an aryl group, that is, a compound having arylsulfonium as a cation.

The arylsulfonium compound is such that all of $R_{201}$ to $R_{203}$ may be aryl groups, or some of $R_{201}$ to $R_{203}$ may be aryl groups, while the rest may be an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound, and an aryldicycloalkylsulfonium compound.

The aryl group of the arylsulfonium compound is preferably a phenyl group or a naphthyl group, and more preferably a phenyl group. The aryl group may be an aryl group having a heterocyclic structure having an oxygen atom, a nitrogen atom, a sulfur atom or the like. Examples of the heterocyclic structure include a pyrrole residue, a furan residue, a thiophene residue, an indole residue, a benzofuran residue, and a benzothiophene residue. When the arylsulfonium compound has two or more aryl groups, the two or more aryl groups may be identical with or different from each other.

The alkyl group or cycloalkyl group which may be carried by the arylsulfonium compound as necessary is preferably a linear or branched alkyl group having 1 to 15 carbon atoms, or a cycloalkyl group having 3 to 15 carbon atoms. Examples thereof include a methyl group, an ethyl group, a propyl group, an n-butyl group, a sec-butyl group, a t-butyl group, a cyclopropyl group, a cyclobutyl group, and a cyclohexyl group.

The aryl group, alkyl group or cycloalkyl group of $R_{201}$ to $R_{203}$ may each have an alkyl group (for example, having 1 to 15 carbon atoms), a cycloalkyl group (for example, having 3 to 15 carbon atoms), an aryl group (for example, having 6 to 14 carbon atoms), an alkoxy group (for example, having 1 to 15 carbon atoms), a halogen atom, a hydroxyl group, or a phenylthio group, as a substituent. Preferred examples of the substituent include a linear or branched alkyl group having 1 to 12 carbon atoms, a cycloalkyl group having 3 to 12 carbon atoms, and a linear, branched or cyclic alkoxy group having 1 to 12 carbon atoms, and more preferred examples include an alkyl group having 1 to 4 carbon atoms, and an alkoxy group having 1 to 4 carbon atoms. The substituent may be substituted at any one of $R_{201}$ to $R_{203}$, or may be substituted at all of the three. Furthermore, if $R_{201}$ to $R_{203}$ are aryl groups, it is preferable that the substituent be substituted at the p-position of the aryl group.

Next, the compound (ZI-2) will be described.

The compound (ZI-2) is a compound in which $R_{201}$ to $R_{203}$ in the formula (ZI) each independently represent an organic group that does not have an aromatic ring. Here, the aromatic ring also includes an aromatic ring containing a heteroatom.

The organic group which does not contain an aromatic ring as $R_{201}$ to $R_{203}$ generally has 1 to 30 carbon atoms, and preferably 1 to 20 carbon atoms.

$R_{201}$ to $R_{203}$ are each independently preferably an alkyl group, a cycloalkyl group, an allyl group, or a vinyl group, more preferably a linear or branched 2-oxoalkyl group, 2-oxocycloalkyl group or an alkoxycarbonylmethyl group, and particularly preferably a linear or branched 2-oxoalkyl group.

Preferred examples of the alkyl group and cycloalkyl group of $R_{201}$ to $R_{203}$ include a linear or branched alkyl group having 1 to 10 carbon atoms (for example, a methyl group, an ethyl group, a propyl group, a butyl group, or a pentyl group), and a cycloalkyl group having 3 to 10 carbon atoms (a cyclopentyl group, a cyclohexyl group, or a norbornyl group). More preferred examples of the alkyl group include a 2-oxoalkyl group, and an alkoxycarbonylmethyl group. More preferred examples of the cycloalkyl group include a 2-oxocycloalkyl group.

The 2-oxoalkyl group may be either linear or branched, and a preferred example thereof is a group having a >C=O moiety at the 2-position of the alkyl group described above.

A preferred example of the 2-oxocycloalkyl group is a group having a >C=O moiety at the 2-position of the cycloalkyl group described above.

The alkoxy group for the alkoxycarbonylmethyl group is preferably an alkoxy group having 1 to 5 carbon atoms (a methoxy group, an ethoxy group, a propoxy group, a butoxy group, or a pentoxy group).

$R_{201}$ to $R_{203}$ may be respectively further substituted with a halogen atom, an alkoxy group (for example, having 1 to 5 carbon atoms), a hydroxyl group, a cyano group, or a nitro group.

Next, the compound (ZI-3) will be described.

The compound (ZI-3) is a compound represented by the following formula (ZI-3), and is a compound having a phenacylsulfonium salt structure.

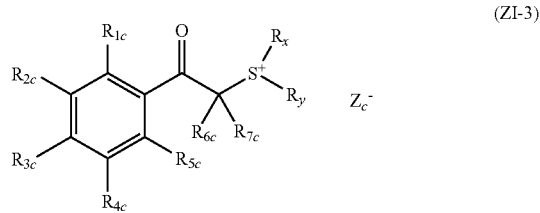

(ZI-3)

In the formula (ZI-3), $R_{1c}$ to $R_{5c}$ each independently represent a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group or an arylthio group.

$R_{6c}$ and $R_{7c}$ each independently represent a hydrogen atom, an alkyl group, a cycloalkyl group, a halogen atom, a cyano group, or an aryl group.

$R_x$ and $R_y$ each independently represent an alkyl group, a cycloalkyl group, a 2-oxoalkyl group, a 2-oxocycloalkyl group, an alkoxycarbonylalkyl group, an allyl group, or a vinyl group.

Any two or more of $R_{1c}$ to $R_{5c}$, $R_{5c}$ and $R_{6c}$, $R_{6c}$ and $R_{7c}$, $R_{5c}$ and $R_x$, and $R_x$ and $R_y$ may be respectively joined to form a cyclic structure, and this cyclic structure may contain an oxygen atom, a sulfur atom, a ketone group, an ester bond, or an amide bond.

Examples of the cyclic structure include aromatic or non-aromatic hydrocarbon rings, aromatic or non-aromatic heterocyclic rings, and polycyclic fused rings in which two or more of these rings are combined. The cyclic structure may be a 3- to 10-membered ring, preferably a 4- to 8-membered ring, and more preferably a 5- or 6-membered ring.

Examples of the group formed by any two or more of $R_{1c}$ to $R_{5c}$, $R_{6c}$ and $R_{7c}$, and $R_x$ and $R_y$ that are joined together include a butylene group, and a pentylene group.

The group formed by $R_{5c}$ and $R_{6c}$, and $R_{5c}$ and $R_x$ that are joined together is preferably a single bond or an alkylene group, and examples of the alkylene group include a methylene group and an ethylene group.

$Zc^-$ represents a non-nucleophilic anion, and examples include the same non-nucleophilic anions as $Z^-$ in the formula (ZI).

The alkyl group as $R_{1c}$ to $R_{7c}$ may be either linear or branched, and examples include an alkyl group having 1 to 20 carbon atoms, while preferred examples include linear or branched alkyl groups having 1 to 12 carbon atoms (for example, a methyl group, an ethyl group, a linear or branched propyl group, a linear or branched butyl group, and a linear or branched pentyl group). Examples of the cycloalkyl group include cycloalkyl groups having 3 to 10 carbon atoms (for example, a cyclopentyl group and a cyclohexyl group).

The aryl group as $R_{1c}$ to $R_{5c}$ preferably has 5 to 15 carbon atoms, and examples include a phenyl group and a naphthyl group.

The alkoxy group as $R_{1c}$ to $R_{5c}$ may be any of linear, branched and cyclic, and examples include alkoxy groups having 1 to 10 carbon atoms, while preferred examples include linear and branched alkoxy groups having 1 to 5 carbon atoms (for example, a methoxy group, an ethoxy group, a linear or branched propoxy group, a linear or branched butoxy group, and a linear or branched pentoxy group), and cyclic alkoxy groups having 3 to 10 carbon atoms (for example, a cyclopentyloxy group, and a cyclohexyloxy group).

Specific examples of the alkoxy group for the alkoxycarbonyl group as $R_{1c}$ to $R_{5c}$ are the same as the specific examples of the alkoxy group as $R_{1c}$ to $R_{5c}$.

Specific examples of the alkyl group for the alkylcarbonyloxy group and the alkylthio group as $R_{1c}$ to $R_{5c}$ are the same as the specific examples of the alkyl group as $R_{1c}$ to $R_{5c}$.

Specific examples of the cycloalkyl group for the cycloalkylcarbonyloxy group as $R_{1c}$ to $R_{5c}$ are the same as the specific examples of the cycloalkyl group as $R_{1c}$ to $R_{5c}$.

Specific example of the aryl group for the aryloxy group and the arylthio group as $R_{1c}$ to $R_{5c}$ are the same as the specific examples of the aryl group as $R_{1c}$ to $R_{5c}$.

Preferably, any of $R_{1c}$ to $R_{5c}$ is a linear or branched alkyl group, a cycloalkyl group, or a linear, branched or a cyclic alkoxy group, and more preferably, the sum of the carbon numbers of $R_{1c}$ to $R_{5c}$ is 2 to 15. Thereby, solvent solubility is further enhanced, and the generation of particles at the time of storage is suppressed.

A cyclic structure which may be formed by any two or more of $R_{1c}$ to $R_{5c}$ that are joined together is preferably a 5-membered or 6-membered ring, and particularly preferably a 6-membered ring (for example, a phenyl ring).

A cyclic structure which may be formed by $R_{5c}$ and $R_{6c}$ that are joined together, may be a 4-membered or higher-membered ring (particularly preferably a 5- to 6-membered ring) that is formed by $R_{5c}$ and $R_{6c}$ by joining together to construct a single bond or an alkylene group (a methylene group, an ethylene group or the like), together with the carbonyl carbon atom and carbon atoms of the formula (I).

The aryl group as $R_{6c}$ and $R_{7c}$ preferably has 5 to 15 carbon atoms, and examples include a phenyl group and a naphthyl group.

A preferred embodiment of $R_{6c}$ and $R_{7c}$ is such that $R_{6c}$ and $R_{7c}$ are both alkyl groups. Particularly, it is preferable that $R_{6c}$ and $R_{7c}$ be each a linear or branched alkyl group having 1 to 4 carbon atoms, and it is particularly preferable that both $R_{6c}$ and $R_{7c}$ be methyl groups.

Furthermore, in the case where $R_{6c}$ and $R_{7c}$ are joined to form a ring, the group formed by $R_{6c}$ and $R_{7c}$ being joined together is preferably an alkylene group having 2 to 10 carbon atoms, and examples include an ethylene group, a propylene group, a butylene group, a pentylene group, and a hexylene group. Furthermore, the ring formed by $R_{6c}$ and $R_{7c}$ that are joined together may have a heteroatom such as an oxygen atom in the ring.

The alkyl group and cycloalkyl group as $R_x$ and $R_y$ may be the same alkyl group and cycloalkyl group for $R_{1c}$ to $R_{7c}$.

The 2-oxoalkyl group and 2-oxocycloalkyl group as $R_x$ and $R_y$ may be groups having a >C=O moiety at the 2-positions of the alkyl group and cycloalkyl group as $R_{1c}$ to $R_{7c}$.

The alkoxy group for the alkoxycarbonylalkyl group as $R_x$ and $R_y$ may be the same alkoxy group for $R_{1c}$ to $R_{5c}$, and examples include alkyl groups having 1 to 12 carbon atoms, while preferred examples include linear alkyl groups having 1 to 5 carbon atoms (for example, a methyl group and an ethyl group).

There are no particular limitations on the allyl group as $R_x$ and $R_y$, but preferred examples include an unsubstituted allyl group, or an allyl group substituted with a monocyclic or polycyclic cycloalkyl group (preferably, a cycloalkyl group having 3 to 10 carbon atoms).

There are no particular limitations on the vinyl group as $R_x$ and $R_y$, but preferred examples include an unsubstituted vinyl group, or a vinyl group substituted with a monocyclic or polycyclic cycloalkyl group (preferably, a cycloalkyl group having 3 to 10 carbon atoms).

A cyclic structure which may be formed by $R_{5c}$ and $R_x$ that are joined together, may be a 5-membered or higher-membered ring (particularly preferably, a 5-membered ring) that is formed by $R_{5c}$ and $R_x$ joining together to construct a single bond or an alkylene group (a methylene group, an ethylene group, or the like), together with the sulfur atom and carbonyl carbon atom of the formula (I).

A cyclic structure which may be formed by $R_x$ and $R_y$ being joined together, may be a 5-membered or 6-membered ring, particularly preferably a 5-membered ring (that is, a tetrahydrothiophene ring), that is formed by divalent $R_x$ and $R_y$ (for example, a methylene group, an ethylene group, or a propylene group), together with the sulfur atom of the formula (ZI-3).

$R_x$ and $R_y$ are each preferably an alkyl group or a cycloalkyl group having 4 or more carbon atoms, and more preferably an alkyl group or a cycloalkyl group having 6 or more carbon atoms, and even more preferably 8 or more carbon atoms.

$R_{1c}$ to $R_{7c}$, $R_x$ and $R_y$ may further have substituents, and examples of such substituents include a halogen atom (for example, a fluorine atom), a hydroxyl group, a carboxyl group, a cyano group, a nitro group, an alkyl group, a cycloalkyl group, an aryl group, an alkoxy group, an aryloxy group, an acyl group, an arylcarbonyl group, an alkoxyalkyl group, an aryloxyalkyl group, an alkoxycarbonyl group, an aryloxycarbonyl group, an alkoxycarbonyloxy group, and an aryloxycarbonyloxy group.

It is more preferable that in the formula (ZI-3), $R_{1c}$, $R_{2c}$, $R_{4c}$ and $R_{5c}$ each independently represent a hydrogen atom, and $R_{3c}$ represent a group other than a hydrogen atom, that is, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group.

As the cation in the compound (ZI-2) or (ZI-3) according to the present invention, the cations described in paragraphs [0130] to [0134] of JP 2010-256842 A; paragraphs [0136] to [0420] of JP 2011-76056 A; and the like may be mentioned.

Next, the compound (ZI-4) will be described.

The compound (ZI-4) is represented by the following formula (ZI-4).

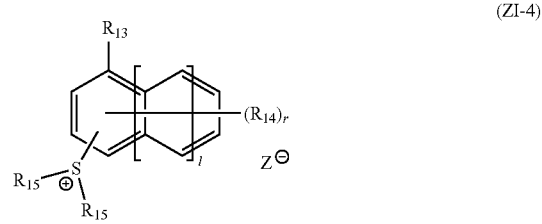

In the formula (ZI-4), $R_{13}$ represents a hydrogen atom, a fluorine atom, a hydroxyl group, an alkyl group, a cycloalkyl group, an alkoxy group, an alkoxycarbonyl group, or a group having a cycloalkyl group. These groups may each have a substituent.

$R_{14}$'s when there are plural $R_{14}$'s, each independently represent a hydroxyl group, an alkyl group, a cycloalkyl group, an alkoxy group, an alkoxycarbonyl group, an alkylcarbonyl group, an alkylsulfonyl group, a cycloalkylsulfonyl group, or a group having a cycloalkyl group. These groups may each have a substituent.

$R_{15}$'s each independently represent an alkyl group, a cycloalkyl group, or a naphthyl group. Two $R_{15}$'s may be joined together to form a ring. These groups may have a substituent.

l represents an integer of 0 to 2.

r represents an integer of 0 to 8.

$Z^-$ represents a non-nucleophilic anion, and examples include the same non-nucleophilic anions as $Z^-$ in the formula (ZI).

In the formula (ZI-4), the alkyl group of $R_{13}$, $R_{14}$ and $R_{15}$ may be linear or branched, and is preferably an alkyl group having 1 to 10 carbon atoms. Preferred examples include a methyl group, an ethyl group, an n-butyl group, and a t-butyl group.

The cycloalkyl group of $R_{13}$, $R_{14}$ and $R_{15}$ may be a monocyclic or polycyclic cycloalkyl group (preferably, a cycloalkyl group having 3 to 20 carbon atoms), and particularly preferred examples include cyclopropyl, cyclopentyl, cyclohexyl, cycloheptyl, and cyclooctyl.

The alkoxy group of $R_{13}$ and $R_{14}$ may be linear or branched, and is preferably an alkoxy group having 1 to 10 carbon atoms. Preferred examples include a methoxy group, an ethoxy group, an n-propoxy group, and a n-butoxy group.

The alkoxycarbonyl group of $R_{13}$ and $R_{14}$ may be linear or branched, and an alkoxycarbonyl group having 2 to 11 carbon atoms is preferred. Preferred examples include a methoxycarbonyl group, an ethoxycarbonyl group, and an n-butoxycarbonyl group.

The group having a cycloalkyl group of $R_{13}$ and $R_{14}$ may be a monocyclic or polycyclic cycloalkyl group (preferably, a cycloalkyl group having 3 to 20 carbon atoms), and examples include a monocyclic or polycyclic cycloalkyloxy group, and an alkoxy group having a monocyclic or polycyclic cycloalkyl group. These groups may further have a substituent.

The monocyclic or polycyclic cycloalkyloxy group of $R_{13}$ and $R_{14}$ preferably has 7 or more carbon atoms in total, more preferably from 7 to 15 carbon atoms in total, and it is more preferable that $R_{13}$ and $R_{14}$ have a monocyclic cycloalkyl group. A monocyclic cycloalkyloxy group having 7 or more carbon atoms in total is a cycloalkyloxy group such as a cyclopropyloxy group, a cyclobutyloxy group, a cyclopentyloxy group, a cyclohexyloxy group, a cycloheptyloxy group, a cyclooctyloxy group, or a cyclododecanyloxy group, and may be a monocyclic cycloalkyloxy group having an arbitrary substituent such as an alkyl group such as a methyl group, an ethyl group, a propyl group, a butyl group, a pentyl group, a hexyl group, a heptyl group, an octyl group, a dodecyl group, a 2-ethylhexyl group, an isopropyl group, a sec-butyl group, a t-butyl group, or an isoamyl group; a hydroxyl group, a halogen atom (fluorine, chlorine, bromine, or iodine), a nitro group, a cyano group, an amide group, a sulfonamide group; a methoxy group, an ethoxy group, a hydroxyethoxy group, a propoxy group, a hydroxypropoxy group, or a butoxy group; an alkoxycarbonyl group such as a methoxycarbonyl group or an ethoxycarbonyl group; an acyl group such as a formyl group, an acetyl group, or a benzoyl group; an acyloxy group such as an acetoxy group or a butyloxy group; or a carboxyl group. The cycloalkyloxy group represents a group having a total number of carbon atoms for the cycloalkyl and the arbitrary substituent.

Furthermore, a polycyclic cycloalkyloxy group having 7 or more carbon atoms in total may be a norbornyloxy group, a tricyclodecanyloxy group, a tetracyclodecanyloxy group, or an adamantyloxy group.

The alkoxy group having a monocyclic or polycyclic cycloalkyl group of $R_{13}$ and $R_{14}$ preferably has 7 or more carbon atoms in total, and more preferably from 7 to 15 carbon atoms in total. It is more preferably an alkoxy group having a monocyclic cycloalkyl group. An alkoxy group having a monocyclic cycloalkyl group having 7 or more carbon atoms in total is a group in which an alkoxy group such as methoxy, ethoxy, propoxy, butoxy, pentyloxy, hexyloxy, heptoxy, octyloxy, dodecyloxy, 2-ethylhexyloxy, isopropoxy, sec-butoxy, t-butoxy, or isoamyloxy, is substituted with a monocycloalkyl group which may have a substituent such as described above, while the total number of carbon atoms including the carbon atoms of the substituents is 7 or greater. For example, a cyclohexylmethoxy group, a cyclopentylethoxy group, or a cyclohexylmethoxy group may be used, and a cyclohexylmethoxy group is preferred.

Furthermore, an alkoxy group having a polycyclic cycloalkyl group having 7 or more carbon atoms may be a norbornylmethoxy group, a norbornylethoxy group, a tricyclodecanylmethoxy group, a tricyclodecanylethoxy group, a tetracyclodecanylmethoxy group, a tetracyclodecanylethoxy group, an adamantylmethoxy group, or an adamantylethoxy group, and a norbornylmethoxy group, a norbornylethoxy group and the like are preferred.

Specific examples of the alkyl group of the alkylcarbonyl group of $R_{14}$ include the same specific examples of the alkyl group as $R_{13}$ to $R_{15}$ described above.

The alkylsulfonyl group and cycloalkylsulfonyl group of $R_{14}$ may be linear, branched, or cyclic, and preferably have 1 to 10 carbon atoms. Preferred examples include a methanesulfonyl group, an ethanesulfonyl group, an n-propanesulfonyl group, an n-butanesulfonyl group, a cyclopentanesulfonyl group, and a cyclohexanesulfonyl group.

Examples of the substituent which may be carried by the various groups include a halogen atom (for example, a fluorine atom), a hydroxyl group, a carboxyl group, a cyano group, a nitro group, an alkoxy group, an alkoxyalkyl group, an alkoxycarbonyl group, and an alkoxycarbonyloxy group.

Examples of the alkoxy group include linear, branched or cyclic alkoxy groups having 1 to 20 carbon atoms, such as a methoxy group, an ethoxy group, an n-propoxy group, an i-propoxy group, an n-butoxy group, a 2-methylpropoxy group, a 1-methylpropoxy group, a t-butoxy group, a cyclopentyloxy group, and a cyclohexyloxy group.

Examples of the alkoxyalkyl group include linear, branched or cyclic alkoxyalkyl groups having 2 to 21 carbon atoms, such as a methoxymethyl group, an ethoxymethyl group, a 1-methoxyethyl group, a 2-methoxyethyl group, a 1-ethoxyethyl group, and a 2-ethoxyethyl group.

Examples of the alkoxycarbonyl group include linear, branched or cyclic alkoxycarbonyl groups having 2 to 21 carbon atoms, such as a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, a cyclopentyloxycarbonyl group, and a cyclohexyloxycarbonyl group.

Examples of the alkoxycarbonyloxy group include linear, branched or cyclic alkoxycarbonyloxy groups having 2 to 21 carbon atoms, such as a methoxycarbonyloxy group, an ethoxycarbonyloxy group, an n-propoxycarbonyloxy group, a i-propoxycarbonyloxy group, an n-butoxycarbonyloxy group, a t-butoxycarbonyloxy group, a cyclopentyloxycarbonyloxy group, and a cyclohexyloxycarbonyloxy group.

The cyclic structure which may be formed by two $R_{15}$'s that are joined together may be a 5-membered or 6-membered ring formed by two $R_{15}$'s together with the sulfur atom of the formula (ZI-4), and particularly preferably a 5-membered ring (that is, a tetrahydrothiophene ring), and the ring may be fused with an aryl group or a cycloalkyl group. This divalent $R_{15}$ may have a substituent, and examples of the substituent include a hydroxyl group, a carboxyl group, a cyano group, a nitro group, an alkyl group, a cycloalkyl group, an alkoxy group, an alkoxyalkyl group, an alkoxycarbonyl group, and an alkoxycarbonyloxy group. There may be plural substituents for the cyclic structure, and the substituents may be joined to form a ring (an aromatic or non-aromatic hydrocarbon ring, an aromatic or non-aromatic heterocyclic ring, or a polycyclic fused ring formed by two or more of these rings in combination).

$R_{15}$ in the formula (ZI-4) is preferably a methyl group, an ethyl group, a naphthyl group, or a divalent group obtained by two $R_{15}$'s being joined together to form a tetrahydrothiophene ring together with the sulfur atom.

The substituent that may be carried by $R_{13}$ and $R_{14}$ is preferably a hydroxyl group, an alkoxy group, an alkoxycarbonyl group, or a halogen atom (particularly, a fluorine atom).

l is preferably 0 or 1, and more preferably 1.

r is preferably 0 to 2.

Examples of the cation of the compound represented by the formula (ZI-4) according to the present invention include the cations described in paragraphs [0121], [0123] and [0124] of JP 2010-256842 A; paragraphs [0127], [0129] and [0130] of JP 2011-76056 A; and the like.

Next, the formulae (ZII) and (ZIII) will be described.

In the formulae (ZII) and (ZIII), $R_{204}$ to $R_{207}$ each independently represent an aryl group, an alkyl group, or a cycloalkyl group.

The aryl group of $R_{204}$ to $R_{207}$ is preferably a phenyl group or a naphthyl group, and more preferably a phenyl group. The aryl group of $R_{204}$ to $R_{207}$ may also be an aryl group having a heterocyclic structure having an oxygen atom, a nitrogen atom, a sulfur atom or the like. Examples of the skeleton of the aryl group having a heterocyclic structure include pyrrole, furan, thiophene, indole, benzofuran, and benzothiophene.

Preferred examples of the alkyl group and cycloalkyl group for $R_{204}$ to $R_{207}$ include linear or branched alkyl groups having 1 to 10 carbon atoms (for example, a methyl group, an ethyl group, a propyl group, a butyl group, and a pentyl group); and cycloalkyl groups having 3 to 10 carbon atoms (a cyclopentyl group, a cyclohexyl group, and a norbornyl group).

The aryl group, alkyl group and cycloalkyl group of $R_{204}$ to $R_{207}$ may have substituents. Examples of the substituents which may be carried by the aryl group, alkyl group, and cycloalkyl group of $R_{204}$ to $R_{207}$, include an alkyl group (for example, having 1 to 15 carbon atoms), a cycloalkyl group (for example, having 3 to 15 carbon atoms), an aryl group (for example, having 6 to 15 carbon atoms), an alkoxy group (for example, having 1 to 15 carbon atoms), a halogen atom, a hydroxyl group, and a phenylthio group.

$Z^-$ represents a non-nucleophilic anion, and examples include the same ones as the non-nucleophilic anions of $Z^-$ in the formula (ZI).

As the acid generator, compounds represented by the following formulae (ZIV), (ZV) and (ZVI) may also be used.

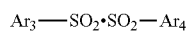

(ZIV)

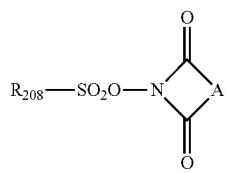

(ZV)

(ZVI)

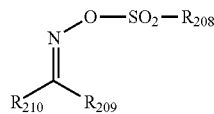

In the formulae (ZIV) to (ZVI), $Ar_3$ and $Ar_4$ each independently represent an aryl group.

$R_{208}$, $R_{209}$ and $R_{210}$ each independently represent an alkyl group, a cycloalkyl group, or an aryl group.

A represents an alkylene group, an alkenylene group or an arylene group.

Specific examples of the aryl group of $Ar_3$, $Ar_4$, $R_{208}$, $R_{209}$ and $R_{210}$ include the same specific examples of the aryl group as $R_{201}$, $R_{202}$ and $R_{203}$ in the formula (ZI-1).

Specific examples of the alkyl group and cycloalkyl group of $R_{208}$, $R_{209}$ and $R_{210}$ include the same specific examples of the alkyl group and cycloalkyl group as $R_{201}$, $R_{202}$ and $R_{203}$ in the formula (ZI-2).

Examples of the alkylene group of A include alkylene groups having 1 to 12 carbon atoms (for example, a methylene group, an ethylene group, a propylene group, an isopropylene group, a butylene group, and an isobutylene group); examples of the alkenylene group of A include alkenylene groups having 2 to 12 carbon atoms (for example, an ethenylene group, a propenylene group, and a butenylene group); and examples of the arylene group of A include arylene groups having 6 to 10 carbon atoms (for example, a phenylene group, a tolylene group, and a naphthylene group).

Among the acid generators, more preferred examples include compounds represented by the formula (ZI) to (ZIII).

Furthermore, the acid generator is preferably a compound which has one sulfonic acid or imide group and generates an acid, and more preferably a monovalent compound which generates a perfluoroalkanesulfonic acid, a monovalent compound which generates an aromatic sulfonic acid substituted with a fluorine atom or a group containing a fluorine atom, or a monovalent compound which generates an imide acid substituted with a fluorine atom or a group containing a fluorine atom. Even more preferably, the acid generator is a fluorinated substituted alkanesulfonic acid, a fluorine-substituted benzenesulfonic acid, a fluorine-substituted imide acid, or a sulfonium salt of a fluorine-substituted methide acid. The acid generator that can be used is particularly preferably a fluorinated substituted alkanesulfonic acid, a fluorinated substituted benzenesulfonic acid, or a fluorinated substituted imide acid, which generates an acid having a pKa of −1 or less, and the sensitivity is enhanced.

Among the acid generators, particularly preferred examples will be listed below.

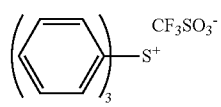

(z1)

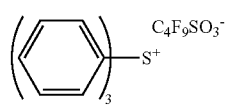

(z2)

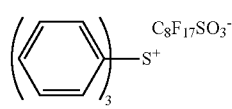

(z3)

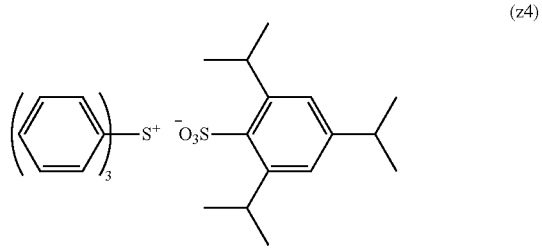

(z4)

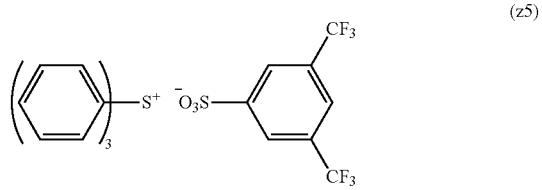

(z5)

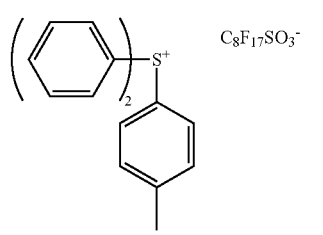

(z6)

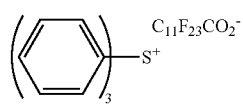

(z7)

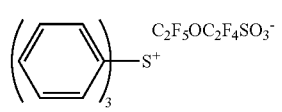

(z8)

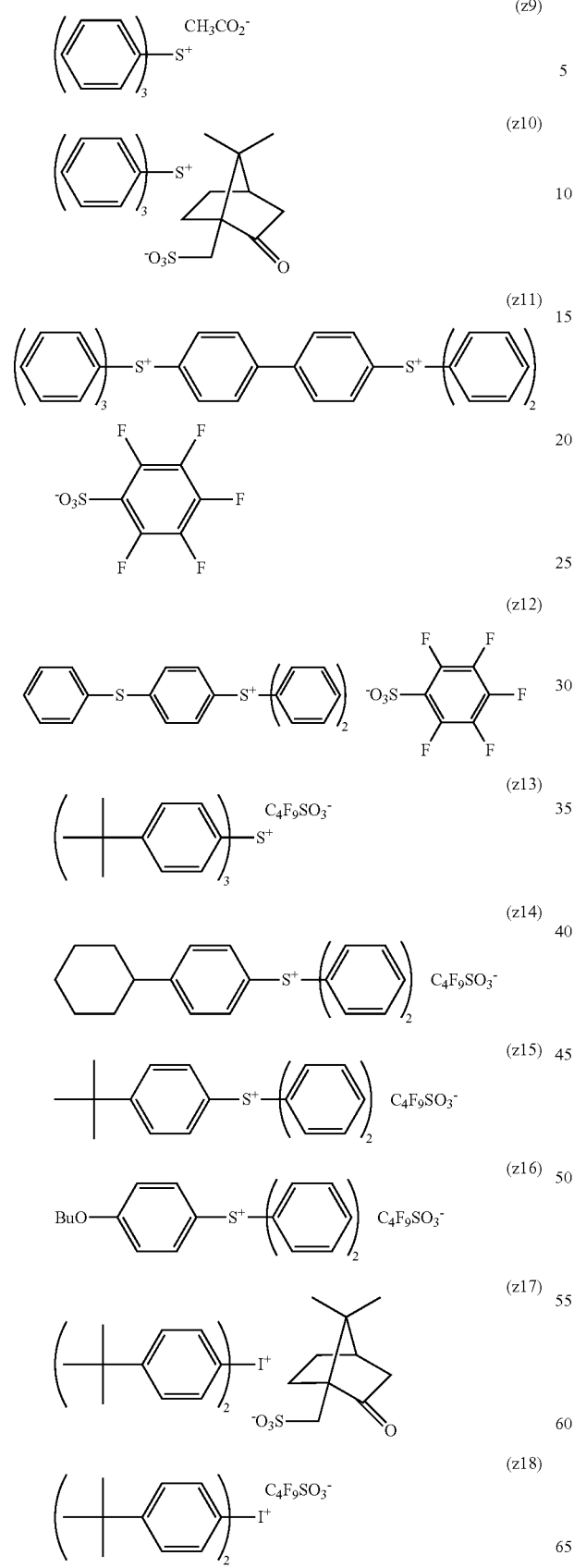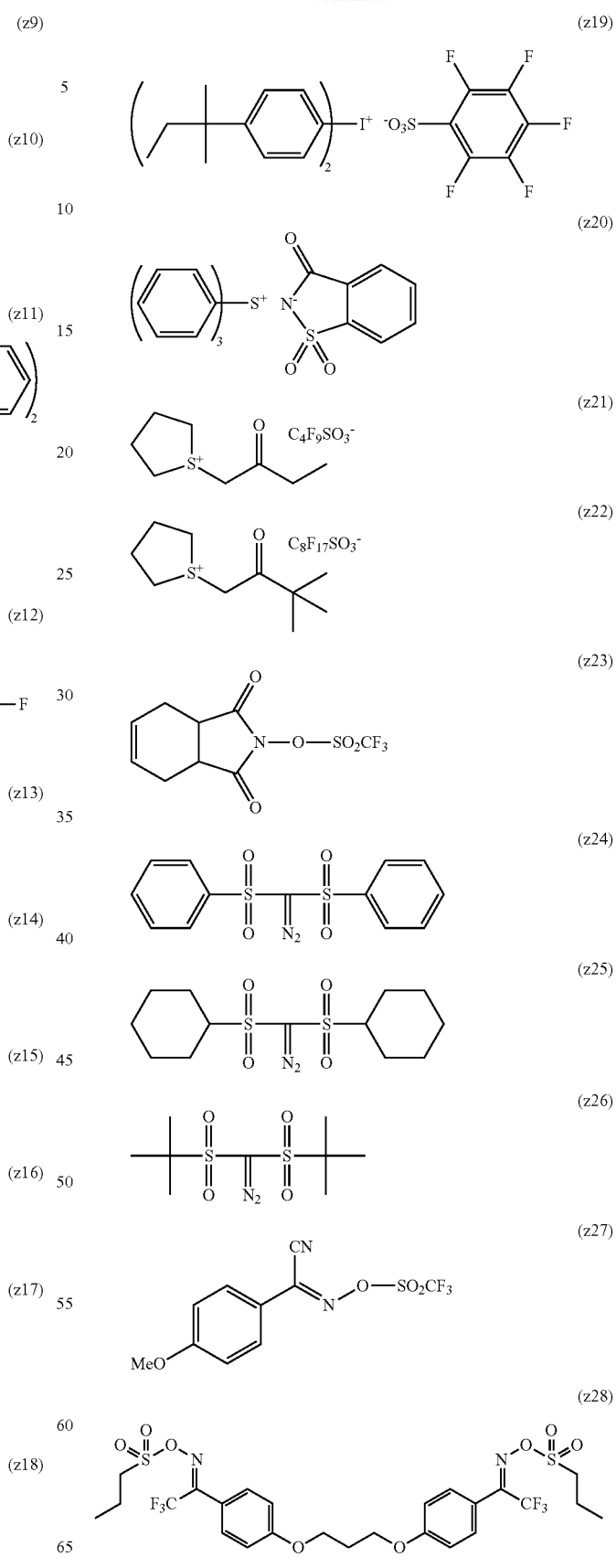

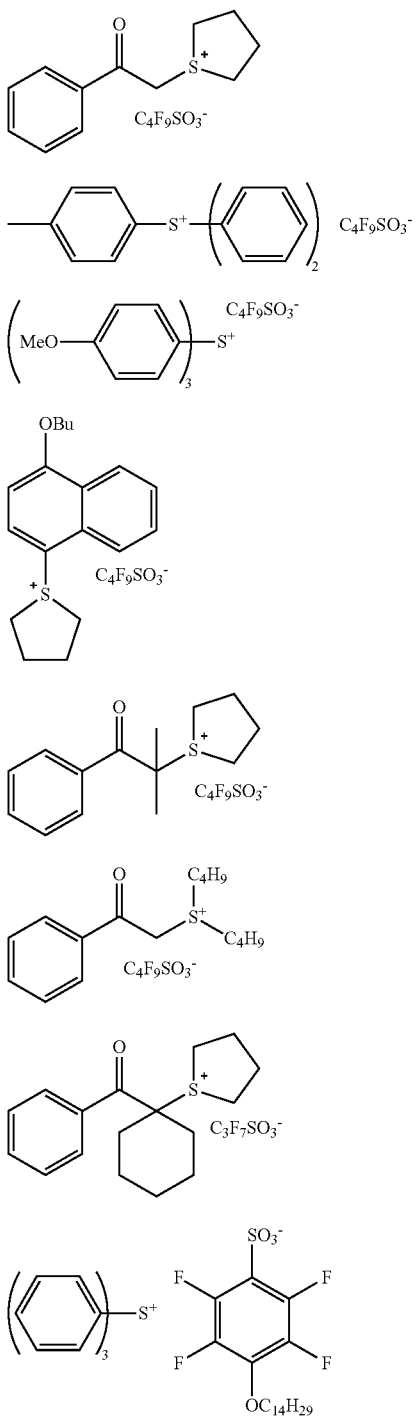
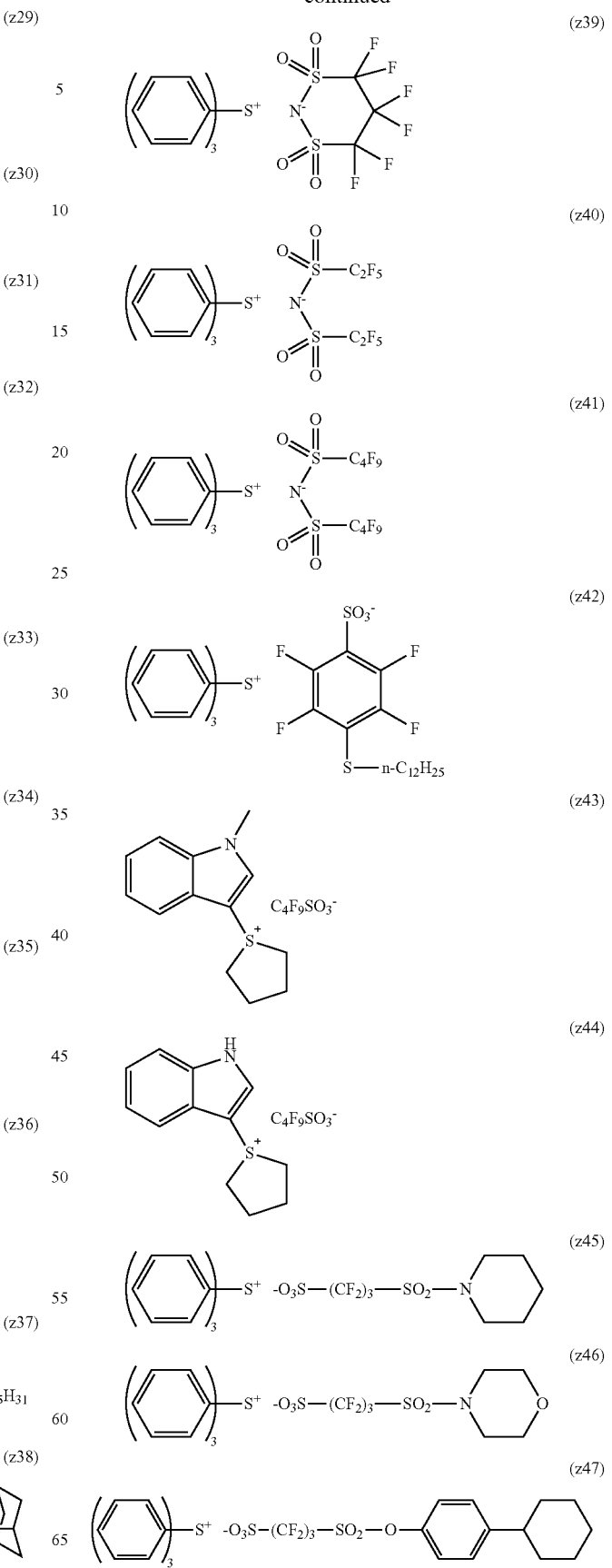

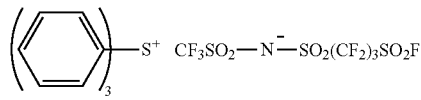 (z48)
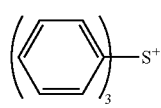 (z49)
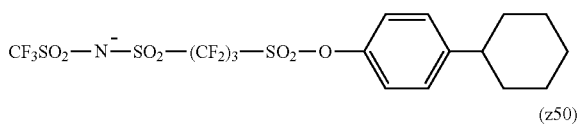
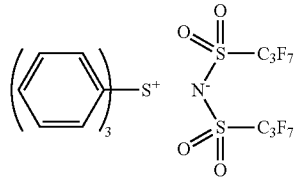 (z50)
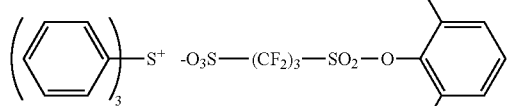 (z51)
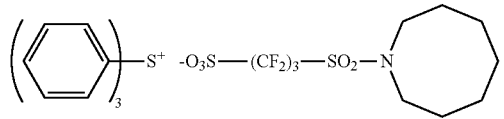 (z52)
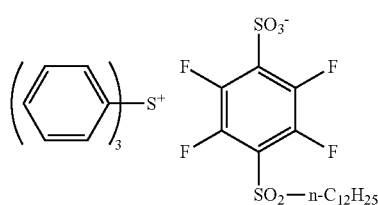 (z53)
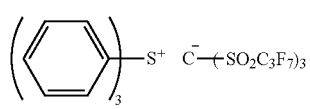 (z54)
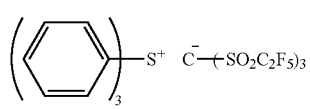 (z55)
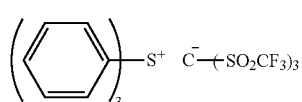 (z56)
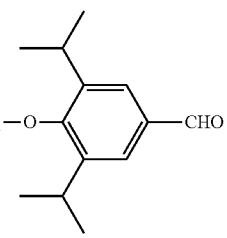 (z57)
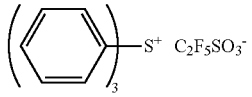 (z58)
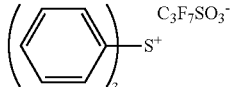 (z59)
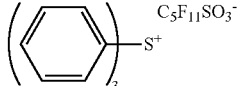 (z60)
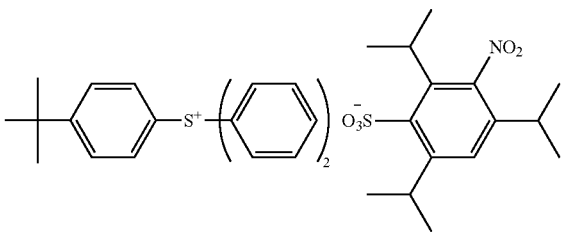 (z61)
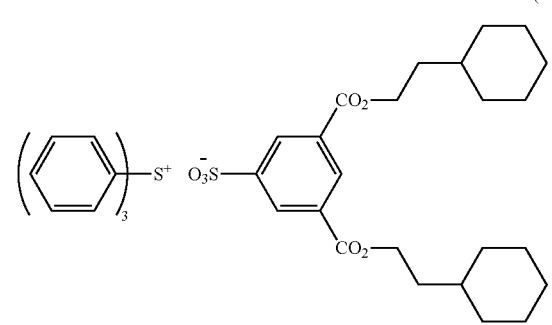 (z62)
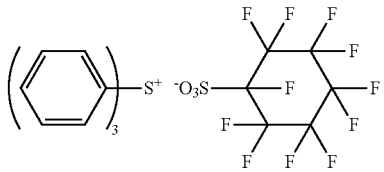 (z63)
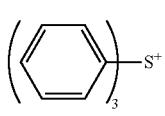 (z64)
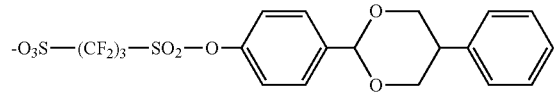

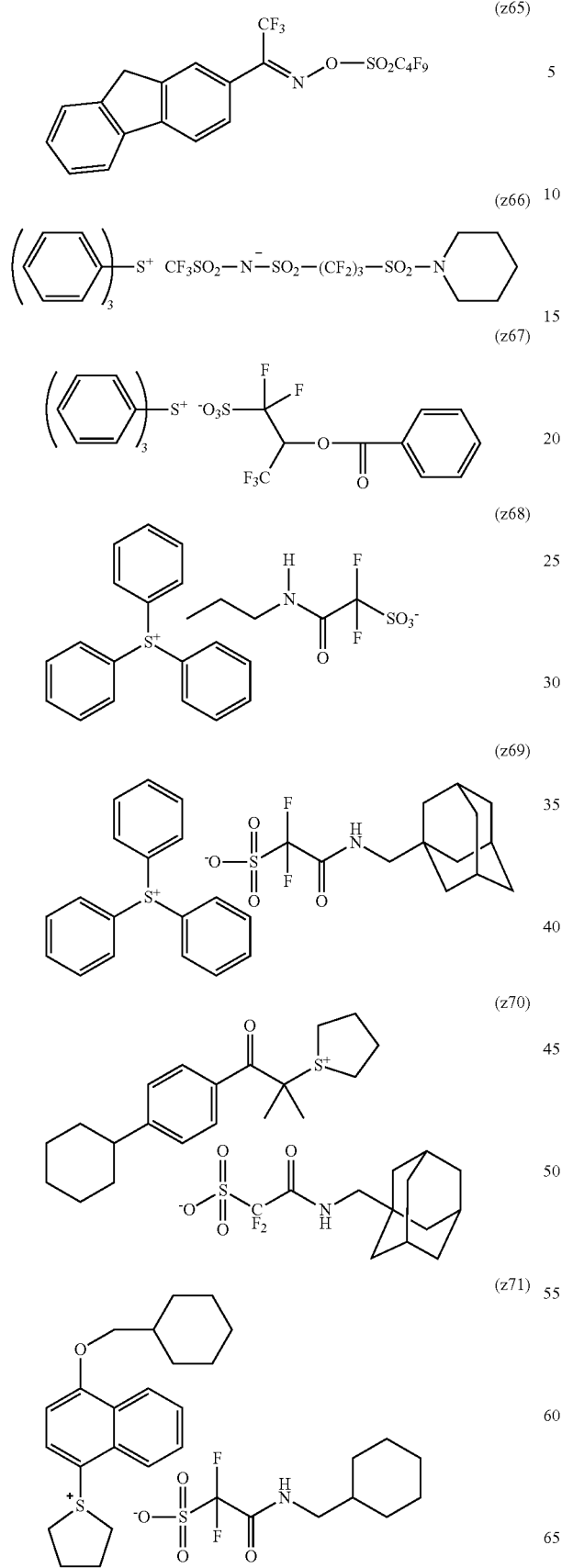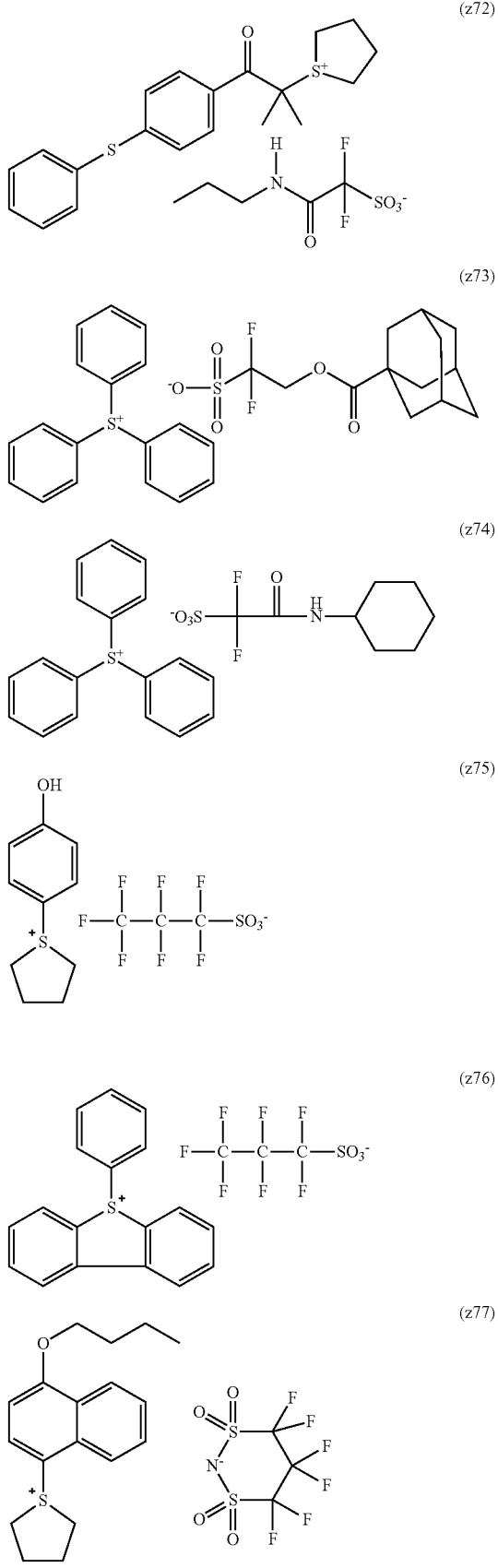

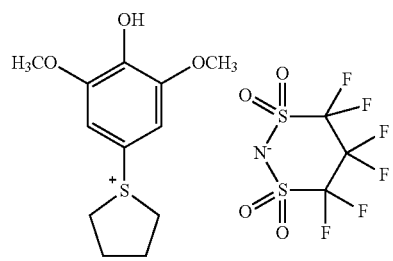
(z78)
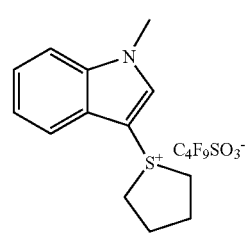
(z83)
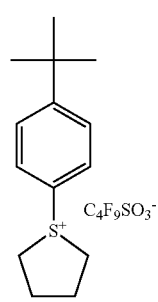
(z80)
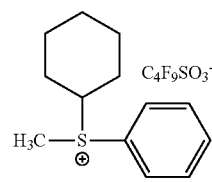
(z84)
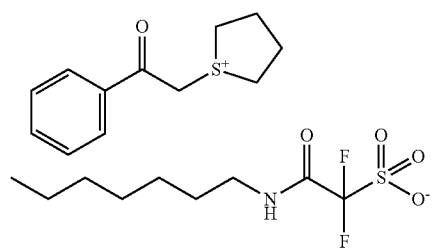
(z79)
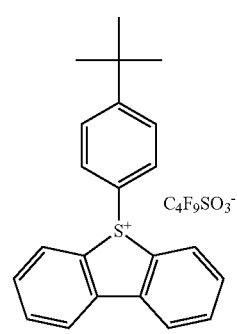
(z85)
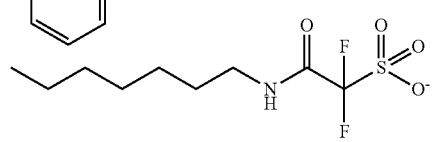
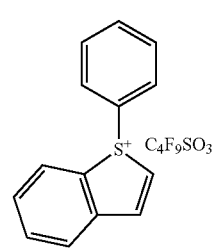
(z86)
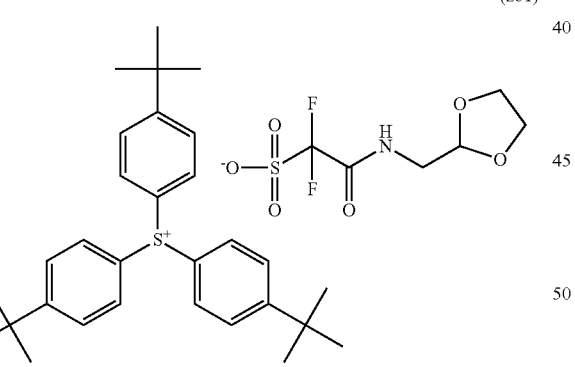
(z81)
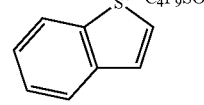
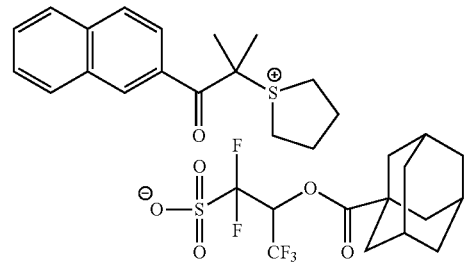
(z87)
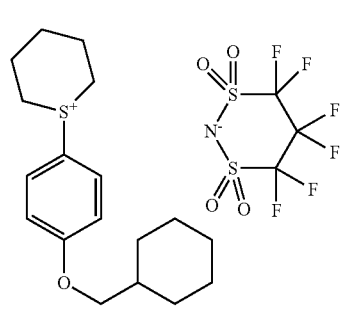
(z82)
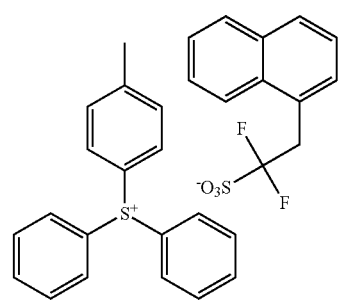
(z88)
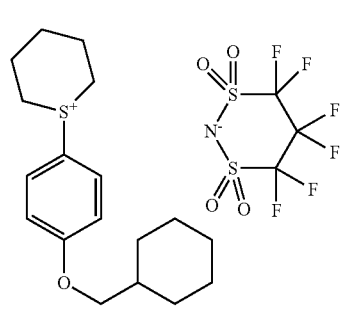

-continued
(z89)
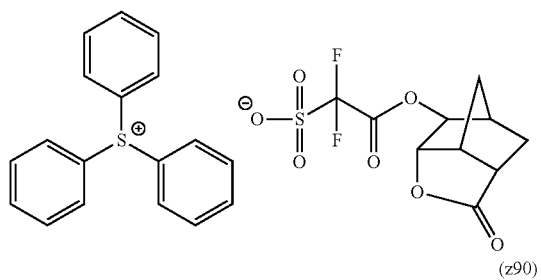
(z90)
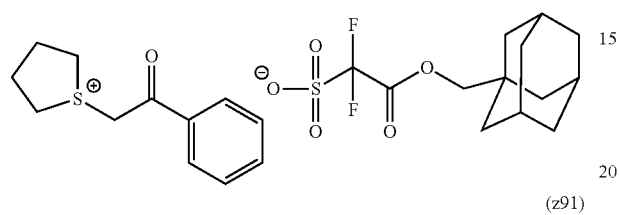
(z91)
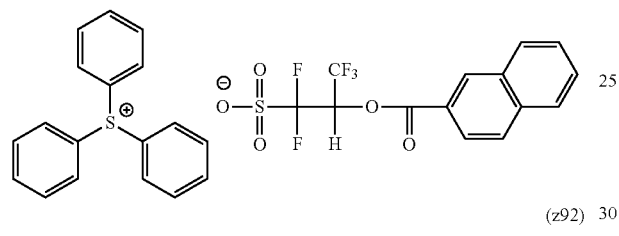
(z92)
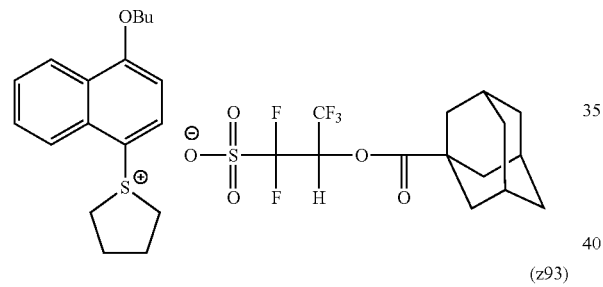
(z93)
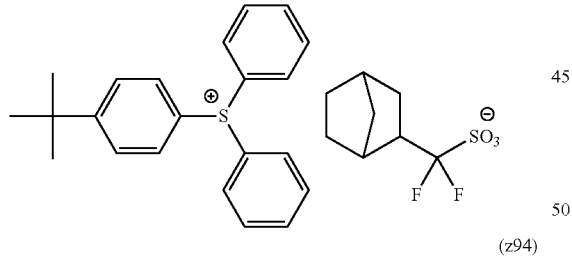
(z94)
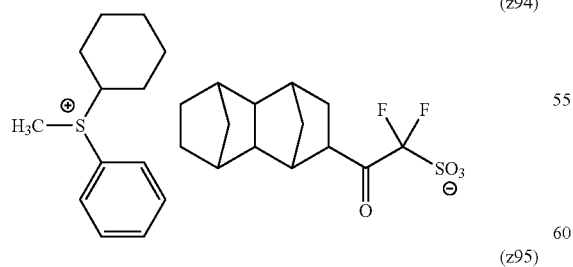
(z95)
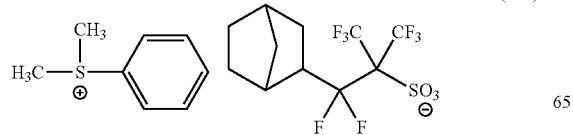
-continued
(z96)
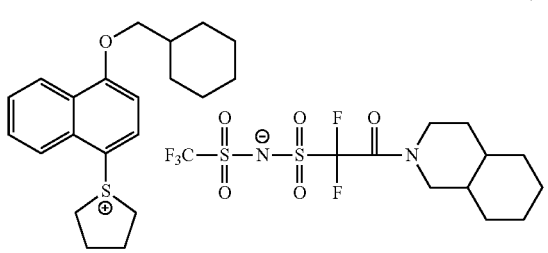
(z97)
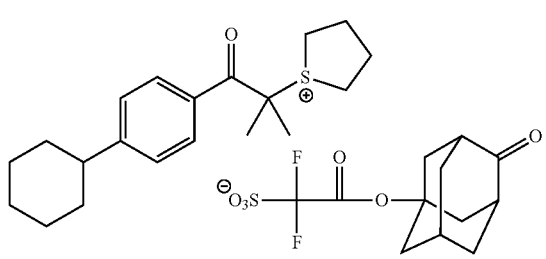
(z98)
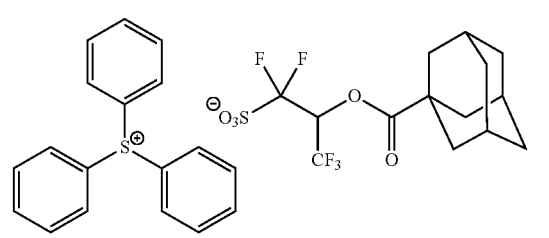
(z99)
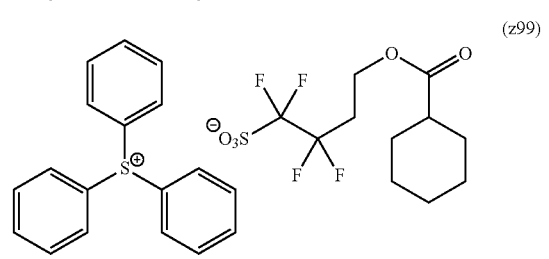
(z100)
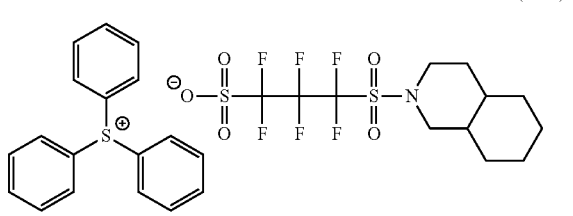
(z101)
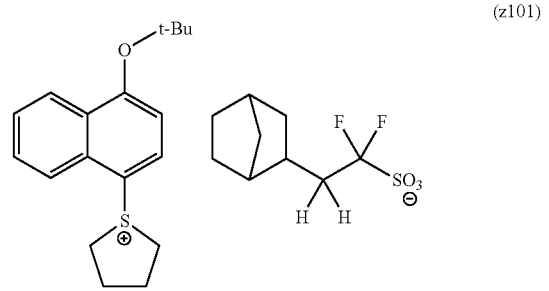

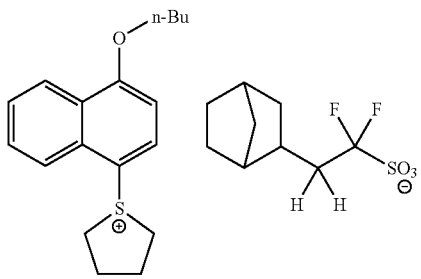

(z102)

The acid generator can be synthesized by a known method, and for example, the acid generator can be synthesized according to the method described in JP 2007-161707 A.

The acid generator can be used individually, or two or more kinds can be used in combination.

The content of the compound which generates an acid when irradiated with an actinic ray or a radiation in the composition is preferably 0.1% to 30% by mass, more preferably 0.5% to 25% by mass, even more preferably 3% to 20% by mass, and particularly preferably 3% to 15% by mass, based on the total solids content of the chemical amplification resist composition.

Furthermore, when the acid generator is represented by the formula (ZI-3) or (ZI-4), the content of the acid generator is preferably 5% to 35% by mass, more preferably 8% to 30% by mass, even more preferably 9% to 30% by mass, and particularly preferably 9% to 25% by mass, based on the total solids content of the composition.

[3-1] Basic compound or ammonium salt compound (C), each of which has decreasing basicity when irradiated with actinic ray or radiation The chemical amplification resist composition according to the present invention preferably includes a basic compound or ammonium salt compound, each of which has decreasing basicity when irradiated with an actinic ray or a radiation (hereinafter, also referred to as "compound (C)").

Since the compound (C) is a basic compound or an ammonium salt compound, it has a function of capturing acid. Therefore, in the unexposed areas, since the compound (C) can capture the acid that diffuses from the exposed areas, the compound (C) can prevent the problem that the reaction by which the solubility of the resin in an organic developer is decreased under the action of acid occurs even at the unexposed areas.

On the other hand, in the exposed areas, it is preferable that the reaction of the resin under the action of acid as described above can be securely carried out. Here, since the compound (C) is a compound which has decreasing basicity when irradiated with an actinic ray or a radiation, the acid-capturing function of the compound (C) is deactivated or reduced in the exposed areas. Thereby, the reaction of the resin under the action of acid as described above, which is necessary in the exposed areas, is not easily inhibited due to the compound (C).

As discussed above, it is speculated that the compound (C) causes an increase in the dissolution contrast of the exposed areas and the unexposed areas in an organic developer, and thereby, a desired hole pattern can be more reliably formed.

The compound (C) is preferably a compound (C-1) having a basic functional group or an ammonium group and a group which produces an acidic functional group when irradiated with an actinic ray or a radiation. That is, the compound (C) is preferably a basic compound having a basic functional group and a group which produces an acidic functional group when irradiated with an actinic ray or a radiation, or an ammonium salt compound having an ammonium group and a group which produces an acidic functional group when irradiated with an actinic ray or a radiation.

Examples of the compound having decreased basicity, which is produced when the compound (C) or (C-1) is produced by being degraded by irradiation of an actinic ray or a radiation, include compounds represented by the following formulae (PA-I), (PA-II) and (PA-III). From the viewpoint that a balance between excellent effects in terms of the LWR, local uniformity of the pattern dimensions, and DOF can be achieved at a high level, compounds represented by the formula (PA-II) and (PA-III) are particularly preferred.

First, the compound represented by the formula (PA-I) will be described.

$$Q\text{-}A_1\text{-}(X)_n\text{—}B\text{—}R \qquad (PA\text{-}I)$$

In the formula (PA-I), $A_1$ represents a single bond or a divalent linking group.

Q represents —$SO_3H$ or —$CO_2H$. Q corresponds to the acidic functional group that is produced by irradiation with an actinic ray or a radiation.

X represents —$SO_2$— or —CO—.

n represents 0 or 1.

B represents a single bond, an oxygen atom, or —N(Rx)-.

Rx represents a hydrogen atom or a monovalent organic group.

R represents a monovalent organic group having a basic functional group, or a monovalent organic group having an ammonium group.

The divalent linking group for $A_1$ is preferably a divalent linking group having 2 to 12 carbon atoms, and examples include an alkylene group and a phenylene group. The divalent linking group is more preferably an alkylene group having at least one fluorine atom, which has preferably 2 to 6 carbon atoms, and more preferably 2 to 4 carbon atoms. The divalent linking group may have a linking group such as an oxygen atom or a sulfur atom in the alkylene chain. The alkylene group is particularly preferably an alkylene group in which 30% to 100% of the hydrogen atoms have been substituted by fluorine atoms, and is more preferably such that the carbon atoms bonded to the Q moiety have fluorine atoms. A perfluoroalkylene group is more preferred, and a perfluoroethylene group, a perfluoropropylene group, or a perfluorobutylene group is even more preferred.

The monovalent organic group for Rx preferably has 4 to 30 carbon atoms, and examples include an alkyl group, a cycloalkyl group, an aryl group, an aralkyl group, and an alkenyl group.

The alkyl group for Rx may be substituted, and preferred examples include linear and branched alkyl groups having 1 to 20 carbon atoms. The alkyl group may have an oxygen atom, a sulfur atom, or a nitrogen atom in the alkyl chin.

Meanwhile, particular examples of the alkyl group having a substituent include groups in which a linear or branched alkyl group is substituted with a cycloalkyl group (for example, an adamantylmethyl group, an adamantylethyl group, a cyclohexylethyl group, and a camphor residue).

The cycloalkyl group for Rx may have a substituent, and preferred examples include cycloalkyl groups having 3 to 20 carbon atoms. The cycloalkyl group may have an oxygen atom in the ring.

The aryl group for Rx may have a substituent, and preferred examples include aryl groups having 6 or 14 carbon atoms.

The aralkyl group for Rx may have a substituent, and preferred examples include aralkyl groups having 7 to 20 carbon atoms.

The alkenyl group for Rx may have a substituent, and preferred examples include groups having a double bond at any position in the alkyl group listed as Rx.

Preferred examples of the partial structure of the basic functional group include the structures of crown ethers, primary to tertiary amines, and nitrogen-containing heterocyclic rings (pyridine, imidazole, pyrazine, and the like).

Preferred examples of the partial structure of the ammonium group include the structures of primary to tertiary ammonium, pyridinium, imidazolinium, and pyrazinium.

Meanwhile, the basic functional group is preferably a functional group having a nitrogen atom, and more preferably a structure having a primary to tertiary amino group, or a nitrogen-containing heterocyclic structure. In these structures, it is preferable that all the atoms that are adjacent to the nitrogen atom that is contained in the structure be carbon atoms or hydrogen atoms, from the viewpoint of enhancing basicity. Furthermore, from the viewpoint of enhancing basicity, it is preferable that an electron-withdrawing functional group (a carbonyl group, a sulfonyl group, a cyano group, a halogen atom or the like) be not directly bonded to the nitrogen atom.

The monovalent organic group in the monovalent organic group (group R) containing such a structure preferably has 4 to 30 carbon atoms, and examples include an alkyl group, a cycloalkyl group, an aryl group, an aralkyl group, and an alkenyl group. The various groups may have a substituent.

The alkyl group, cycloalkyl group, aryl group, aralkyl group, and alkenyl group in the alkyl group, cycloalkyl group, aryl group, aralkyl group, and alkenyl group containing a basic functional group or an ammonium group for R, are respectively the same as the alkyl group, cycloalkyl group, aryl group, aralkyl group, and alkenyl group listed as Rx.

Examples of the substituent that may be carried by the various groups described above include a halogen atom, a hydroxyl group, a nitro group, a cyano group, a carboxyl group, a carbonyl group, a cycloalkyl group (preferably having 3 to 10 carbon atoms), an aryl group (preferably having 6 to 14 carbon atoms), an alkoxy group (preferably having 1 to 10 carbon atoms), an acyl group (preferably having 2 to 20 carbon atoms), an acyloxy group (preferably having 2 to 10 carbon atoms), an alkoxycarbonyl group (preferably having 2 to 20 carbon atoms), and an aminoacyl group (preferably having 2 to 20 carbon atoms). A further substituent for the cyclic structure in the aryl group, cycloalkyl group and the like may be an alkyl group (preferably having 1 to 20 carbon atoms). A further substituent for the aminoacyl group may be one or two alkyl groups (preferably having 1 to 20 carbon atoms).

When B represents —N(Rx)-, it is preferable that R and Rx be joined together to form a ring. When a cyclic structure is formed, stability is enhanced, and the storage stability of the composition using this is enhanced. The number of carbon atoms that form a ring is preferably 4 to 20, and the cyclic structure may be monocyclic or polycyclic. The ring may contain an oxygen atom, a sulfur atom, or a nitrogen atom.

Examples of the monocyclic structure include 4-membered to 8-membered rings containing nitrogen atoms. Examples of the polycyclic structure include structures formed from combinations of two or three or more monocyclic structures. The monocyclic structure and the polycyclic structure may have substituents, and preferred examples include a halogen atom, a hydroxyl group, a cyano group, a carboxyl group, a carbonyl group, a cycloalkyl group (preferably having 3 to 10 carbon atoms), an aryl group (preferably having 6 to 14 carbon atoms), an alkoxy group (preferably having 1 to 10 carbon atoms), an acyl group (preferably having 2 to 15 carbon atoms), an acyloxy group (preferably having 2 to 15 carbon atoms), an alkoxycarbonyl group (preferably having 2 to 15 carbon atoms), and an aminoacyl group (preferably having 2 to 20 carbon atoms). A further substituent for the cyclic structure in the aryl group, cycloalkyl group and the like may be an alkyl group (preferably having 1 to 15 carbon atoms). A further substituent for the aminoacyl group may be one or two alkyl groups (preferably having 1 to 15 carbon atoms).

Among the compounds represented by the formula (PA-I), a compound in which the Q moiety is sulfonic acid can be synthesized using a general sulfonamidation reaction. For example, such a compound can be obtained by a method of selectively allowing one of the sulfonyl halide moieties of a bissulfonyl halide compound to react with an amine compound to form a sulfonamide bond, and then hydrolyzing the other sulfonyl halide moiety; or a method of allowing a cyclic sulfonic acid anhydride to react with an amine compound to open the ring.

Next, the compound represented by the formula (PA-II) will be described.

$$Q_1\text{-}X_1\text{—}NH\text{—}X_2\text{-}Q_2 \qquad \text{(PA-II)}$$

In the formula (PA-II), $Q_1$ and $Q_2$ each independently represent a monovalent organic group. However, any one of $Q_1$ and $Q_2$ has a basic functional group. $Q_1$ and $Q_2$ may be joined to form a ring, and the ring thus formed may have a basic functional group.

$X_1$ and $X_2$ each independently represent —CO— or —SO$_2$—.

Meanwhile, —NH— corresponds to the acidic functional group that is produced when irradiated with an actinic ray or a radiation.

In the formula (PA-II), the monovalent organic group as $Q_1$ and $Q_2$ preferably has 1 to 40 carbon atoms, and examples include an alkyl group, a cycloalkyl group, an aryl group, an aralkyl group, and an alkenyl group.

The alkyl group for $Q_1$ and $Q_2$ may have a substituent, and is preferably a linear or branched alkyl group having 1 to 30 carbon atoms. The alkyl group may have an oxygen atom, a sulfur atom, or a nitrogen atom in the alkyl chain.

The cycloalkyl group for $Q_1$ and $Q_2$ may have a substituent, and is preferably a cycloalkyl group having 3 to 20 carbon atoms. The cycloalkyl group may have an oxygen atom or a nitrogen atom in the ring.

The aryl group for $Q_1$ and $Q_2$ may have a substituent, and is preferably an aryl group having 6 to 14 carbon atoms.

The aralkyl group for $Q_1$ and $Q_2$ may have a substituent, and is preferably an aralkyl group having 7 to 20 carbon atoms.

The alkenyl group for $Q_1$ and $Q_2$ may have a substituent, and may be a group having a double bond at any position in the alkyl group described above.

Examples of the substituent which may be carried by the various groups include a halogen atom, a hydroxyl group, a nitro group, a cyano group, a carboxyl group, a carbonyl group, a cycloalkyl group (preferably having 3 to 10 carbon atoms), an aryl group (preferably having 6 to 14 carbon atoms), an alkoxy group (preferably having 1 to 10 carbon atoms), an acyl group (preferably having 2 to 20 carbon atoms), an acyloxy group (preferably having 2 to 10 carbon atoms), an alkoxycarbonyl group (preferably having 2 to 20 carbon atoms), and an aminoacyl group (preferably having 2 to 10 carbon atoms). A further substituent for the cyclic structure for the aryl group, cycloalkyl group and the like may be an alkyl group (preferably having 1 to 10 carbon atoms). A further substituent for the aminoacyl group may be an alkyl group (preferably having 1 to 10 carbon atoms). Examples of the alkyl group having a substituent include perfluoroalkyl groups such as a perfluoromethyl group, a perfluoroethyl group, a perfluoropropyl group, and a perfluorobutyl group.

Preferred examples of the partial structure of the basic functional group carried by at least any one of $Q_1$ and $Q_2$ include the same groups described as the basic functional groups carried by R of the formula (PA-I).

Examples of the structure in which $Q_1$ and $Q_2$ are joined to form a ring, and the ring thus formed has a basic functional group, include structures in which the organic groups of $Q_1$ and $Q_2$ are further bonded to an alkylene group, an oxy group, an imino group and the like.

In the formula (PA-II), at least one of $X_1$ and $X_2$ is preferably $-SO_2-$.

Next, the compound represented by the formula (PA-III) will be described.

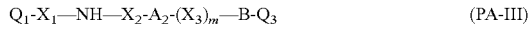

$$Q_1\text{-}X_1\text{—NH—}X_2\text{-}A_2\text{-}(X_3)_m\text{—B-}Q_3 \quad \text{(PA-III)}$$

In the formula (PA-III), $Q_1$ and $Q_3$ each independently represent a monovalent organic group. However, any one of $Q_1$ and $Q_3$ has a basic functional group. $Q_1$ and $Q_3$ may be joined to form a ring, and the ring thus formed may have a basic functional group.

$X_1$, $X_2$ and $X_3$ each independently represent $-CO-$ or $-SO_2-$.

$A_2$ represents a divalent linking group.

B represents a single bond, an oxygen atom, or $-N(Qx)-$.

Qx represents a hydrogen atom or a monovalent organic group.

When B is $-N(Qx)-$, $Q_3$ and Qx may be joined to form a ring.

m represents 0 or 1.

Meanwhile, $-NH-$ corresponds to the acidic functional group produced upon irradiation with an actinic ray or a radiation.

$Q_1$ has the same meaning as $Q_1$ in the formula (PA-II).

Examples of the organic group of $Q_3$ include the same organic groups of $Q_1$ and $Q_2$ in the formula (PA-II).

Furthermore, examples of the structure in which $Q_1$ and $Q_3$ are joined to form a ring, and the ring thus formed has a basic functional group, include structures in which the organic groups of $Q_1$ and $Q_3$ are further bonded to an alkylene group, an oxy group, an imino group, and the like.

The divalent linking group for $A_2$ is preferably a divalent linking group having 1 to 8 carbon atoms and a fluorine atom, and examples include an alkylene group having 1 to 8 carbon atoms and a fluorine atom, and a phenylene group having a fluorine atom. More preferred examples include alkylene groups having a fluorine atom, which preferably 2 to 6 carbon atoms, and more preferably 2 to 4 carbon atoms. The divalent linking group may also have a linking group such as an oxygen atom or a sulfur atom in the alkylene chain. The alkylene group is preferably an alkylene group in which 30% to 100% of the hydrogen atoms have been substituted by fluorine atoms, more preferably a perfluoroalkylene group, and particularly preferably a perfluoroalkylene group having 2 to 4 carbon atoms.

The monovalent organic group in Qx is preferably an organic group having 4 to 30 carbon atoms, and examples include an alkyl group, a cycloalkyl group, an aryl group, an aralkyl group, and an alkenyl group. The alkyl group, cycloalkyl group, aryl group, aralkyl group and alkenyl group may be respectively the same as those groups listed for Rx in the formula (PA-I).

In the formula (PA-III), $X_1$, $X_2$, and $X_3$ are each preferably $-SO_2-$.

The compound (C) is preferably a sulfonium salt compound of the compound represented by the formula (PA-I), (PA-II) or (PA-III), or an iodonium salt compound of the compound represented by the formula (PA-I), (PA-II) or (PA-III), and more preferably a compound represented by the following formula (PA1) or (PA2).

In the formula (PA1), $R'_{201}$, $R'_{202}$ and $R'_{203}$ each independently represent an organic group, and specifically, these are the same as $R_{201}$, $R_{202}$ and $R_{203}$ of the formula ZI for the component (B).

$X^-$ represents a sulfonate anion or a carboxylate anion obtained by detaching a hydrogen atom from the $-SO_3H$ moiety or the $-COOH$ moiety of the compound represented by the formula (PA-I), or an anion obtained by detaching a hydrogen atom from the $-NH-$ moiety of the compound represented by the formula (PA-II) or (PA-III).

In the formula (PA2), $R'_{204}$ and $R'_{205}$ each independently represent an aryl group, an alkyl group or a cycloalkyl group, and specifically, these are the same as $R_{204}$ and $R_{205}$ of the formula ZII for the component (B).

$X^-$ represents a sulfonate anion or a carboxylate anion obtained by detaching a hydrogen atom from the $-SO_3H$ moiety or the $-COOH$ moiety of the compound represented by the formula (PA-I), or an anion obtained by detaching a hydrogen atom from the $-NH-$ moiety of the compound represented by the formula (PA-II) or (PA-III).

The compound (C) is degraded when irradiated with an actinic ray or a radiation, and produces a compound represented by, for example, formula (PA-I), (PA-II) or (PA-III).

The compound represented by the formula (PA-I) is a compound having a sulfonic acid group or a carboxylic acid group together with a basic functional group or an ammonium group, in which basicity has been decreased or lost, or basicity has been changed to acidity, as compared with the compound (C).

The compound represented by the formula (PA-II) or (PA-III) is a compound having an organic sulfonylimino group or an organic carbonylimino group together with a basic functional group, in which basicity has been decreased or lost, or basicity has been changed to acidity, as compared with the compound (C).

According to the present invention, a decrease in the basicity under irradiation with an actinic ray or a radiation means that the acceptor-like properties of the compound (C) toward protons (the acid generated by irradiation with an actinic ray or a radiation) are deteriorated as a result of the irradiation with an actinic ray or a radiation. Deteriorated acceptor-like properties mean that when an equilibrium reaction occurs, by which a non-covalent bonded complex formed from a compound having a basic functional group and a proton, which is a proton adduct, or an equilibrium reaction occurs, by which the counter cation of a compound having an ammonium group is exchanged with a proton, the equilibrium constant in the chemical equilibrium decreases.

As such, when the compound (C) which has decreasing basicity when irradiated with an actinic ray or a radiation is incorporated in the resist film, the acceptor-like properties of the compound (C) is sufficiently expressed in the unexposed areas, and the unintended reaction between the acid that has diffused from exposed areas or the like and the resin (A) can be suppressed. Also, in the exposed areas, since the acceptor-like properties of the compound (C) are decreased, the intended reaction between the acid and the resin (P) occurs more reliably, and there is also contribution of such an operating mechanism. Thus, it is speculated that a pattern which is excellent in the line width roughness (LWR), local uniformity of the pattern dimensions, the depth of focus (DOF), and the pattern shape may be obtained.

Meanwhile, the basicity can be confirmed by performing pH measurement, and the calculated value can also be computed using commercially available software programs.

Specific examples of the compound (C) which generates a compound represented by the formula (PA-I) when irradiated with an actinic ray or a radiation will be listed below, but the present invention is not intended to be limited to these.

(PA-1)

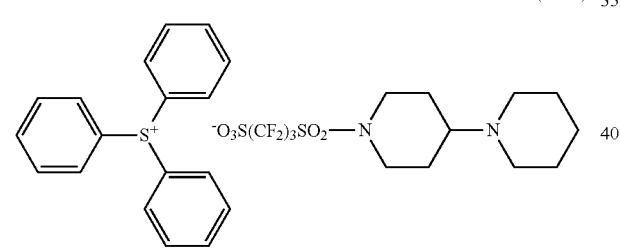

(PA-2)

(PA-3)

(PA-4)

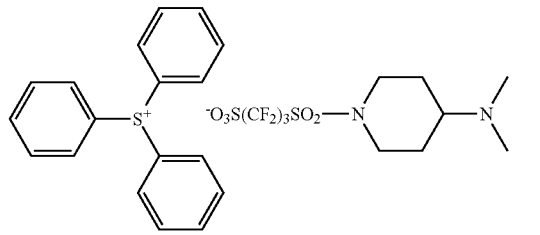

(PA-5)

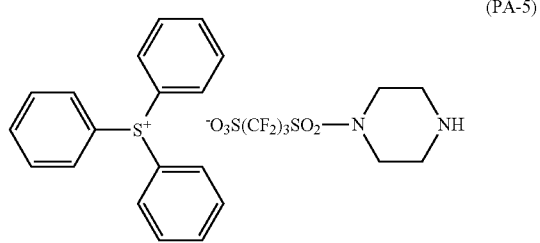

(PA-6)

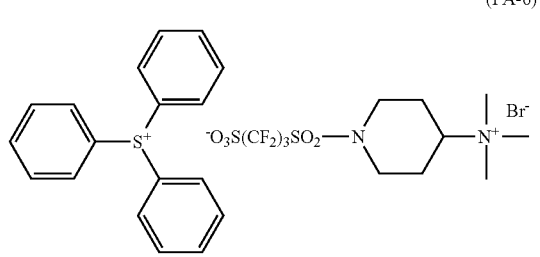

(PA-7)

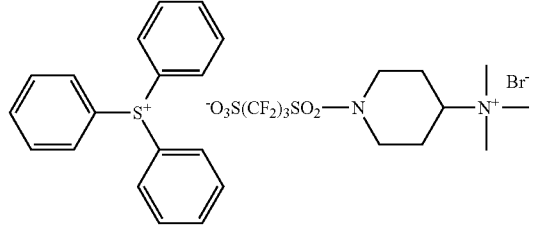

(PA-8)

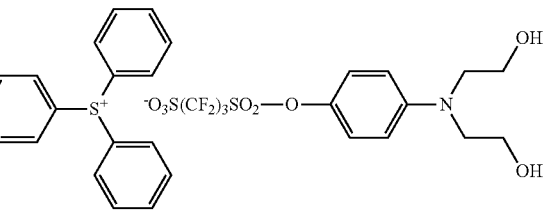

(PA-9)

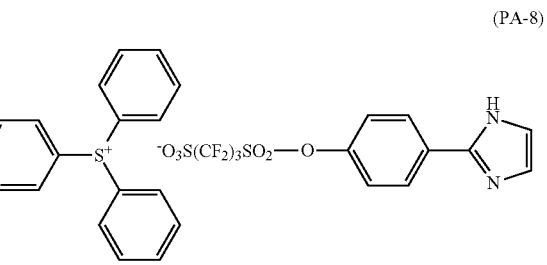

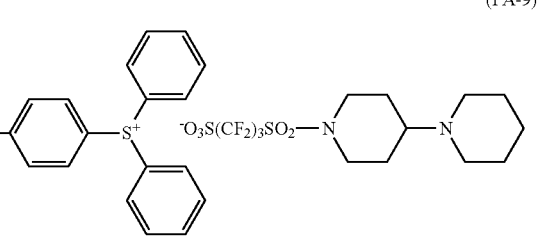

(PA-10)
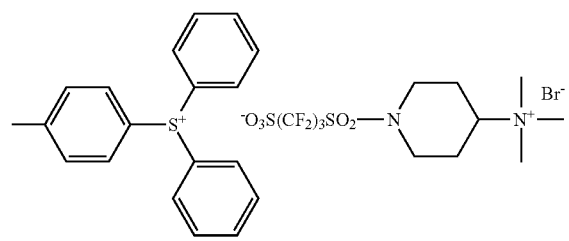
(PA-11)
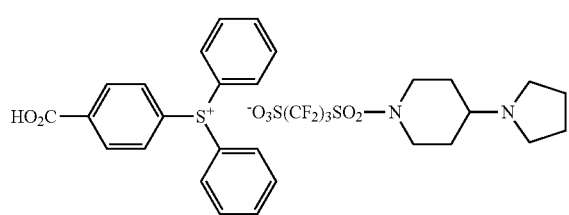
(PA-12)
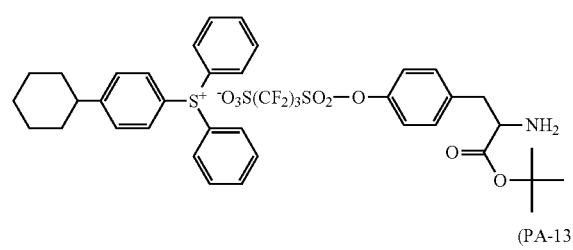
(PA-13)
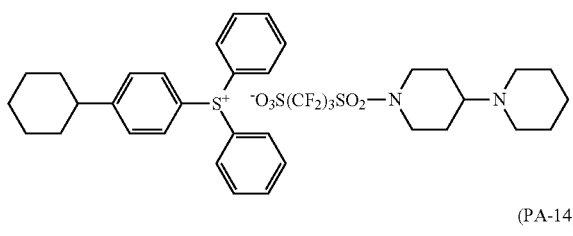
(PA-14)
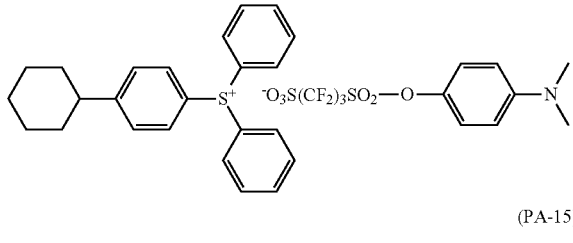
(PA-15)
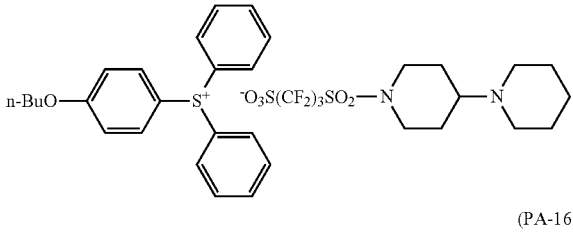
(PA-16)
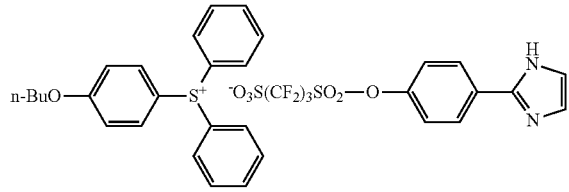
(PA-17)
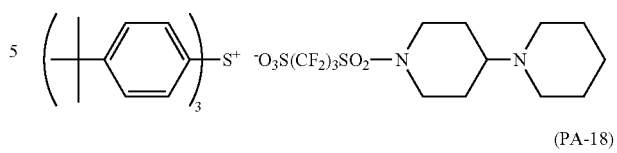
(PA-18)
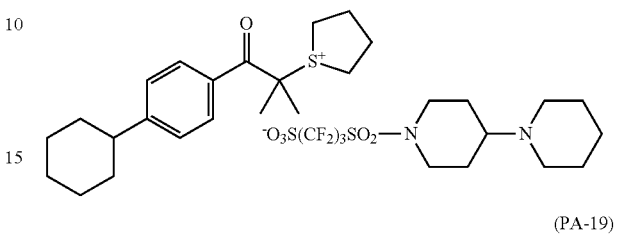
(PA-19)
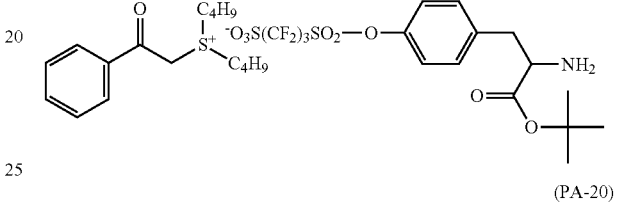
(PA-20)
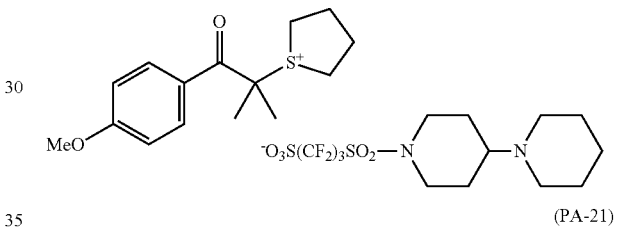
(PA-21)
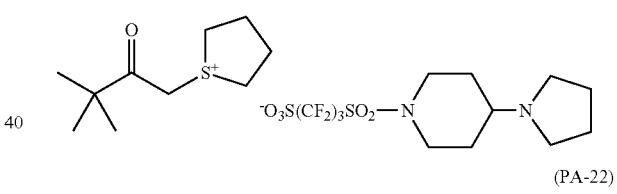
(PA-22)
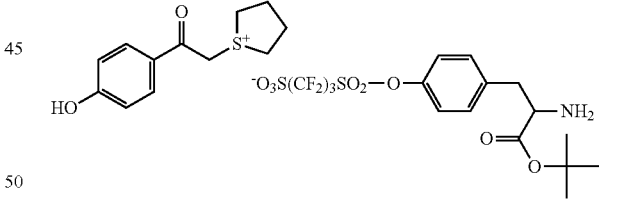
(PA-23)
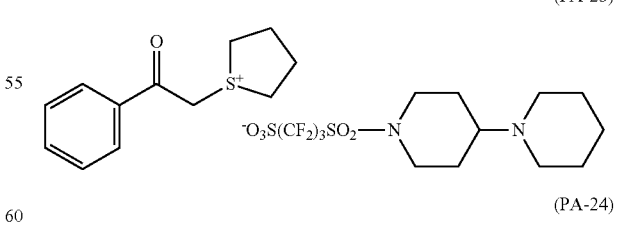
(PA-24)
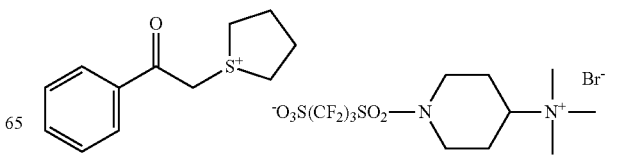

(PA-25)
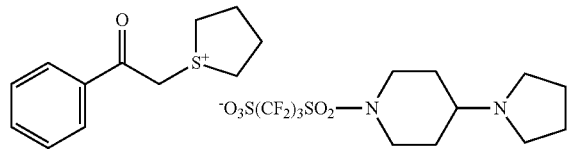
(PA-26)
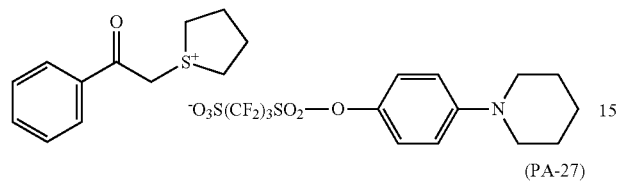
(PA-27)
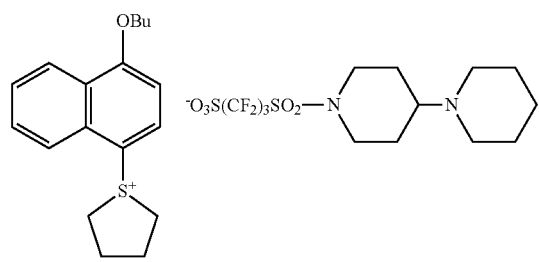
(PA-28)
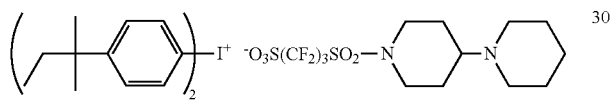
(PA-29)
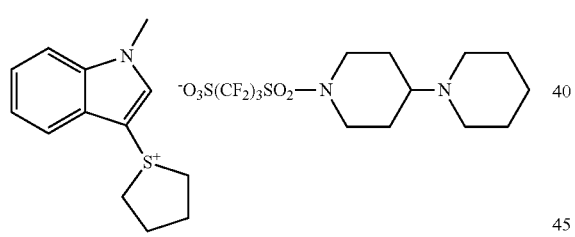
(PA-30)
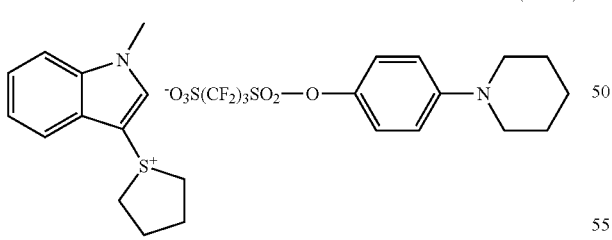
(PA-31)
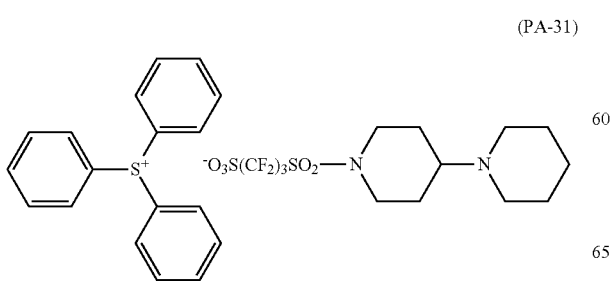
(PA-32)
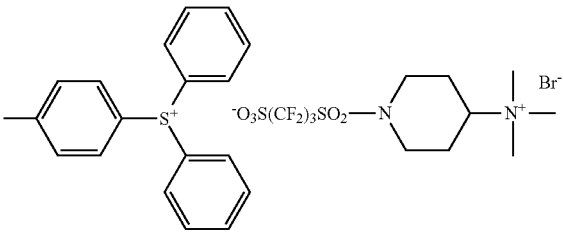
(PA-33)
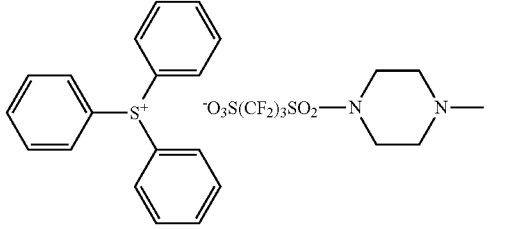
(PA-34)
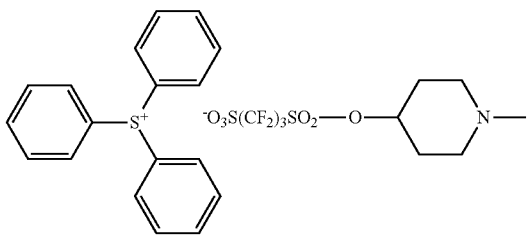
(PA-35)
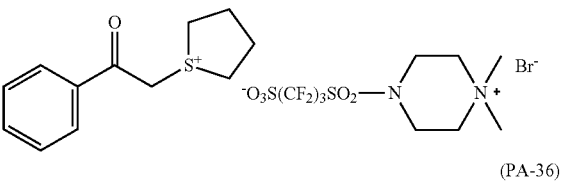
(PA-36)
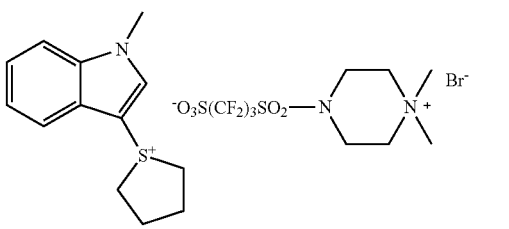
(PA-37)
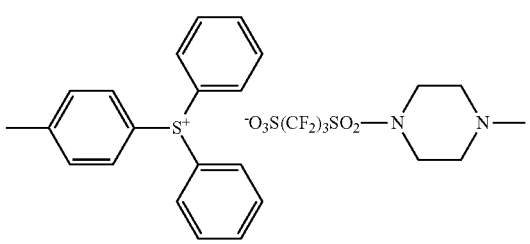
(PA-38)
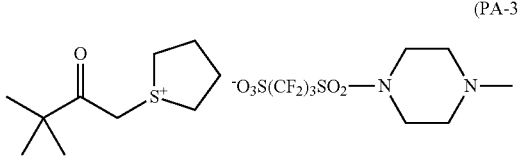

(PA-39)
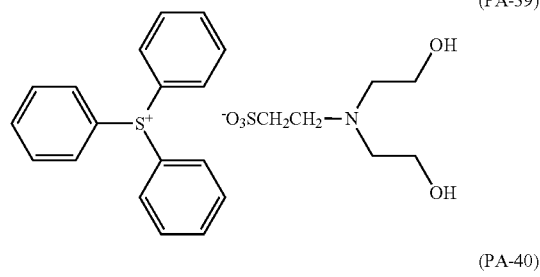
(PA-40)
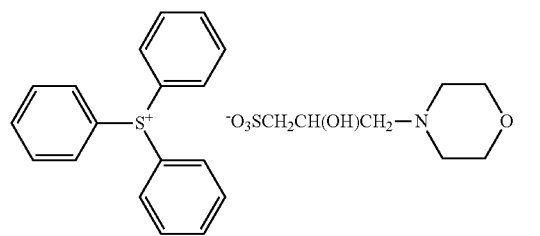
(PA-41)
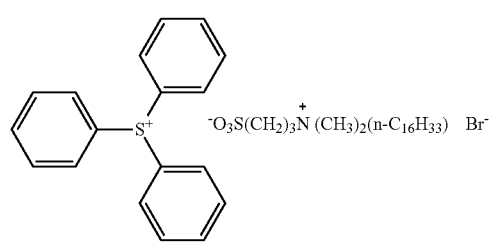
(PA-42)
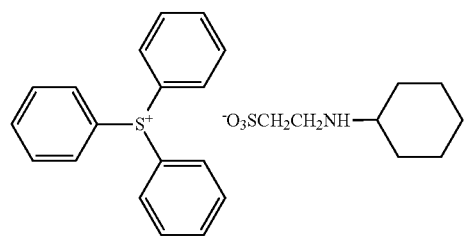
(PA-43)
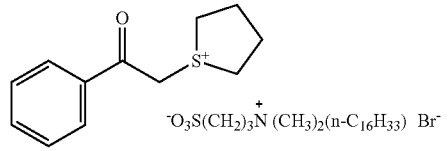
(PA-44)
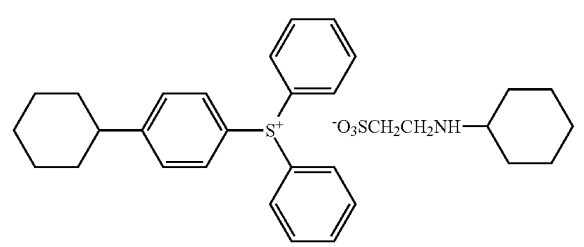
(PA-45)
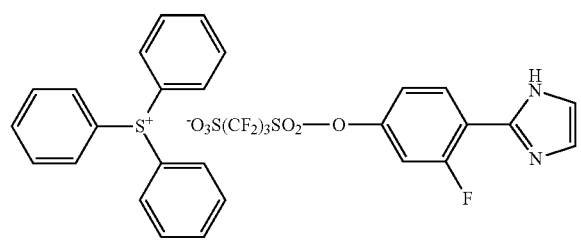
(PA-46)
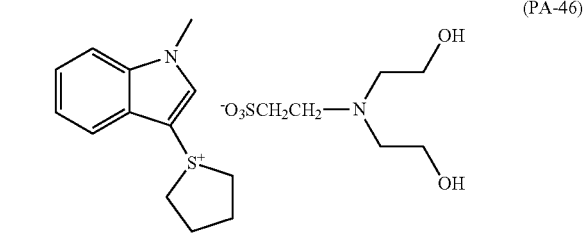
(PA-47)
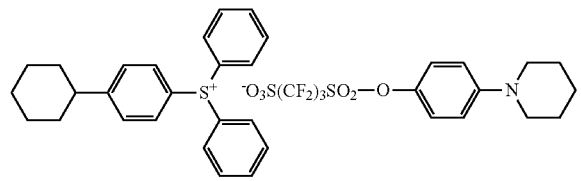
(PA-48)
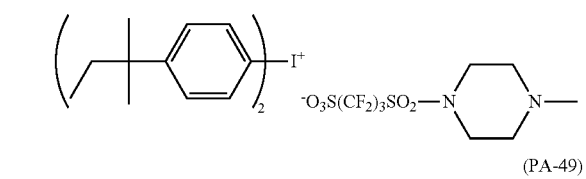
(PA-49)
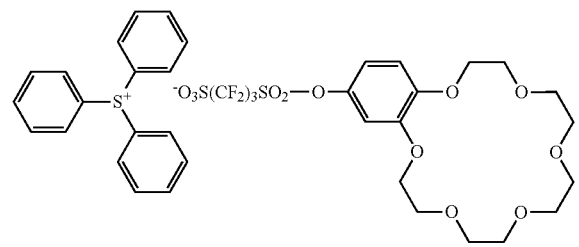
(PA-50)
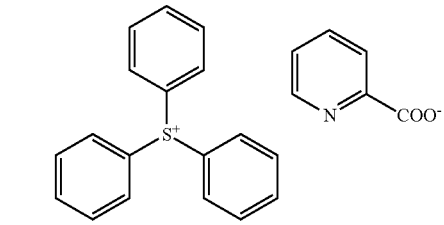
(PA-51)
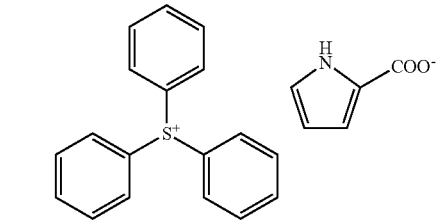

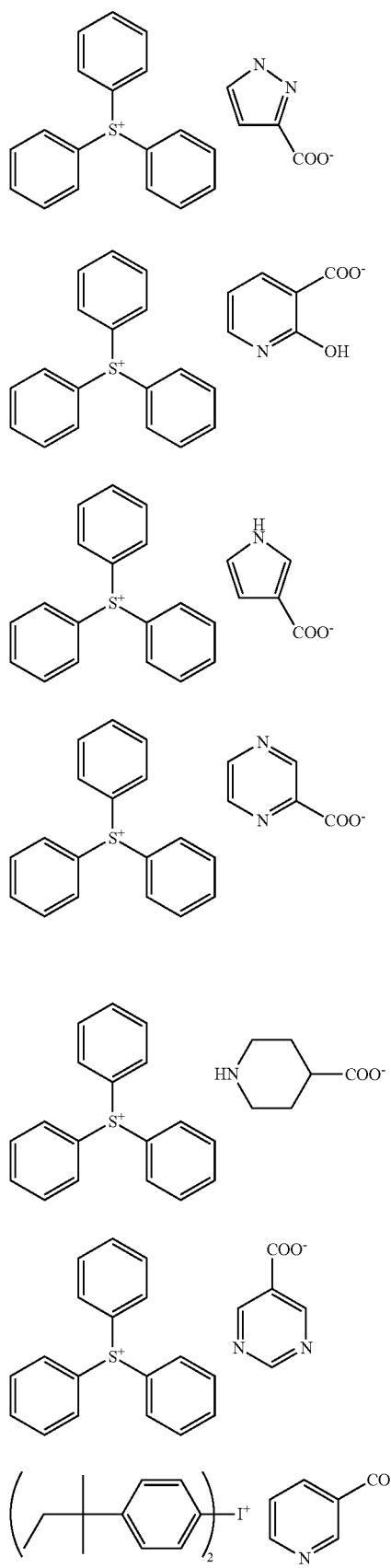

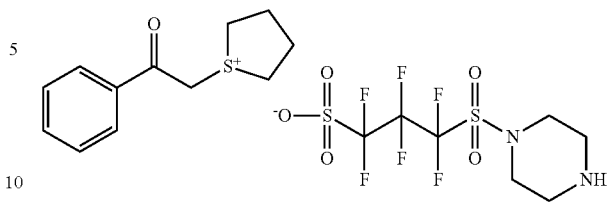

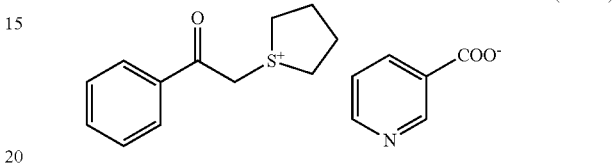

These compounds can be easily synthesized from the compound represented by the formula (PA-I), a lithium, sodium or potassium salt thereof, the hydroxide, bromide, chloride or the like of an iodonium or a sulfonium, using the salt exchange method described in JP 1999-501909 A (JP-H11-501909 A) or JP 2003-246786 A. Furthermore, the synthesis can also be carried out according to the synthesis method described in JP 1995-333851 A (JP-H07-333851 A).

Specific examples of the compound (C) that generates a compound represented by the formula (PA-II) or (PA-III) when irradiated with an actinic ray or a radiation will be listed below, but the present invention is not intended to be limited to these.

(PA-64)
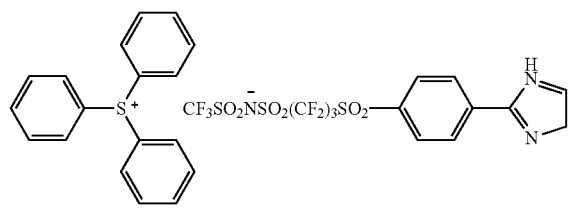
(PA-70)
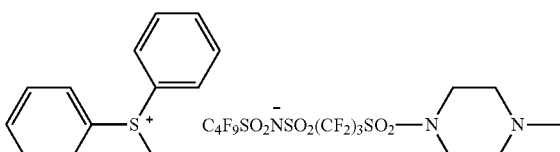
(PA-65)
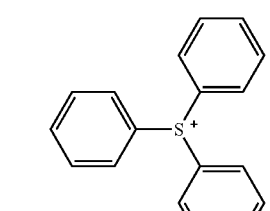
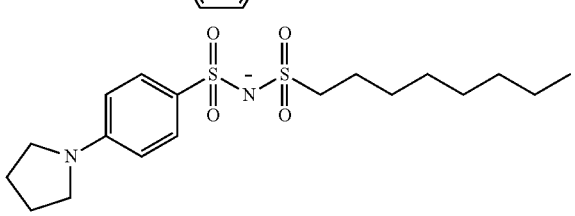
(PA-71)
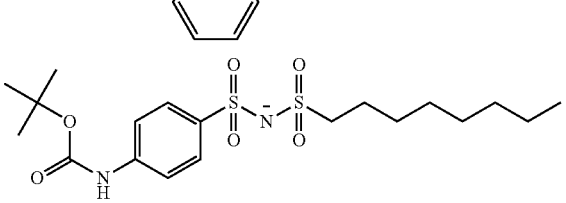
(PA-66)
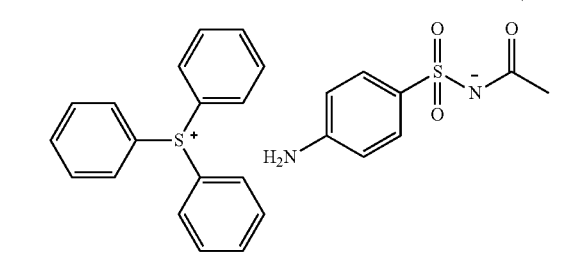
(PA-72)
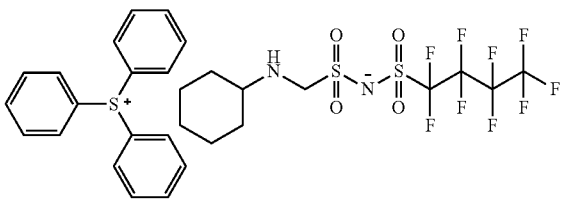
(PA-67)
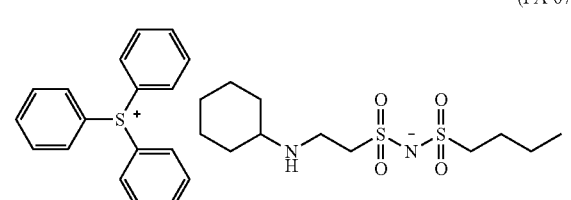
(PA-73)
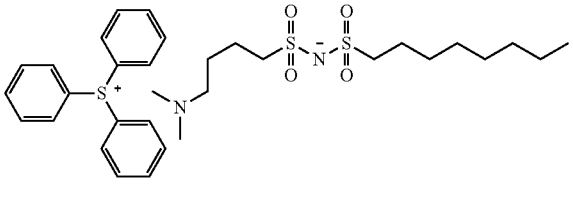
(PA-68)
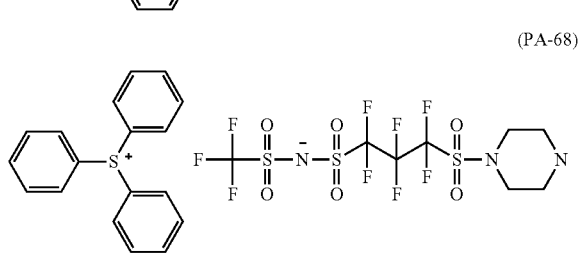
(PA-74)
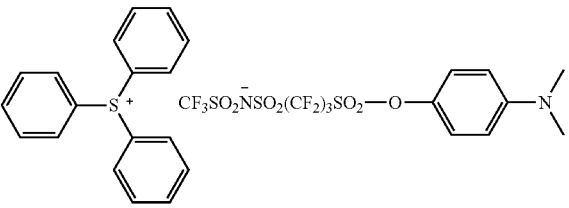
(PA-69)
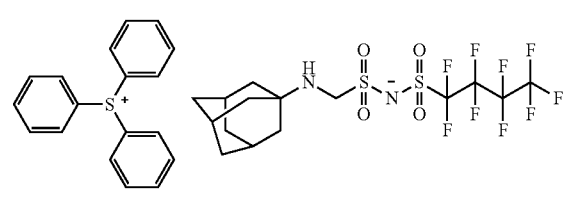
(PA-75)
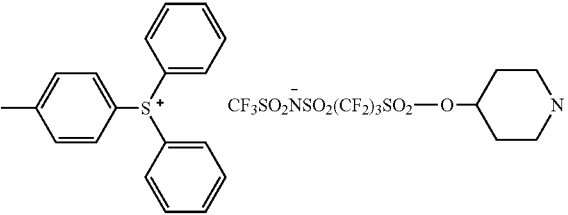

-continued
(PA-76) 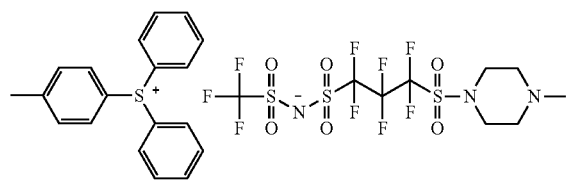
(PA-77) 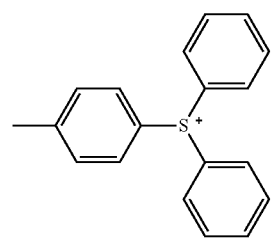
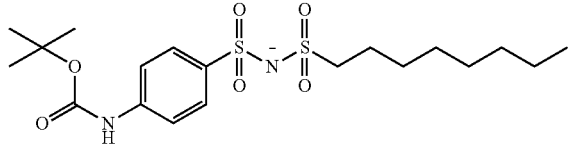
(PA-78) 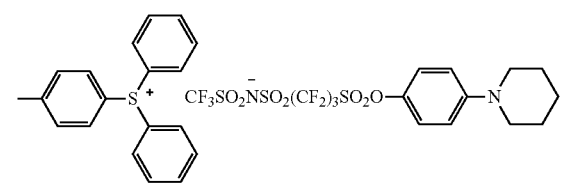
(PA-79) 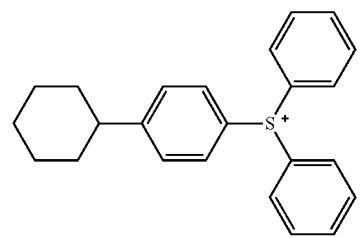
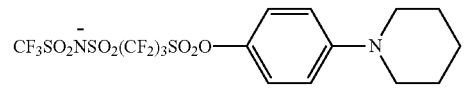
(PA-80)
(PA-81) 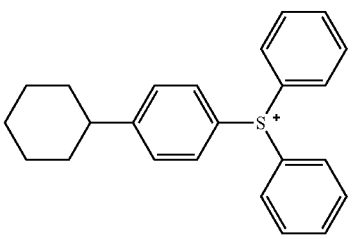
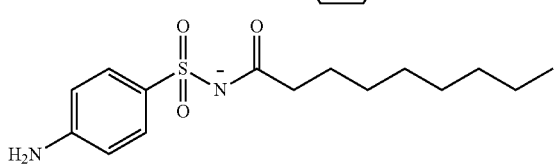
(PA-82) 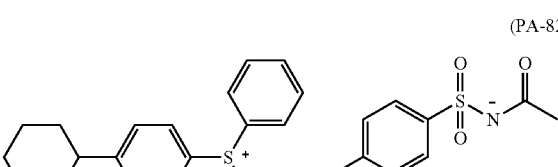
(PA-83) 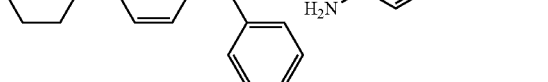
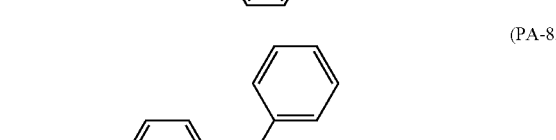
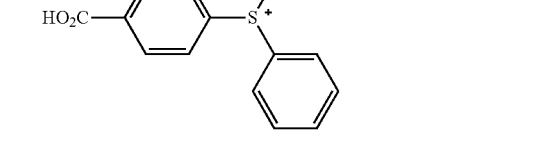
(PA-84) 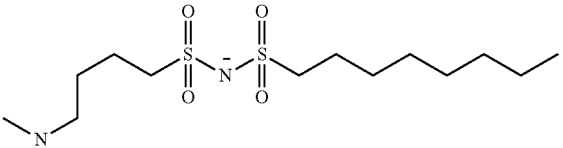
(PA-85) 

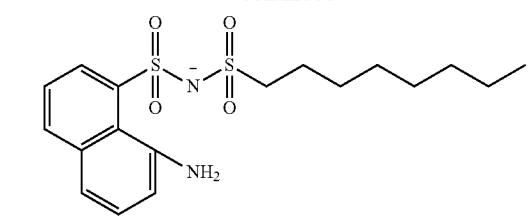
(PA-86)
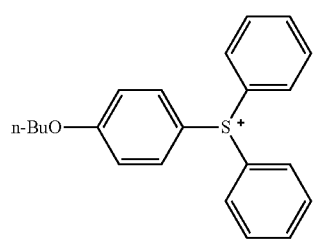
(PA-87)
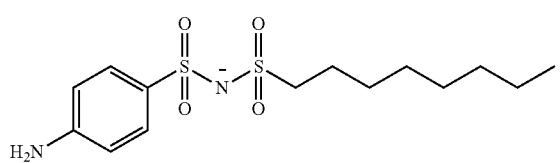
(PA-88)
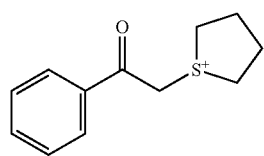
(PA-89)
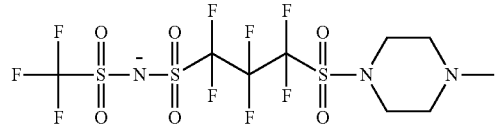
(PA-90)
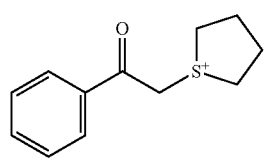
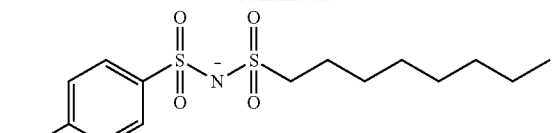
(PA-91)
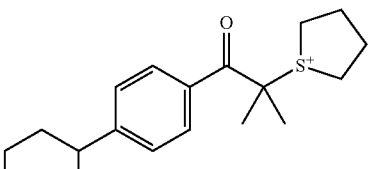
(PA-92)
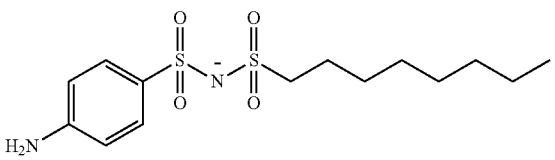
(PA-93)
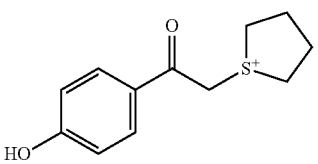
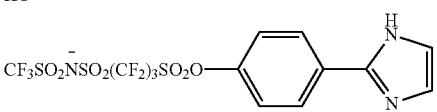
(PA-94)
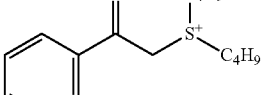
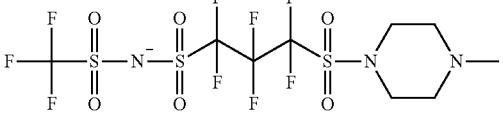
(PA-95)
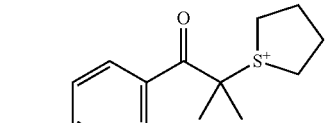
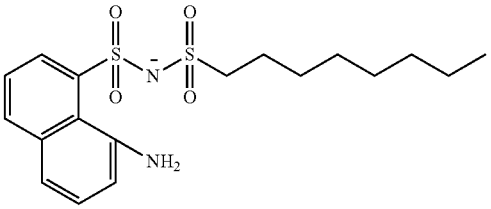
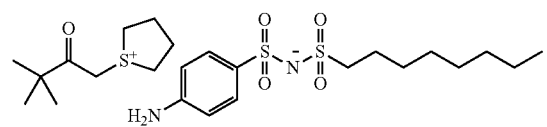

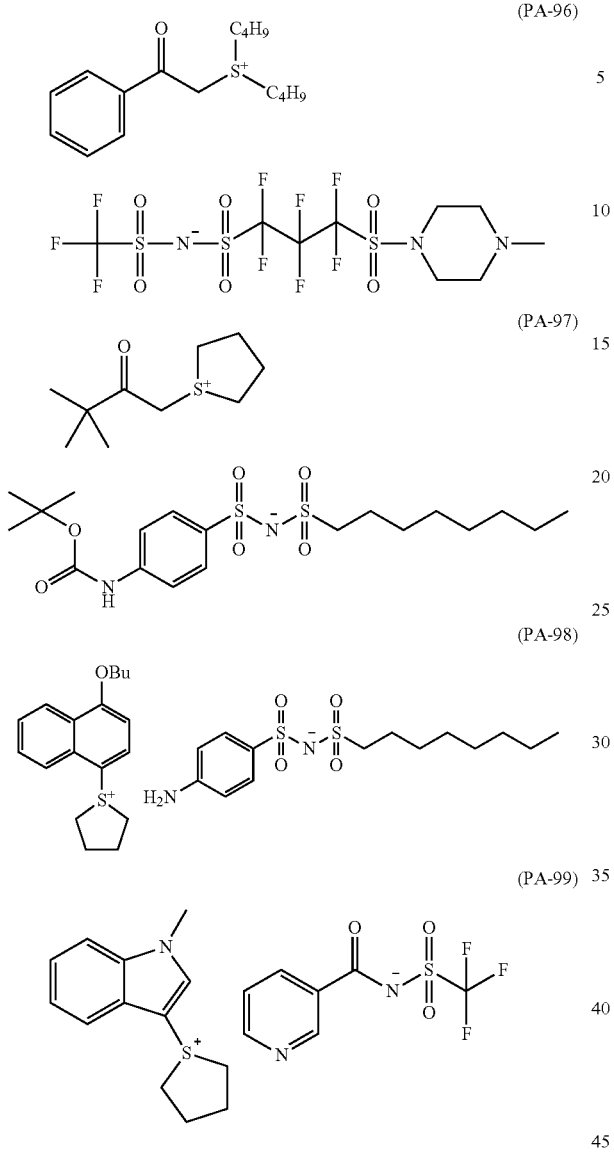
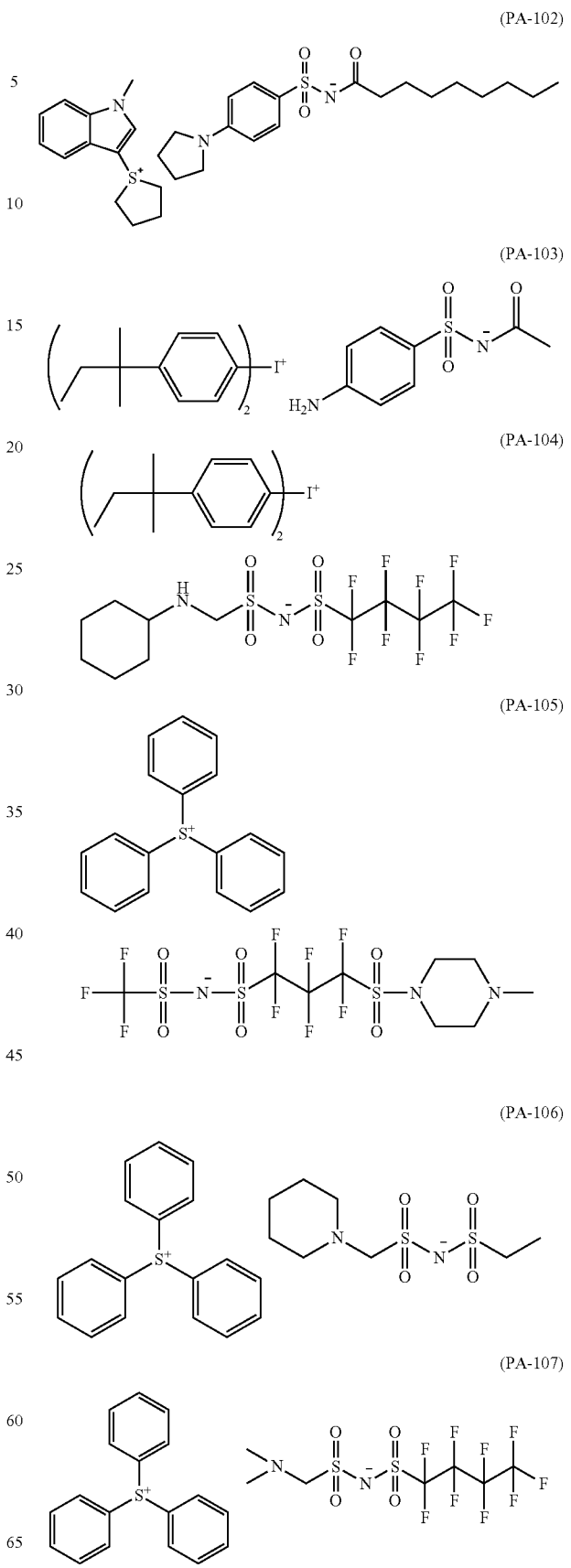

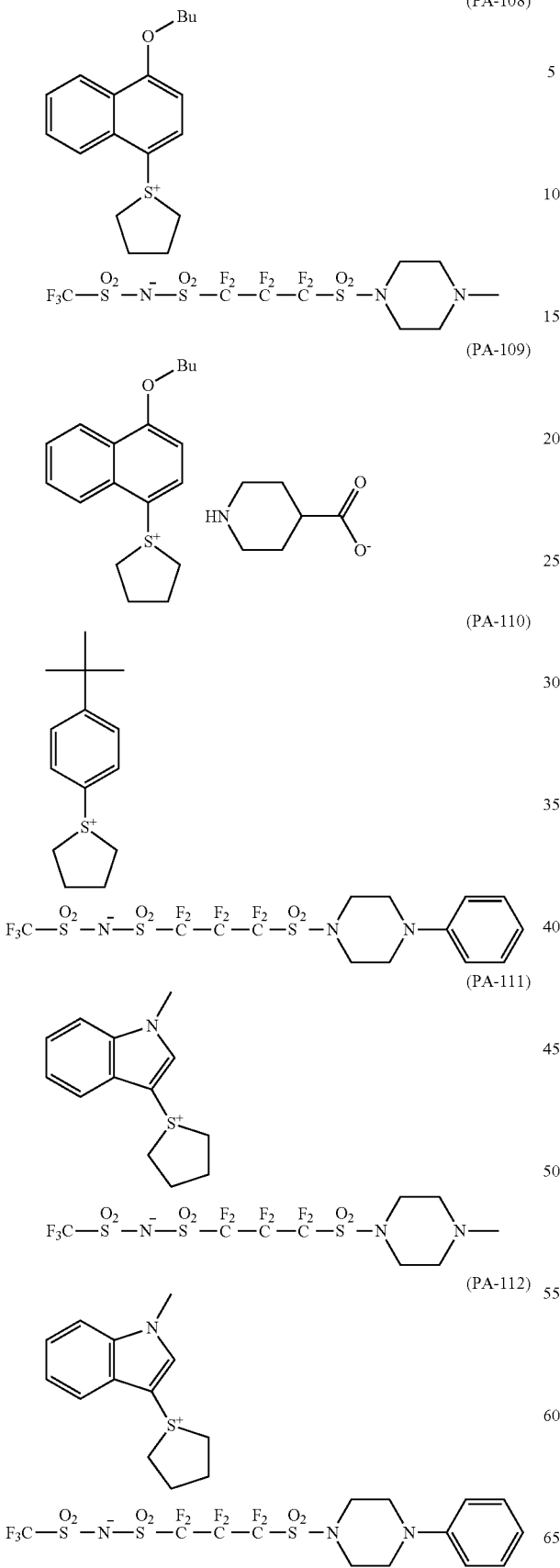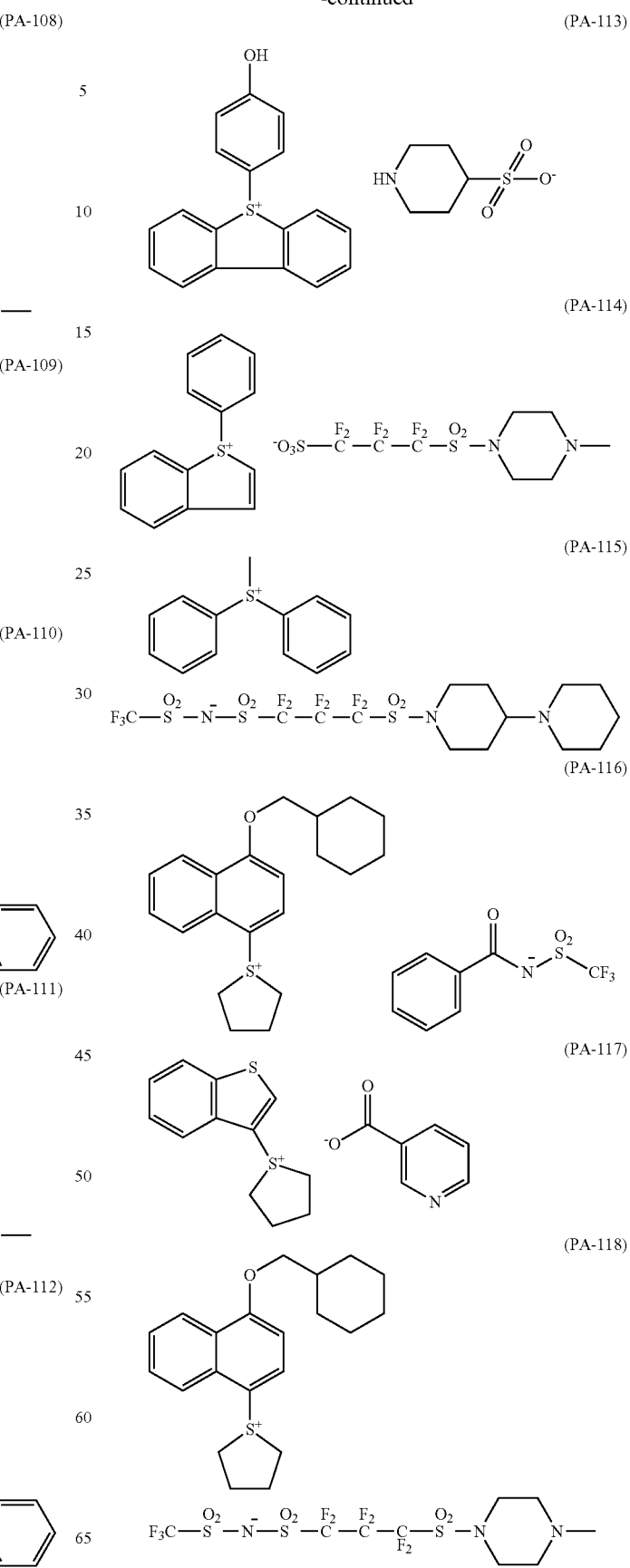

(PA-119)
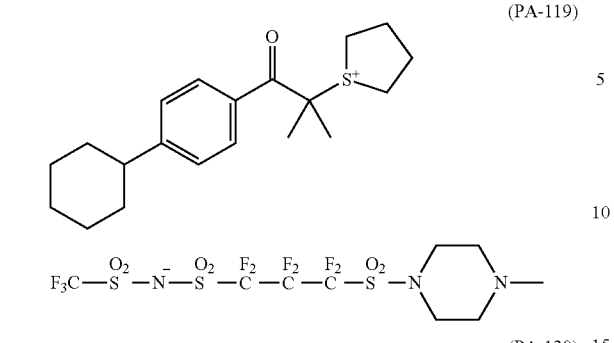
(PA-120)
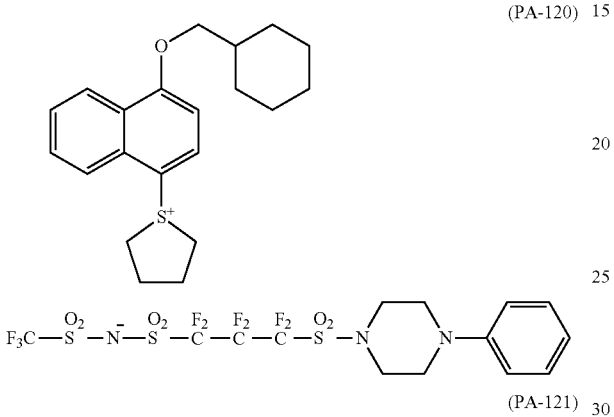
(PA-121)
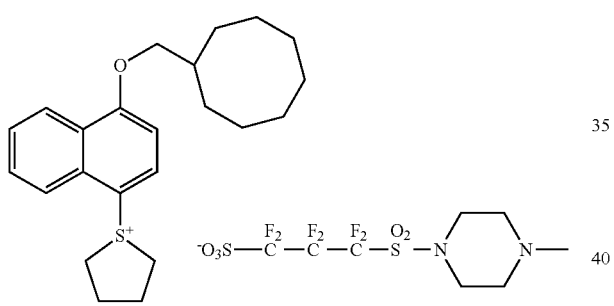
(PA-122)
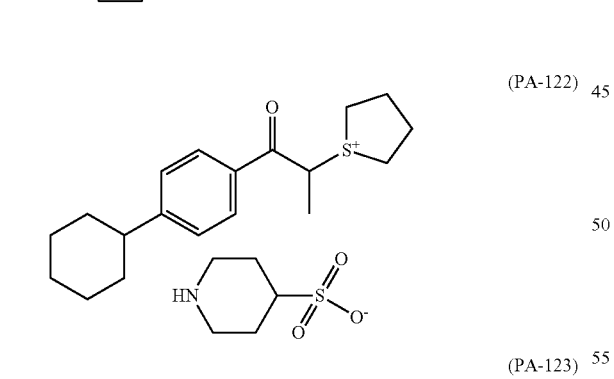
(PA-123)
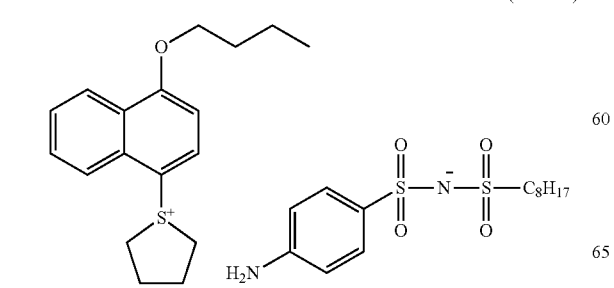
(PA-124)
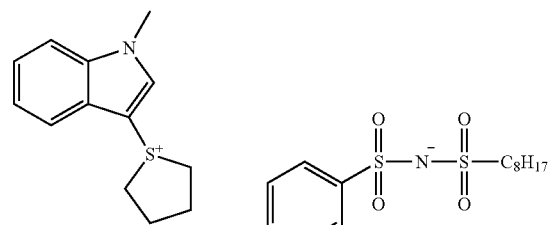
(PA-125)
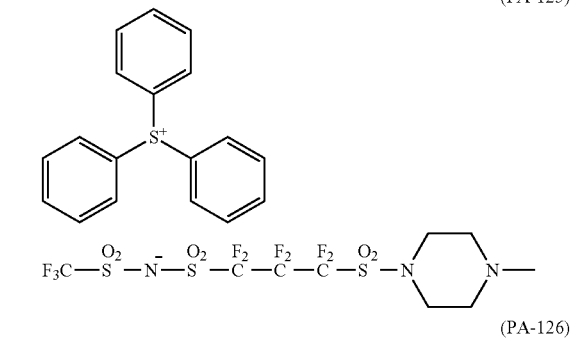
(PA-126)
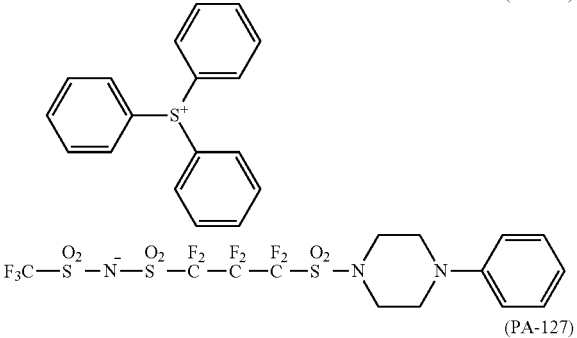
(PA-127)
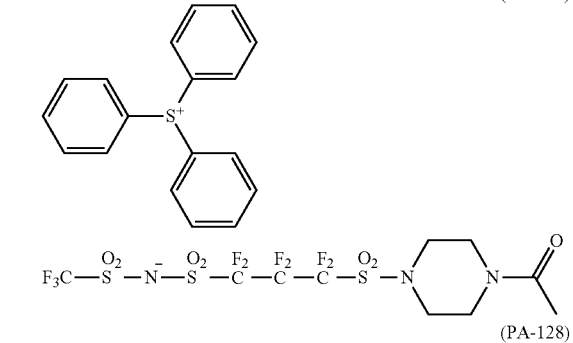
(PA-128)
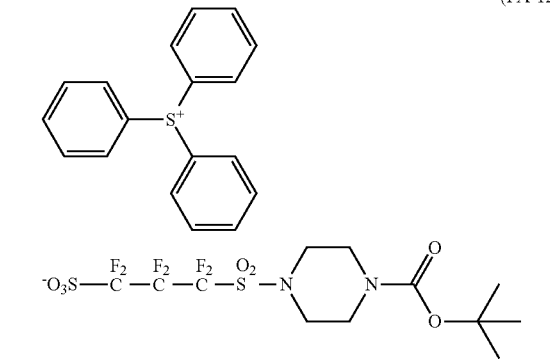

(PA-129)
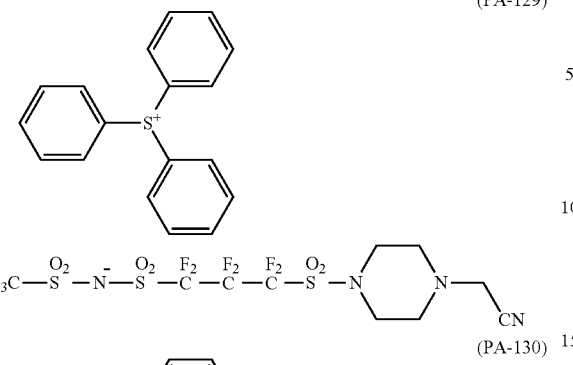
(PA-130)
(PA-131)
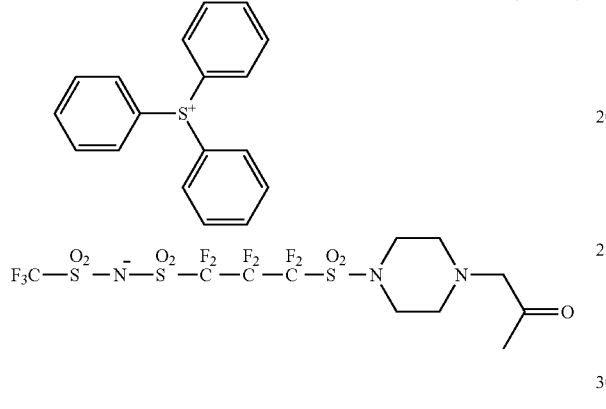
(PA-132)
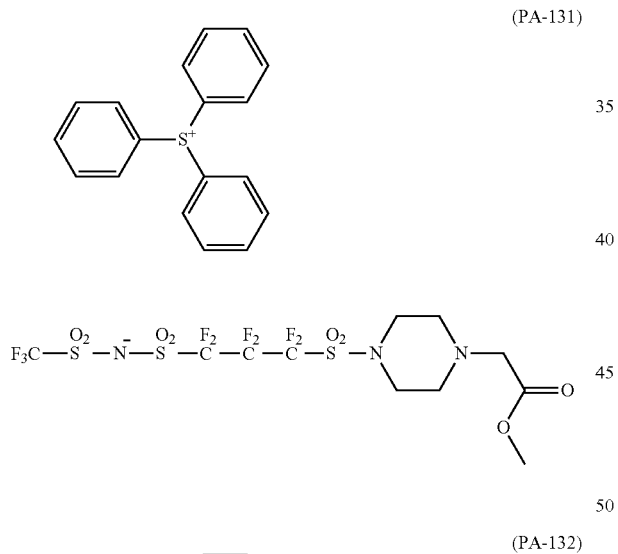
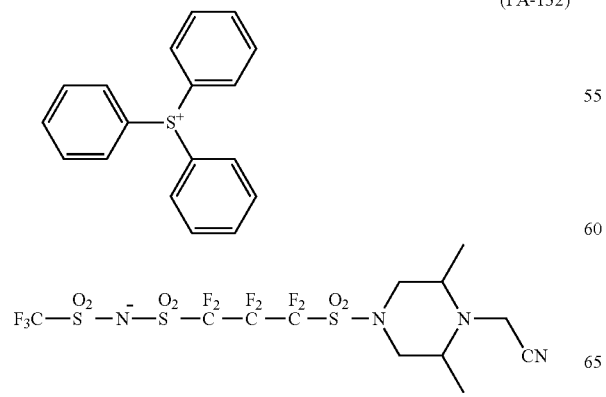
(PA-133)
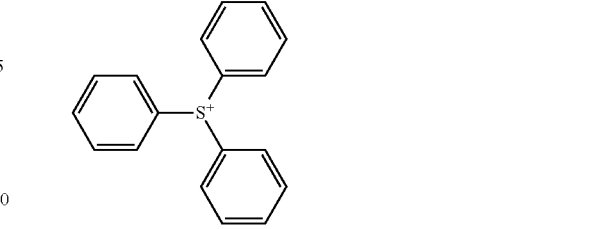
(PA-134)
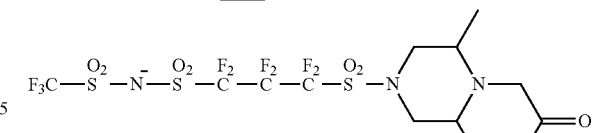
(PA-135)
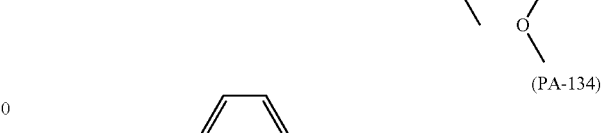
(PA-136)
(PA-137)
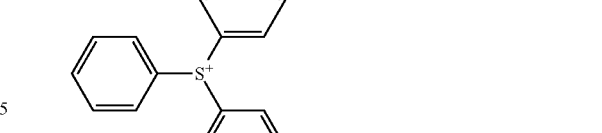

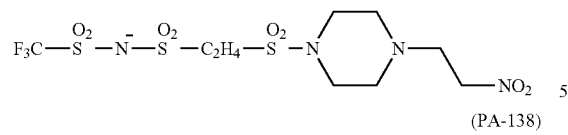
(PA-138)
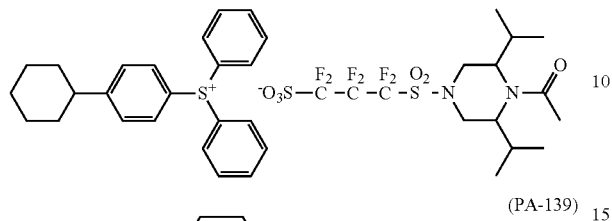
(PA-139)
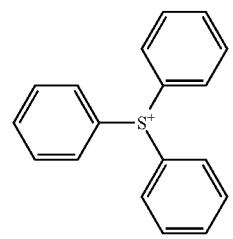
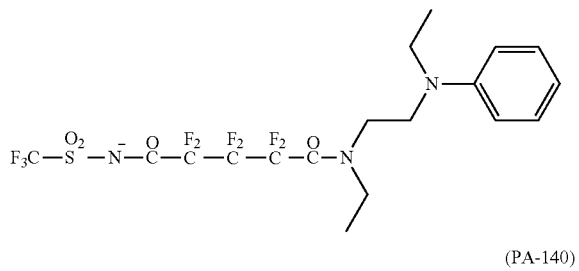
(PA-140)
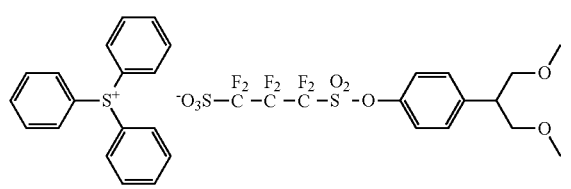
(PA-141)
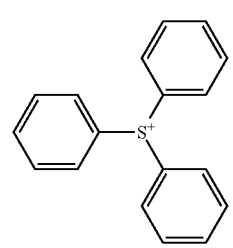
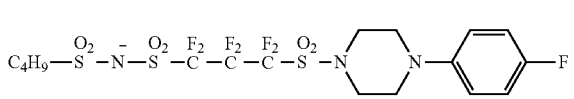
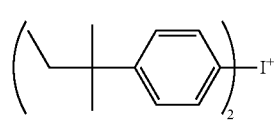
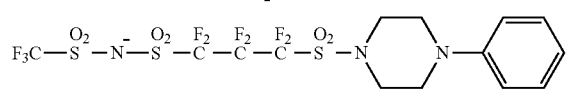
(PA-142)
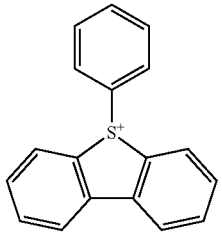
(PA-143)
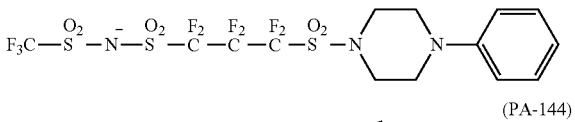
(PA-144)
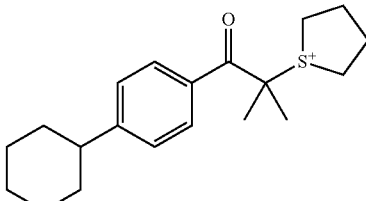
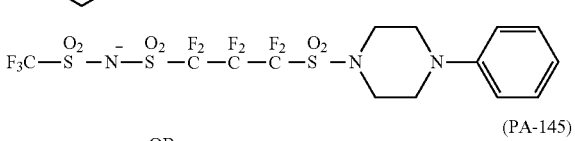
(PA-145)
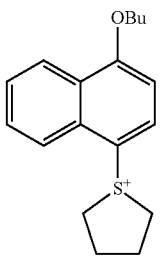
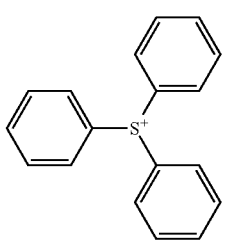
(PA-146)
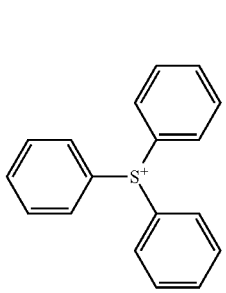
(PA-147)

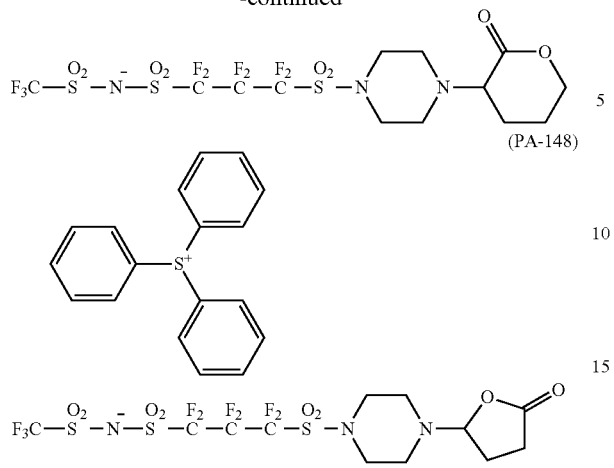

(PA-148)

These compounds can be easily synthesized by using a general sulfonic acid esterification reaction or a sulfonamidation reaction. For example, such a compound can be obtained by a method of selectively allowing one of the sulfonyl halide moieties of a bissulfonyl halide compound to react with an amine, an alcohol or the like, which all contain a partial structure represented by the formula (PA-II) or (PA-III), to form a sulfonamide bond or a sulfonic acid ester bond, and then hydrolyzing the other sulfonyl halide moiety; or a method of allowing a cyclic sulfonic acid anhydride to react with an amine or alcohol containing a partial structure represented by the formula (PA-II) to open the ring. The amine or alcohol containing a partial structure represented by the formula (PA-II) or (PA-III) can be synthesized by allowing an amine or alcohol to react with an anhydride such as $(R'O_2C)_2O$ or $(R'SO_2)_2O$, or with an acid chloride compound such as $R'O_2CCl$ or $R'SO_2Cl$ in a basic environment (R' represents a methyl group, an n-octyl group, a trifluoromethyl group, or the like).

The synthesis of the compound (C) can be carried out particularly according to the Synthesis Examples of JP 2006-330098 A and JP 2011-100105 A.

The molecular weight of the compound (C) is preferably 500 to 1000.

The chemical amplification resist composition according to the present invention may or may not contain the compound (C). However, if the resist composition contains the compound (C), the content of the compound (C) is preferably 0.1% to 20% by mass, and more preferably 0.1% to 10% by mass, based on the solids content of the chemical amplification resist composition.

[3-2] Basic Compound (C')

The chemical amplification resist composition according to the present invention may contain a basic compound (C') in order to reduce any change in the performance over time from the exposure to the heating.

Preferred examples of the basic compound include compounds having structures represented by the following formulae (A) to (E).

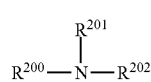
(A)

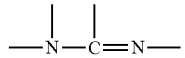
(B)

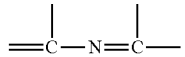
(C)

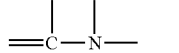
(D)

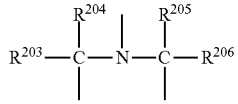
(E)

In the formulae (A) and (E),
$R^{200}$, $R^{201}$ and $R^{202}$, which may be identical with or different from each other, each represent a hydrogen atom, an alkyl group (preferably having 1 to 20 carbon atoms), a cycloalkyl group (preferably having 3 to 20 carbon atoms), or an aryl group (having 6 to 20 carbon atoms). Here, $R^{201}$ and $R^{202}$ may be joined together to form a ring. $R^{203}$, $R^{204}$, $R^{205}$, and $R^{206}$, which may be identical with or different from each other, each represent an alkyl group having 1 to 20 carbon atoms.

In regard to the alkyl group described above, an alkyl group having a substituent is preferably an aminoalkyl group having 1 to 20 carbon atoms, a hydroxyalkyl group having 1 to 20 carbon atoms, or a cyanoalkyl group having 1 to 20 carbon atoms.

These alkyl groups of the formulae (A) and (E) are more preferably unsubstituted.

Preferred compounds include guanidine, aminopyrrolidine, pyrazole, pyrazoline, piperazine, aminomorpholine, aminoalkylmorpholine, and piperidine. More preferred compounds include compounds having an imidazole structure, a diazabicyclo structure, an onium hydroxide structure, an onium carboxylate structure, a trialkylamine structure, an aniline structure, or a pyridine structure; alkylamine derivatives having a hydroxyl group and/or an ether bond; and aniline derivatives having a hydroxyl group and/or an ether bond.

Examples of a compound having an imidazole structure include imidazole, 2,4,5-triphenylimidazole, and benzimidazole. Examples of a compound having a diazabicyclo structure include 1,4-diazabicyclo[2,2,2]octane, 1,5-diazabicyclo[4,3,0]non-5-ene, and 1,8-diazabicyclo[5,4,0]undec-7-ene. Examples of a compound having an onium hydroxide structure include triarylsulfonium hydroxide, phenacylsulfonium hydroxide, sulfonium hydroxide having a 2-oxoalkyl group, specifically triphenylsulfonium hydroxide, tris(t-butylphenyl)sulfonium hydroxide, bis(t-butylphenyl)iodonium hydroxide, phenacylthiophenium hydroxide, and 2-oxopropylthiophenium hydroxide. A compound having an onium carboxylate structure is a compound in which the anion moiety of a compound having an onium hydroxide structure has been converted to carboxylate, and examples thereof include acetates, adamantane-1-carboxylates, and perfluoroalkylcarboxylates. Examples of a compound having a trialkylamine structure include tri(n-butyl)amine, and tri(n-octyl)amine. Examples of a compound having an aniline structure include 2,6-diisopropylaniline, N,N-dimethylaniline, N,N-dibutylaniline, and N,N-dihexylaniline. Examples of an alkylamine derivative having a hydroxyl group and/or an ether bond include ethanolamine, diethanolamine, triethanolamine, and tris(methoxyethoxyethyl)amine. Examples of an aniline derivative having a hydroxyl group and/or an ether bond include N,N-bis(hydroxyethyl)aniline.

Preferred examples of the basic compound include an amine compound having a phenoxy group, an ammonium salt compound having a phenoxy group, an amine compound having a sulfonic acid ester group, and an ammonium salt compound having a sulfonic acid ester group.

In the amine compound having a phenoxy group, the ammonium salt compound having a phenoxy group, the amine compound having a sulfonic acid ester group, and the ammonium salt compound having a sulfonic acid ester group, it is preferable that at least one alkyl group be bonded to a nitrogen atom. Furthermore, it is preferable that the compounds each have an oxygen atom in the alkyl chain, so that an oxyalkylene group is formed. The number of the oxyalkylene groups is one or more, preferably 3 to 9, and even more preferably 4 to 6, in one molecule. Among the oxyalkylene groups, structures of —$CH_2CH_2O$—, —$CH(CH_3)CH_2O$— and —$CH_2CH_2CH_2O$— are preferred.

Specific examples of the amine compound having a phenoxy group, the ammonium salt compound having a phenoxy group, the amine compound having a sulfonic acid ester group, and the ammonium salt compound having a sulfonic acid ester group include, but are not limited to, compounds (C1-1) to (C3-3) listed as examples in paragraph [0066] of US 2007/0224539 A.

Furthermore, as one kind of the basic compound, a nitrogen-containing organic compound having a group which is detached under the action of acid can also be used. An example of this compound may be a compound represented by the following formula (F). Meanwhile, a compound represented by the following formula (F) exhibits effective basicity in the system, as the group that is detached under the action of acid is detached.

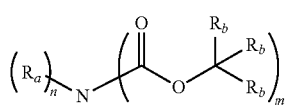

(F)

In the formula (F), $R_a$'s each independently represent a hydrogen atom, an alkyl group, a cycloalkyl group, an aryl group or an aralkyl group. Furthermore, when n=2, two $R_a$'s may be identical with or different from each other, and two $R_a$'s may be joined together to form a divalent heterocyclic hydrocarbon group (preferably having 20 or fewer carbon atoms) or a derivative thereof.

$R_b$'s independently represent a hydrogen atom, an alkyl group, a cycloalkyl group, an aryl group or an aralkyl group. However, in —$C(R_b)(R_b)(R_b)$, when one or more $R_b$'s are hydrogen atoms, at least one of the other $R_b$'s is a cyclopropyl group or a 1-alkoxyalkyl group.

At least two $R_b$'s may be joined together to form an alicyclic hydrocarbon group, an aromatic hydrocarbon group, a heterocyclic hydrocarbon group, or a derivative thereof.

n represents an integer of 0 to 2, and m represents an integer of 1 to 3, while n+m=3.

In the formula (F), the alkyl group, cycloalkyl group, aryl group and aralkyl group represented by $R_a$ and $R_b$ may be substituted with a functional group such as a hydroxyl group, a cyano group, an amino group, a pyrrolidino group, a piperidino group, a morpholino group, or an oxo group, an alkoxy group, or a halogen atom.

Specific examples of the compound represented by the formula (F) will be listed below, but the present invention is not intended to be limited to these.

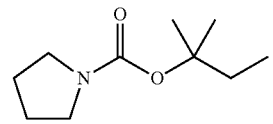

(D-1)

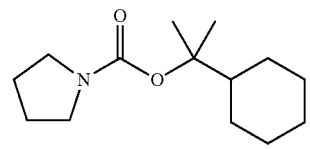

(D-2)

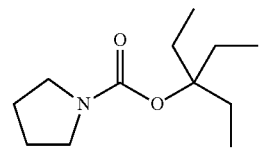

(D-3)

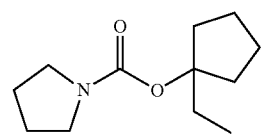

(D-4)

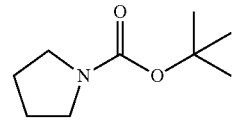

(D-5)

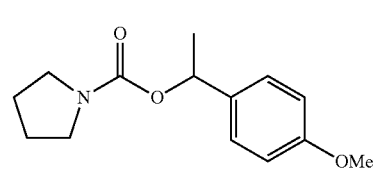

(D-6)

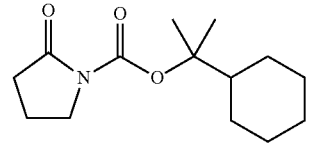

(D-7)

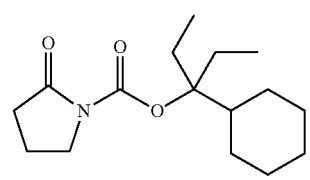

(D-8)

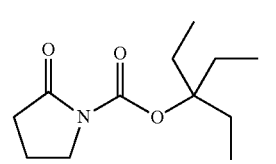

(D-9)

-continued
(D-10) 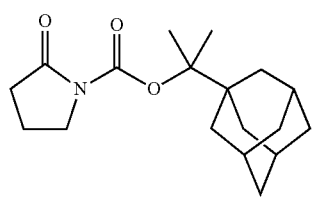
(D-11) 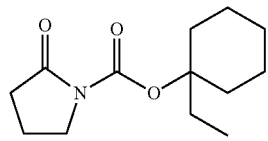
(D-12) 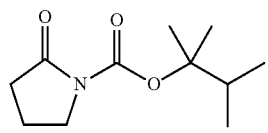
(D-13) 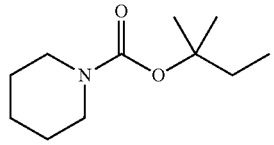
(D-14) 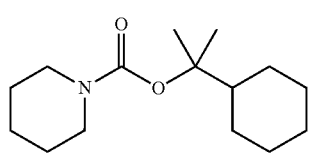
(D-15) 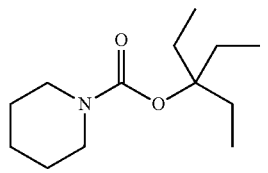
(D-16) 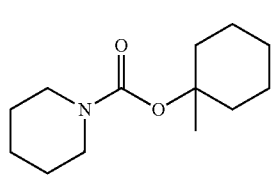
(D-17) 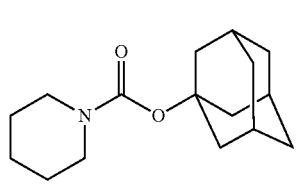
(D-18) 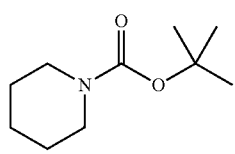
(D-19) 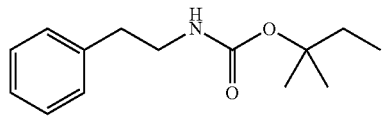
-continued
(D-20) 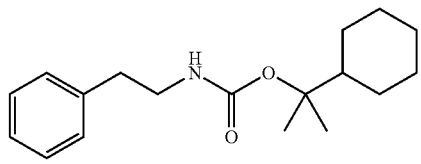
(D-21) 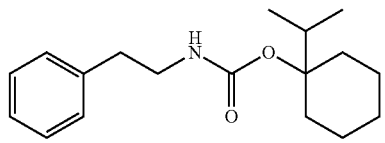
(D-22) 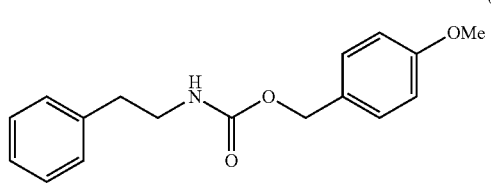
(D-23) 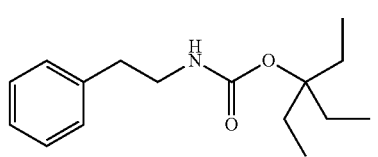
(D-24) 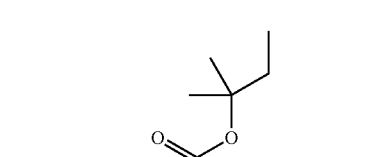
(D-25) 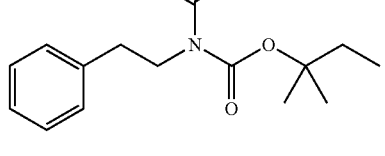
(D-25) 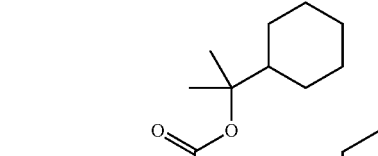
(D-26) 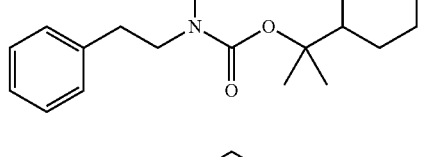
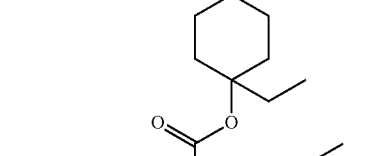
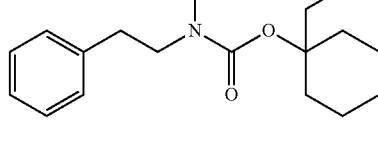

(D-27) 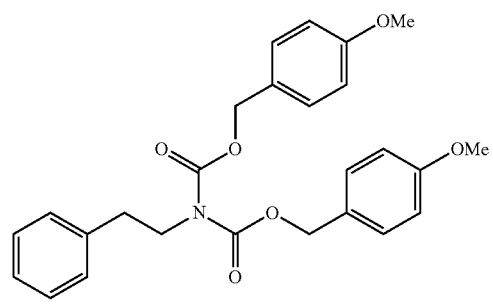
(D-28) 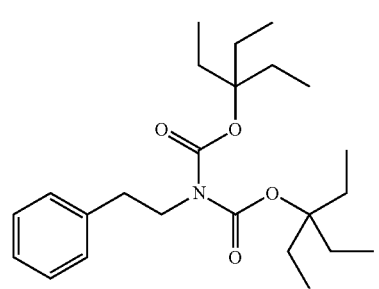
(D-29) 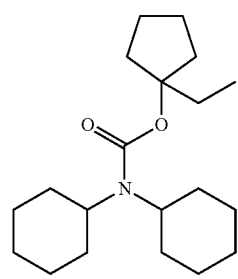
(D-30) 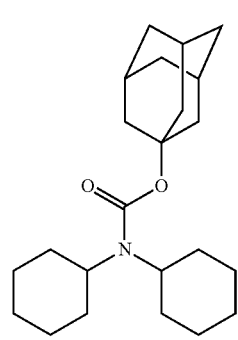
(D-31) 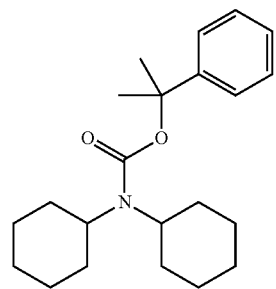
(D-32) 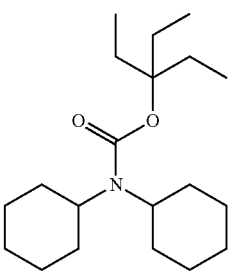
(D-33) 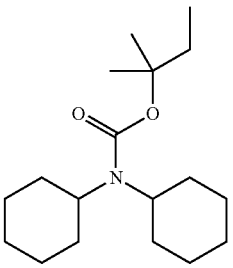
(D-34) 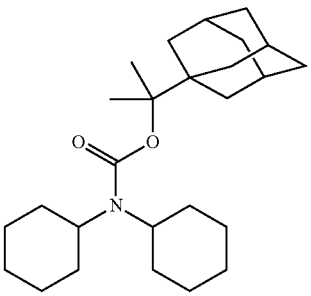
(D-35) 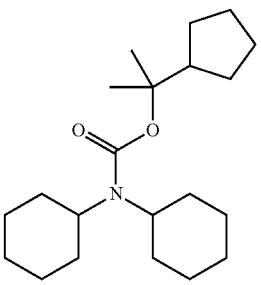
(D-36) 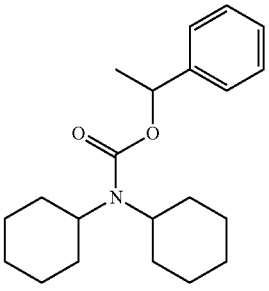
(D-37)

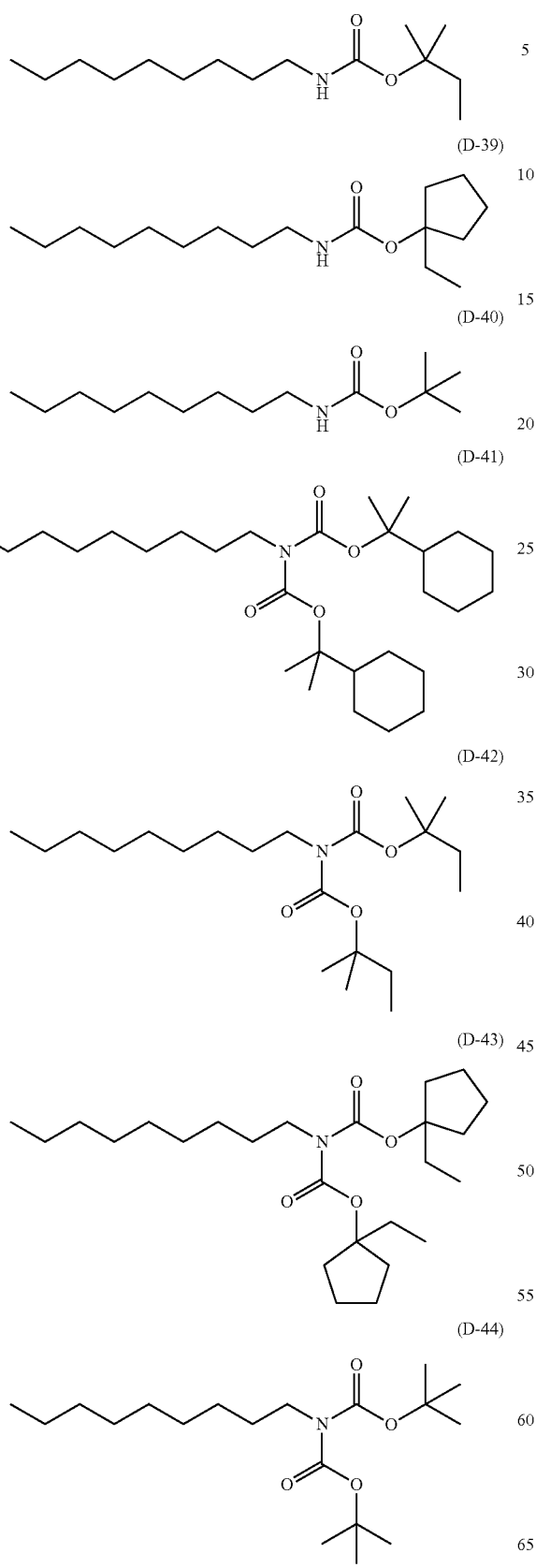
(D-38)
(D-39)
(D-40)
(D-41)
(D-42)
(D-43)
(D-44)
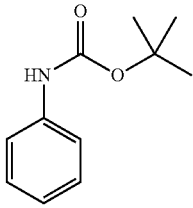
(D-45)
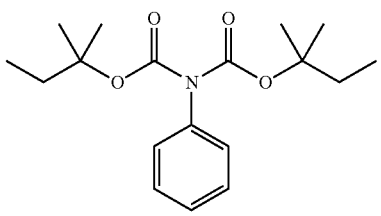
(D-46)
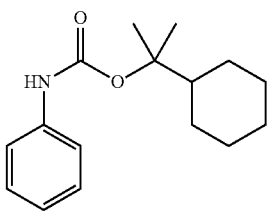
(D-47)
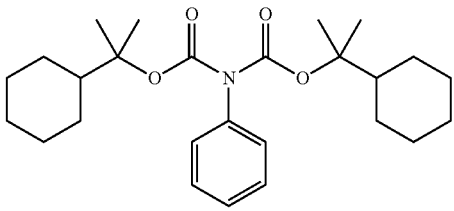
(D-48)
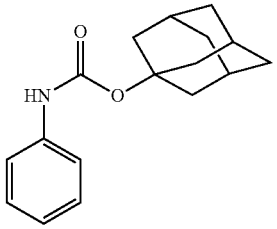
(D-49)
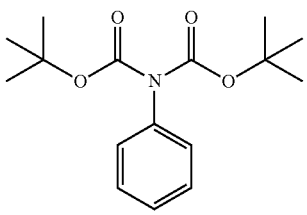
(D-50)
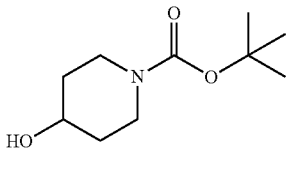
(D-51)

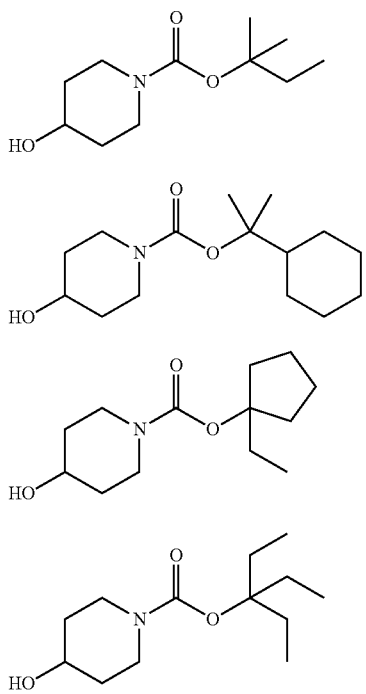

The compound represented by the formula (F) can be synthesized based on the descriptions of JP 2009-199021 A or the like.

The molecular weight of the basic compound (C') is preferably 250 to 2,000, and more preferably 400 to 1,000. From the viewpoint of further reduction of LWR and local uniformity of the pattern dimensions, the molecular weight of the basic compound is preferably 400 or greater, more preferably 500 or greater, and even more preferably 600 or greater.

Such a basic compound (C') may be used in combination with the compound (C), and may be used individually or in combination of two or more kinds.

The chemical amplification resist composition according to the present invention may or may not contain the basic compound (C'), but when the composition contains the basic compound (C'), the amount of the basic compound used is usually 0.001% to 10% by mass, and preferably 0.01% to 5% by mass, based on the solids content of the chemical amplification resist composition.

The use ratio of the acid generator to the basic compound in the composition is preferably such that the ratio of the acid generator/basic compound (molar ratio)=2.5 to 300. That is, in view of sensitivity and resolution, the molar ratio is preferably 2.5 or greater, and from the viewpoint of suppressing a decrease in the resolution due to the size of the resist pattern with a lapse of time during the period from the exposure to the heating treatment, the molar ratio is preferably 300 or less. The ratio of the acid generator/basic compound (molar ratio) is more preferably 5.0 to 200, and even more preferably 7.0 to 150.

[4] Solvent (D)

Examples of the solvent that can be used to prepare the chemical amplification resist composition according to the present invention include organic solvents such as alkylene glycol monoalkyl ether carboxylates, alkylene glycol monoalkyl ethers, lactic acid alkyl esters, alkyl alkoxypropionates, cyclic lactones (preferably having 4 to 10 carbon atoms), monoketone compounds which may have a cyclic structure (preferably having 4 to 10 carbon atoms), alkylene carbonates, alkyl alkoxyacetates, and alkyl pyruvates.

Specific examples of these solvents include the solvents described in paragraphs [0441] to [0455] of US 2008/0187860 A.

According to the present invention, as the organic solvent, a solvent mixture prepared by mixing a solvent containing a hydroxyl group in the structure with a solvent which does not contain a hydroxyl group may be used.

As the solvent containing a hydroxyl group and the solvent which does not contain a hydroxyl group, the exemplary compounds described above can be appropriately selected, but the solvent containing a hydroxyl group is preferably an alkylene glycol monoalkyl ether, an alkyl lactate, or the like; and more preferably propylene glycol monomethyl ether (PGME, also known as 1-methoxy-2-propanol), or ethyl lactate. Furthermore, the solvent which does not contain a hydroxyl group is preferably an alkylene glycol monoalkyl ether acetate, an alkyl alkoxypropionate, a monoketone compound which may contain a ring, a cyclic lactone, an alkyl acetate or the like, and among these, propylene glycol monomethyl ether acetate (PGMEA, also known as 1-methoxy-2-acetoxypropane), ethyl ethoxypropionate, 2-heptanone, γ-butyrolactone, cyclohexanone, and butyl acetate are particularly preferred, while propylene glycol monomethyl ether acetate, ethyl ethoxypropionate, and 2-heptanone are most preferred.

The mixing ratio (mass) of the solvent containing a hydroxyl group to the solvent which does not contain a hydroxyl group is 1/99 to 99/1, preferably 10/90 to 90/10, and more preferably 20/80 to 60/40. A solvent mixture containing 50% by mass or more of the solvent which does not contain a hydroxyl group is particularly preferable in view of coating uniformity.

The solvent preferably includes propylene glycol monomethyl ether acetate, and a single solvent of propylene glycol monomethyl ether acetate, or a solvent mixture of two or more kinds including propylene glycol monomethyl ether acetate is preferred.

[5] Hydrophobic Resin (E)

The chemical amplification resist composition of the present invention may contain a hydrophobic resin having at least any one of a fluorine atom and a silicon atom (hereinafter, also referred to as "hydrophobic resin (E)" or simply as "resin (E)"), particularly when the resist composition is applied to immersion exposure. Thereby, the hydrophobic resin (E) is unevenly distributed in the film surface layer, and when the immersion medium is water, the static/dynamic contact angle of the resist film surface against water is increased, and thereby the conformity to the immersion liquid can be enhanced.

It is desirable that the hydrophobic resin (E) be designed so as to be unevenly distributed at the interface as described above. However, since the hydrophobic resin (E) is different from surfactants, it is not essentially necessary for the hydrophobic resin to have a hydrophobic group, and the hydrophobic resin may not contribute to uniform mixing of polar/non-polar substances.

The hydrophobic resin (E) typically contains a fluorine atom and/or a silicon atom. The fluorine atom and/or silicon atom in the hydrophobic resin (E) may be included in the main chain of the resin, or may be included in a side chain.

When the hydrophobic resin (E) contains a fluorine atom, the resin preferably has an alkyl group containing a fluorine atom, a cycloalkyl group containing a fluorine atom, or an aryl group containing a fluorine atom, as a partial structure containing a fluorine atom.

The alkyl group containing a fluorine atom (preferably having 1 to 10 carbon atoms, and more preferably 1 to 4 carbon atoms) is a linear or branched alkyl group in which at least one hydrogen atom has been substituted with a fluorine atom, and may also have a substituent other than a fluorine atom.

The cycloalkyl group containing a fluorine atom is a monocyclic or polycyclic cycloalkyl group in which at least one hydrogen atom has been substituted with a fluorine atom, and may also have a substituent other than a fluorine atom.

The aryl group containing a fluorine atom is an aryl group such as a phenyl group or a naphthyl group, in which at least one hydrogen atom has been substituted with a fluorine atom, and the aryl group may also have a substituent other than a fluorine atom.

Preferred examples of the alkyl group containing a fluorine atom, the cycloalkyl group containing a fluorine atom, and the aryl group containing a fluorine atom include groups represented by the following formulae (F2) to (F4), but the present invention is not intended to be limited to these.

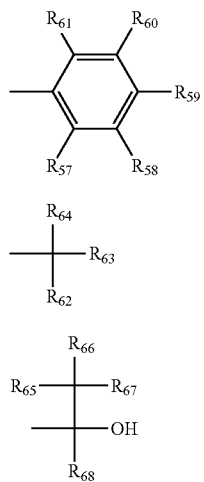

In the formulae (F2) to (F4), $R_{57}$ to $R_{68}$ each independently represent a hydrogen atom, a fluorine atom, or an alkyl group (linear or branched). However, at least one of $R_{57}$ to $R_{61}$, at least one of $R_{62}$ to $R_{64}$, and at least one of $R_{65}$ to $R_{68}$ each independently represent a fluorine atom, or an alkyl group (preferably having 1 to 4 carbon atoms) having at least one hydrogen atom substituted with a fluorine atom.

$R_{57}$ to $R_{61}$ and $R_{65}$ to $R_{67}$ are preferably all fluorine atoms. $R_{62}$, $R_{63}$ and $R_{68}$ are each preferably an alkyl group (having 1 to 4 carbon atoms) having at least one hydrogen atom substituted with a fluorine atom, and more preferably a perfluoroalkyl group having 1 to 4 carbon atoms. $R_{62}$ and $R_{63}$ may be joined together to form a ring.

Specific examples of the group represented by the formula (F2) include a p-fluorophenyl group, a pentafluorophenyl group, and a 3,5-di(trifluoromethyl)phenyl group.

Specific examples of the group represented by the formula (F3) include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluorocyclobutyl group, and a perfluorocyclohexyl group. A hexafluoroisopropyl group, a heptafluoroisopropyl group, a hexafluoro(2-methyl)isopropyl group, an octafluoroisobutyl group, a nonafluoro-t-butyl group, and a perfluoroisopentyl group are preferred, and a hexafluoroisopropyl group, and a heptafluoroisopropyl group are more preferred.

Specific examples of the group represented by the formula (F4) include —C(CF$_3$)$_2$OH, —C(C$_2$F$_5$)$_2$OH, —C(CF$_3$)(CH$_3$)OH, and —CH(CF$_3$)OH, and —C(CF$_3$)$_2$OH is preferred.

The partial structure containing a fluorine atom may be directly linked to the main chain, or may also be linked to the main chain via a group selected from the group consisting of an alkylene group, a phenylene group, an ether bond, a thioether bond, a carbonyl group, an ester bond, an amide bond, a urethane bond, and a ureylene bond, or a group combining two or more of these.

Suitable examples of a repeating unit having a fluorine atom include the following.

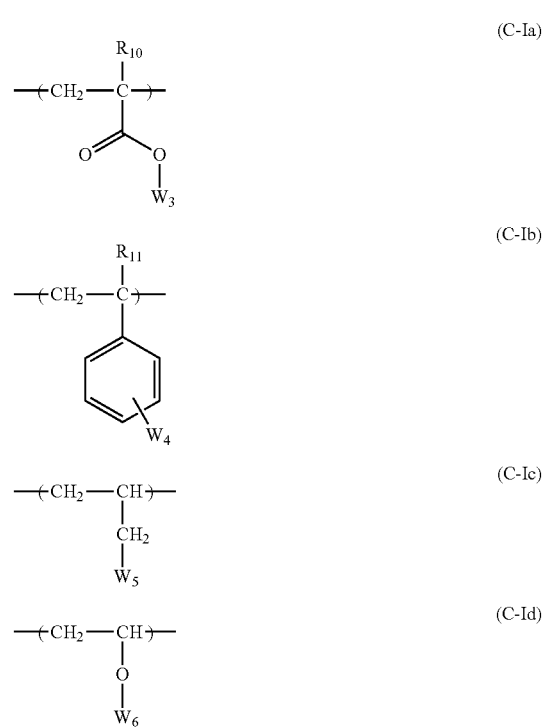

In the formulae, $R_{10}$ and $R_{11}$ each independently represent a hydrogen atom, a fluorine atom, or an alkyl group. The alkyl group is preferably a linear or branched alkyl group having 1 to 4 carbon atoms, and may have a substituent. Examples of an alkyl group having a substituent include fluorinated alkyl groups in particular.

$W_3$ to $W_6$ each independently represent an organic group containing at least one or more fluorine atoms. Specific examples include the atomic groups of the formulae (F2) to (F4).

Furthermore, the hydrophobic resin (E) may also have a unit represented by the following formula as a repeating unit having a fluorine atom, in addition to those described above.

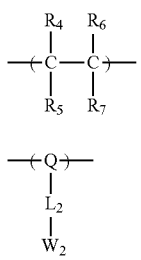

(C-II)

(C-III)

In the formulae, $R_4$ to $R_7$ each independently represent a hydrogen atom, a fluorine atom, or an alkyl group. The alkyl group is preferably a linear or branched alkyl group having 1 to 4 carbon atoms, and may have a substituent. Examples of an alkyl group having a substituent include fluorinated alkyl groups in particular.

However, at least one of $R_4$ to $R_7$ represents a fluorine atom. $R_4$ and $R_5$, or $R_6$ and $R_7$ may form a ring.

$W_2$ represents an organic group containing at least one fluorine atom. Specific examples include the atomic groups of the formulae (F2) to (F4).

$L_2$ represents a single bond, or a divalent linking group. The divalent linking group represents a substituted or unsubstituted arylene group, a substituted or unsubstituted alkylene group, a substituted or unsubstituted cycloalkylene group, —O—, —SO$_2$—, —CO—, —N(R)— (wherein R represents a hydrogen atom or an alkyl), —NHSO$_2$—, or a divalent linking group combining several of these.

Q represents an alicyclic structure. The alicyclic structure may have a substituent, and may be monocyclic or polycyclic. In the case of a polycyclic structure, the structure may be of a bridge type. The monocyclic structure is preferably a cycloalkyl group having 3 to 8 carbon atoms, and examples include a cyclopentyl group, a cyclohexyl group, a cyclobutyl group, and a cyclooctyl group. The polycyclic structure may be a group having a bicyclo, tricyclo or tetracyclo structure with 5 or more carbon atoms, and is preferably a cycloalkyl group having 6 to 20 carbon atoms. Examples include an adamantyl group, a norbornyl group, a dicyclopentyl group, a tricyclodecanyl group, and a tetracyclododecyl group. Meanwhile, a portion of the carbon atoms in the cycloalkyl group may be substituted by heteroatoms such as oxygen atoms. Q is particularly preferably a norbornyl group, a tricyclodecanyl group, or a tetracyclododecyl group.

Specific examples of the repeating unit having a fluorine atom will be listed below, but the present invention is not limited to these.

In the specific examples, $X_1$ represents a hydrogen atom, —CH$_3$, —F or —CF$_3$. $X_2$ represents —F or —CF$_3$.

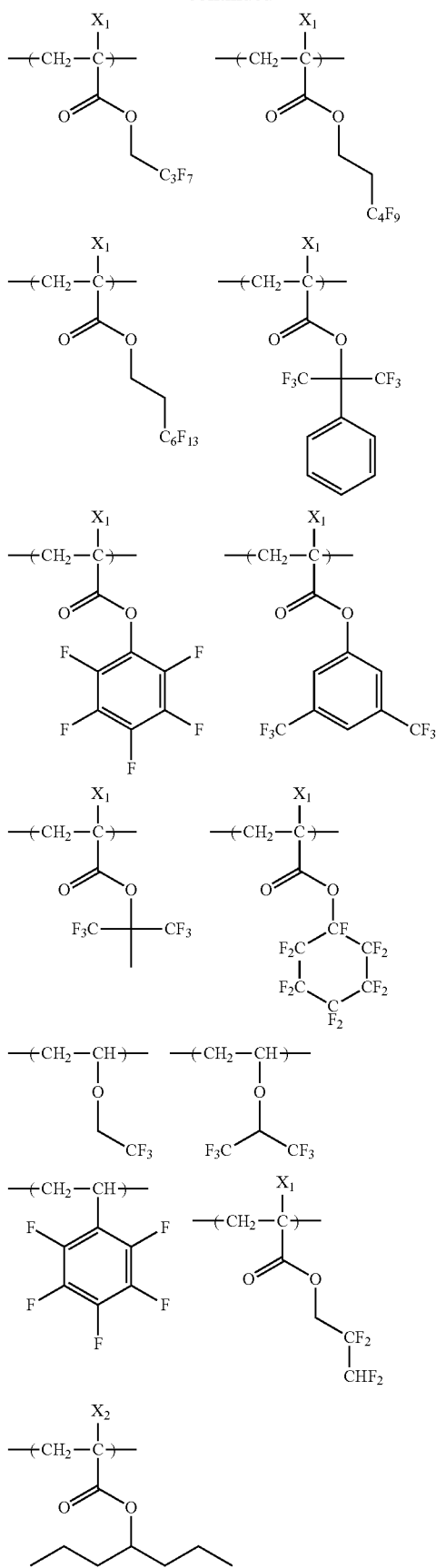

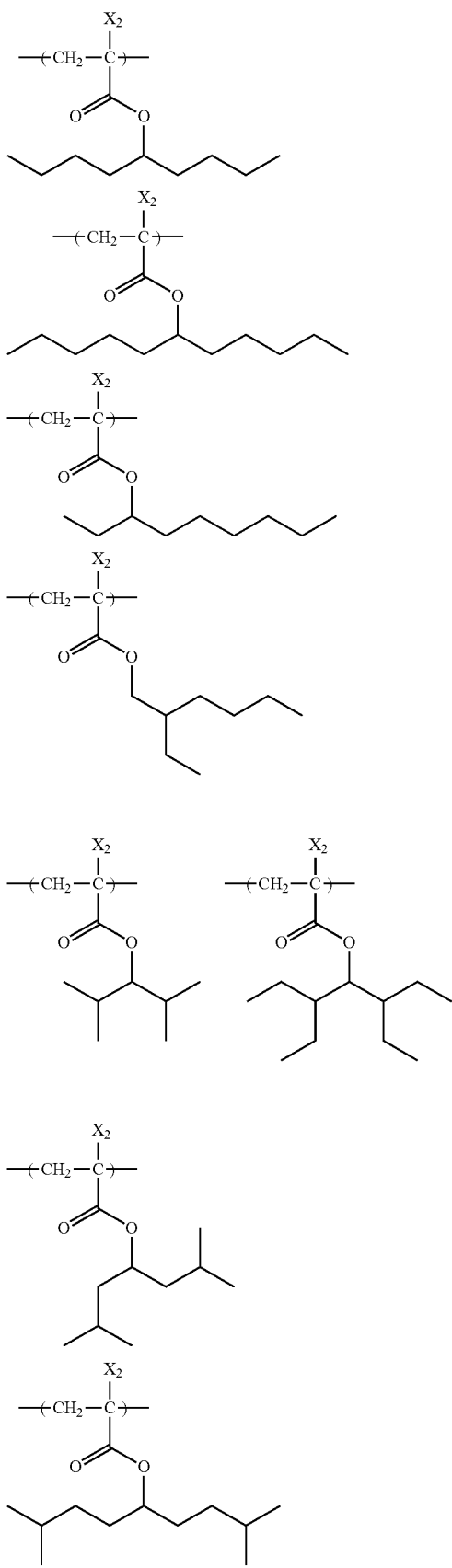
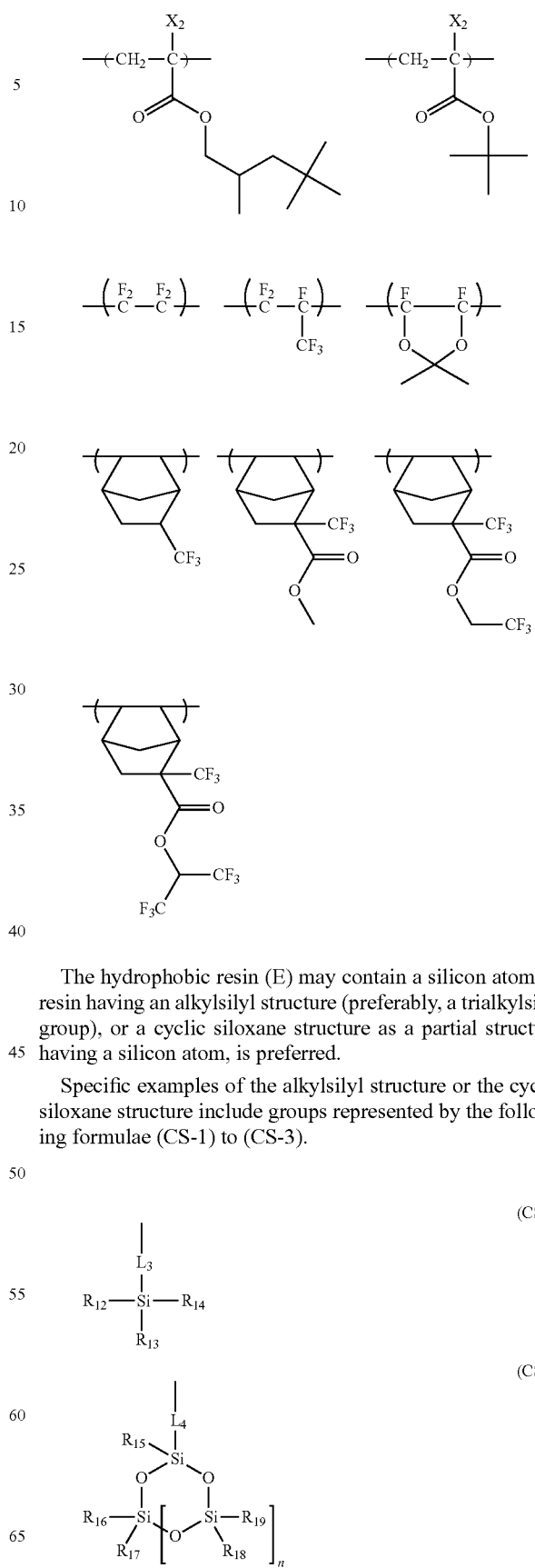

The hydrophobic resin (E) may contain a silicon atom. A resin having an alkylsilyl structure (preferably, a trialkylsilyl group), or a cyclic siloxane structure as a partial structure having a silicon atom, is preferred.

Specific examples of the alkylsilyl structure or the cyclic siloxane structure include groups represented by the following formulae (CS-1) to (CS-3).

(CS-1)

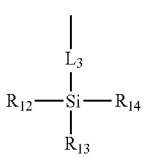

(CS-2)

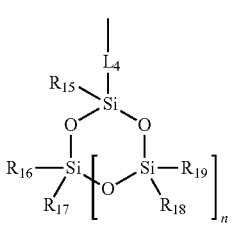

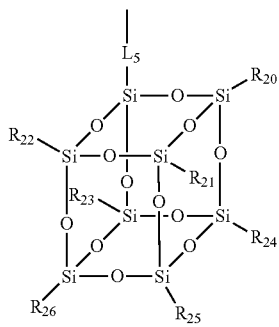

(CS-3)

In the formulae (CS-1) to (CS-3), $R_{12}$ to $R_{26}$ each independently represent a linear or branched alkyl group (preferably, having 1 to 20 carbon atoms), or a cycloalkyl group (preferably, having 3 to 20 carbon atoms).

$L_3$ to $L_5$ each represent a single bond or a divalent linking group. The divalent linking group may be one or a combination of two or more (preferably, having 12 or fewer carbon atoms in total) selected from the group consisting of an alkylene group, a phenylene group, an ether bond, a thioether bond, a carbonyl group, an ester bond, an amide bond, a urethane bond, and a urea bond.

n represents an integer from 1 to 5. n is preferably an integer from 2 to 4.

Specific examples of the repeating unit having a group represented by the formulae (CS-1) to (CS-3) will be listed below, but the present invention is not limited to these. Meanwhile, in the specific examples, $X_1$ represents a hydrogen atom, —$CH_3$, —F, or —$CF_3$.

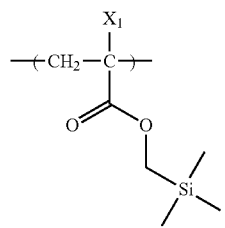
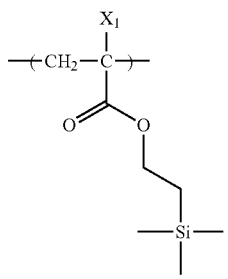
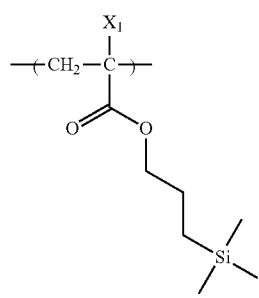
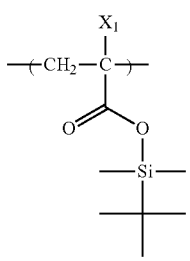
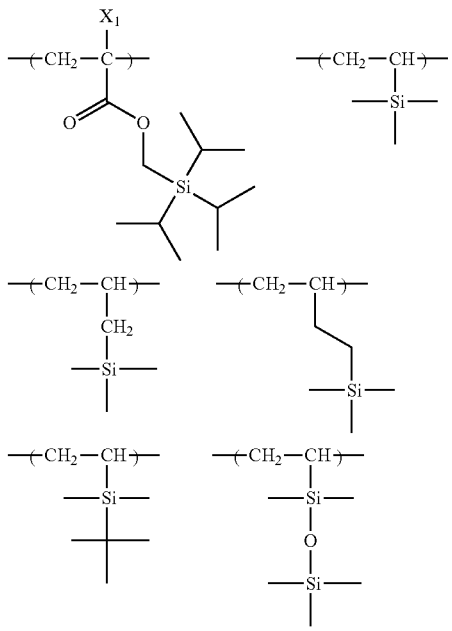
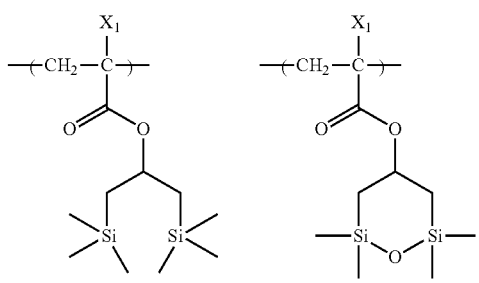
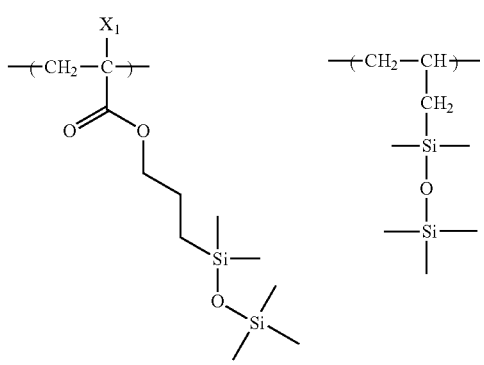
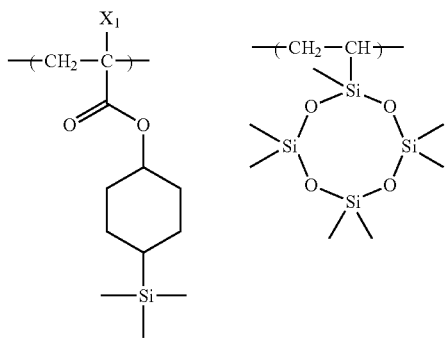

-continued

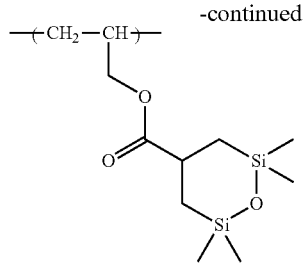

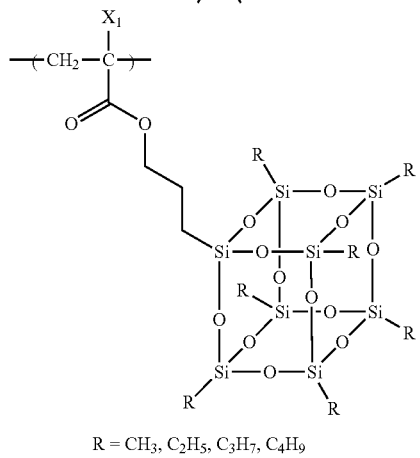

R = CH$_3$, C$_2$H$_5$, C$_3$H$_7$, C$_4$H$_9$

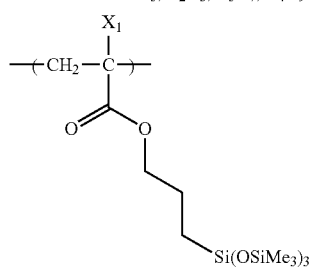

Furthermore, the hydrophobic resin (E) may have at least one group selected from the group of the following (x) to (z):
(x) an acid group;
(y) a group having a lactone structure, an acid anhydride group, or an acid imide group; and
(z) a group which is degraded under the action of acid.

Examples of the acid group (x) include a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group.

Preferred examples of the acid group include a fluorinated alcohol group (preferably, hexafluoroisopropanol), a sulfonamide group, and a bis(alkylcarbonyl)methylene group.

Examples of a repeating unit having an acid group (x) include a repeating unit in which the acid group is directly linked to the main chain of a resin, such as a repeating unit based on acrylic acid or methacrylic acid; and a repeating unit in which the acid group is linked to the main chain of a resin via a linking group. Furthermore, the acid group can also be introduced to the ends of the polymer chain by using a polymerization initiator or chain transfer agent having an acid group. Thus, any of these cases is preferable. The repeating unit having the acid group (x) may have at least any of a fluorine atom and a silicon atom.

The content of the repeating unit having an acid group (x) is preferably 1 mol % to 50 mol %, more preferably 3 mol % to 35 mol %, and even more preferably 5 mol % to 20 mol %, based on the total content of the repeating units in the hydrophobic resin (E).

Specific examples of the repeating unit having an acid group (x) will be listed below, but the present invention is not limited to these. In the formulae, Rx represents a hydrogen atom, CH$_3$, CF$_3$, or CH$_2$OH.

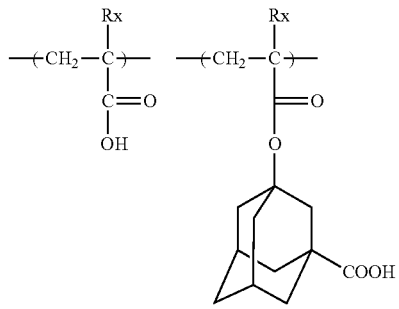

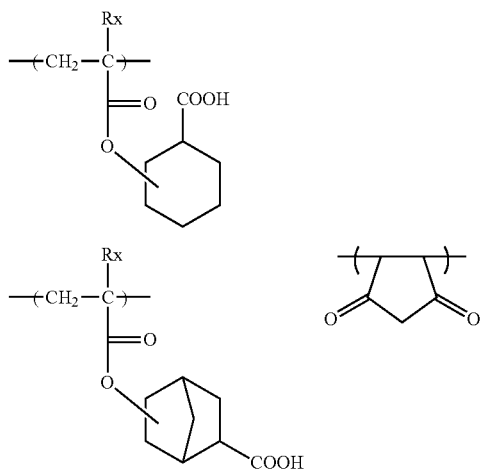

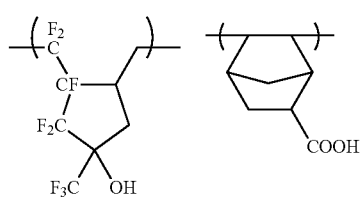

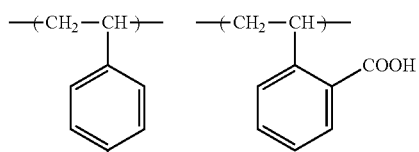

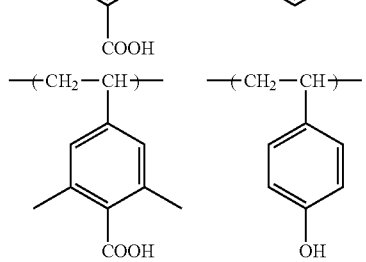

151
-continued
152
-continued
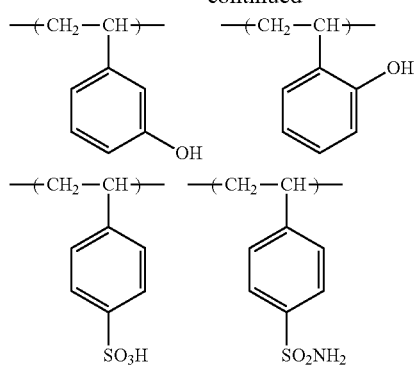
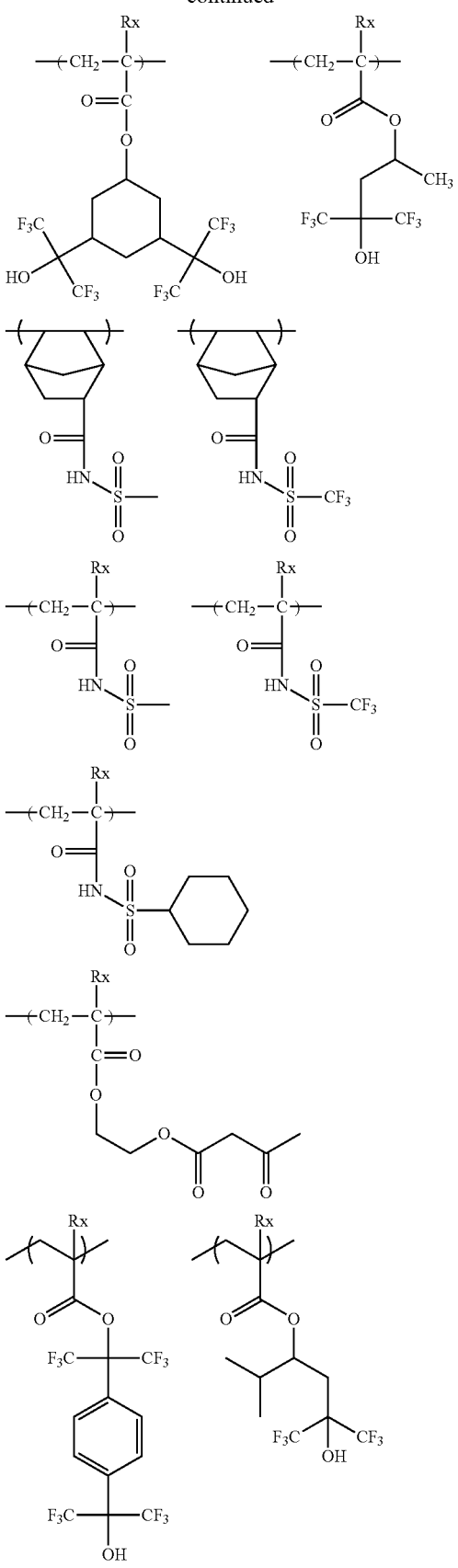

-continued

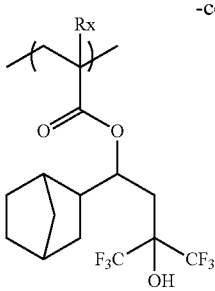

As the group having a lactone structure, an acid anhydride group, or an acid imide group (y), a group having a lactone structure is particularly preferred.

Examples of repeating units containing such a group include repeating units in which this group is directly linked to the main chain of the resin, such as repeating units based on acrylic acid esters and methacrylic acid esters. Alternatively, these repeating units may also be repeating units in which this group is linked to the main chain of the resin via a linking group. Alternatively, these repeating units may have this group introduced to the ends of the resin by using a polymerization initiator or chain transfer agent having this group at the time of polymerization.

Examples of the repeating unit having a group having a lactone structure include the same repeating units as those having a lactone structure, which have been described previously in the section for the acid-degradable resin (A).

The content of the repeating unit having a group having a lactone structure, an acid anhydride group, or an acid imide group is preferably 1 mol % to 100 mol %, more preferably 3 mol % to 98 mol %, and even more preferably 5 mol % to 95 mol %, based on the total content of the repeating units in the hydrophobic resin.

In the hydrophobic resin (E), the repeating unit having a group which is degraded under the action of acid may be the same as the repeating unit having an acid-degradable group as mentioned for the resin (A). The repeating unit having a group which is degraded under the action of acid (z) may have at least any one of a fluorine atom and a silicon atom. The content of the repeating unit having a group which is degraded under the action of acid (z) in the hydrophobic resin (E) is preferably 1 mol % to 80 mol %, more preferably 10 mol % to 80 mol %, and even more preferably 20 mol % to 60 mol %, based on the total content of the repeating units in the resin (E).

The hydrophobic resin (E) may further have a repeating unit represented by the following formula (III).

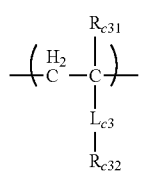
(III)

In the formula (III), $R_{c31}$ represents a hydrogen atom, an alkyl group (may be substituted with a fluorine atom or the like), a cyano group, or a —$CH_2$—O-$Rac_2$ group. In the formula, $Rac_2$ represents a hydrogen atom, an alkyl group, or an acyl group. $R_{c31}$ is preferably a hydrogen atom, a methyl group, a hydroxymethyl group, or a trifluoromethyl group, and particularly preferably a hydrogen atom or a methyl group.

$R_{c32}$ represents a group having an alkyl group, a cycloalkyl group, an alkenyl group, a cycloalkenyl group, or an aryl group. These groups may be substituted with a group containing a fluorine atom or a silicon atom.

$L_{c3}$ represents a single bond or a divalent linking group.

In the formula (III), the alkyl group of $R_{c32}$ is preferably a linear or branched alkyl group having 3 to 20 carbon atoms.

The cycloalkyl group is preferably a cycloalkyl group having 3 to 20 carbon atoms.

The alkenyl group is preferably an alkenyl group having 3 to 20 carbon atoms.

The cycloalkenyl group is preferably a cycloalkenyl group having 3 to 20 carbon atoms.

The aryl group is preferably an aryl group having 6 to 20 carbon atoms, and a phenyl group and a naphthyl group are more preferred. These may have substituents.

$R_{c32}$ is preferably an unsubstituted alkyl group, or an alkyl group substituted with a fluorine atom.

The divalent linking group of $L_{c3}$ is preferably an alkylene group (preferably having 1 to 5 carbon atoms), an ether bond, a phenylene group, or an ester bond (a group represented by —COO—).

The content of the repeating unit represented by the formula (III) is preferably 1 mol % to 100 mol %, more preferably 10 mol % to 90 mol %, and even more preferably 30 mol % to 70 mol %, based on the total content of the repeating units in the hydrophobic resin.

Furthermore, it is also preferable that the hydrophobic resin (E) have a repeating unit represented by the following formula (CII-AB).

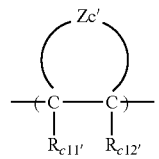
(CII-AB)

In the formula (CII-AB), $R_{c11}'$ and $R_{c12}'$ each independently represent a hydrogen atom, a cyano group, a halogen atom, or an alkyl group.

Zc' represents an atomic group for forming an alicyclic structure, which contains two bonded carbon atoms (C—C).

The content of the repeating unit represented by the formula (CII-AB) is preferably 1 mol % to 100 mol %, more preferably 10 mol % to 90 mol %, and even more preferably 30 mol % to 70 mol %, based on the total content of the repeating units in the hydrophobic resin.

Specific examples of the repeating units represented by the formulae (III) and (CII-AB) will be listed below, but the present invention is not limited to these. In the formulae, Ra represents H, $CH_3$, $CH_2OH$, $CF_3$ or CN.

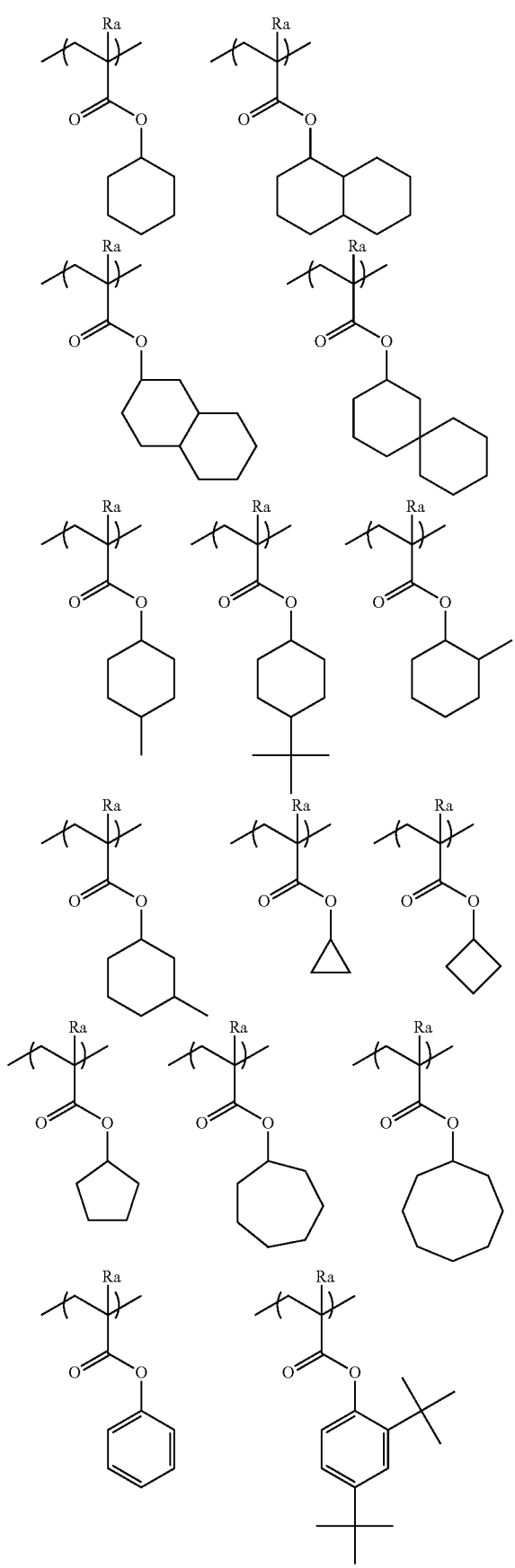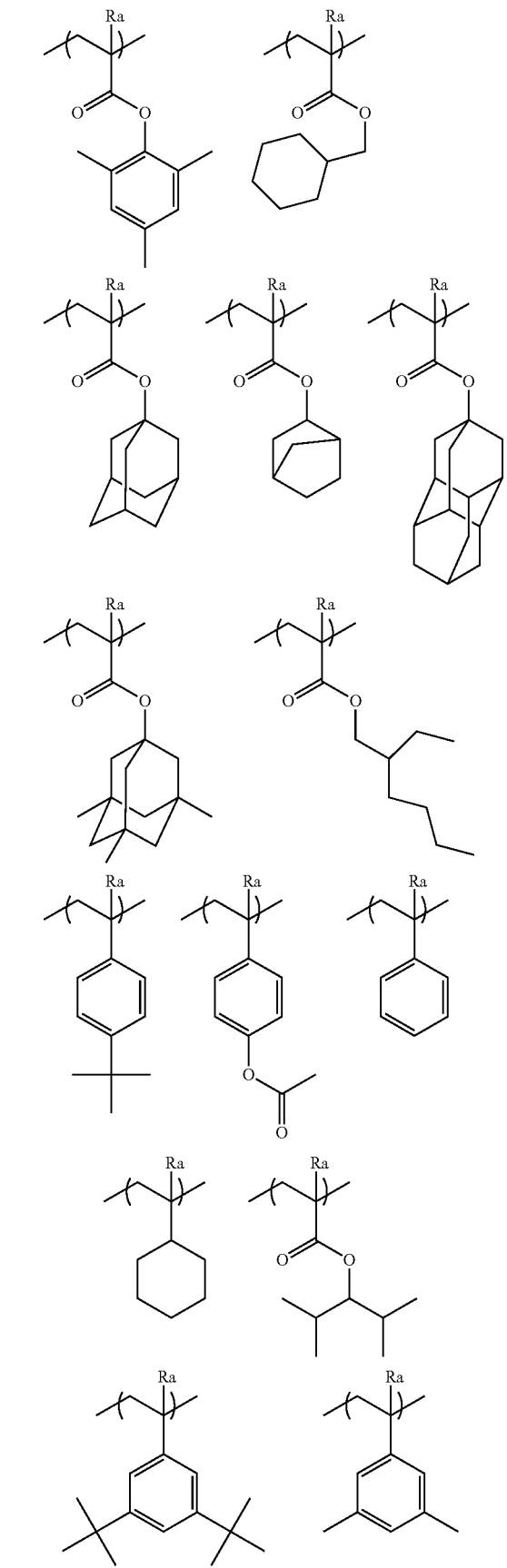

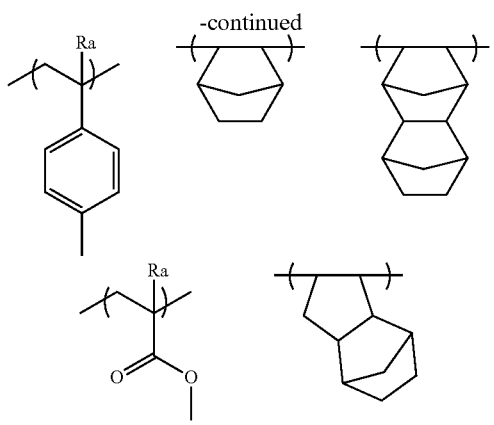

When the hydrophobic resin (E) has fluorine atoms, the content of the fluorine atoms is preferably 5% to 80% by mass, and more preferably 10% to 80% by mass, based on the weight average molecular weight of the hydrophobic resin (E). Furthermore, the content of the repeating unit containing a fluorine atom is preferably 10 mol % to 100 mol %, and more preferably 30 mol % to 100 mol %, based on the total content of the repeating units included in the hydrophobic resin (E).

When the hydrophobic resin (E) has silicon atoms, the content of the silicon atoms is preferably 2% to 50% by mass, and more preferably 2% to 30% by mass, based on the weight average molecular weight of the hydrophobic resin (E). Furthermore, the content of the repeating unit containing a silicon atom is preferably 10 mol % to 100 mol %, and more preferably 20 mol % to 100 mol %, based on the total content of the repeating units included in the hydrophobic resin (E).

The weight average molecular weight of the hydrophobic resin (E) relative to polystyrene standards is preferably 1,000 to 100,000, more preferably 1,000 to 50,000, and even more preferably 2,000 to 15,000.

Furthermore, the hydrophobic resin (E) may be used individually, or plural resins may be used in combination.

The content of the hydrophobic resin (E) in the composition is preferably 0.01% to 10% by mass, more preferably 0.05% to 8% by mass, and even more preferably 0.1% to 5% by mass, based on the total solids content of the composition of the present invention.

For the hydrophobic resin (E), it is essential that the resin contains less impurities such as metals, as in the case of the resin (A), and the content of the residual monomer or oligomer components is preferably 0.01% to 5% by mass, more preferably 0.01% to 3% by mass, and even more preferably 0.05% to 1% by mass. Thereby, a chemical amplification resist composition having no foreign materials in the liquid or no change over time in the sensitivity or the like can be obtained. Furthermore, from the viewpoints of resolution, resist shape, sidewalls of the resist pattern, roughness and the like, the molecular weight distribution (Mw/Mn, also called dispersity) is preferably in the range of 1 to 5, more preferably in the range of 1 to 3, and even more preferably in the range of 1 to 2.

In regard to the hydrophobic resin (E), various commercially available products can be used, or the resin can be synthesized according to a conventional method (for example, radical polymerization). For example, as a general synthesis method, a bulk polymerization method of performing polymerization by dissolving monomer species and an initiator in a solvent and heating the solution; a dropping polymerization method of adding a solution of monomer species and an initiator dropwise into a heated solvent over 1 to 10 hours; and the like may be used, and the dropping polymerization method is preferred.

Matters concerning the reaction solvent, polymerization initiator, reaction conditions (temperature, concentration, and the like), and the purification method after reaction, are the same as those described with regard to the resin (A); however, in the synthesis of the hydrophobic resin (E), the concentration of the reaction is preferably 30% to 50% by mass.

Specific examples of the hydrophobic resin (E) will be listed below. Furthermore, the molar proportions of the repeating units (corresponding to the respective repeating units in the order given on the left side), the weight average molecular weight, and the dispersity for various resins are indicated in the following Table 1 and Table 2.

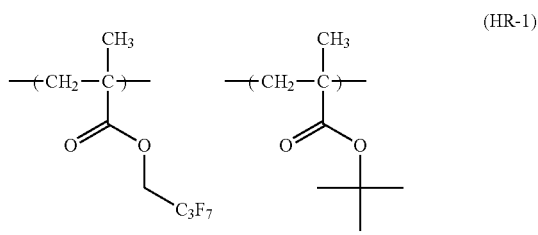

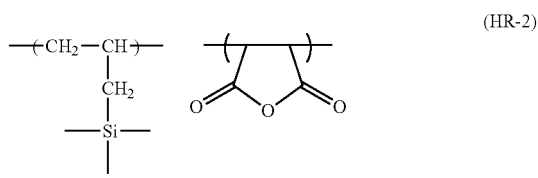

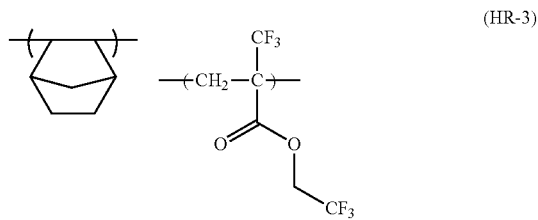

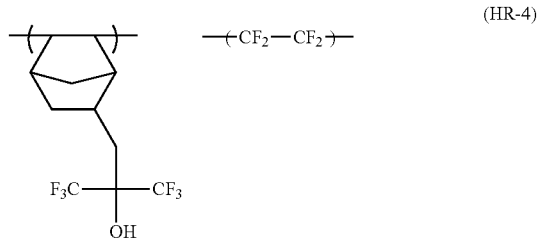

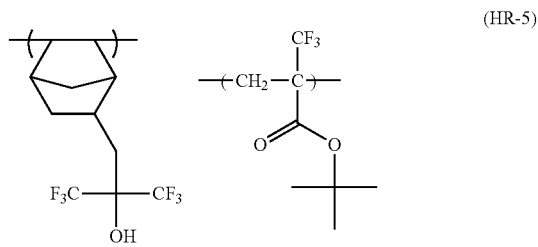

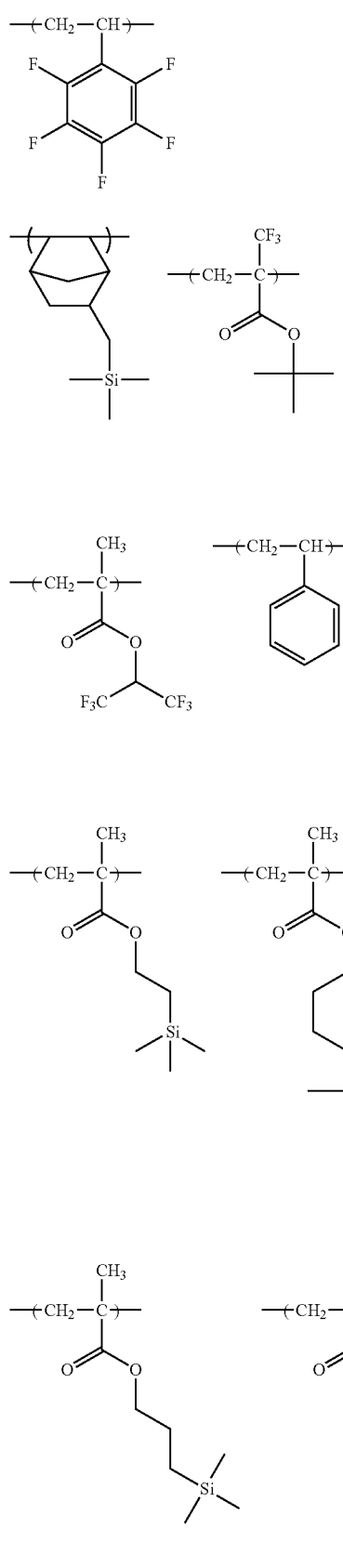

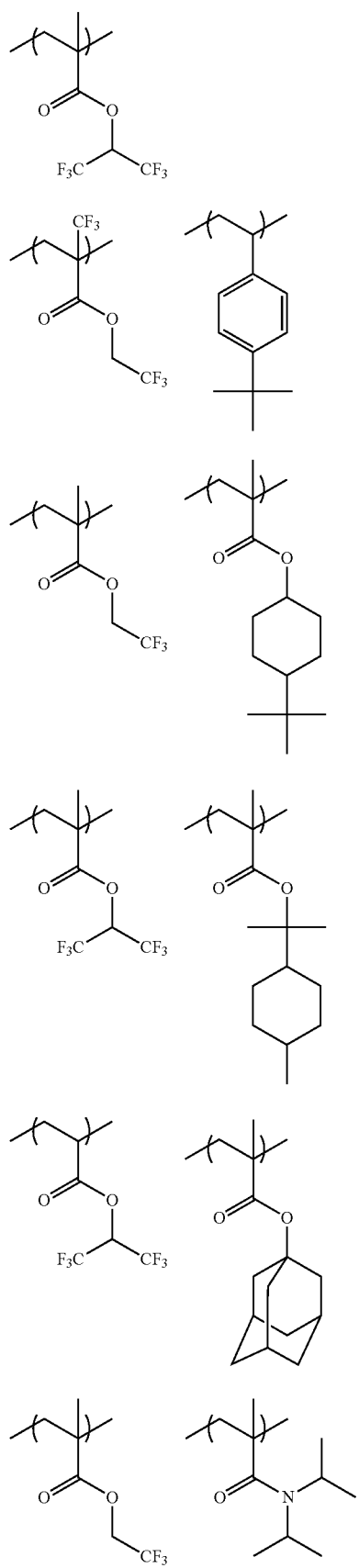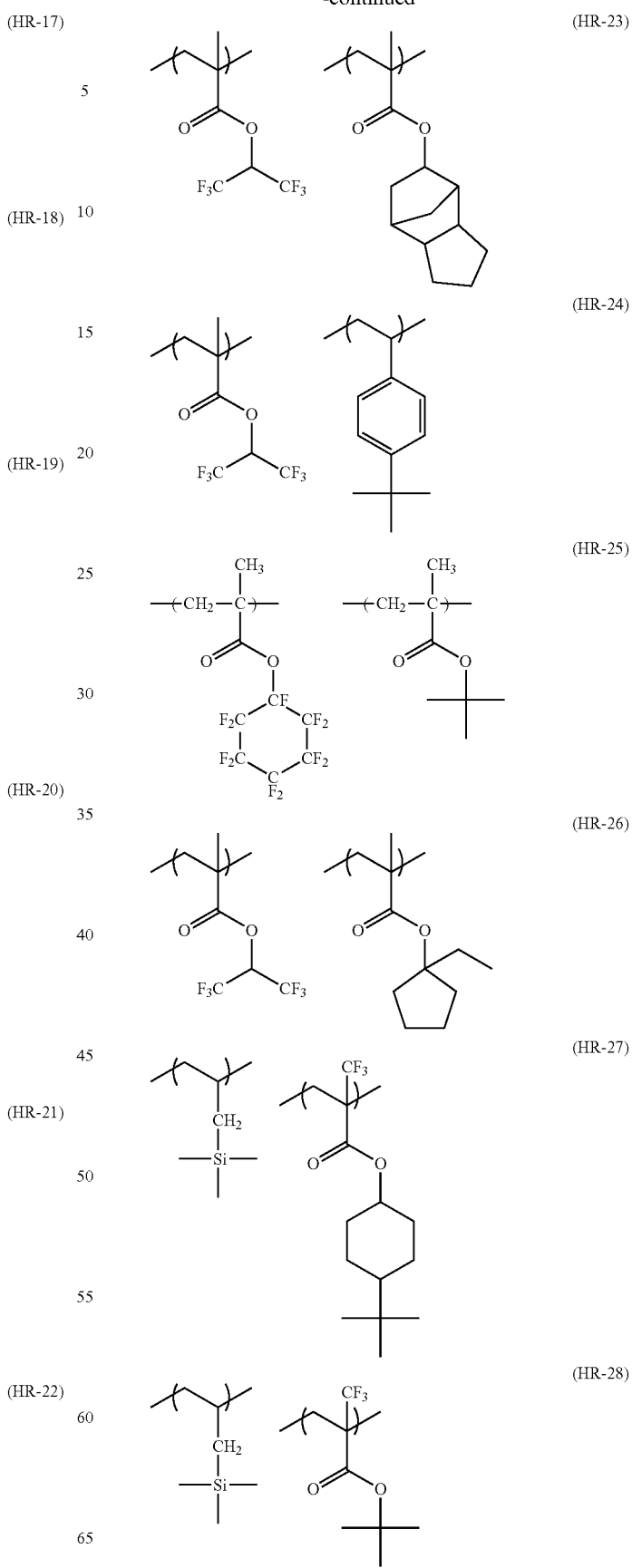

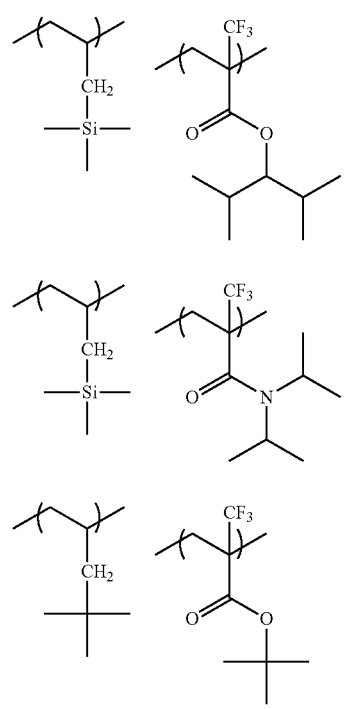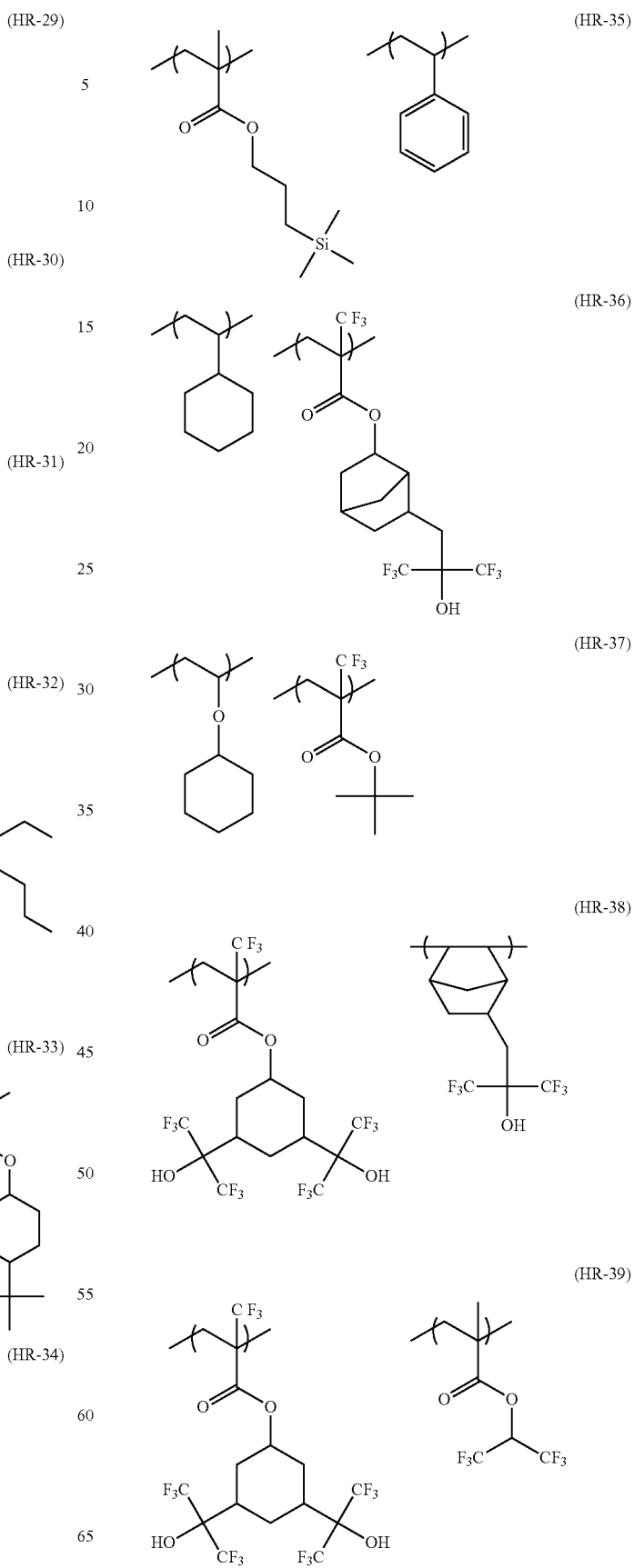

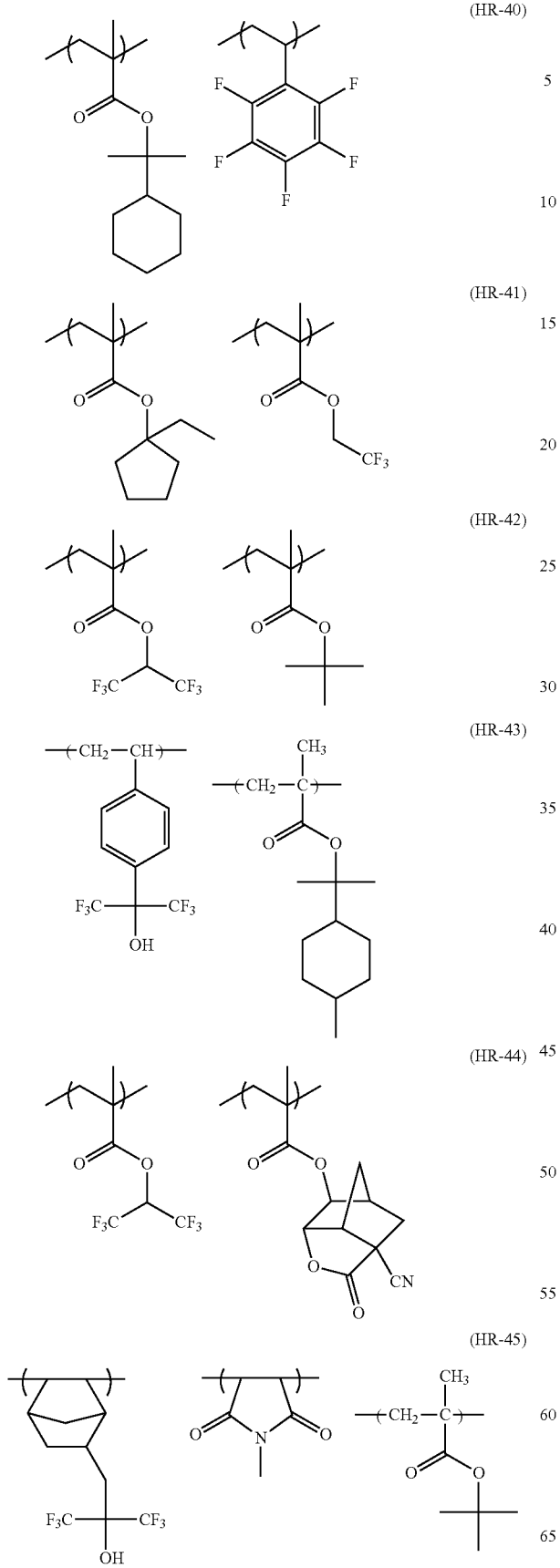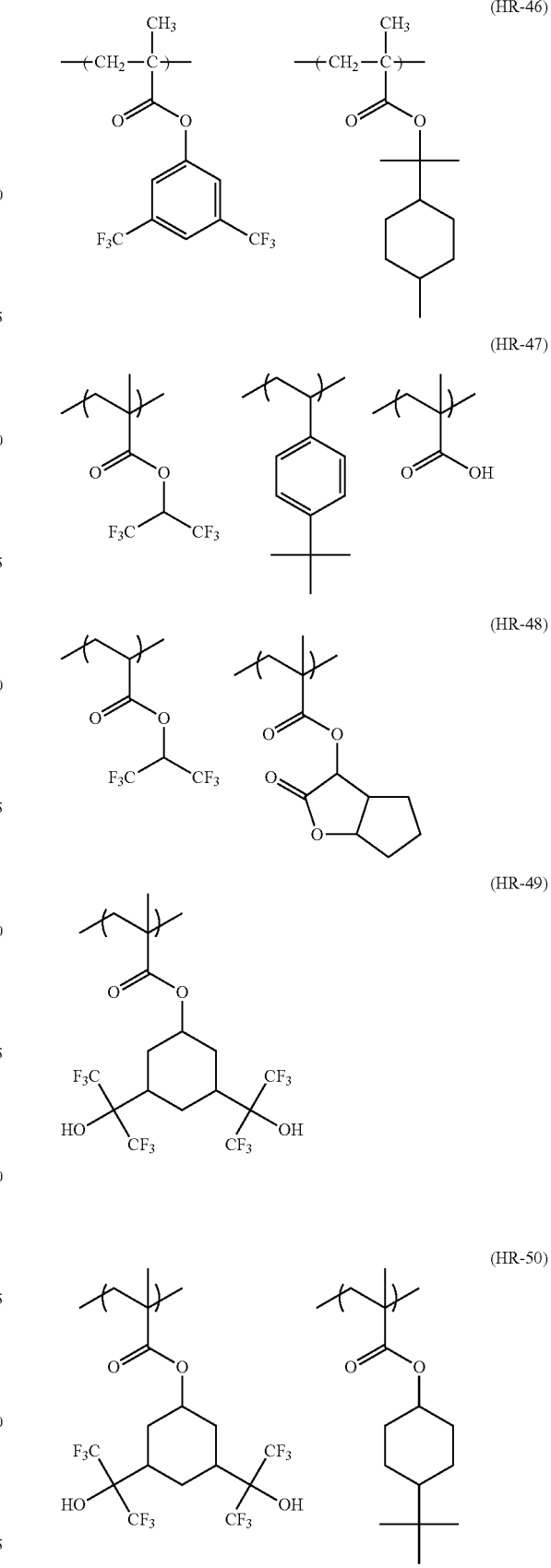

-continued
(HR-51)
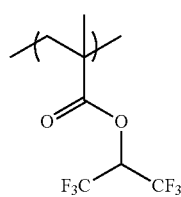 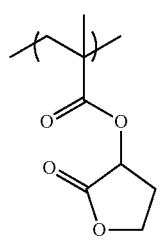 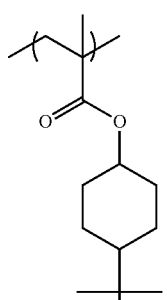
(HR-52)
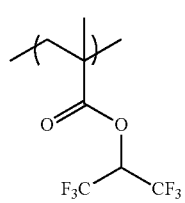 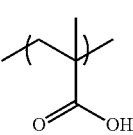
(HR-53)
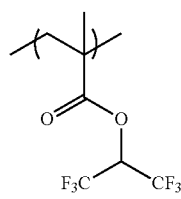 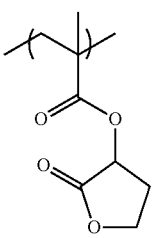
(HR-54)
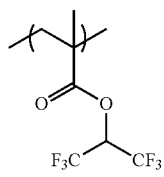 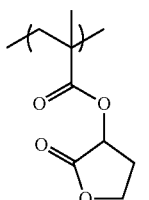 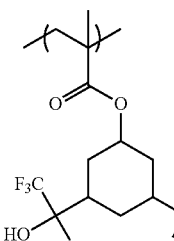
(HR-55)
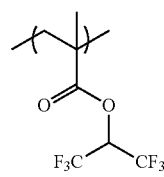 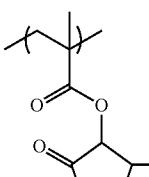 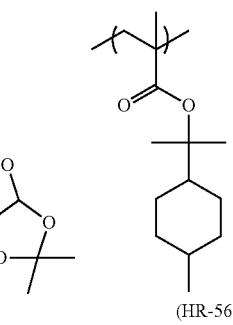
(HR-56)
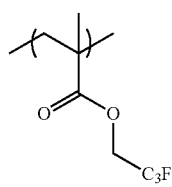 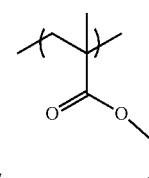 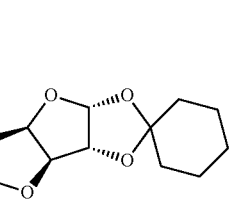
-continued
(HR-57)
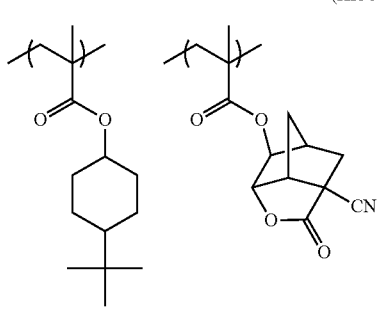
(HR-58)
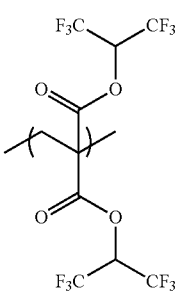 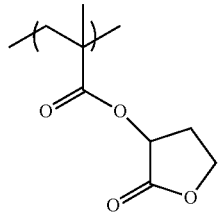
(HR-59)
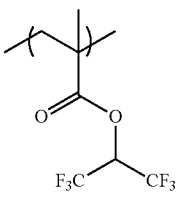 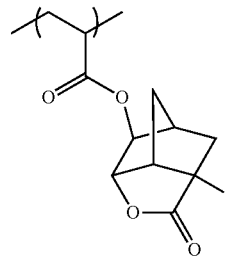
(HR-60)
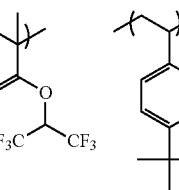 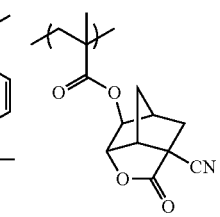
(HR-61)
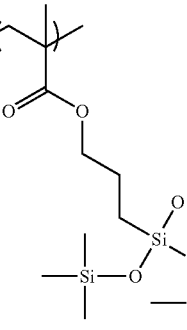 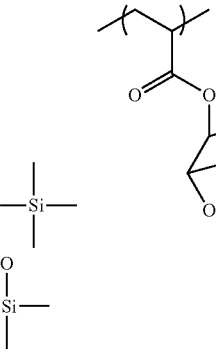

(HR-62) 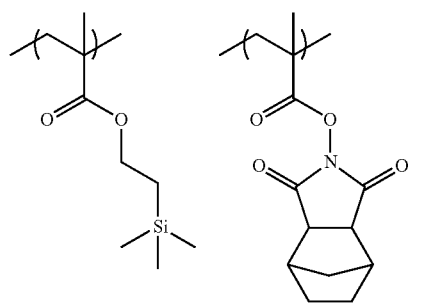
(HR-63) 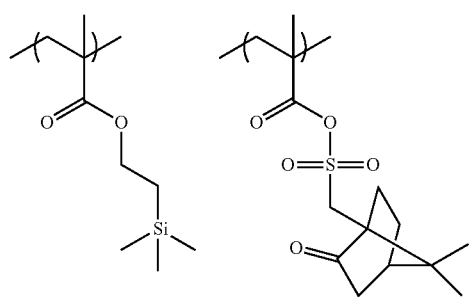
(HR-64) 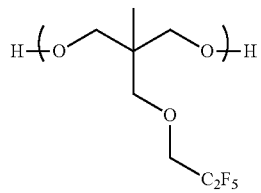
(HR-65) 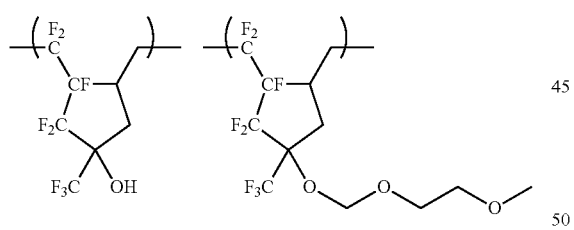
(HR-66) 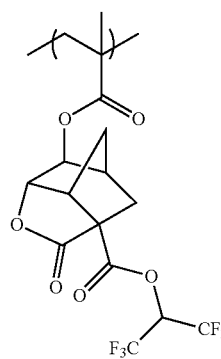
(HR-67) 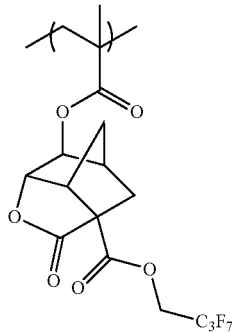
(HR-68) 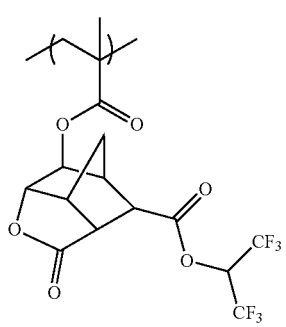
(HR-69) 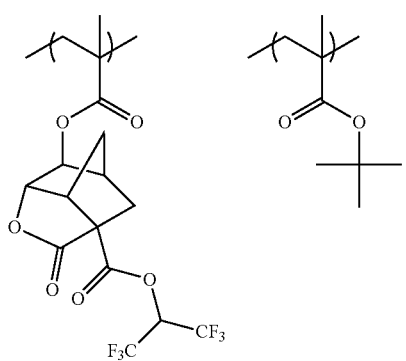
(HR-70) 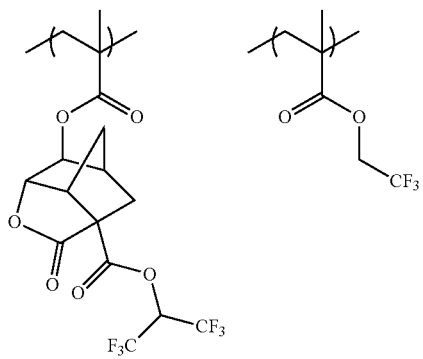

(HR-71)
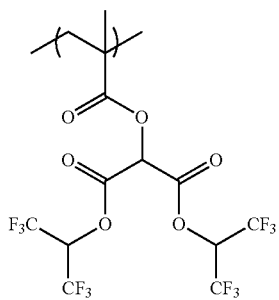
(HR-72)
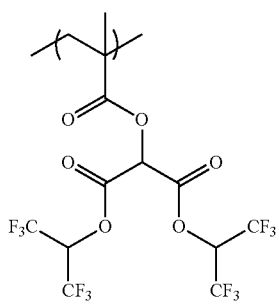 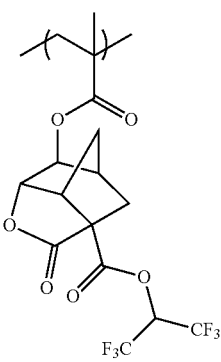
(HR-73)
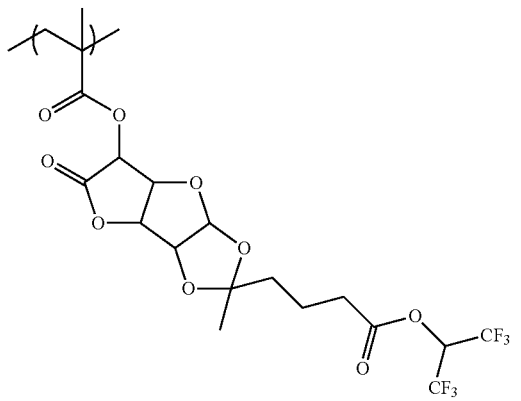
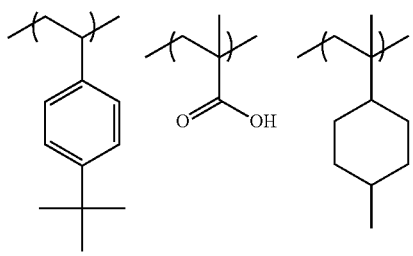
(HR-74)
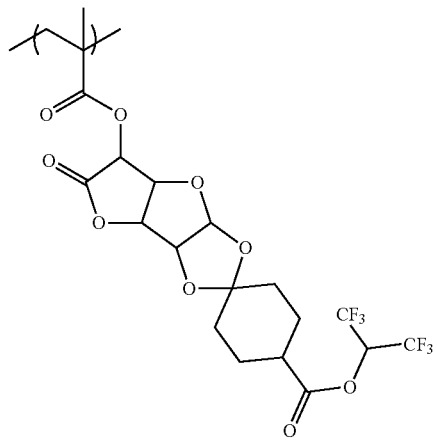
(HR-75)
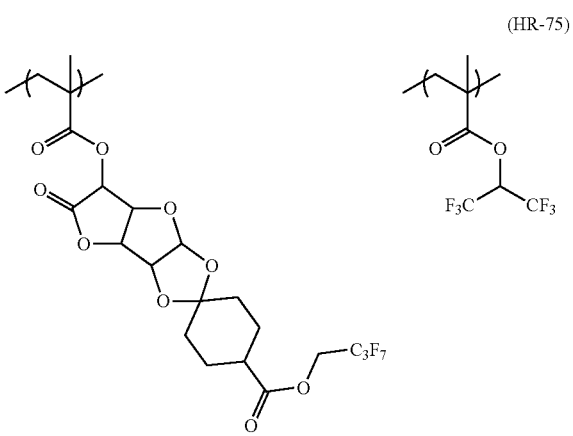
(HR-76)
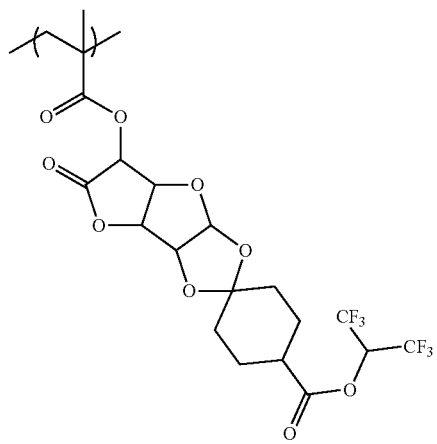
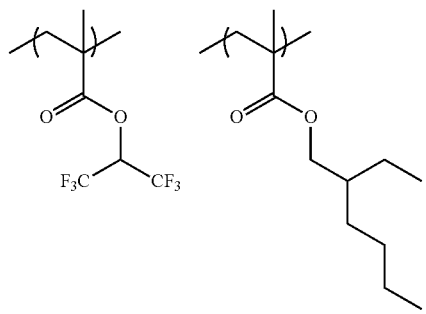

-continued
(HR-77)
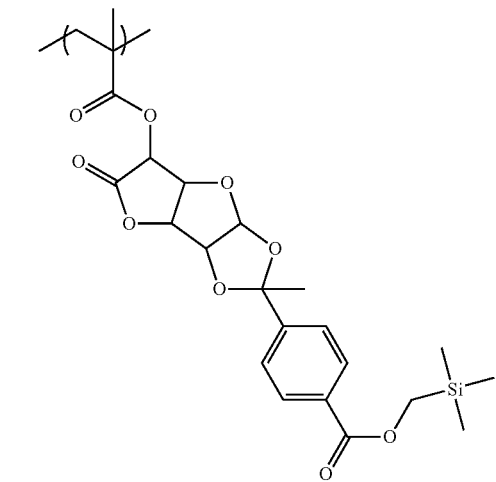
(HR-78)
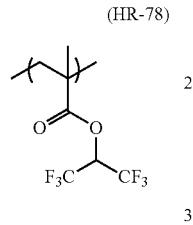
(HR-79)
(HR-80)
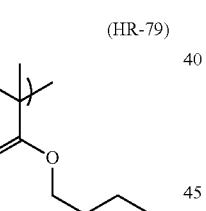
-continued
(HR-81)
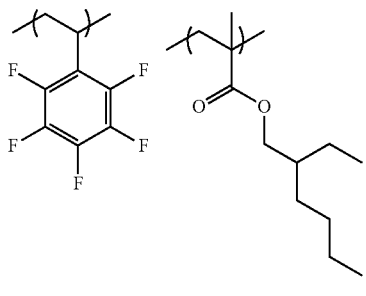
(HR-82)
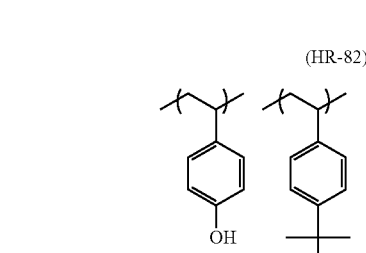
(HR-83)
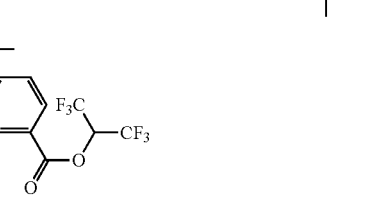
(HR-84)
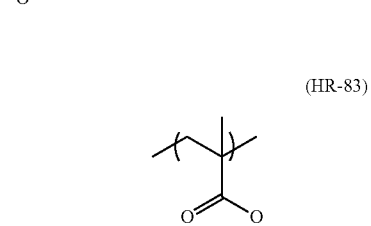

(HR-85)
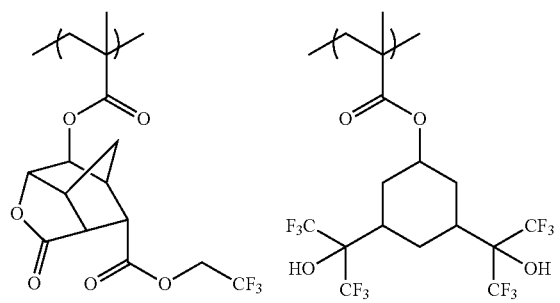
(HR-86)
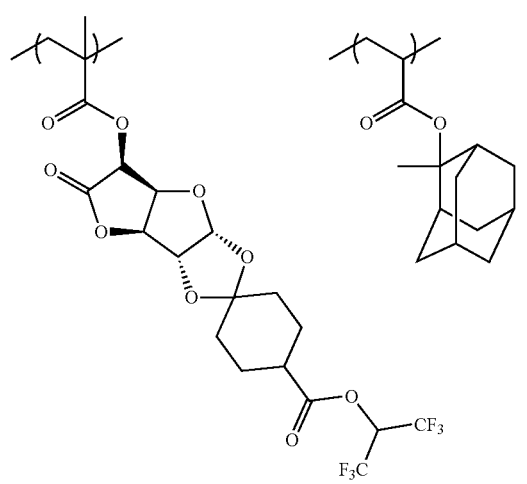
(HR-87)
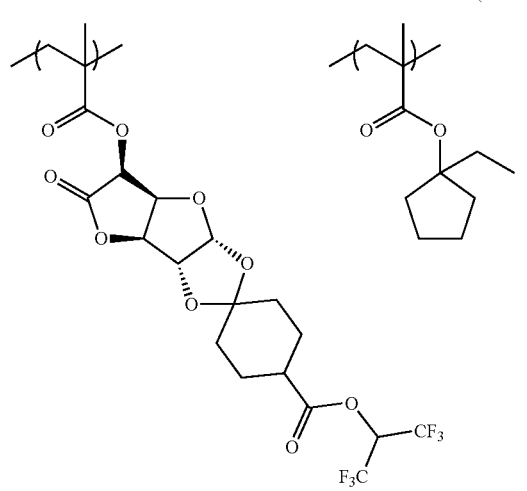
(HR-88)
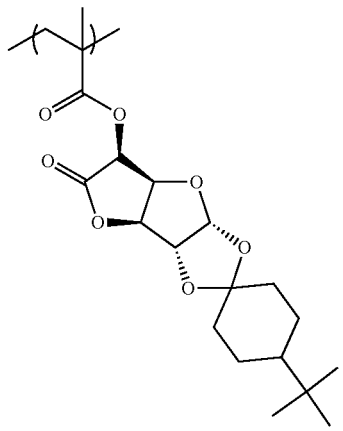
(HR-89)
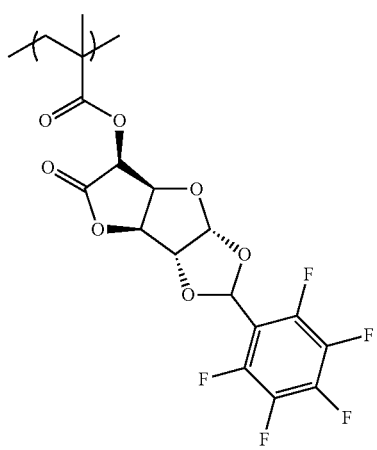
(HR-90)
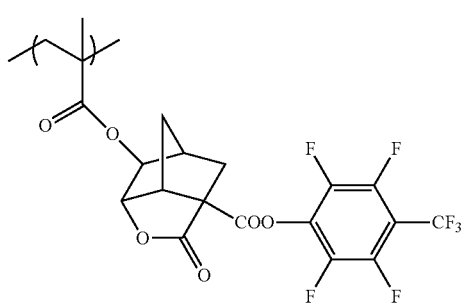
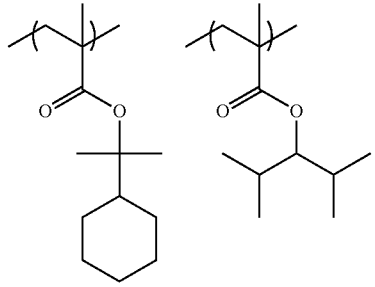
TABLE 1
| Resin | Composition | Mw | Mw/Mn |
|---|---|---|---|
| HR-1 | 50/50 | 4900 | 1.4 |
| HR-2 | 50/50 | 5100 | 1.6 |

TABLE 1-continued

| Resin | Composition | Mw | Mw/Mn |
|---|---|---|---|
| HR-3 | 50/50 | 4800 | 1.5 |
| HR-4 | 50/50 | 5300 | 1.6 |
| HR-5 | 50/50 | 4500 | 1.4 |
| HR-6 | 100 | 5500 | 1.6 |
| HR-7 | 50/50 | 5800 | 1.9 |
| HR-8 | 50/50 | 4200 | 1.3 |
| HR-9 | 50/50 | 5500 | 1.8 |
| HR-10 | 40/60 | 7500 | 1.6 |
| HR-11 | 70/30 | 6600 | 1.8 |
| HR-12 | 40/60 | 3900 | 1.3 |
| HR-13 | 50/50 | 9500 | 1.8 |
| HR-14 | 50/50 | 5300 | 1.6 |
| HR-15 | 100 | 6200 | 1.2 |
| HR-16 | 100 | 5600 | 1.6 |
| HR-17 | 100 | 4400 | 1.3 |
| HR-18 | 50/50 | 4300 | 1.3 |
| HR-19 | 50/50 | 6500 | 1.6 |
| HR-20 | 30/70 | 6500 | 1.5 |
| HR-21 | 50/50 | 6000 | 1.6 |
| HR-22 | 50/50 | 3000 | 1.2 |
| HR-23 | 50/50 | 5000 | 1.5 |
| HR-24 | 50/50 | 4500 | 1.4 |
| HR-25 | 30/70 | 5000 | 1.4 |
| HR-26 | 50/50 | 5500 | 1.6 |
| HR-27 | 50/50 | 3500 | 1.3 |
| HR-28 | 50/50 | 6200 | 1.4 |
| HR-29 | 50/50 | 6500 | 1.6 |
| HR-30 | 50/50 | 6500 | 1.6 |
| HR-31 | 50/50 | 4500 | 1.4 |
| HR-32 | 30/70 | 5000 | 1.6 |
| HR-33 | 30/30/40 | 6500 | 1.8 |
| HR-34 | 50/50 | 4000 | 1.3 |
| HR-35 | 50/50 | 6500 | 1.7 |
| HR-36 | 50/50 | 6000 | 1.5 |
| HR-37 | 50/50 | 5000 | 1.6 |
| HR-38 | 50/50 | 4000 | 1.4 |
| HR-39 | 20/80 | 6000 | 1.4 |
| HR-40 | 50/50 | 7000 | 1.4 |
| HR-41 | 50/50 | 6500 | 1.6 |
| HR-42 | 50/50 | 5200 | 1.6 |
| HR-43 | 50/50 | 6000 | 1.4 |
| HR-44 | 70/30 | 5500 | 1.6 |
| HR-45 | 50/20/30 | 4200 | 1.4 |
| HR-46 | 30/70 | 7500 | 1.6 |
| HR-47 | 40/58/2 | 4300 | 1.4 |
| HR-48 | 50/50 | 6800 | 1.6 |
| HR-49 | 100 | 6500 | 1.5 |
| HR-50 | 50/50 | 6600 | 1.6 |
| HR-51 | 30/20/50 | 6800 | 1.7 |
| HR-52 | 95/5 | 5900 | 1.6 |
| HR-53 | 40/30/30 | 4500 | 1.3 |
| HR-54 | 50/30/20 | 6500 | 1.8 |
| HR-55 | 30/40/30 | 7000 | 1.5 |
| HR-56 | 60/40 | 5500 | 1.7 |
| HR-57 | 40/40/20 | 4000 | 1.3 |
| HR-58 | 60/40 | 3800 | 1.4 |
| HR-59 | 80/20 | 7400 | 1.6 |
| HR-60 | 40/40/15/5 | 4800 | 1.5 |
| HR-61 | 60/40 | 5600 | 1.5 |
| HR-62 | 50/50 | 5900 | 2.1 |
| HR-63 | 80/20 | 7000 | 1.7 |
| HR-64 | 100 | 5500 | 1.8 |
| HR-65 | 50/50 | 9500 | 1.9 |

TABLE 2

| Resin | Composition | Mw | Mw/Mn |
|---|---|---|---|
| HR-66 | 100 | 6000 | 1.5 |
| HR-67 | 100 | 6000 | 1.4 |
| HR-68 | 100 | 9000 | 1.5 |
| HR-69 | 60/40 | 8000 | 1.3 |
| HR-70 | 80/20 | 5000 | 1.4 |
| HR-71 | 100 | 9500 | 1.5 |
| HR-72 | 40/60 | 8000 | 1.4 |

TABLE 2-continued

| Resin | Composition | Mw | Mw/Mn |
|---|---|---|---|
| HR-73 | 55/30/5/10 | 8000 | 1.3 |
| HR-74 | 100 | 13000 | 1.4 |
| HR-75 | 70/30 | 8000 | 1.3 |
| HR-76 | 50/40/10 | 9500 | 1.5 |
| HR-77 | 100 | 9000 | 1.6 |
| HR-78 | 80/20 | 3500 | 1.4 |
| HR-79 | 90/8/2 | 13000 | 1.5 |
| HR-80 | 85/10/5 | 5000 | 1.5 |
| HR-81 | 80/18/2 | 6000 | 1.5 |
| HR-82 | 50/20/30 | 5000 | 1.3 |
| HR-83 | 90/10 | 8000 | 1.4 |
| HR-84 | 100 | 9000 | 1.6 |
| HR-85 | 80/20 | 15000 | 1.6 |
| HR-86 | 70/30 | 4000 | 1.42 |
| HR-87 | 60/40 | 8000 | 1.32 |
| HR-88 | 100 | 3800 | 1.29 |
| HR-89 | 100 | 6300 | 1.35 |
| HR-90 | 50/40/10 | 8500 | 1.51 |

[6] Surfactant (F)

The chemical amplification resist composition according to the present invention may or may not further contain a surfactant, and when the composition contains a surfactant, it is more preferable that the resist composition contain any of fluorine- and/or silicone-based surfactants (fluorine-based surfactants, silicone-based surfactants, and surfactants having both fluorine atoms and silicon atoms), or contain two or more kinds.

When the chemical amplification resist composition according to the present invention contains a surfactant, a resist pattern having satisfactory sensitivity, resolution and adhesiveness and having fewer development defects can be provided when an exposure light source at 250 nm or less, particularly 220 nm or less, is used.

Examples of the fluorine-based and/or silicone-based surfactants include the surfactants described in paragraph [0276] of US 2008/0248425 A, and examples include EFTOP EF301 and EF303 (manufactured by Shin-Akita Chemical Co., Ltd.); FLUORAD FC430, 431 and 4430 (manufactured by Sumitomo 3M Co., Ltd.); MEGAFAC F171, F173, F176, F189, F113, F110, F177, F120, and R08 (manufactured by DIC Corp.); SURFLON S-382, SC101, 102, 103, 104, 105, 106, and KH-20 (manufactured by Asahi Glass Co., Ltd.); TROYSOL S-366 (manufactured by Troy Chemical Industries, Inc.); GF-300 and GF-150 (manufactured by Toagosei Co., Ltd.); SURFLON S-393 (manufactured by AGC Seimi Chemical Co., Ltd.); EFTOP EF121, EF122A, EF122B, RF122C, EF125M, EF135M, EF351, EF352, EF801, EF802, and EF601 (manufactured by Jemco, Inc.); PF636, PF656, PF6320, and PF6520 (manufactured by Omnova Solutions, Inc.); and FTX-204G, 208G, 218G, 230G, 204D, 208D, 212D, 218D, and 222D (manufactured by Neos Co., Ltd.). Furthermore, polysiloxane polymer KP-341 (manufactured by Shin-Etsu Chemical Co., Ltd.) can also be used as a silicone-based surfactant.

Furthermore, as the surfactant, in addition to the known compounds described above, surfactants utilizing polymers having fluoroaliphatic groups that are derived from fluoroaliphatic compounds which are produced by a telomerization method (also called a telomer method) or an oligomerization method (also called an oligomer method), can be used. The fluoroaliphatic compounds can be synthesized according to the method described in JP 2002-90991 A.

Examples of the surfactants corresponding to the compounds described above include MEGAFAC F178, F-470, F-473, F-475, F-476, and F-472 (manufactured by DIC Corp.); copolymers of an acrylate (or a methacrylate) having a $C_6F_{13}$ group and a (poly(oxyalkylene)) acrylate (or methacrylate); and a copolymer of an acrylate (or methacrylate) having a $C_3F_7$ group and a (poly(oxyethylene)acrylate (or methacrylate).

Furthermore, according to the present invention, surfactants other than the fluorine-based and/or silicone-based surfactants, which are described in paragraph [0280] of U 2008/0248425 A can also be used.

These surfactants may be used individually, or several kinds may be used in combination.

When the chemical amplification resist composition contains a surfactant, the amount of the surfactant used is preferably 0.0001% to 2% by mass, and more preferably 0.0005% to 1% by mass, based on the total amount (excluding the solvent) of the chemical amplification resist composition.

On the other hand, when the amount of the surfactant added is adjusted to 10 ppm or less based on the total amount (excluding the solvent) of the chemical amplification resist composition, the uneven distribution of the hydrophobic resin at the surface is increased, and thereby the surface of the resist film can be made more hydrophobic. Thus, water conformity at the time of immersion exposure can be enhanced.

[7] Other Additives (G)

The chemical amplification resist composition according to the present invention may contain, in addition to the components described above, a carboxylic acid onium salt, a low molecular weight dissolution inhibitor, and the like, for the purpose of performance regulation.

The chemical amplification resist composition is preferably used to provide a film having a thickness of 30 nm to 250 nm from the viewpoint of enhancing resolution, and more preferably, the resist composition is preferably used to provide a film having a thickness of 30 nm to 200 nm. When the solids concentration in the composition is set to an appropriate range to have an appropriate viscosity, and thereby coatability and film-forming properties are enhanced, a film having such a thickness can be provided.

The solids concentration in the chemical amplification resist composition according to the present invention is usually 1.0% to 10% by mass, preferably 2.0% to 5.7% by mass, and more preferably 2.0% to 5.3% by mass. When the solids concentration is set to the range described above, the resist solution can be uniformly applied on a substrate, and a resist pattern having excellent line width roughness can be formed. Although the reasons are not clearly known, it can be speculated that when the solids concentration is adjusted to 10% by mass or less, and preferably 5.7% by mass or less, the aggregation of the materials in the resist solution, particularly the photo-acid generator, is suppressed, and as a result, a uniform resist film can be formed.

The solids concentration means the weight percentage of the weight of the resist components except for the solvent, relative to the total weight of the chemical amplification resist composition.

The chemical amplification resist composition according to the present invention is used by dissolving the components described above in a predetermined organic solvent, preferably the solvent mixture described above, filtering the solution through a filter, and then applying the filtrate on a predetermined support (substrate). The pore size of the filter used in the filtration is 0.1 µm or less, more preferably 0.05 µm or less, and even more preferably 0.03 µm or less, and a filter made of polytetrafluoroethylene, polyethylene or nylon is preferred. For the process of filtration through a filter, for example, circulating filtration may be carried out as described in JP 2002-62667 A, or filtration may be carried out by connecting plural kinds of filters in series or in parallel. Furthermore, the composition may be filtered several times. Before or after the process of filtration through a filter, the composition may be subjected to a degassing treatment or the like.

EXAMPLES

Hereinafter, the present invention will be more specifically described based on Examples, but the present invention is not intended to be limited to the following Examples.

Synthesis Example

Synthesis of Resin P-1

83.6 parts by mass of cyclohexanone was heated to 80° C. under a nitrogen gas stream. While this liquid was stirred, a mixed solution of 71.1 parts by mass of a monomer corresponding to the repeating unit on the left side of the resin P-1 shown below, 68.3 parts by mass of a monomer corresponding to the repeating unit on the right side of the resin P-1 shown below, 334.5 parts by mass of cyclohexanone, and 3.68 parts by mass of dimethyl 2,2'-azobisisobutyrate [V-601, manufactured by Wako Pure Chemical Industries, Ltd.] was added dropwise to the liquid for 4 hours. After completion of the dropwise addition, the mixture was further stirred for 2 hours at 80° C. The reaction liquid was left to cool naturally, and then the reaction liquid was subjected to reprecipitation using a large amount of hexane/ethyl acetate (mass ratio 9:1) and filtration. A solid thus obtained was dried in a vacuum, and thus 125.5 parts by mass of the resin (P-1) of the present invention was obtained.

The weight average molecular weight (Mw: relative to polystyrene standards) of the resin thus obtained as determined by gel permeation chromatography (GPC; carrier: tetrahydrofuran (THF)) was 21,700, and the dispersity Mw/Mn was 1.97. The composition ratio (molar ratio) of the repeating unit on the left side of the resin P-1 shown below and the repeating unit on the right side of the resin P-1 shown below, as measured by $^{13}$C-NMR, was 40:60.

Resins (P-2) to (P-11) were synthesized by the same operation as in the Synthesis Example described above.

The structures, composition ratios (molar ratios) of the repeating units, weight average molecular weights (Mw), and dispersity (Mw/Mn) of the resins (P-1) to (P-11) are indicated below.

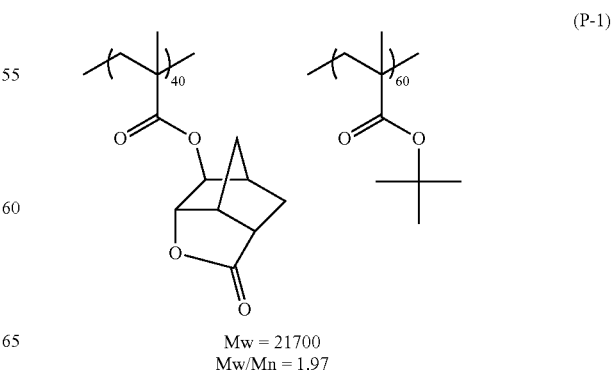

(P-1)

Mw = 21700
Mw/Mn = 1.97

-continued
(P-2)
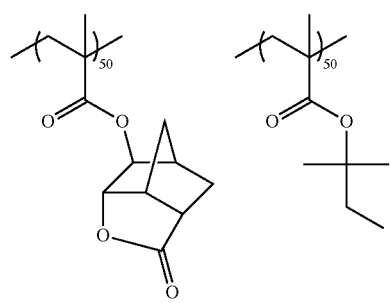
Mw = 13800
Mw/Mn = 1.89
(P-3)
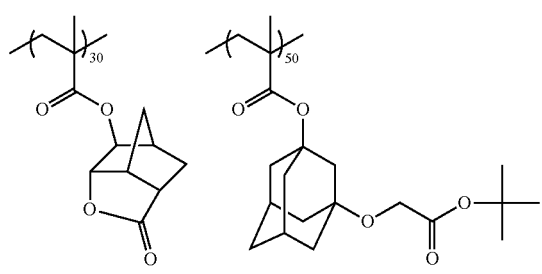
Mw = 13700
Mw/Mn = 1.67
(P-4)
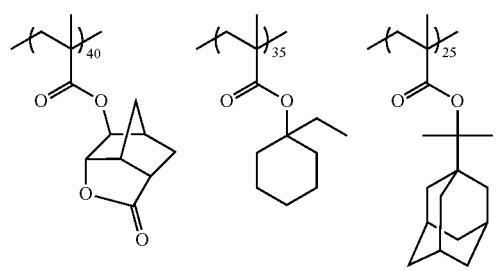
Mw = 9700
Mw/Mn = 1.73
(P-5)
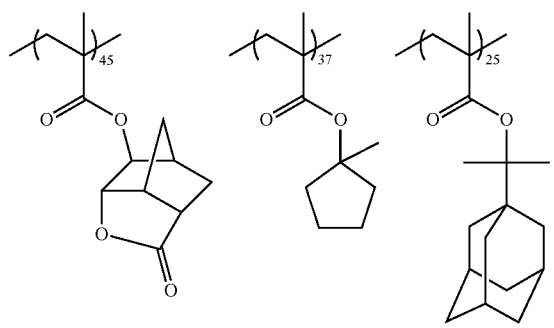
Mw = 12700
Mw/Mn = 1.74
-continued
(P-6)
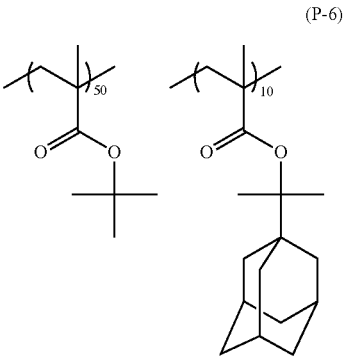
Mw = 20500
Mw/Mn = 1.98
(P-7)
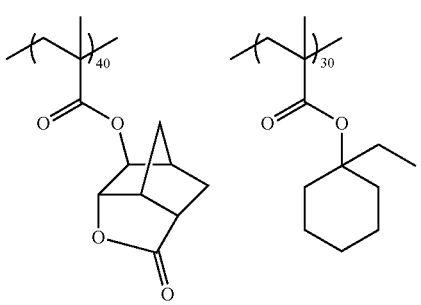
Mw = 18100
Mw/Mn = 1.84
(P-8)
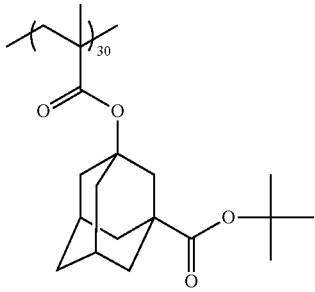
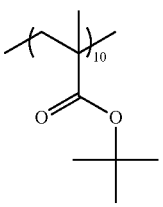

-continued

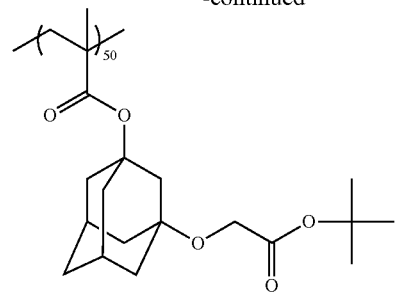

Mw = 18900
Mw/Mn = 1.92

(P-9)

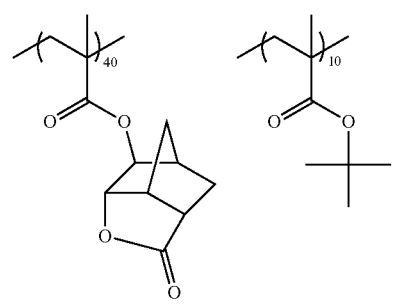

Mw = 19600
Mw/Mn = 1.77

(P-10)

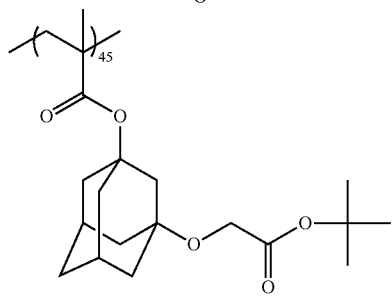

-continued

Mw = 10600
Mw/Mn = 1.83

(P-11)

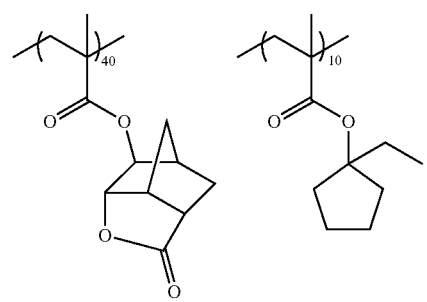

Mw = 10400
Mw/Mn = 1.72

<Preparation of Resist Composition>

Resist compositions R1 to R11 were each prepared by dissolving the components indicated in the following Table 3 in the solvents indicated in the following Table 3 to adjust the total solids concentration to 3.8 mass %, and filtering each solution through a polyethylene filter having a pore size of 0.1 µm.

TABLE 3

| Resist composition | Composition | | | | | |
|---|---|---|---|---|---|---|
| | Resin (A) (0.3 g) (mass ratio) | Acid generator (B) (mg) | Solvent (mass ratio) | Compound (C) or compound (C') (mg) | Surfactant (F) (mg) | Hydrophobic resin (E) (mg) |
| R1 | P-1 | PAG2 (19) | SL-1/SL-3 (70/30) | PTB-2 (24) | — | IMA-1 (3) |
| R2 | P-2 | PAG3 (17) | SL-1/SL-4 (95/5) | PTB-1 (26) | W-1 (1) | IMA-1 (3) |
| R3 | P-3 | PAG2 (19) | SL-1/SL-2 (60/40) | PTB-1 (26) | — | IMA-1 (3) |
| R4 | P-4 | PAG1 (18) | SL-1/SL-2/SL-4 (80/15/5) | PTB-2 (24) | — | IMA-1 (3) |

TABLE 3-continued

| Resist composition | Resin (A) (0.3 g) (mass ratio) | Acid generator (B) (mg) | Solvent (mass ratio) | Compound (C) or compound (C') (mg) | | Surfactant (F) (mg) | Hydrophobic resin (E) (mg) |
|---|---|---|---|---|---|---|---|
| R5 | P-5 | PAG2 (19) | SL-1/SL-3 (70/30) | PTB-1 (26) | | W-1 (1) | IMA-1 (3) |
| R6 | P-6 | PAG1 (18) | SL-1/SL-3 (70/30) | PTB-1 (26) | | — | IMA-1 (3) |
| R7 | P-7 | PAG3 (25) | SL-1/SL-4 (95/5) | N-1 (15) | | — | IMA-1 (3) |
| R8 | P-3/P-8 (50/50) | PAG1 (18) | SL-1/SL-2 (60/40) | PTB-2 (24) | | — | IMA-1 (3) |
| R9 | P-9 | PAG2 (19) | SL-1/SL-2/SL-4 (80/15/5) | PTB-1 (15) | PTB-2 (11) | W-1 (1) | IMA-1 (3) |
| R10 | P-10 | PAG1 PAG2 (10) (8) | SL-1/SL-2 (60/40) | PTB-2 (24) | | — | IMA-1 (3) |
| R11 | P-11 | PAG3 (25) | SL-1/SL-2 (60/40) | N-1 (5) | PTB-1 (13) | W-1 (3) | IMA-1 (3) |

Hereinafter, the abbreviations in Table 3 will be explained.
<Acid Generator (B)>
The acid generators are as follows.

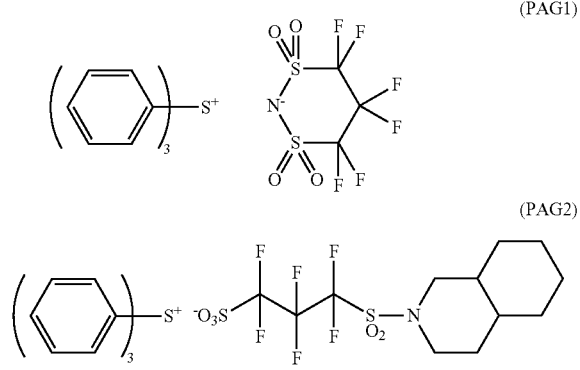

(PAG1)

(PAG2)

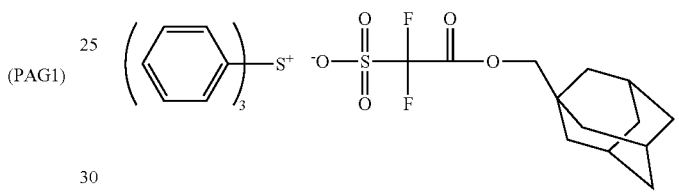

(PAG3)

<Basic compound (C) Having Decreasing Basicity when Irradiated with Actinic Ray or Radiation, and Basic Compound (C')>

The basic compound which has decreasing basicity when irradiated with an actinic ray or a radiation, and the basic compound are as follows.

N-1: 2-Phenylbenzimidazole

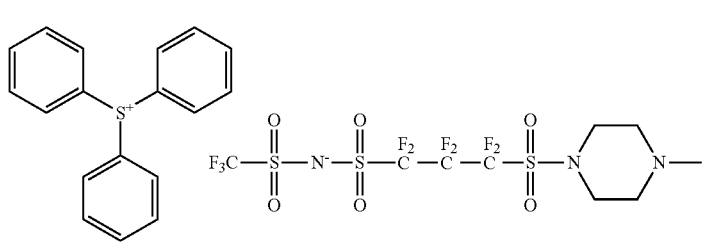

(PTB-1)

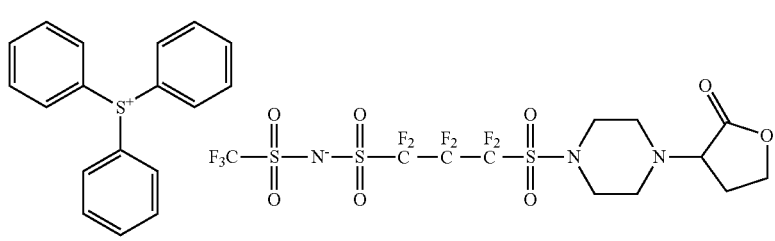

(PTB-2)

<Hydrophobic Resin (E)>
The hydrophobic resins are as follows.

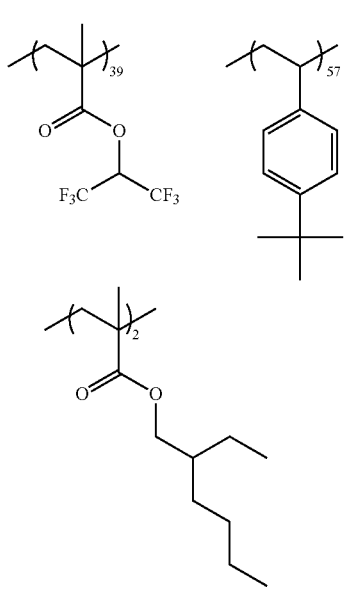

Weight average molecular weight: 4180
Dispersity: 1.35

<Surfactant>
The surfactants are as follows.
W-1: MEGAFAC F176 (manufactured by DIC Corp.; fluorine-based)
<Solvent>
The solvents are as follows.
SL-1: Propylene glycol monomethyl ether acetate (PGMEA)
SL-2: Propylene glycol monomethyl ether (PGME)
SL-3: Cyclohexanone
SL-4: γ-Butyrolactone Examples 1 to 11

In Examples 1 to 11, hole patterns were formed based on the pattern forming method related to the exemplary embodiment of the present invention described above. That is, after the first exposure, and after the second exposure, heating treatments were carried out. Specifically, ARC145 (manufactured by Nissan Chemical Industries, Ltd.) for forming an organic antireflective film was applied on a silicon wafer, and was baked for 60 seconds at 205° C. to form an antireflective film having a thickness of 46 nm. Furthermore, ARC113 (manufactured by the same company) for forming an organic antireflective film was applied thereon and was baked for 60 seconds at 205° C. to form an antireflective film having a thickness of 49 nm. On the antireflective films, each of the resist compositions R1 to R11 prepared as described above was applied and baked for 60 seconds at 100° C. Thus, a resist film having a thickness of 100 nm was formed.

This resist film was subjected to pattern exposure of a first round (the amount of exposure is indicated in Table 4) using an ArF excimer laser immersion scanner (XT1700i manufactured by ASML, NA=1.2, Dipole-X), through a line-and-space mask in which light-shielding mask lines having a width of 35 nm and translucent spaces having a width of 55 nm were alternately arranged. Immediately after the exposure, the exposed resist film was heated on a hot plate at 105° C. for 60 seconds, and then was cooled to room temperature. Immediately after cooling, pattern exposure of a second round (the amount of exposure is indicated in Table 4) was carried out using an ArF excimer laser immersion scanner (XT1700i manufactured by ASML, NA=1.2, Dipole-Y), through a mask which was equivalent to the mask that was used in the pattern exposure of the first round but rotated 90° (that is, a line-and-space mask in which light-shielding mask lines having a width of 35 nm and translucent spaces having a width of 55 nm were alternately arranged, such that these light-shielding mask lines were arranged perpendicularly to the light-shielding mask lines of the mask for the pattern exposure of the first round). Immediately after the exposure, the exposed resist film was heated on a hot plate for 60 seconds at 105° C., and then the resist film was cooled to room temperature. As the immersion liquid at the time of the first exposure and second exposure, ultrapure water was used.

Subsequently, the resist film was developed for 30 seconds with butyl acetate (organic developer), and thereby a contact hole pattern having a final dimension in which the circular cross-section diameter in the plane direction of the resist film was 45 nm was obtained.

Comparative Examples 1 to 11

In Comparative Examples 1 to 11, hole patterns were formed based on a pattern forming method for comparison. That is, the pattern forming method of Comparative Examples 1 to 11 was carried out by the same technique as in Examples 1 to 11, except that the heating treatment between the first pattern exposure and the second pattern exposure was not carried out (the resist compositions used in Comparative Examples 1 to 11, and the amounts of exposure for the first pattern exposure and the second pattern exposure of Comparative Examples 1 to 11 are as indicated in Table 4.

Meanwhile, for all of Examples 1 to 11 and Comparative Examples 1 to 11, the amount of exposure for the first pattern exposure and the amount of exposure for the second pattern exposure were respectively adjusted so that the value of circularity in the following circularity evaluation of the hole pattern finally obtained would be minimum. Thus, exposure was carried out with the optimum amount of exposure.

<Evaluation Method>
[Circularity Evaluation]

The pattern in the resist films obtained by the pattern forming methods of Examples and Comparative Examples was observed under a scanning electron microscope (S9380II manufactured by Hitachi, Ltd.), and photographs were taken. From the images, the circularity (inner diameter, 3σ) of the cross-section of the contact holes in the plane direction of the resist film was calculated using Offline CD Measurement Software (manufactured by Hitachi, Ltd.). A smaller value means higher circularity.

The numerical results of circularity are given in Table 4.

Figure 9A:
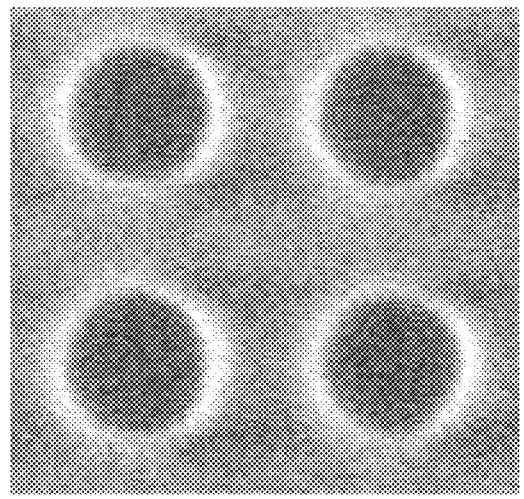
FIG. 9A is a diagram illustrating the results of an observation made based on an electron micrograph of the pattern obtained in Example 1.
Figure 9B:
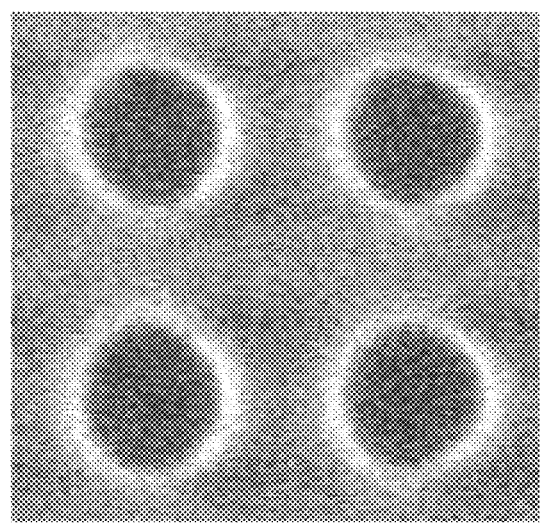
FIG. 9B is a diagram illustrating the results of an observation made based on an electron micrograph of the pattern obtained in Comparative Example 1.

Furthermore, FIG. 9A is a diagram illustrating the observation results based on the electron micrograph of the pattern obtained in Example 1, and FIG. 9B is a diagram illustrating the observation results based on the electron micrograph of the pattern obtained in Comparative Example 1.

TABLE 4

| | Resist composition | Amount of exposure (mJ/cm$^2$) First/Second | Evaluation results Circularity |
|---|---|---|---|
| Example 1 | R1 | 31/39 | 0.90 |
| Example 2 | R2 | 33/41 | 0.83 |
| Example 3 | R3 | 29/27 | 0.88 |
| Example 4 | R4 | 26/33 | 1.01 |
| Example 5 | R5 | 23/30 | 1.03 |
| Example 6 | R6 | 30/38 | 0.86 |
| Example 7 | R7 | 27/34 | 0.99 |
| Example 8 | R8 | 26/33 | 0.86 |
| Example 9 | R9 | 28/35 | 0.93 |
| Example 10 | R10 | 30/38 | 0.96 |
| Example 11 | R11 | 16/19 | 1.12 |
| Comp. Ex. 1 | R1 | 37/37 | 1.13 |
| Comp. Ex. 2 | R2 | 39/39 | 1.04 |
| Comp. Ex. 3 | R3 | 35/35 | 1.10 |
| Comp. Ex. 4 | R4 | 31/31 | 1.09 |
| Comp. Ex. 5 | R5 | 28/28 | 1.08 |
| Comp. Ex. 6 | R6 | 36/36 | 1.03 |
| Comp. Ex. 7 | R7 | 32/32 | 1.12 |
| Comp. Ex. 8 | R8 | 31/31 | 1.08 |
| Comp. Ex. 9 | R9 | 33/33 | 1.11 |
| Comp. Ex. 10 | R10 | 36/36 | 1.09 |
| Comp. Ex. 11 | R11 | 20/20 | 1.20 |

From the results of Table 4, when compared with the pattern forming method of the Comparative Examples, it is clear that contact holes having high circularity in connection with the cross-sectional shape in the plane direction of the resist film can be formed by the pattern forming method of the Examples.

Furthermore, as shown in FIG. 9A, it can be seen that the pattern obtained in Example 1 has satisfactory shapeability of the cross-sectional shape in the plane direction of the resist film (a circle of low deformity is formed).

On the other hand, as shown in FIG. 9B, it can be seen that the pattern obtained in Comparative Example 1 has poor shapeability of the cross-sectional shape in the plane direction of the resist film, as compared with Example 1 (the shape is a deformed circle, such as there are many straight parts instead of an arc).

This application claims priority under 35 U.S.C. §119 of Japanese Patent application JP 2011-145019, filed on Jun. 29, 2011 and Japanese Patent application JP 2012-088485, filed on Apr. 9, 2012, the entire contents of which are hereby incorporated by reference.

What is claimed is:

1. A pattern forming method comprising, in the following order:

(1) forming, on a substrate, a resist film using a chemical amplification resist composition including (A) a resin in which the polarity increases under the action of an acid and thereby the solubility in a developer containing an organic solvent decreases, and (B) a compound which generates an acid when irradiated with an actinic ray or a radiation;

(2) exposing the resist film, and thereby forming a first line-and-space latent image in which a first group of lines and a first group of spaces are alternately arranged;

(3) subjecting the resist film in which the first line-and-space latent image has been formed, to a first heating treatment;

(4) exposing the resist film that has been subjected to the first heating treatment, and thereby forming a second line-and-space latent image in which a second group of lines and a second group of spaces are alternately arranged, so that the line direction in the second line-and-space latent image intersects the line direction in the first line-and-space latent image;

(5) subjecting the resist film in which the second line-and-space latent image has been formed, to a second heating treatment; and (6) developing the resist film that has been subjected to the second heating treatment, using a developer containing an organic solvent, wherein a contact hole latent image is formed by combining the first line-and-space latent image and the second line-and-space latent image, the first heating treatment is performed after forming the first line-and-space latent image and before forming the second line-and-space latent image, and the chemical amplification resist composition further includes a hydrophobic resin including at least one of a fluorine atom and a silicon atom.

2. The pattern forming method according to claim 1, wherein the content of the organic solvent in the developer containing the organic solvent is from 90% by mass to 100% by mass with respect to the total amount of the developer.

3. The pattern forming method according to claim 1, wherein the chemical amplification resist composition contains (C) a basic compound or ammonium salt compound, each of which has decreasing basicity when irradiated with an actinic ray or a radiation.

4. The pattern forming method according to claim 1, wherein the resin (A) contains a repeating unit represented by the following formula (AI):

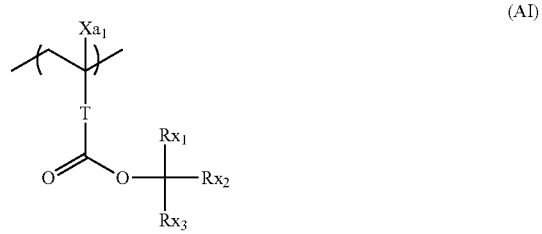

(AI)

wherein in the formula (AI),

Xa$_1$ represents a hydrogen atom, a methyl group which may be substituted, or a group represented by the formula —CH$_2$—R$_9$; R$_9$ represents a hydroxyl group or a monovalent organic group;

T represents a single bond or a divalent linking group;

Rx$_1$ to Rx$_3$ each independently represent an alkyl group or a cycloalkyl group; and two of Rx$_1$ to Rx$_3$ may be joined to form a cycloalkyl group.

5. The pattern forming method according to claim 4, wherein in the formula (AI), T represents a single bond; and Rx$_1$ to Rx$_3$ each independently represent a linear or branched alkyl group, provided that two of Rx$_1$ to Rx$_3$ do not join together to form a cycloalkyl group.

6. The pattern forming method according to claim 1, wherein the resin (A) contains a repeating unit represented by the following formula (I), and the repeating unit represented by the following formula (I) is decomposed by an acid and produces a carboxyl group:

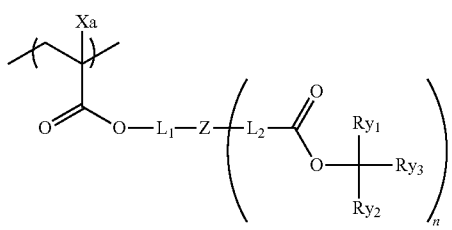

(I)

wherein Xa represents a hydrogen atom, an alkyl group, a cyano group, or a halogen atom;

Ry$_1$ to Ry$_3$ each independently represent an alkyl group or a cycloalkyl group; two of Ry$_1$ to Ry$_3$ may be joined to form a ring;

Z represents a linking group having a valence of (n+1) and having a polycyclic hydrocarbon structure which may have heteroatoms as ring members;

L$_1$ and L$_2$ each independently represent a single bond or a divalent linking group;

n represents an integer of 1 to 3; and when n is 2 or 3, plural L$_2$'s, plural Ry$_1$'s, plural Ry$_2$'s, and plural Ry$_3$'s may be each identical with or different from each other.

7. The pattern forming method according to claim 1, wherein the forming of the first line-and-space latent image and the forming of the second line-and-space latent image respectively involve exposing the resist film using an ArF excimer laser.

8. The pattern forming method according to claim 7, wherein the forming of the first line-and-space latent image and the forming of the second line-and-space latent image respectively involve exposing the resist film through an immersion liquid using an ArF excimer laser.

9. The pattern forming method according to claim 1, wherein the heating temperature in the performing of the first heating treatment and the heating temperature in the performing of the second heating treatment are respectively independently from 70° C. to 150° C., and the heating time in the performing of the first heating treatment and the heating time in the performing of the second heating treatment are each independently from 10 seconds to 90 seconds.

10. The pattern forming method according to claim 1, wherein the amount of exposure in the forming of the second line-and-space latent image is greater than the amount of exposure in the forming of the first line-and-space latent image, and the difference of the amount of exposure in the forming of the second line-and-space latent image and the amount of exposure in the forming of the first line-and-space latent image is 15 mJ/cm$^2$ or less, and is larger than 0 mJ/cm$^2$.

11. The pattern forming method according to claim 1, wherein the amount of exposure in the forming of the second line-and-space latent image is greater by an amount in a range of 2 mJ/cm$^2$ to 15 mJ/cm$^2$ as compared with the amount of exposure in the forming of the first line-and-space latent image.

12. The pattern forming method according to claim 1, wherein the widths of the plural spaces constituting the first group of spaces are identical to each other, and the widths of the plural spaces constituting the second group of spaces are identical to each other.

13. The pattern forming method according to claim 12, wherein in the forming of the second line-and-space latent image, the second line-and-space latent image is formed such that the line direction in the second line-and-space latent image is perpendicular to the line direction in the first line-and-space latent image.

14. The pattern forming method according to claim 12, wherein the widths of the spaces in the first group of spaces are identical to the widths of the spaces in the second group of spaces.

15. The pattern forming method according to claim 12, wherein in the forming of the second line-and-space latent image, the second line-and-space latent image is formed such that the line direction in the second line-and-space latent image obliquely intersects the line direction in the first line-and-space latent image.

16. The pattern forming method according to claim 1, wherein the exposure processes employed in the forming of the first line-and-space latent image and the forming of the second line-and-space latent image are exposure processes respectively using a double pole illumination.

17. The pattern forming method according to claim 1, wherein the exposure processes employed in the forming of the first line-and-space latent image and the forming of the second line-and-space latent image are exposure processes respectively using a photomask selected from a binary mask and a phase shift mask.

18. The pattern forming method according to claim 1, wherein the developer includes ester-based solvents as the organic solvent.

19. The pattern forming method according to claim 1, wherein the forming of the first line-and-space latent image and the forming of the second line-and-space latent image respectively involve exposing the resist film through an immersion liquid, said method further comprising forming a film being poorly soluble in the immersion liquid on the resist film between steps of (1) forming the resist film on the substrate and (2) exposing the resist film which form the first line-and-space latent image.

20. The pattern forming method according to claim 1, wherein the chemical amplification resist composition further includes a nitrogen-containing organic compound having a group which is detached under the action of acid, the nitrogen-containing compound represented by the following formula (F),

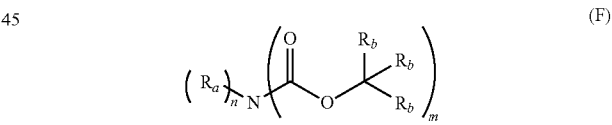

(F)

in the formula (F), n represents an integer of 0 to 2, and m represents an integer of 1 to 3, while n+m=3, R$_a$'s each independently represent a hydrogen atom, an alkyl group, a cycloalkyl group, an aryl group or an aralkyl group, when n=2, two R$_a$'s may be identical with or different from each other, and two R$_a$'s may be joined together to form a divalent heterocyclic hydrocarbon group or a derivative thereof, R$_b$'s independently represent a hydrogen atom, an alkyl group, a cycloalkyl group, an aryl group or an aralkyl group; however, in —C(R$_b$)(R$_b$)(R$_b$), when one or more R$_b$'s are hydrogen atoms, at least one of the other R$_b$'s is a cyclopropyl group or a 1-alkoxyalkyl group, at least two R$_b$'s may be joined together to form an alicyclic hydrocarbon group, an aromatic hydrocarbon group, a heterocyclic hydrocarbon group, or a derivative thereof, the alkyl group, cycloalkyl group, aryl group and aralkyl group represented by $R_a$ and $R_b$ may be substituted with a functional group such as a hydroxyl group, a cyano group, an amino group, a pyrrolidino group, a piperidino group, a morpholino group, or an oxo group, an alkoxy group, or a halogen atom.

21. A method for producing an electronic device, the method comprising the pattern forming method according to claim 1.

22. A pattern forming method comprising, in the following order:
(1) forming, on a substrate, a resist film using a chemical amplification resist composition including (A) a resin in which the polarity increases under the action of an acid and thereby the solubility in a developer containing an organic solvent decreases, and (B) a compound which generates an acid when irradiated with an actinic ray or a radiation;
(2) exposing the resist film, and thereby forming a first line-and-space latent image in which a first group of lines and a first group of spaces are alternately arranged;
(3) subjecting the resist film in which the first line-and-space latent image has been formed, to a first heating treatment;
(4) exposing the resist film that has been subjected to the first heating treatment, and thereby forming a second line-and-space latent image in which a second group of lines and a second group of spaces are alternately arranged, so that the line direction in the second line-and-space latent image intersects the line direction in the first line-and-space latent image;
(5) subjecting the resist film in which the second line-and-space latent image has been formed, to a second heating treatment; and
(6) developing the resist film that has been subjected to the second heating treatment to dissolve the unexposed area of the resist film, using a developer containing an organic solvent,
wherein the amount of exposure in the forming of the second line-and-space latent image is greater than the amount of exposure in the forming of the first line-and-space latent image, and the difference of the amount of exposure in the forming of the second line-and-space latent image and the amount of exposure in the forming of the first line-and-space latent image is 15 mJ/cm$^2$ or less, and is larger than 0 mJ/cm$^2$.

23. The pattern forming method according to claim 22, wherein the amount of exposure in the forming of the second line-and-space latent image is greater by an amount in a range of 2 mJ/cm$^2$ to 15 mJ/cm$^2$ as compared with the amount of exposure in the forming of the first line-and-space latent image.

24. A method for producing an electronic device, the method comprising the pattern forming method according to claim 22.

* * * * *